US012696489B2

(12) United States Patent
Jintyou et al.

(10) Patent No.: US 12,696,489 B2
(45) Date of Patent: Jul. 28, 2026

(54) SEMICONDUCTOR DEVICE COMPRISING CONTACT HOLE REACHING SEMICONDUCTOR LAYER

(71) Applicant: SEMICONDUCTOR ENERGY LABORATORY CO., LTD., Atsugi (JP)

(72) Inventors: Masami Jintyou, Shimotsuga (JP); Takahiro Iguchi, Nikko (JP); Rai Sato, Tochigi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 416 days.

(21) Appl. No.: 18/257,331

(22) PCT Filed: Dec. 1, 2021

(86) PCT No.: PCT/IB2021/061155
§ 371 (c)(1),
(2) Date: Jun. 14, 2023

(87) PCT Pub. No.: WO2022/130086
PCT Pub. Date: Jun. 23, 2022

(65) Prior Publication Data
US 2024/0038898 A1 Feb. 1, 2024

(30) Foreign Application Priority Data

Dec. 15, 2020 (JP) ................................. 2020-207485
Sep. 7, 2021 (JP) ................................. 2021-145106

(51) Int. Cl.
*H10D 30/67* (2025.01)
*H10H 20/857* (2025.01)
(Continued)

(52) U.S. Cl.
CPC ....... *H10D 30/6755* (2025.01); *H10D 30/673* (2025.01); *H10H 20/857* (2025.01);
(Continued)

(58) Field of Classification Search
CPC ............. H10D 30/6755; H10D 30/673; H10D 30/6734; H10D 30/6704; H01L 25/0753;
(Continued)

(56) References Cited

U.S. PATENT DOCUMENTS 5,940,732 A 8/1999 Zhang
6,828,188 B2 * 12/2004 Hirota .................... H10B 12/09
257/E21.654
(Continued)

FOREIGN PATENT DOCUMENTS

CN 102269901 A 12/2011
CN 107683531 A 2/2018
(Continued)

OTHER PUBLICATIONS

International Search Report (Application No. PCT/IB2021/061155) Dated Mar. 15, 2022.
(Continued)

*Primary Examiner* — Tan N Tran
(74) *Attorney, Agent, or Firm* — Fish & Richardson P.C.

(57) ABSTRACT
A semiconductor device with favorable electrical characteristics is provided. A highly reliable semiconductor device is provided. A semiconductor device with stable electrical characteristics is provided. The semiconductor device includes a semiconductor layer, a gate insulating layer, a gate electrode, a first insulating layer, a second insulating layer, and a conductive layer. The gate insulating layer is in contact with a top surface and a side surface of the semiconductor layer, and the gate electrode includes a region overlapping with the semiconductor layer with the gate insulating layer
(Continued)

therebetween. The first insulating layer contains an inorganic material and is in contact with a top surface of the gate insulating layer and a top surface and a side surface of the gate electrode. The gate insulating layer and the first insulating layer include a first opening in a region overlapping with the semiconductor layer. The second insulating layer contains an organic material and includes a second opening inside the first opening. The second insulating layer is in contact with a top surface and a side surface of the first insulating layer and a side surface of the gate insulating layer. The conductive layer is electrically connected to the semiconductor layer through the second opening.

14 Claims, 58 Drawing Sheets

(51) Int. Cl.
| | | |
|---|---|---|
| *H10W 90/00* | (2026.01) |
| *H10K 59/131* | (2023.01) |
| *H10K 59/80* | (2023.01) |

(52) U.S. Cl.
CPC .......... *H10W 90/00* (2026.01); *H10K 59/131* (2023.02); *H10K 59/873* (2023.02)

(58) Field of Classification Search
CPC .. H01L 25/167; H10H 20/857; H10K 59/131; H10K 59/873; H10K 59/35; H10K 59/124; G02F 1/1368; G09F 9/30; H05B 33/14
See application file for complete search history.

(56) References Cited

U.S. PATENT DOCUMENTS

| | | | |
|---|---|---|---|
| 7,786,553 | B1 | 8/2010 | Zhang |
| 7,800,235 | B2 | 9/2010 | Zhang |
| 8,283,788 | B2 | 10/2012 | Zhang |
| 8,643,013 | B2 | 2/2014 | Zhan et al. |
| 9,012,273 | B2 | 4/2015 | Zhan et al. |
| 9,129,864 | B2 | 9/2015 | Matsuura |
| 9,496,408 | B2 | 11/2016 | Yamazaki et al. |
| 9,741,865 | B2 | 8/2017 | Yamazaki et al. |
| 9,748,403 | B2 | 8/2017 | Koezuka et al. |
| 9,806,200 | B2 | 10/2017 | Shimomura et al. |
| 9,899,536 | B2 | 2/2018 | Yamazaki et al. |
| 10,032,929 | B2 | 7/2018 | Koezuka et al. |
| 10,209,587 | B2 * | 2/2019 | Wu ................... G02F 1/136286 |
| 11,024,725 | B2 | 6/2021 | Yamazaki et al. |
| 11,329,166 | B2 | 5/2022 | Hosaka et al. |
| 11,538,928 | B2 | 12/2022 | Yamazaki et al. |
| 11,942,554 | B2 | 3/2024 | Hosaka. et al. |
| 2011/0297941 | A1 | 12/2011 | Zhan et al. |
| 2012/0168880 | A1 | 7/2012 | Zhang |
| 2014/0231797 | A1 | 8/2014 | Matsuura |
| 2016/0284856 | A1 | 9/2016 | Shimomura et al. |
| 2016/0343868 | A1 | 11/2016 | Koezuka et al. |
| 2017/0025544 | A1 | 1/2017 | Yamazaki et al. |
| 2020/0243574 | A1 * | 7/2020 | Tian ....................... H10D 86/60 |
| 2021/0005754 | A1 | 1/2021 | Hosaka et al. |
| 2023/0132342 | A1 | 4/2023 | Yamazaki et al. |
| 2024/0266443 | A1 | 8/2024 | Hosaka. et al. |

FOREIGN PATENT DOCUMENTS

| | | |
|---|---|---|
| JP | 09-213968 A | 8/1997 |
| JP | 2011-257735 A | 12/2011 |
| JP | 2014-007399 A | 1/2014 |
| JP | 2014-160755 A | 9/2014 |
| JP | 2016-189461 A | 11/2016 |
| JP | 2016-219801 A | 12/2016 |
| JP | 2017-028288 A | 2/2017 |
| KR | 10-0339644 | 6/2002 |
| KR | 2011-0133923 A | 12/2011 |
| KR | 2018-0010205 A | 1/2018 |
| TW | 201219945 | 5/2012 |
| TW | 201705491 | 2/2017 |
| WO | WO-2016/189414 | 12/2016 |
| WO | WO-2017/085591 | 5/2017 |

OTHER PUBLICATIONS

Written Opinion (Application No. PCT/IB2021/061155) Dated Mar. 15, 2022.

* cited by examiner

FIG. 1A
100
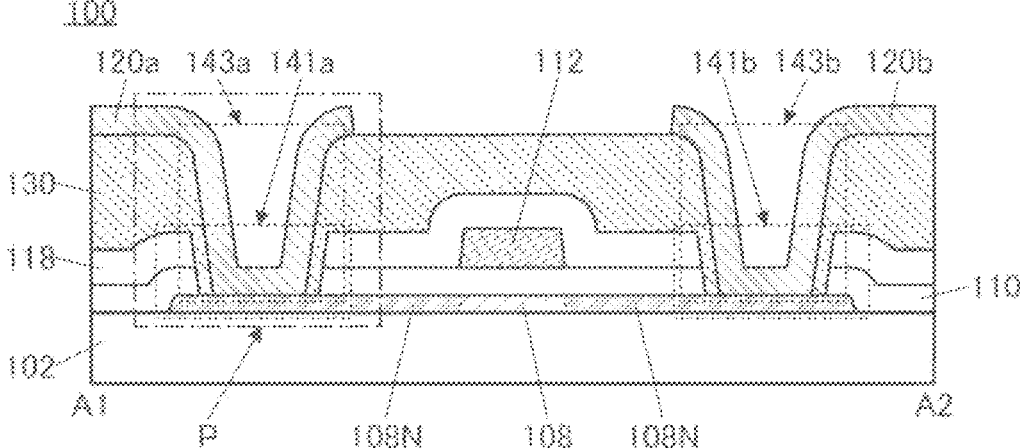
FIG. 1B
100
FIG. 1C
100
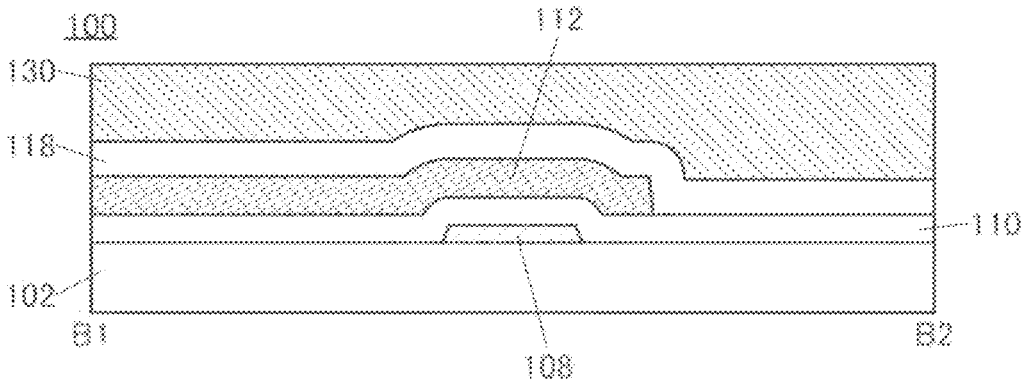

100A

100A

FIG. 22A
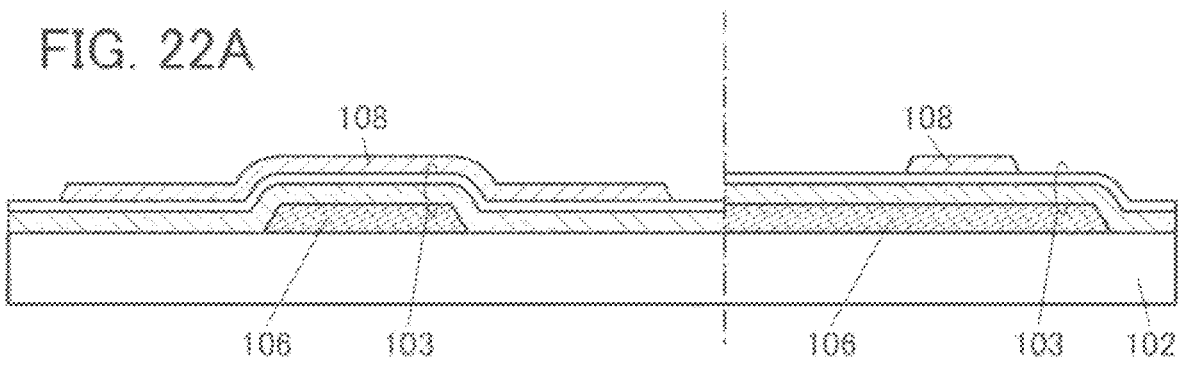
FIG. 22B
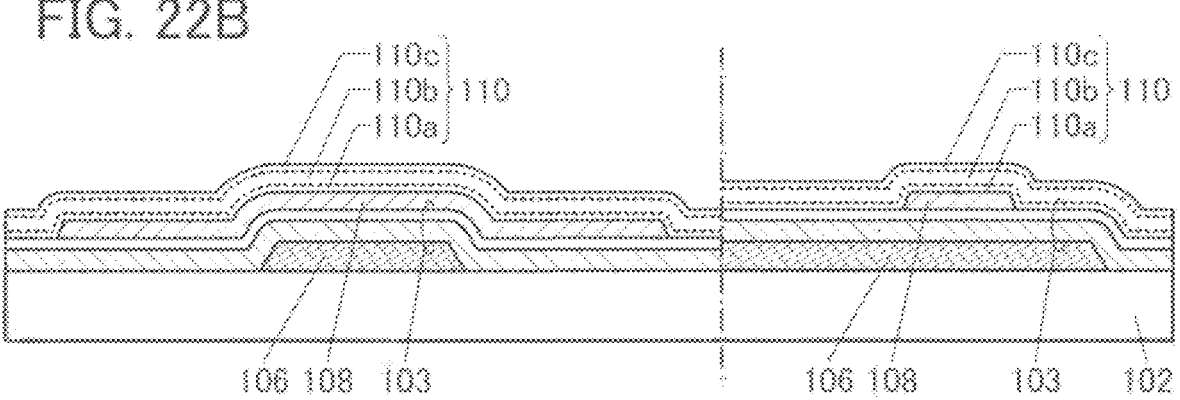
FIG. 22C
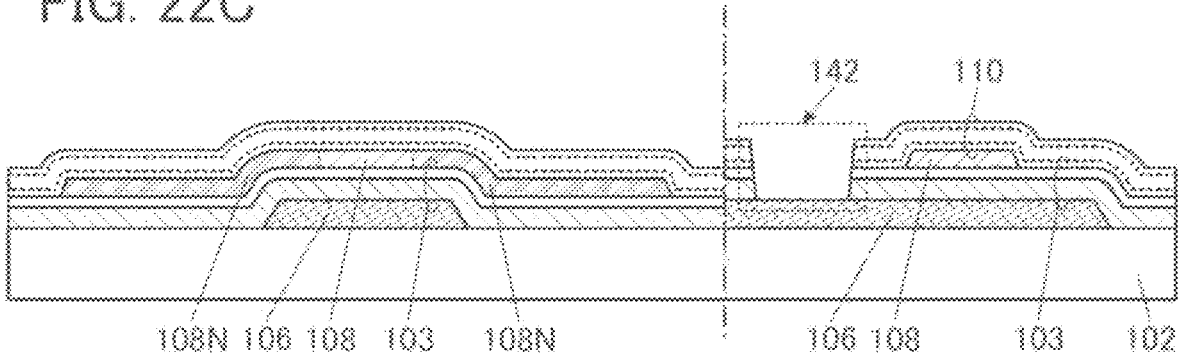
FIG. 22D

FIG. 32A
FIG. 32B
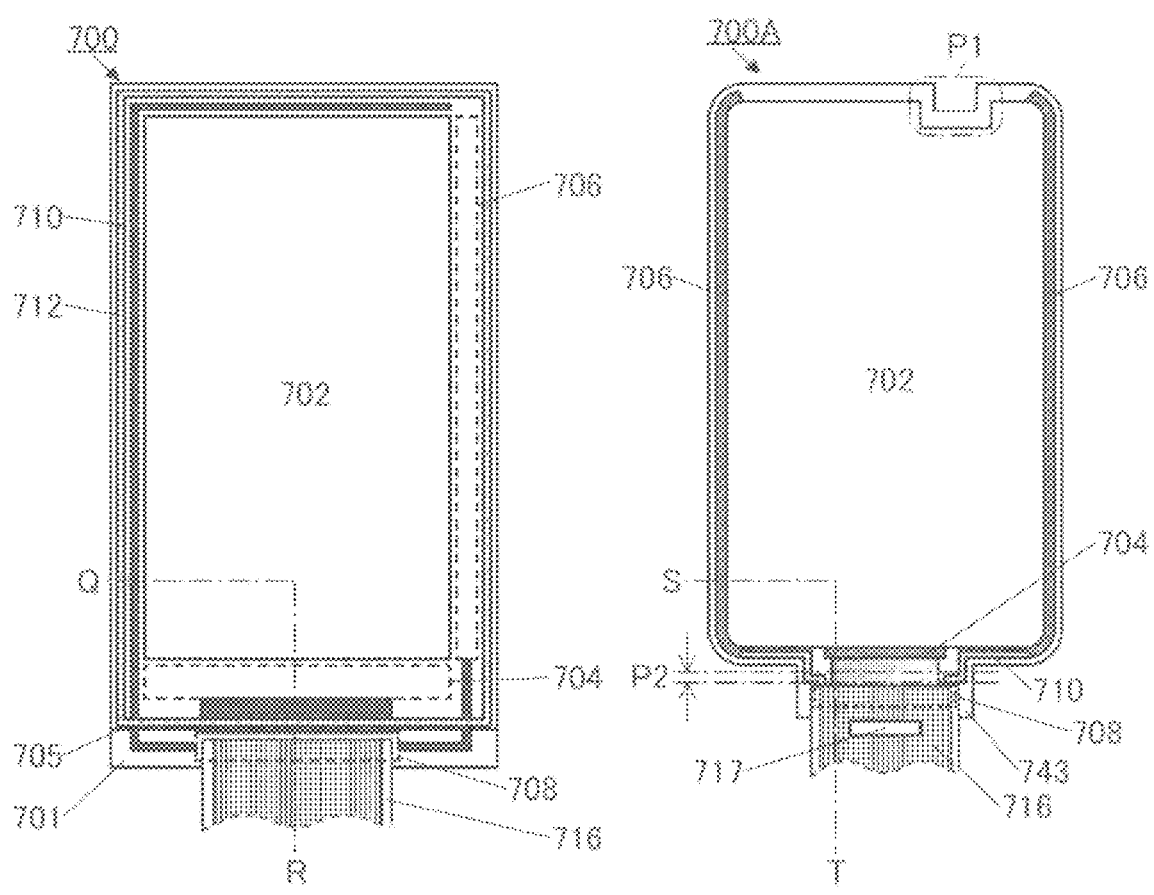
FIG. 32C
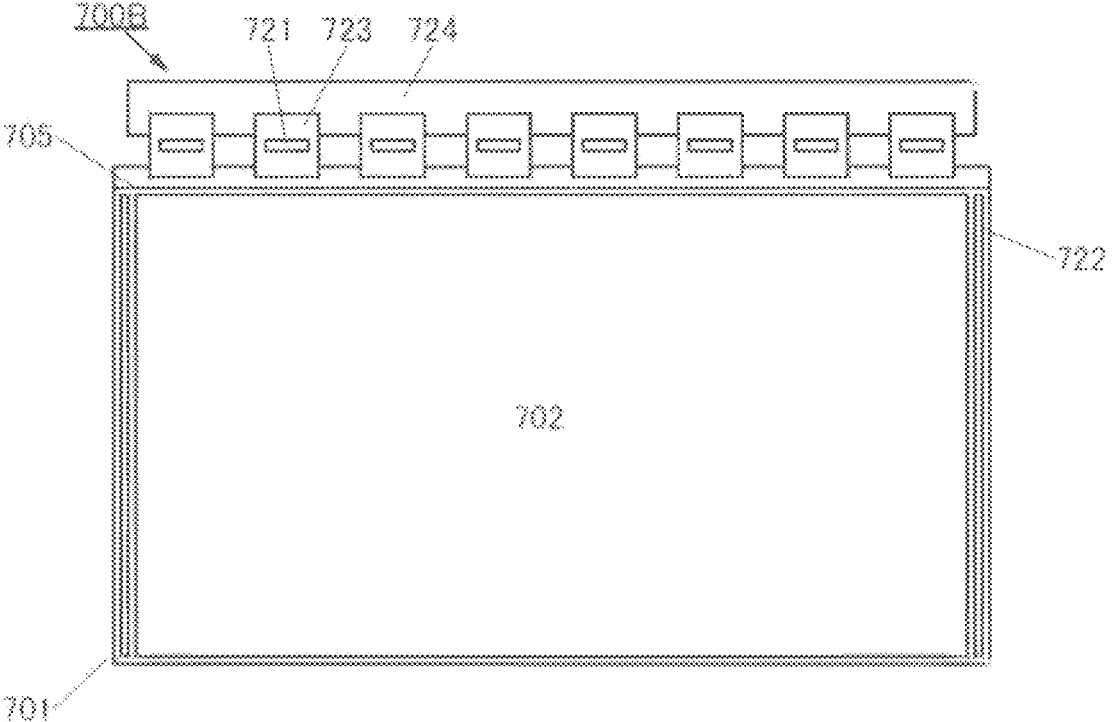

FIG. 39A
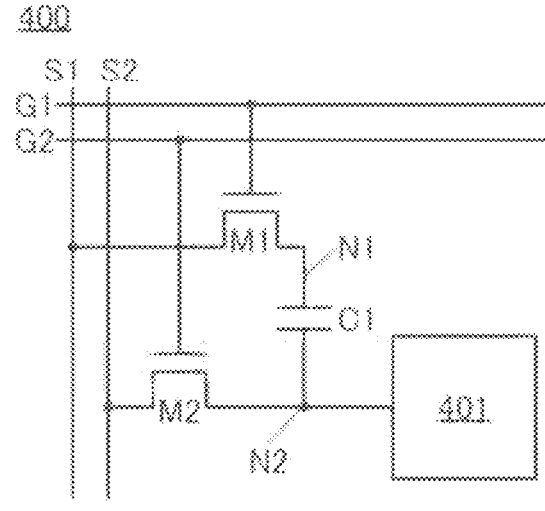
FIG. 39B
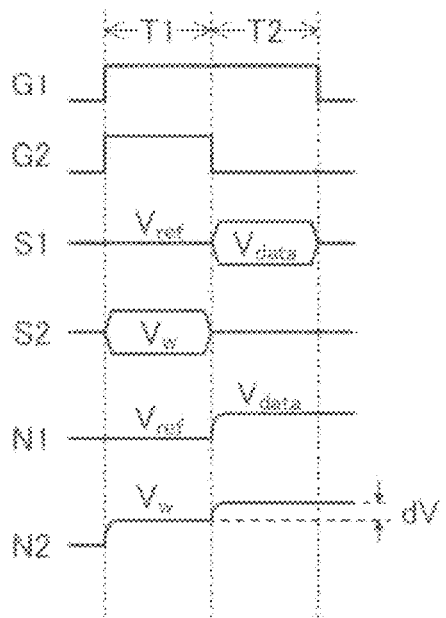
FIG. 39C
FIG. 39D
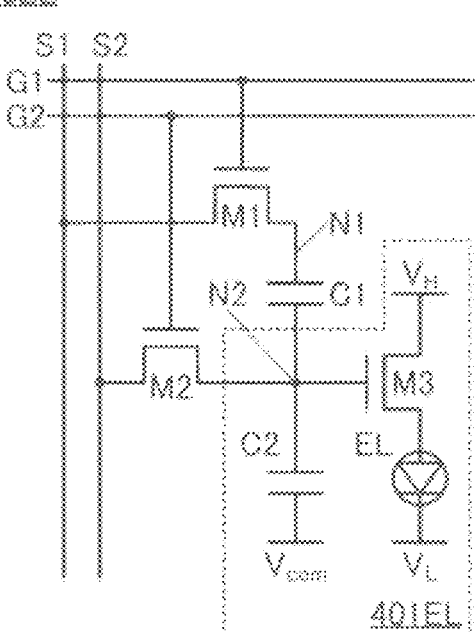

6500

6501

6502

6505

6507

6508

6503

6504

6506

6502

6510  6513  6512  6511

6515  6516  6517  6518  6501

FIG. 42A
FIG. 42B
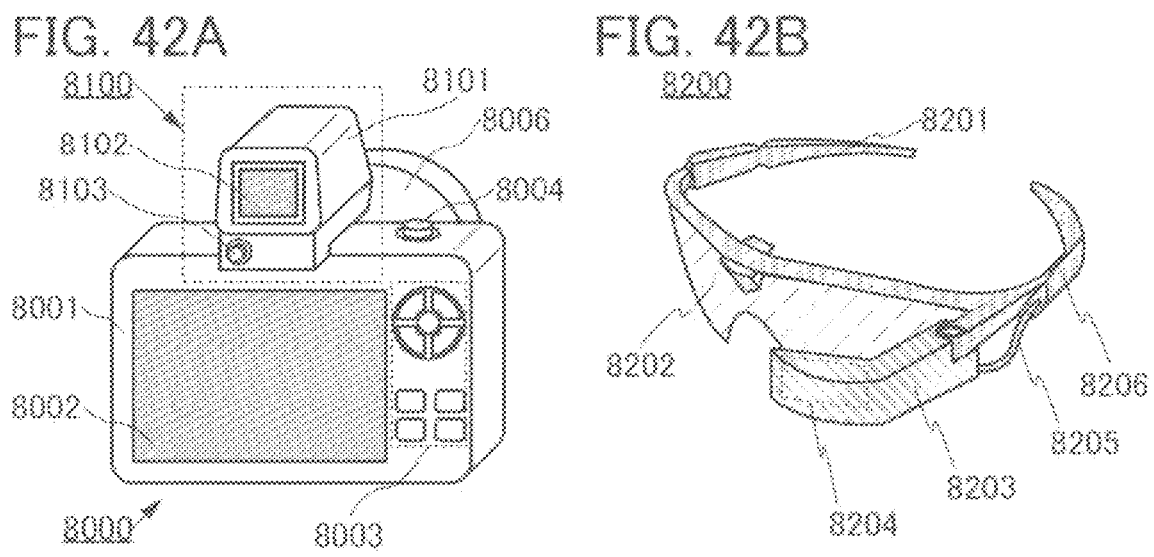
FIG. 42C
FIG. 42D
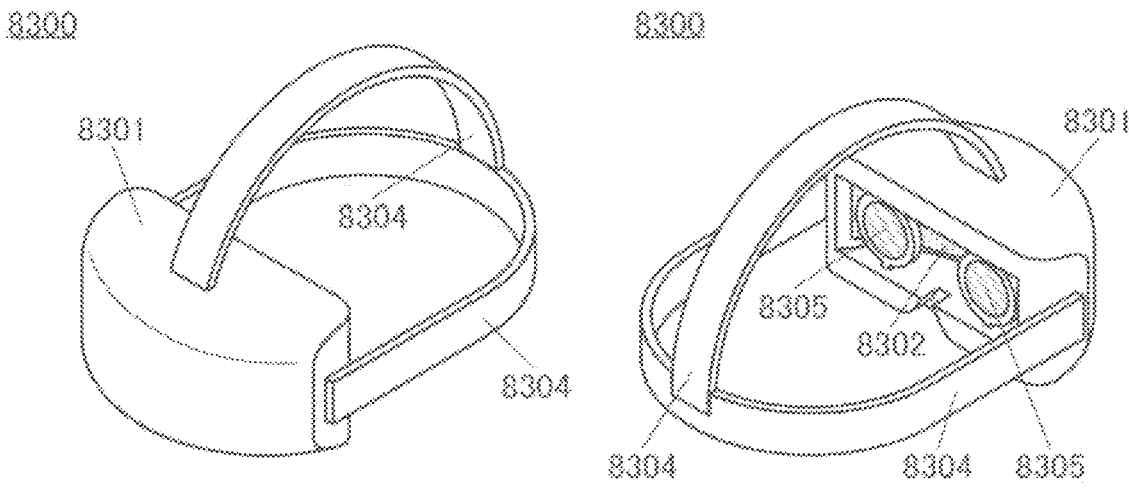
FIG. 42E
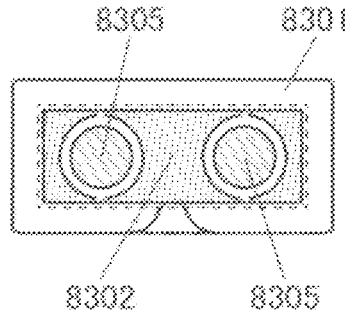

FIG. 43A
9100
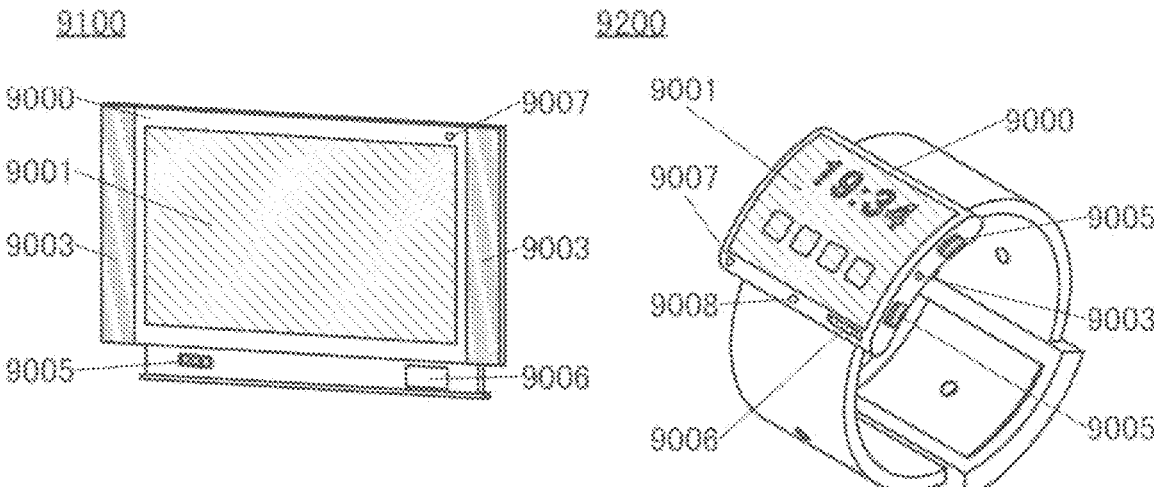
FIG. 43D
9200
FIG. 43B
9101
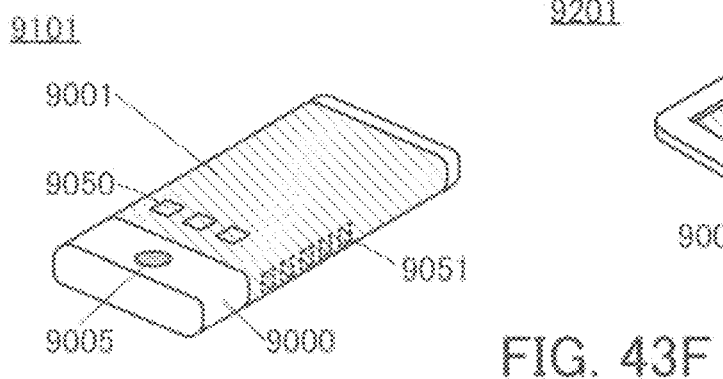
FIG. 43E
9201
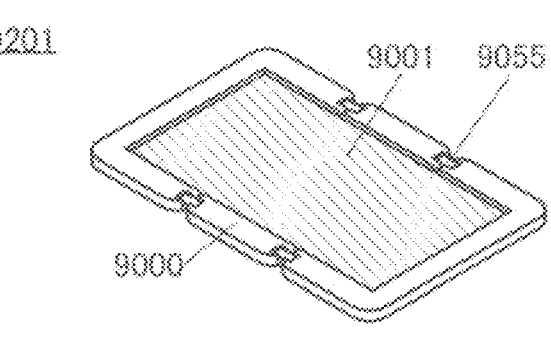
FIG. 43F
9201
FIG. 43C
9102
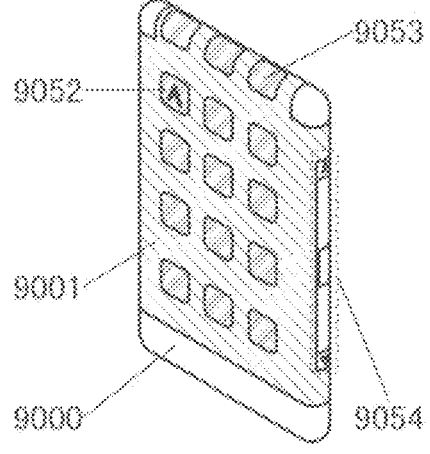
FIG. 43G
9201
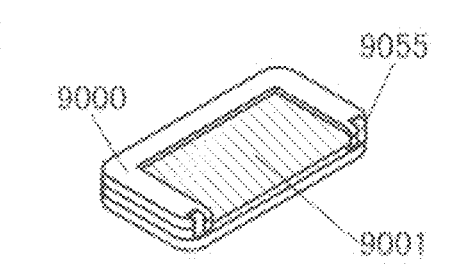

FIG. 44A
FIG. 44B
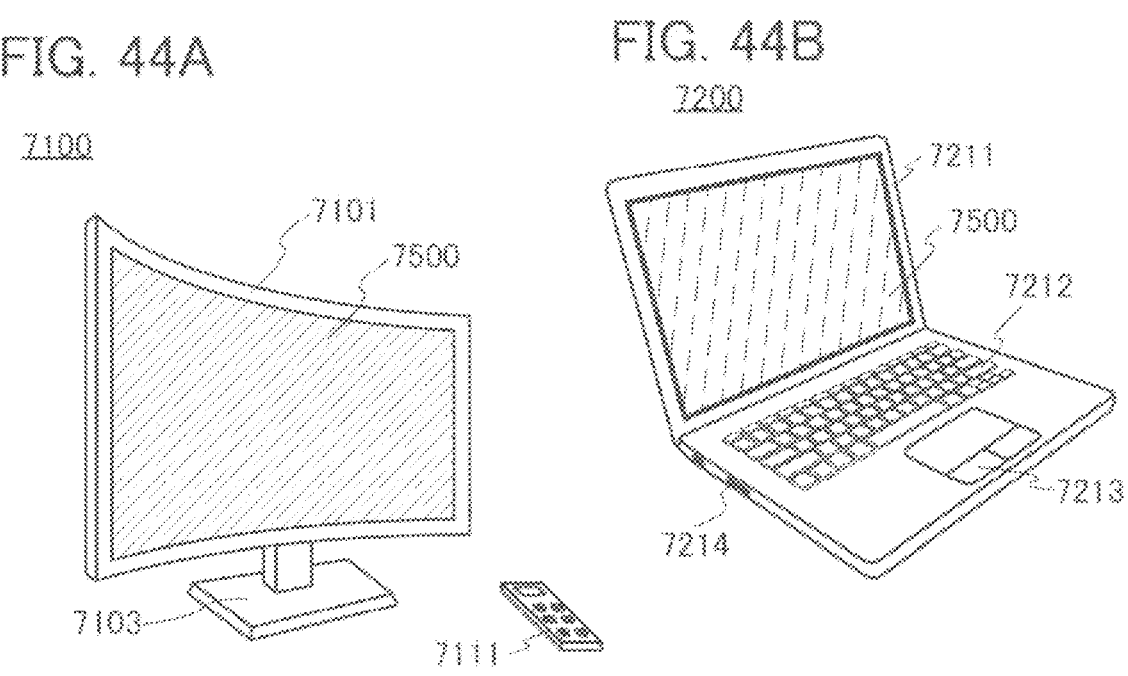
FIG. 44C
FIG. 44D
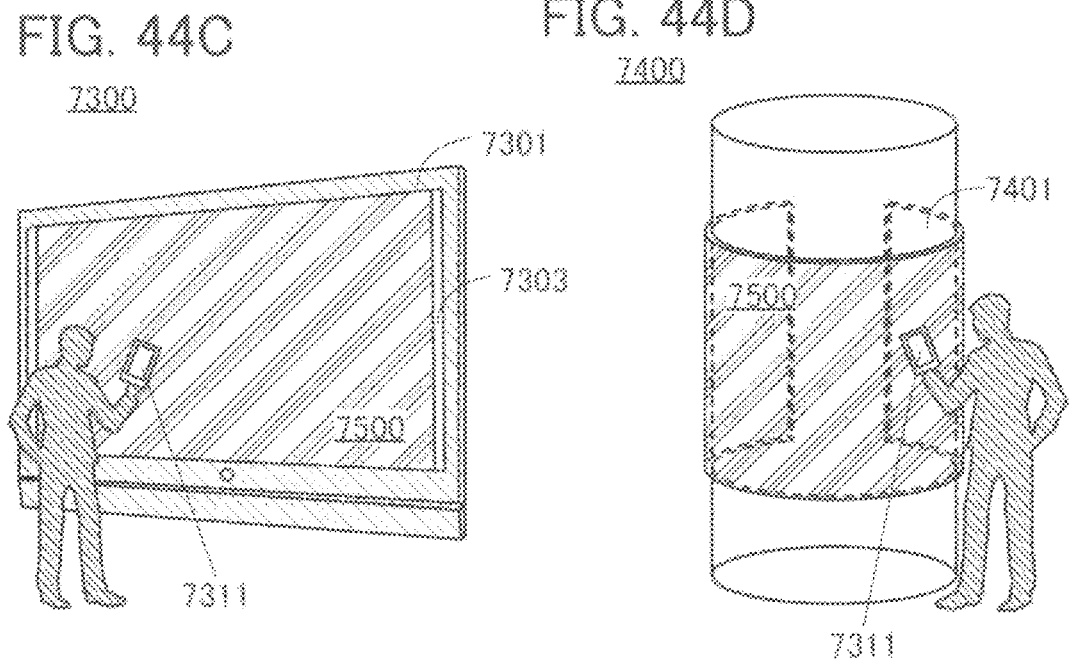

3.00 μm 120a
130
110,118
108N
103b
103a
102

1.00 μm 3.00 μm 3.00 μm 120a
110,118
108N
103b
103a
102

1.00 μm

SEMICONDUCTOR DEVICE COMPRISING CONTACT HOLE REACHING SEMICONDUCTOR LAYER

CROSS REFERENCE TO RELATED APPLICATIONS

This application is a U.S. National Phase Application under 35 U.S.C. § 371 of International Application PCT/IB2021/061155, filed on Dec. 1, 2021, which is incorporated by reference and claims the benefit of foreign priority applications filed in Japan on Dec. 15, 2020, as Application No. 2020-207485 and on Sep. 7, 2021, as Application No. 2021-145106.

TECHNICAL FIELD

One embodiment of the present invention relates to a semiconductor device and a manufacturing method thereof. One embodiment of the present invention relates to a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

As a semiconductor material applicable to a transistor, an oxide semiconductor using a metal oxide has attracted attention. For example, Patent Document 1 discloses a semiconductor device in which the field-effect mobility (simply referred to as mobility or FE in some cases) is increased by stacking a plurality of oxide semiconductor layers, containing indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a semiconductor layer of a transistor included in a large display device. In addition, capital investment can be reduced because part of production equipment for transistors using polycrystalline silicon or amorphous silicon can be retrofitted and utilized. Furthermore, a transistor using a metal oxide has high field-effect mobility compared to the case of using amorphous silicon; therefore, a high-performance display device provided with a driver circuit can be achieved.

REFERENCE

[Patent Document]
[Patent Document 1] Japanese Published Patent Application No. 2014-7399

SUMMARY OF THE INVENTION

Problems to be Solved by the Invention

An object of one embodiment of the present invention is to provide a semiconductor device with favorable electrical characteristics. An object of one embodiment of the present invention is to provide a highly reliable semiconductor device. An object of one embodiment of the present invention is to provide a semiconductor device with stable electrical characteristics. An object of one embodiment of the present invention is to provide a novel semiconductor device. An object of one embodiment of the present invention is to provide a highly reliable display device. An object of one embodiment of the present invention is to provide a novel display device.

Note that the description of these objects does not preclude the existence of other objects. One embodiment of the present invention does not have to achieve all these objects. Note that objects other than these can be derived from the description of the specification, the drawings, the claims, and the like.

Means for Solving the Problems

One embodiment of the present invention is a semiconductor device including a semiconductor layer, a gate insulating layer, a gate electrode, a first insulating layer, a second insulating layer, and a conductive layer. The gate insulating layer is in contact with atop surface and a side surface of the semiconductor layer, and the gate electrode includes a region overlapping with the semiconductor layer with the gate insulating layer therebetween. The first insulating layer contains an inorganic material and is in contact with a top surface of the gate insulating layer and a top surface and a side surface of the gate electrode. The gate insulating layer and the first insulating layer include a first opening in a region overlapping with the semiconductor layer. The second insulating layer contains an organic material and includes a second opening inside the first opening. The second insulating layer is in contact with a top surface and a side surface of the first insulating layer and a side surface of the gate insulating layer. The conductive layer is electrically connected to the semiconductor layer through the second opening.

One embodiment of the present invention is a semiconductor device including a semiconductor layer, a gate insulating layer, a gate electrode, a first insulating layer, a second insulating layer, and a conductive layer. The gate insulating layer is in contact with atop surface of the semiconductor layer, and the gate electrode includes a region overlapping with the semiconductor layer with the gate insulating layer therebetween. The first insulating layer contains an inorganic material and is in contact with the top surface and a side surface of the semiconductor layer, a side surface of the gate insulating layer, and atop surface and a side surface of the gate electrode. The first insulating layer includes a first opening in a region overlapping with the semiconductor layer. The second insulating layer contains an organic material and includes a second opening inside the first opening. The second insulating layer is in contact with a top surface and a side surface of the first insulating layer. The conductive layer is electrically connected to the semiconductor layer through the second opening.

In the above semiconductor device, an angle formed by a side surface of the second insulating layer and the top surface of the semiconductor layer is preferably greater than or equal to 45° and less than 90°.

In the above semiconductor device, the second insulating layer preferably includes a region in contact with the top surface of the semiconductor layer. The width of the region is preferably greater than or equal to 50 nm and less than or equal to 3000 nm.

In the above semiconductor device, the transmittance of the second insulating layer in a wavelength range of greater than or equal to 200 nm and less than or equal to 350 nm is preferably higher than or equal to 0.01% and lower than or equal to 70%.

In the above semiconductor device, the transmittance of the organic material in a wavelength range of greater than or equal to 200 nm and less than or equal to 350 nm is preferably higher than or equal to 0.01% and lower than or equal to 70%.

In the above semiconductor device, the organic material preferably includes one or more of an acrylic resin, a polyimide resin, an epoxy resin, a polyamide resin, a poly-imide-amide resin, a siloxane resin, a benzocyclobutene-based resin, a phenol resin, a novolac resin, and precursors of these resins.

The above semiconductor device preferably includes a third insulating layer. It is preferable that the third insulating layer contain an inorganic material and include a third opening inside the second opening. The third insulating layer is preferably in contact with a top surface and the side surface of the second insulating layer.

Effect of the Invention

According to one embodiment of the present invention, a semiconductor device with favorable electrical characteristics can be provided. Alternatively, a highly reliable semiconductor device can be provided. Alternatively, a semiconductor device with stable electrical characteristics can be provided. Alternatively, a novel semiconductor device can be provided. Alternatively, a highly reliable display device can be provided. Alternatively, a novel display device can be provided.

Note that the description of the effects does not preclude the existence of other effects. Note that one embodiment of the present invention does not need to have all these effects. Note that effects other than these can be derived from the description of the specification, the drawings, the claims, and the like.

BRIEF DESCRIPTION OF THE DRAWINGS

FIG. 1A to FIG. 1C are diagrams illustrating a structure example of a transistor.

FIG. 22A to FIG. 22D are diagrams illustrating a method for manufacturing a transistor.

FIG. 32A to FIG. 32C are top views of display devices.

FIG. 35 is a cross-sectional view of a display device.

FIG. 38B and FIG. 38C are circuit diagrams of the display device.

FIG. 39A, FIG. 39C, and FIG. 39D are circuit diagrams of display devices. FIG. 39B is a timing chart.

FIG. 42A to FIG. 42E are diagrams illustrating structure examples of electronic devices.

FIG. 43A to FIG. 43G are diagrams illustrating structure examples of electronic devices.

FIG. 44A to FIG. 44D are diagrams illustrating structure examples of electronic devices.

MODE FOR CARRYING OUT THE INVENTION

Figure 2:
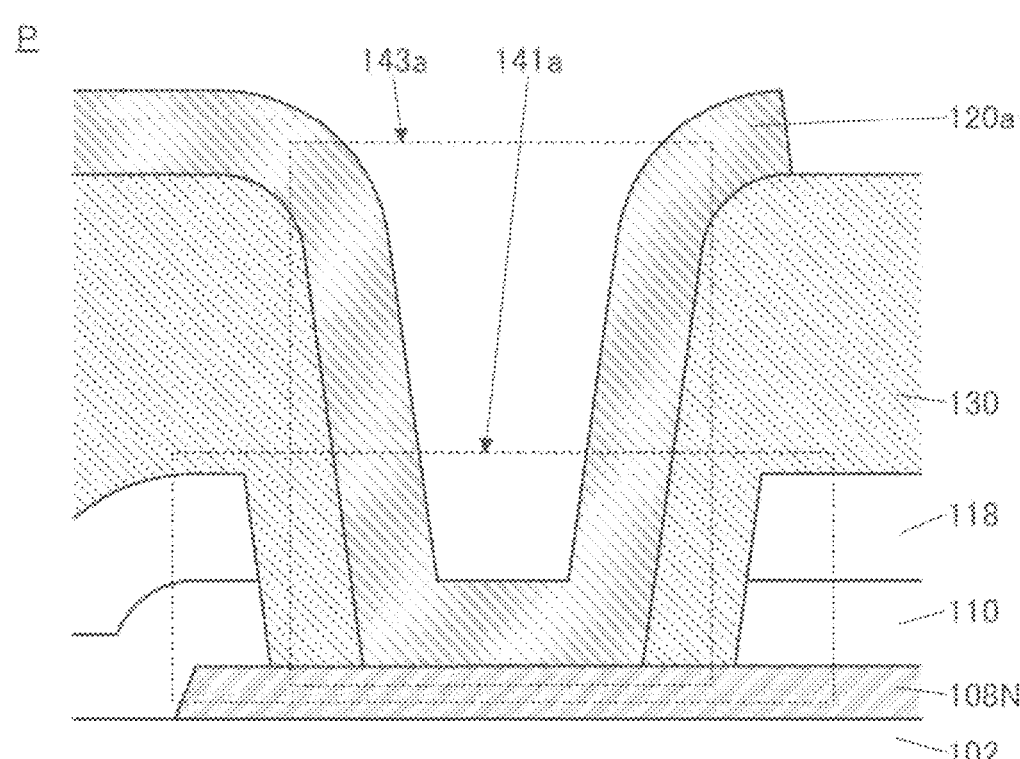
FIG. 2 is a diagram illustrating a structure example of a transistor.

Hereinafter, embodiments are described with reference to the drawings. Note that the embodiments can be implemented with many different modes, and it will be readily understood by those skilled in the art that modes and details thereof can be changed in various ways without departing from the spirit and scope thereof. Thus, the present invention should not be construed as being limited to the following description of the embodiments.

In each drawing described in this specification, the size, the layer thickness, or the region of each component is exaggerated for clarity in some cases.

Ordinal numbers such as "first", "second", and "third" used in this specification and the like are used in order to avoid confusion among components and do not limit the components numerically.

In this specification and the like, terms for describing arrangement, such as "over" and "under", are used for convenience to describe the positional relation between components with reference to drawings. The positional relation between components is changed as appropriate in accordance with a direction in which each component is described. Thus, terms for the description are not limited to those used in the specification, and the description can be rephrased appropriately depending on the situation.

In this specification and the like, functions of a source and a drain of a transistor are sometimes interchanged with each other when a transistor of opposite polarity is employed or the direction of current is changed in a circuit operation, for example. Therefore, the terms "source" and "drain" can be used interchangeably.

Note that in this specification and the like, a channel length direction of a transistor refers to one of the directions parallel to a straight line that connects a source region and a drain region in the shortest distance. In other words, a channel length direction corresponds to one of the directions of current flowing through a semiconductor layer when a transistor is in an on state. In addition, a channel width direction refers to a direction orthogonal to the channel length direction. Note that each of the channel length direction and the channel width direction is not fixed to one direction in some cases depending on the structure or the shape of a transistor.

In this specification and the like, "electrically connected" includes the case where connection is made through an "object having any electric function". Here, there is no particular limitation on the "object having any electric function" as long as electric signals can be transmitted and received between components that are connected through the object. Examples of the "object having any electric action" include a switching element such as a transistor, a resistor, an inductor, a capacitor, and other elements with a variety of functions as well as an electrode and a wiring.

In this specification and the like, the term "film" and the term "layer" can be interchanged with each other. For example, in some cases, the term "conductive layer" can be interchanged with the term "conductive film". In some cases, the term "insulating layer" can be interchanged with the term "insulating film".

Unless otherwise specified, off-state current in this specification and the like refers to drain current of a transistor in an off state (also referred to as a non-conducting state or a cutoff state). Unless otherwise specified, an off state refers to, in an n-channel transistor, a state where voltage $V_{gs}$ between its gate and source is lower than the threshold voltage $V_{th}$ (in a p-channel transistor, higher than $V_{th}$).

In this specification and the like, a display panel that is one embodiment of a display device has a function of displaying (outputting) an image or the like on (to) a display surface. Thus, the display panel is one embodiment of an output device.

In this specification and the like, a substrate of a display panel to which a connector such as an FPC (Flexible Printed Circuit) or a TCP (Tape Carrier Package) is attached, or a substrate on which an IC (Integrated Circuit) is mounted by a COG (Chip On Glass) method or the like is referred to as a display panel module, a display module, or simply a display panel or the like in some cases.

Note that in this specification and the like, a touch panel that is one embodiment of a display device has a function of displaying an image or the like on a display surface and a function of a touch sensor capable of sensing the contact, press, approach, or the like of a sensing target with or to the display surface. Thus, the touch panel is one embodiment of an input/output device. Note that examples of the sensing target include a finger and a stylus.

A touch panel can also be referred to as, for example, a display panel (or a display device) with a touch sensor or a display panel (or a display device) having a touch sensor function. A touch panel can include a display panel and a touch sensor panel. Alternatively, a touch panel can have a function of a touch sensor inside a display panel or on a surface thereof.

In this specification and the like, a substrate of a touch panel on which one or more of a connector and an IC are mounted is referred to as a touch panel module, a display module, or simply a touch panel or the like in some cases.

Embodiment 1

In this embodiment, a semiconductor device of one embodiment of the present invention and a manufacturing method thereof will be described. In particular, in this embodiment, as an example of the semiconductor device, a transistor using an oxide semiconductor for a semiconductor layer where a channel is formed will be described.

One embodiment of the present invention is a transistor including a semiconductor layer, a gate insulating layer, a gate electrode, a first insulating layer, a second insulating layer, and a conductive layer. The semiconductor layer preferably contains a metal oxide exhibiting semiconductor characteristics (hereinafter, also referred to as an oxide semiconductor). The gate insulating layer is in contact with a top surface and a side surface of the semiconductor layer, and the gate electrode includes a region overlapping with the semiconductor layer with the gate insulating layer therebetween.

It is preferable that the first insulating layer contain an inorganic material and be in contact with a top surface of the gate insulating layer and a top surface and a side surface of the gate electrode. The gate insulating layer and the first insulating layer include a first opening in a region overlapping with the semiconductor layer.

The second insulating layer preferably includes a second opening inside the first opening. The second insulating layer is in contact with a top surface and a side surface of the first insulating layer and a side surface of the gate insulating layer. That is, the second insulating layer is provided to cover the first insulating layer and the gate insulating layer. The second insulating layer preferably has a low transmittance of ultraviolet light (also referred to as ultraviolet rays). For the second insulating layer, for example, an organic material can be suitably used.

The conductive layer functioning as a source electrode or a drain electrode is electrically connected to the semiconductor layer through the second opening. The conductive layer includes a region in contact with the second insulating layer. Meanwhile, it is preferable that the conductive layer include no region that is in contact with both the first insulating layer and the gate insulating layer.

Here, at the time of depositing a conductive film to be the conductive layer, ultraviolet light might be generated in a deposition apparatus in some cases. The ultraviolet light reaching a channel formation region adversely affects the electrical characteristics and the reliability of the transistor in some cases. In the transistor of one embodiment of the present invention, the first insulating layer and the gate insulating layer are covered with the second insulating layer having a low transmittance of ultraviolet light, so that the amount of ultraviolet light reaching the channel formation region can be reduced. Accordingly, a transistor having favorable electrical characteristics and reliability can be provided.

A more specific structure example of a transistor will be described below.

Structure Example 1

FIG. 1A is a top view of a transistor 100, FIG. 1B corresponds to a cross-sectional view of a cut plane along the dashed-dotted line A1-A2 shown in FIG. 1A, and FIG. 1C corresponds to a cross-sectional view of a cut plane along the dashed-dotted line B1-B2 shown in FIG. 1A. Note that in FIG. 1A, some components (e.g., a gate insulating layer) of the transistor 100 are not illustrated. The direction of the dashed-dotted line A1-A2 corresponds to a channel length direction, and the direction of the dashed-dotted line B1-B2 corresponds to a channel width direction. Some components are not illustrated in top views of transistors in the following drawings, as in FIG. 1A. FIG. 2 is an enlarged view of a region P surrounded by a dashed-dotted line in FIG. 1B.

The transistor 100 is provided over a substrate 102 and includes a semiconductor layer 108, an insulating layer 110, a conductive layer 112, an insulating layer 118, an insulating layer 130, and the like. The semiconductor layer 108 having an island shape is provided over the substrate 102. The insulating layer 110 is provided in contact with atop surface of the substrate 102 and a top surface and a side surface of the semiconductor layer 108. The conductive layer 112 is provided over the insulating layer 110 and includes a region overlapping with the semiconductor layer 108. The insulating layer 110 functions as a gate insulating layer. The conductive layer 112 functions as agate electrode. The transistor 100 is what is called atop-gate transistor, in which the gate electrode is provided over the semiconductor layer 108.

The semiconductor layer 108 contains a metal oxide exhibiting semiconductor characteristics (hereinafter, also referred to as an oxide semiconductor). The semiconductor layer 108 preferably contains at least indium and oxygen. When the semiconductor layer 108 contains an oxide of indium, the carrier mobility can be increased. For example, a transistor that can flow higher current than a transistor using amorphous silicon can be provided.

A region in the semiconductor layer 108 overlapping with the conductive layer 112 functions as a channel formation region. Furthermore, the semiconductor layer 108 preferably includes a pair of low-resistance regions 108N with the channel formation region sandwiched therebetween. Each of the low-resistance regions 108N has higher carrier concentration than the channel formation region and functions as a source region or a drain region.

The low-resistance region 108N can also be referred to as a region having lower resistance than the channel formation region, a region having a higher carrier concentration than the channel formation region, a region having a larger amount of oxygen vacancies than the channel formation region, a region having a higher hydrogen concentration than the channel formation region, a region having a higher impurity concentration than the channel formation region, or an n-type region.

As illustrated in FIG. TA, FIG. 1B, FIG. 1C, and FIG. 2, the insulating layer 118 is provided to cover a top surface of the insulating layer 110 and a top surface and a side surface of the conductive layer 112. The insulating layer 110 and the insulating layer 118 include an opening 141a and an opening 141b in regions overlapping with the low-resistance regions 108N.

The insulating layer 118 functions as a protective layer protecting the transistor 100. An inorganic material can be suitably used for the insulating layer 118. For example, oxide, nitride, or the like can be suitably used as the inorganic material. More specifically, for the insulating layer 118, one or more of silicon oxide, silicon oxynitride, silicon nitride, silicon nitride oxide, aluminum oxide, aluminum oxynitride, aluminum nitride, hafnium oxide, and hafnium aluminate can be used. Some of the materials described above may be stacked and used for the insulating layer 118.

Note that in this specification, an oxynitride refers to a material that contains more oxygen than nitrogen in its composition, and a nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

In the case where an oxynitride and a nitride oxide, which have the same elements, are described in this specification, the oxynitride includes a material that has a higher oxygen content and/or a lower nitrogen content than the nitride oxide. Similarly, the nitride oxide includes a material that has a lower oxygen content and/or a higher nitrogen content than the oxynitride. For example, in the case where silicon oxynitride and silicon nitride oxide are described, the silicon oxynitride includes a material that has a higher oxygen content and a lower nitrogen content than the silicon nitride oxide. Similarly, the silicon nitride oxide includes a material that has a lower oxygen content and a higher nitrogen content than the silicon oxynitride.

For example, the insulating layer 118 can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD: Plasma Enhanced CVD) method and a thermal CVD method. In addition, as an example of the thermal CVD method, a metal organic chemical vapor deposition (MOCVD: Metal Organic CVD) method can be given.

In particular, the insulating layer 118 is preferably formed by a PECVD method.

FIG. TA, FIG. 1B, FIG. 1C, and FIG. 2 illustrate an example in which the top surface shape of the insulating layer 110 and the top surface shape of the insulating layer 118 are substantially aligned with each other.

Note that in this specification and the like, the expression "top surface shapes are substantially aligned with each other" means that at least outlines of stacked layers partly overlap with each other. For example, the case of processing an upper layer and a lower layer with the use of the same mask pattern or mask patterns that are partly the same is included. However, in some cases, the outlines do not completely overlap with each other and the upper layer is positioned on an inner side of the lower layer or the upper layer is positioned on an outer side of the lower layer; such a case is also represented by the expression "top surface shapes are substantially aligned with each other".

The insulating layer 130 is provided to cover a top surface and a side surface of the insulating layer 118 and a side surface of the insulating layer 110. The insulating layer 130 functions as a protective layer protecting the transistor 100. The insulating layer 130 includes an opening 143a and an opening 143b. The opening 143a is positioned inside the opening 141a, and the opening 143b is positioned inside the opening 141b. Furthermore, the insulating layer 130 may include a region in contact with the top surface of the semiconductor layer 108. It can be said that the insulating layer 130 includes end portions over the semiconductor layer 108.

The transistor 100 may include a conductive layer 120a and a conductive layer 120b over the insulating layer 130. The conductive layer 120a and the conductive layer 120b function as a source electrode or a drain electrode. The conductive layer 120a and the conductive layer 120b are electrically connected to the low-resistance regions 108N through the opening 143a and the opening 143b, respectively, which are provided in the insulating layer 130. The conductive layer 120a and the conductive layer 120b each include a region in contact with the insulating layer 130. The conductive layer 120a and the conductive layer 120b each include neither a region in contact with the insulating layer 110 nor a region in contact with the insulating layer 118.

Here, the deposition of a conductive film to be the conductive layer 120a and the conductive layer 120b is described. When depositing the conductive film to be the conductive layer 120a and the conductive layer 120b over the insulating layer 130, ultraviolet light is generated in a deposition apparatus, and the ultraviolet light reaches the semiconductor layer 108, so that an oxygen vacancy $V_O$ is formed in the semiconductor layer 108 in some cases. When hydrogen exists in the semiconductor layer 108, a state in which hydrogen enters the oxygen vacancy $V_O$ (hereinafter, referred to as $V_OH$) is sometimes generated. In some cases, $V_OH$ serves as a carrier generation source that adversely affects the electrical characteristics and reliability of the transistor. In particular, oxygen vacancies $V_O$ and $V_OH$ in the channel formation region are preferably reduced as much as possible.

Note that examples of an apparatus in which ultraviolet light is generated in processing include an apparatus in which plasma is generated in a treatment chamber. Specifically, as the apparatus in which ultraviolet light is generated in processing, a dry etching apparatus, a sputtering apparatus, a plasma CVD apparatus, or the like can be given.

The insulating layer 130 preferably has a low transmittance of ultraviolet light. By covering the insulating layer 118 and the insulating layer 110 with the insulating layer 130 having a low transmittance of ultraviolet light, an increase in the amount of ultraviolet light reaching the semiconductor layer 108 can be reduced. Accordingly, the amount of oxygen vacancies $V_O$ and $V_OH$ in a channel formation region can be inhibited, whereby a transistor having favorable electrical characteristics and reliability can be obtained.

Note that in this specification and the like, ultraviolet light refers to light having one or more peaks in a wavelength range of greater than or equal to 200 nm and less than or equal to 400 nm.

The insulating layer 130 preferably contains a material having a low transmittance of ultraviolet light. For example, a material absorbing ultraviolet light can be suitably used for the insulating layer 130.

An organic material can be suitably used for the insulating layer 130. In particular, an organic material having a low transmittance of ultraviolet light is preferably used for the insulating layer 130. For the insulating layer 130, for example, one or more of a light curable resin and a thermosetting resin can be used. More specifically, for the insulating layer 130, one or more of an acrylic resin, a polyimide resin, an epoxy resin, a polyamide resin, a polyimide-amide resin, a siloxane resin, a benzocyclobutene-based resin, a phenol resin, a novolac resin, and precursors of these resins can be used. Some of the materials described above may be stacked and used for the insulating layer 130. The insulating layer 130 may have a stacked-layer structure of the organic material and the inorganic material.

Note that since the transmittance of ultraviolet light of the material used for the insulating layer 130 is preferably as low as possible, it is not necessary to set the lower limit of the transmittance. Note that in the case where the lower limit is set, the transmittance of ultraviolet light of the material used for the insulating layer 130 is preferably higher than or equal to 0.01%, for example.

The transmittance of the material used for the insulating layer 130 in the wavelength range of greater than or equal to 200 nm and less than or equal to 400 nm is preferably higher than or equal to 0.01% and lower than or equal to 80%, further preferably higher than or equal to 0.01% and lower than or equal to 75%, still further preferably higher than or equal to 0.01% and lower than or equal to 70%.

Furthermore, the transmittance of the material used for the insulating layer 130 in a wavelength range of greater than or equal to 200 nm and less than or equal to 350 nm is preferably higher than or equal to 0.01% and lower than or equal to 70%, further preferably higher than or equal to 0.01% and lower than or equal to 60%, further preferably higher than or equal to 0.01% and lower than or equal to 50%, further preferably higher than or equal to 0.01% and lower than or equal to 40%, still further preferably higher than or equal to 0.01% and lower than or equal to 30%, yet further preferably higher than or equal to 0.01% and lower than or equal to 20%, yet still further preferably higher than or equal to 0.01% and lower than or equal to 10%.

In the case where the insulating layer 130 has a stacked-layer structure, the transmittance of at least one of the layers forming the insulating layer 130 is preferably in the above range.

Since the transmittance is lower as the thickness of the material is larger, the transmittance at the time when the thickness of the material is 2 μm is used as the transmittance of the material in this specification and the like. Note that the transmittance at the time when the thickness of the material is less than 2 μm is a certain value, it can be said that the transmittance at the time when the thickness of the material is 2 μm is lower than or equal to the certain value.

Figure 3A:
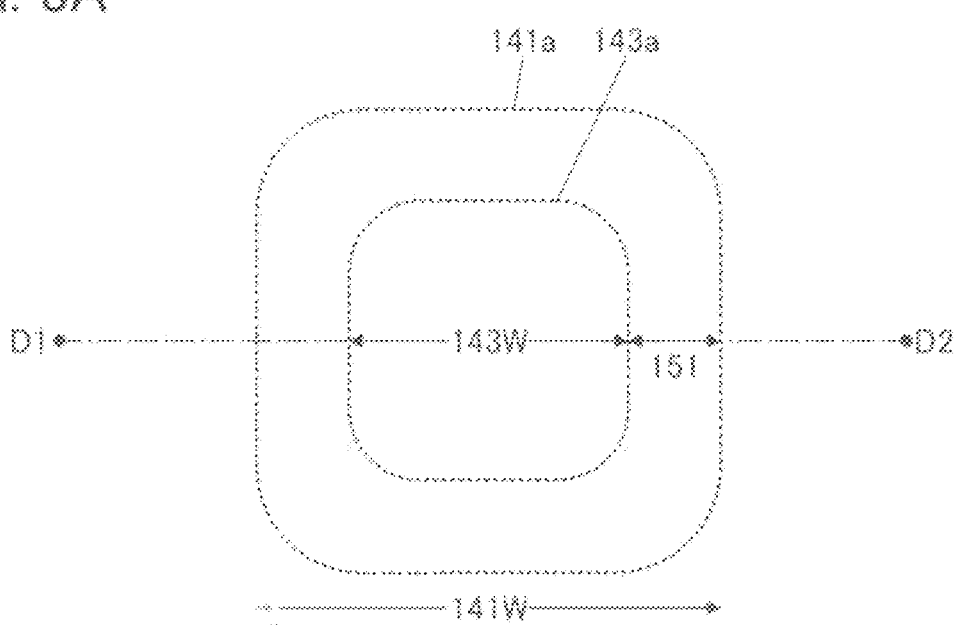
FIG. 3A and FIG. 3B are diagrams illustrating a structure example of a transistor.
Figure 3B:
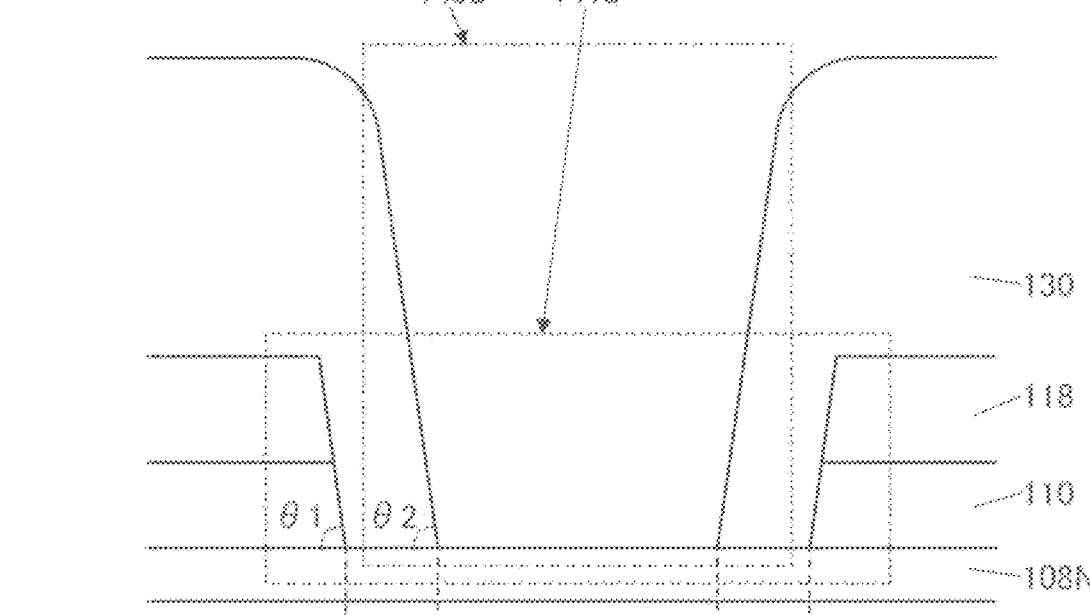

FIG. 3A and FIG. 3B are enlarged views of the opening 141*a*, the opening 143*a*, and the vicinity thereof. FIG. 3A is a top view, and FIG. 3B corresponds to a cross-sectional view of a cut plane along the dashed-dotted line D1-D2 in FIG. 3A. Note that hatching is omitted in FIG. 3B to avoid complexity of the drawing. The description of the opening 141*a* and the opening 143*a* can be referred to for the opening 141*b* and the opening 143*b*; thus, the detailed description thereof is omitted.

On a given straight line crossing the opening 141*a* and the opening 143*a*, the value of a width 143W of a bottom portion of the opening 143*a* is preferably smaller than the value of a width 141W of a bottom portion of the opening 141*a*. Furthermore, in the low-resistance region 108N, a width 151 of a region in contact with the insulating layer 130 is preferably larger than or equal to 50 nm and smaller than or equal to 3000 nm, further preferably larger than or equal to 100 nm and smaller than or equal to 2500 nm, further preferably larger than or equal to 200 nm and smaller than or equal to 2000 nm, further preferably larger than or equal to 300 nm and smaller than or equal to 1500 nm, further preferably larger than or equal to 300 nm and smaller than or equal to 1200 nm, further preferably larger than or equal to 300 nm and smaller than or equal to 1000 nm, still further preferably larger than or equal to 400 nm and smaller than or equal to 1000 nm, yet further preferably larger than or equal to 400 nm and smaller than or equal to 800 nm, yet still further preferably larger than or equal to 450 nm and smaller than or equal to 800 nm.

When the value of the width 151 is small, an effect of reducing ultraviolet light is not sufficient, and the electrical characteristics and the reliability of the transistor 100 might be degraded. Meanwhile, when the value of the width 151 is large, the size of the transistor 100 might be increased. When the value of the width 151 is in the above range, a miniaturized transistor having favorable electrical characteristics and reliability can be obtained. The value of the width 151 is determined in consideration of alignment accuracy of a device used for forming the insulating layer 130.

Note that using a material having a low transmittance of ultraviolet light for the insulating layer 130 can reduce the amount of ultraviolet light reaching the semiconductor layer 108 even when the value of the width 151 is small. When the value of the width 151 can be large, a material having a high transmittance of ultraviolet light may be used for the insulating layer 130. The value of the width 151 may be determined in accordance with the transmittance of the material used for the insulating layer 130. The material used for the insulating layer 130 may be determined in accordance with the value of the width 151.

The transmittance of the insulating layer 130 in the wavelength range of greater than or equal to 200 nm and less than or equal to 400 nm is preferably higher than or equal to 0.01% and lower than or equal to 80%, further preferably higher than or equal to 0.01% and lower than or equal to 75%, still further preferably higher than or equal to 0.01% and lower than or equal to 70%.

Furthermore, the transmittance of the insulating layer 130 in the wavelength range of greater than or equal to 200 nm and less than or equal to 350 nm is preferably higher than or equal to 0.01% and lower than or equal to 70%, further preferably higher than or equal to 0.01% and lower than or equal to 60%, further preferably higher than or equal to 0.01% and lower than or equal to 50%, further preferably higher than or equal to 0.01% and lower than or equal to 40%, still further preferably higher than or equal to 0.01% and lower than or equal to 30%, yet further preferably higher than or equal to 0.01% and lower than or equal to 20%, yet still further preferably higher than or equal to 0.01% and lower than or equal to 10%.

Since the amount of ultraviolet light passing through the insulating layer 130 is preferably as small as possible, the transmittance of a region where the thickness of the insulating layer 130 is minimum in the opening 141*a* is preferably in the above range. At the same time, the transmittance of a region where the thickness of the insulating layer 130 is minimum in the opening 141*b* is preferably in the above range.

End portions of the insulating layer 110 are preferably tapered. Specifically, an angle θ1 of the end portion of the insulating layer 110 is preferably less than 90°. The angle θ1 is preferably greater than or equal to 45° and less than 90°, further preferably greater than or equal to 50° and less than or equal to 85°, further preferably greater than or equal to 55° and less than or equal to 85°, further preferably greater than or equal to 60° and less than or equal to 85°, still further preferably greater than or equal to 60° and less than or equal to 80°, yet further preferably greater than or equal to 65° and less than or equal to 80°, yet still further preferably greater than or equal to 70° and less than or equal to 80°. When the angle θ1 of the end portion of the insulating layer 110 is in the above range, the step coverage with the layer formed over the insulating layer 110 (e.g., the insulating layer 130) can be improved and a defect such as step disconnection or a void can be inhibited from occurring in the layer.

Similarly, end portions of the insulating layer 130 are preferably tapered. Specifically, an angle 62 of the end portion of the insulating layer 130 is preferably less than 90°. The angle 62 is preferably greater than or equal to 45° and less than 90°, further preferably greater than or equal to 50° and less than or equal to 85°, further preferably greater than or equal to 55° and less than or equal to 85°, further preferably greater than or equal to 60° and less than or equal to 85°, still further preferably greater than or equal to 60° and less than or equal to 80°, yet further preferably greater than or equal to 65° and less than or equal to 80°, yet still further preferably greater than or equal to 70° and less than or equal to 80°. When the angle 62 of the end portion of the insulating layer 130 is in the above range, the step coverage with the layers formed over the insulating layer 130 (e.g., the conductive layer 120*a* and the conductive layer 120*b*) can be improved and a defect such as step disconnection or a void can be inhibited from occurring in the layer.

Note that in this specification and the like, the angle of an end portion of a layer refers to the angle formed by a side surface of the layer and a formation surface of the layer.

Here, an influence of ultraviolet light on the semiconductor layer 108 is described.

Figure 4A:
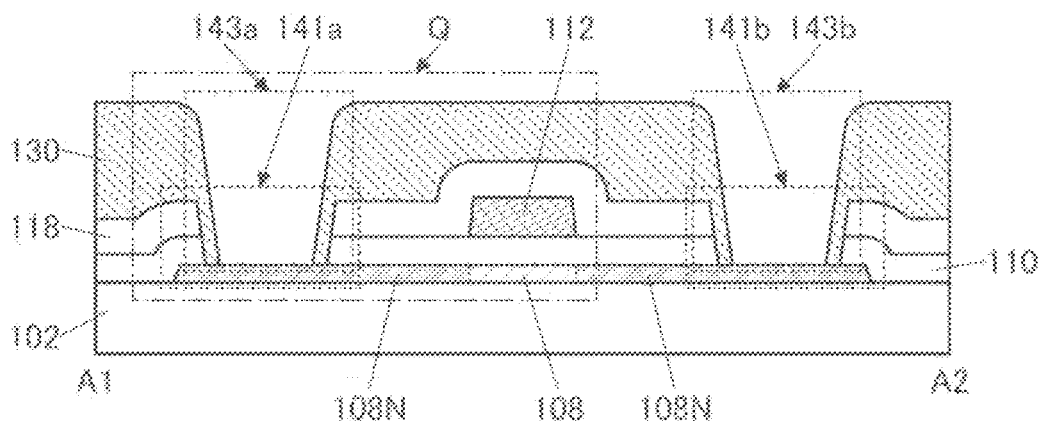
FIG. 4A and FIG. 4B are diagrams illustrating a structure example of a transistor.
Figure 4B:
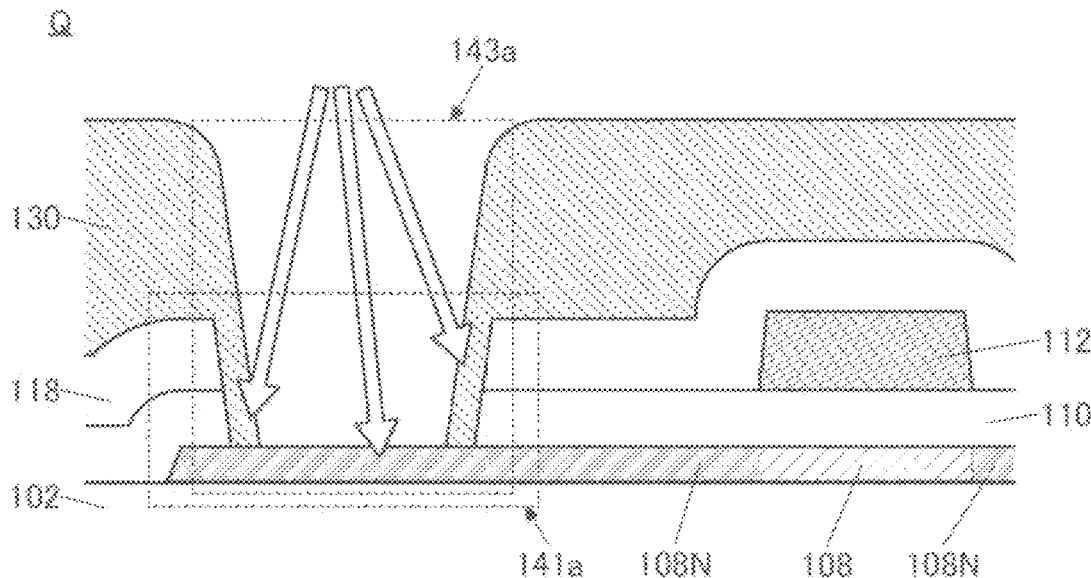

FIG. 4A is a cross-sectional view of the transistor 100 before the formation of the conductive layer 120a and the conductive layer 120b. FIG. 4B is an enlarged view of a region Q surrounded by a dashed-dotted line in FIG. 4A. In FIG. 4B, ultraviolet light generated inside the deposition apparatus when depositing the conductive film to be the conductive layer 120a and the conductive layer 120b is represented by solid white arrows, and a state where the ultraviolet light enters the opening 141a and the opening 143a is schematically illustrated.

As illustrated in FIG. 4B, in the case where the ultraviolet light enters the opening 143a, the ultraviolet light reaches the insulating layer 130 to be absorbed by the insulating layer 130, and is inhibited from reaching the semiconductor layer 108. Thus, only ultraviolet light directly entering a region where the semiconductor layer 108 is exposed in the opening 143a reaches the semiconductor layer 108, so that the amount of ultraviolet light reaching the semiconductor layer 108 can be reduced.

Figure 5A:
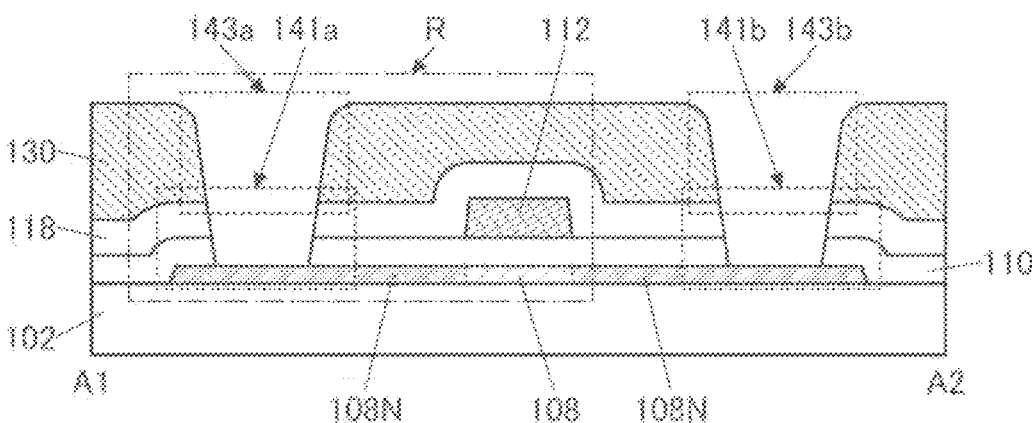
FIG. 5A and FIG. 5B are diagrams illustrating a comparative example.
Figure 5B:
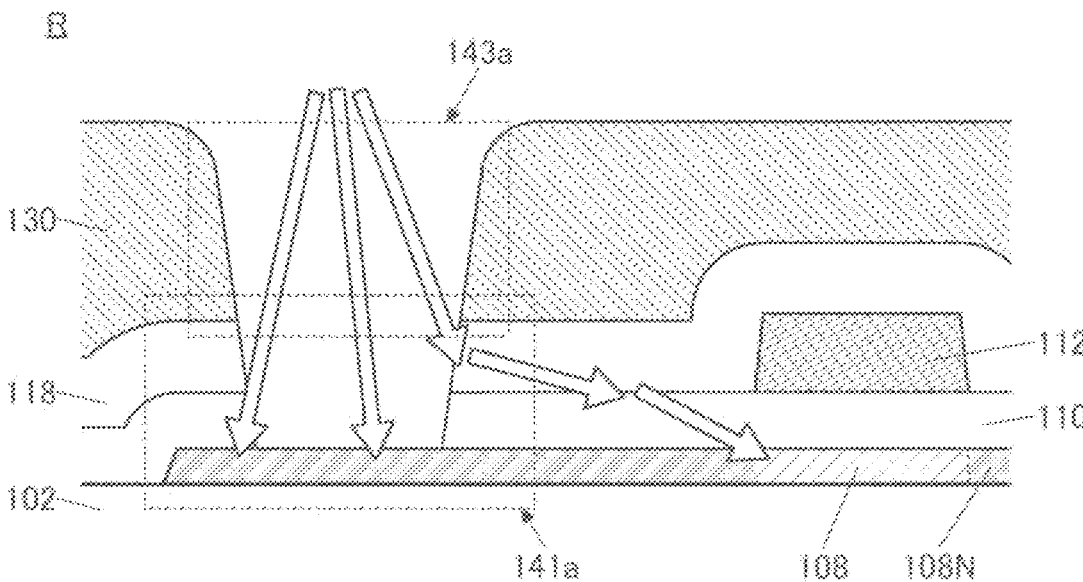

FIG. 5A and FIG. 5B illustrate a comparative transistor. FIG. 5A is a cross-sectional view of the comparative transistor. FIG. 5B is an enlarged view of a region R surrounded by a dashed-dotted line in FIG. 5A.

In the comparative transistor illustrated in FIG. 5A and FIG. 5B, the opening 143a and the opening 143b included in the insulating layer 130 are provided over the insulating layer 118. The comparative transistor is different from the transistor of one embodiment of the present invention in that the insulating layer 130 does not cover the side surface of the insulating layer 110 and the side surface of the insulating layer 118, and the side surface of the insulating layer 110 and the side surface of the insulating layer 118 are exposed in the opening 143a and the opening 143b.

As illustrated in FIG. 5B, ultraviolet light entering the opening 141a passes through the insulating layer 110 or the insulating layer 118. Furthermore, the ultraviolet light sometimes reaches the semiconductor layer 108 by refraction at the interface between the insulating layer 110 and the insulating layer 118 or the semiconductor layer 108. Accordingly, the amount of ultraviolet light reaching the semiconductor layer 108 in the comparative transistor is larger than that in the transistor of one embodiment of the present invention.

In the transistor 100 of one embodiment of the present invention, the insulating layer 130 covers the side surface of the insulating layer 110 and the side surface of the insulating layer 118; thus, the amount of ultraviolet light reaching the semiconductor layer 108 can be reduced, so that the transistor can have favorable electrical characteristics and reliability.

Although FIG. TA and the like illustrate an example in which the width 151 has substantially the same value in each of the opening 143a and the opening 143b, one embodiment of the present invention is not limited thereto. In the opening 143a, the width 151 may have different values. Similarly, in the opening 143b, the width 151 may have different values.

Figure 6A:
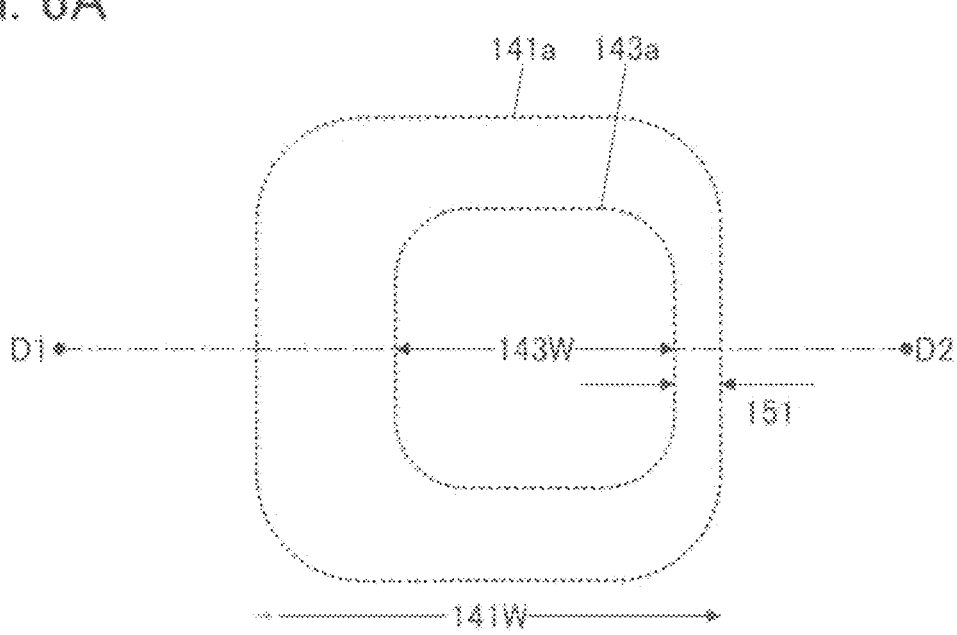
FIG. 6A and FIG. 6B are diagrams illustrating a structure example of a transistor.
Figure 6B:
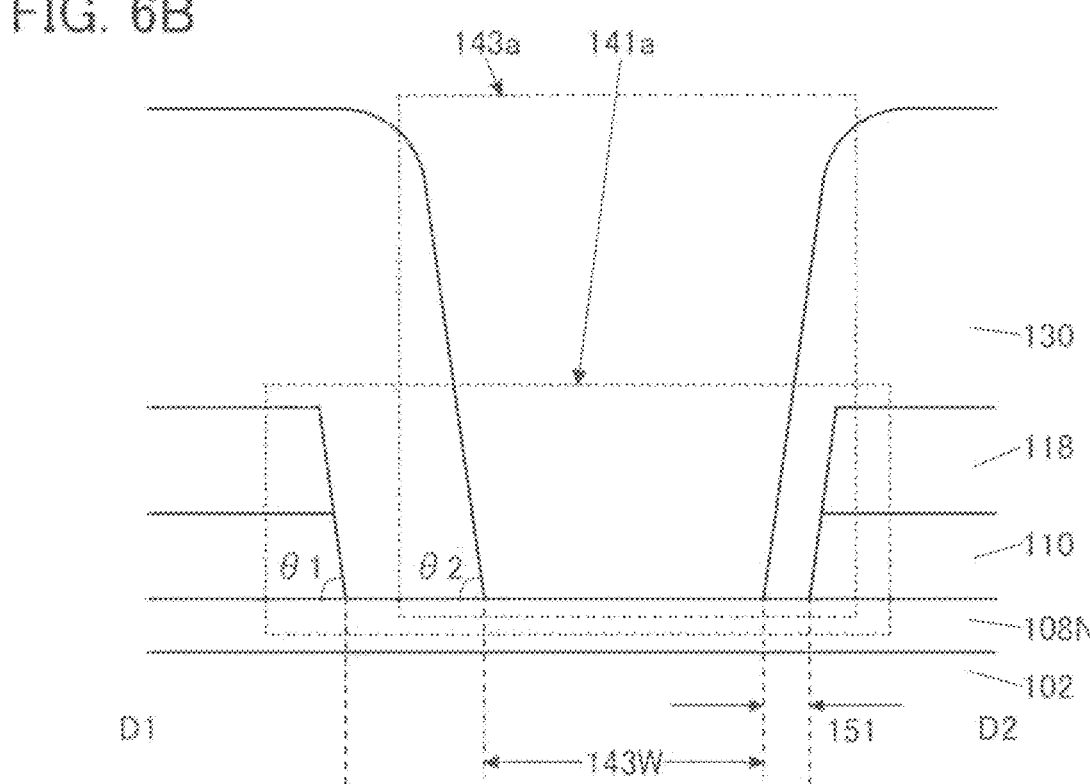

FIG. 6A and FIG. 6B are enlarged views of the opening 141a, the opening 143a, and the vicinity thereof. FIG. 6A is a top view, and FIG. 6B corresponds to a cross-sectional view of a cut plane along the dashed-dotted line D1-D2 in FIG. 6A. Note that hatching is omitted in FIG. 6B to avoid complexity of the drawing.

As illustrated in FIG. 6A and FIG. 6B, the width 151 may have different values in the opening 143a. Note that in each of the opening 143a and the opening 143b, the minimum value of the width 151 is preferably in the above range. The value of the width 151 in the opening 143a may be different from that in the opening 143b.

Although FIG. 3B illustrates an example in which the angle $\theta1$ of the end portion of the insulating layer 110 and the angle $\theta2$ of the end portion of the insulating layer 130 have substantially the same values, one embodiment of the present invention is not limited thereto. The angle $\theta1$ and the angle 62 may have different values.

Figure 7:
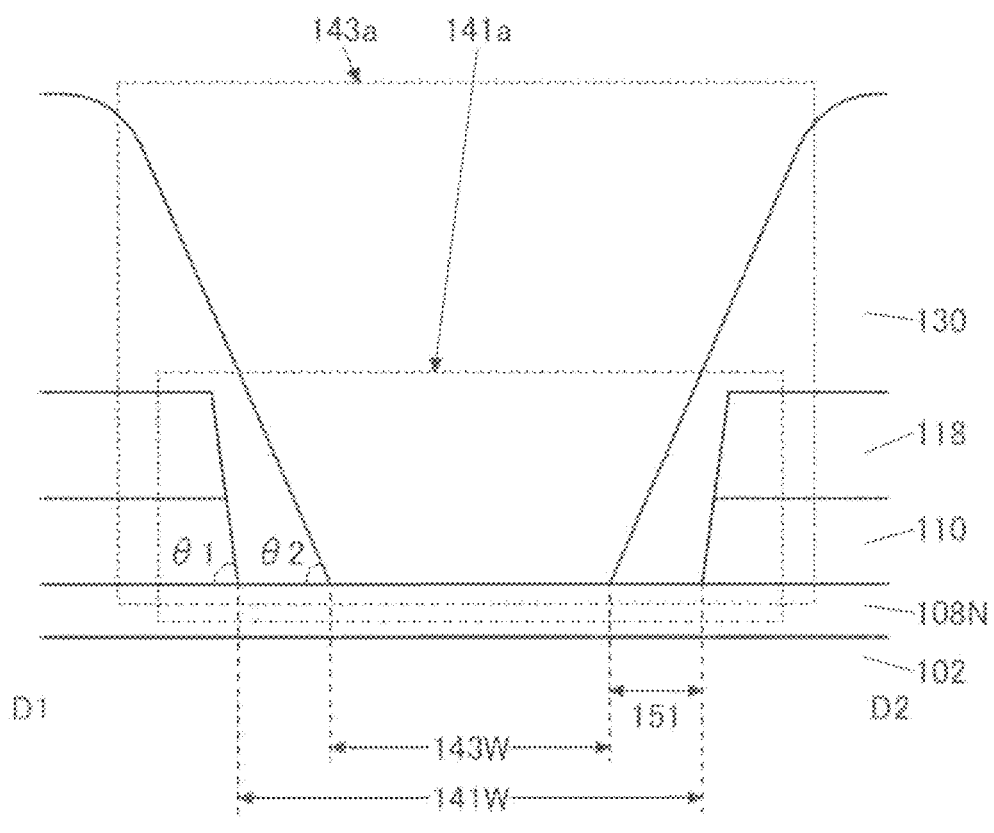
FIG. 7 is a diagram illustrating a structure example of a transistor.

FIG. 7 is an enlarged view of the opening 141a, the opening 143a, and the vicinity thereof. FIG. 3A can be referred to for a top view. FIG. 7 corresponds to the cross-sectional view of the cut plane along the dashed-dotted line D1-D2 in FIG. 3A. Note that hatching is omitted in FIG. 7 to avoid complexity of the drawing.

As illustrated in FIG. 7, the angle $\theta1$ of the end portion of the insulating layer 110 and the angle $\theta2$ of the end portion of the insulating layer 130 may have different values. For example, the angle $\theta2$ can have a larger value than the angle $\theta1$. When the angle 62 has a larger value than the angle $\theta1$, the step coverage with the layer formed over the insulating layer 130 (e.g., the conductive layer 120a) can be improved and a defect such as step disconnection or a void can be inhibited from occurring in the layer.

Note that although FIG. TA and the like illustrate an example in which the shape of each of the opening 141a, the opening 141b, the opening 143a, and the opening 143b in a plan view is a rectangular shape with rounded corners, one embodiment of the present invention is not limited thereto. The shape of each of the opening 141a, the opening 141b, the opening 143a, and the opening 143b may be a rectangular shape, a polygonal shape, a circular shape, or an elliptical shape. In addition, the shape of each the opening 141a, the opening 141b, the opening 143a, and the opening 143b may be a shape in which a curve line and a straight line are combined.

There is no particular limitation on the crystallinity of a semiconductor material used for the semiconductor layer 108, and any of an amorphous semiconductor, a single crystal semiconductor, and a semiconductor having crystallinity other than single crystal (a microcrystalline semiconductor, a polycrystalline semiconductor, or a semiconductor partly including crystal regions) may be used. A single crystal semiconductor or a semiconductor having crystallinity is preferably used because degradation of the transistor characteristics can be inhibited.

The semiconductor layer 108 preferably contains a metal oxide (also referred to as an oxide semiconductor). Alternatively, the semiconductor layer 108 may contain silicon. Examples of silicon include amorphous silicon and crystalline silicon (e.g., low-temperature polysilicon and single crystal silicon).

In the case of using a metal oxide, the semiconductor layer 108 preferably contains indium, an element M (the element M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, the element M is preferably one or more kinds selected from aluminum, gallium, yttrium, and tin.

It is particularly preferable to use an oxide containing indium (In), gallium (Ga), and zinc (Zn) (hereinafter also referred to as IGZO) for the semiconductor layer 108.

As the semiconductor layer 108, an oxide containing, in addition to indium, gallium, and zinc, one or more of aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium can also be used. In particular, an oxide containing one or more of tin, aluminum, and silicon in addition to indium, gallium, and zinc is preferably used as the semiconductor layer, in which case a transistor with high field-effect mobility can be obtained.

In the case where the semiconductor layer 108 is an In-M-Zn oxide, the atomic ratio of In to the element M is preferably higher than or equal to 1. Specifically, In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=6:1:6, In:M:Zn=5:2:5, In:M:Zn=10:1:3, In:M:Zn=10:1:6, In:M:Zn=10:1:8, and the like can be given. In the case where two or more kinds of elements are contained as the element M, the proportion of M in the atomic ratio corresponds to the sum of the number of atoms of the two or more metal elements.

Note that when the atomic ratio is described as In:M:Zn=4:2:3 or in the neighborhood thereof, the case is included where M is greater than or equal to 1 and less than or equal to 3 and Zn is greater than or equal to 2 and less than or equal to 4 with In being 4. When the atomic ratio is described as In:M:Zn=5:1:6 or in the neighborhood thereof, the case is included where M is greater than 0.1 and less than or equal to 2 and Zn is greater than or equal to 5 and less than or equal to 7 with In being 5. When the atomic ratio is described as In:M:Zn=1:1:1 or in the neighborhood thereof, the case is included where M is greater than 0.1 and less than or equal to 2 and Zn is greater than 0.1 and less than or equal to 2 with In being 1.

Here, the composition of the semiconductor layer 108 is described. The semiconductor layer 108 preferably contains a metal oxide containing at least indium and oxygen. Moreover, the semiconductor layer 108 may contain zinc additionally. The semiconductor layer 108 may contain gallium.

Here, the composition of the semiconductor layer 108 greatly affects the electrical characteristics and reliability of the transistor 100. For example, an increase in the indium content in the semiconductor layer 108 can increase the carrier mobility and achieve a transistor with high field-effect mobility.

Here, one of indexes for evaluating the reliability of a transistor is a gate bias stress test (GBT) in which a state of applying an electric field to a gate is maintained. Among GBTs, a test in which a state where a positive potential relative to a source potential and a drain potential is supplied to a gate is maintained at high temperatures is referred to as a PBTS (Positive Bias Temperature Stress) test, and a test in which a state where a negative potential is supplied to a gate is maintained at high temperatures is referred to as an NBTS (Negative Bias Temperature Stress) test. The PBTS test and the NBTS test conducted in a state where irradiation with light such as white LED light is performed are respectively referred to as a PBTIS (Positive Bias Temperature Illumination Stress) test and an NBTIS (Negative Bias Temperature Illumination Stress) test.

In particular, in an n-channel transistor using an oxide semiconductor, a positive potential is applied to a gate in putting the transistor in an on state (a state where current flows); thus, the amount of change in threshold voltage in the PBTS test is one important item to be focused on as an indicator of the reliability of the transistor.

Here, the use of a metal oxide film not containing gallium or having a low gallium content in the composition of the semiconductor layer 108 can reduce the amount of change in the threshold voltage in the PBTS test. In the case where gallium is contained, the gallium content is preferably lower than the indium content in the composition of the semiconductor layer 108. Thus, a highly reliable transistor can be achieved.

One of the factors in change in the threshold voltage in the PBTS test is a defect state at the interface between a semiconductor layer and a gate insulating layer or in the vicinity of the interface. As the density of defect states increases, degradation in the PBTS test becomes significant. Generation of the defect states can be inhibited by reducing the gallium content in a portion of the semiconductor layer that is in contact with the gate insulating layer.

The following can be given, for example, as the reason why degradation in the PBTS test can be inhibited when gallium is not contained or the gallium content is made low. Gallium contained in the semiconductor layer 108 has a property of attracting oxygen more easily than another metal element (e.g., indium or zinc) does. Thus, when, at the interface between a metal oxide film containing a large amount of gallium and the insulating layer 110 containing an oxide, gallium is bonded to excess oxygen in the insulating layer 110, trap sites of carriers (here, electrons) are probably generated easily. This might cause the change in the threshold voltage when a positive potential is applied to a gate and carriers are trapped at the interface between the semiconductor layer and the gate insulating layer.

Specifically, in the case where an In—Ga—Zn oxide is used for the semiconductor layer 108, a metal oxide film whose atomic proportion of In is higher than the atomic proportion of Ga can be used as the semiconductor layer 108. It is further preferable to use a metal oxide film whose atomic proportion of Zn is higher than the atomic proportion of Ga. In other words, a metal oxide film in which the atomic proportions of metal elements satisfy In>Ga and Zn>Ga is preferably used as the semiconductor layer 108.

For example, a metal oxide film having any of the following atomic ratios of metal elements can be used as the semiconductor layer 108: In:Ga:Zn=2:1:3, In:Ga:Zn=3:1:2, In:Ga:Zn=4:2:3, In:Ga:Zn=4:2:4.1, In:Ga:Zn=5:1:3, In:Ga:Zn=5:1:6, In:Ga:Zn=5:1:7, In:Ga:Zn=5:1:8, In:Ga:Zn=6:1:6, In:Ga:Zn=10:1:3, In:Ga:Zn=10:1:6, In:Ga:Zn=10:1:8, In:Ga:Zn=5:2:5, and a neighborhood thereof.

In the case where a metal oxide film containing indium and gallium is used as the semiconductor layer 108, the atomic proportion (atomic ratio) of gallium to metal elements contained in the metal oxide can be higher than 0 and lower than 50%, preferably higher than or equal to 0.05% and lower than or equal to 30%, further preferably higher than or equal to 0.1% and lower than or equal to 15%, still further preferably higher than or equal to 0.1% and lower than or equal to 5%. Note that oxygen vacancies are less likely to be generated when the semiconductor layer 108 contains gallium.

A metal oxide film not containing gallium may be used as the semiconductor layer 108. For example, an In—Zn oxide can be used for the semiconductor layer 108. In this case, when the atomic proportion of In to metal elements contained in the metal oxide film is increased, the field-effect mobility of the transistor can be increased. By contrast, when the atomic proportion of Zn to metal elements contained in the metal oxide is increased, the metal oxide film has high crystallinity; thus, a change in the electrical characteristics of the transistor can be inhibited and the reliability can be increased. Alternatively, a metal oxide film that contains neither gallium nor zinc, such as indium oxide, can be used as the semiconductor layer 108. The use of a metal oxide film not containing gallium at all can make a change in the threshold voltage particularly in the PBTS test extremely small.

For example, an oxide containing indium and zinc can be used for the semiconductor layer 108. In that case, for example, a metal oxide film with an atomic ratio of metal elements of In:Zn=2:3, In:Zn=4:1, or a neighborhood thereof can be used.

In the transistor 100 of one embodiment of the present invention, a metal oxide film that has a low gallium content or does not contain gallium is used as the semiconductor layer 108, and a film formed by a deposition method in which damage to the semiconductor layer 108 is reduced is used as the insulating layer 110 in contact with the top surface of the semiconductor layer 108. Therefore, the density of defect states at the interface between the semiconductor layer 108 and the insulating layer 110 is reduced and the transistor 100 can thus have high reliability.

Although the case of using gallium is described here as an example, the same applies in the case where the element M (M is one or more kinds selected from aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium) is used instead of gallium. Specifically, M is preferably one or more kinds selected from gallium, aluminum, yttrium, and tin.

In particular, a metal oxide film whose atomic proportion of In is higher than the atomic proportion of the element M is preferably used as the semiconductor layer 108. Furthermore, a metal oxide film whose atomic proportion of Zn is higher than the atomic proportion of the element M is preferably used.

It is preferable to use a metal oxide film having crystallinity as the semiconductor layer 108. For example, a metal oxide film having a CAAC (c-axis aligned crystal) structure, which is described later, an nc (nano crystal) structure, a polycrystalline structure, a microcrystalline structure, or the like can be used. With the use of a metal oxide film having crystallinity as the semiconductor layer 108, the density of defect states in the semiconductor layer 108 can be reduced, which enables the semiconductor device to have high reliability.

As the semiconductor layer 108 has higher crystallinity, the density of defect states in the film can be lower. By contrast, the use of a metal oxide film with low crystallinity enables a transistor to flow a large amount of current.

In the case where the metal oxide film is deposited by a sputtering method, the crystallinity of the deposited metal oxide film can be increased as the substrate temperature (stage temperature) at the time of deposition is higher. The crystallinity of the deposited metal oxide film can be increased as the proportion of a flow rate of an oxygen gas to the whole deposition gas (also referred to as oxygen flow rate ratio) used at the time of deposition is higher. In this manner, the crystallinity of the metal oxide film to be deposited can be controlled by the substrate temperature and the oxygen flow rate ratio of the deposition gas.

The low-resistance region 108N of the semiconductor layer 108 may be a region containing an impurity element. Examples of the impurity element include hydrogen, boron, carbon, nitrogen, fluorine, phosphorus, sulfur, arsenic, aluminum, a rare gas, and the like. Note that typical examples of a rare gas include helium, neon, argon, krypton, and xenon. In particular, the low-resistance region 108N preferably contains boron or phosphorus. Alternatively, two or more of these elements may be contained.

Treatment for adding the impurity to the low-resistance region 108N can be performed through the insulating layer 110 using the conductive layer 112 as a mask.

The low-resistance region 108N preferably includes a region where the impurity concentration is higher than or equal to $1\times10^{19}$ atoms/cm$^3$ and lower than or equal to $1\times10^{23}$ atoms/cm$^{-3}$, preferably higher than or equal to $5\times10^{19}$ atoms/cm$^3$ and lower than or equal to $5\times10^{22}$ atoms/cm$^{-3}$, further preferably higher than or equal to $1\times10^{20}$ atoms/cm$^3$ and lower than or equal to $1\times10^{22}$ atoms/cm$^{-3}$.

The concentrations of the impurities included in the low-resistance region 108N can be analyzed by an analysis method such as secondary ion mass spectrometry (SIMS) or X-ray photoelectron spectroscopy (XPS), for example. In the case of using XPS analysis, it is possible to analyze concentration distribution in the depth direction by combination of XPS analysis and ion sputtering from a front surface side or a rear surface side.

In addition, the impurity element preferably exists in an oxidized state in the low-resistance region 108N. For example, it is preferable to use an element that is easily oxidized, such as boron, phosphorus, magnesium, aluminum, or silicon, as the impurity element. Since such an element that is easily oxidized can exist stably in an oxidized state by being bonded to oxygen in the semiconductor layer 108, the element can be inhibited from being released even when a high temperature (e.g., higher than or equal to 400° C., higher than or equal to 600° C., or higher than or equal to 800° C.) is applied in a later step. Furthermore, the impurity element takes oxygen in the semiconductor layer 108 away, and many oxygen vacancies are generated in the low-resistance region 108N. The oxygen vacancies are bonded to hydrogen in a film to serve as carrier supply sources; thus, the low-resistance region 108N is in an extremely low-resistance state.

For example, in the case where boron is used as the impurity element, boron contained in the low-resistance region 108N can exist in a state of being bonded to oxygen. This can be confirmed when a spectrum peak attributed to a $B_2O_3$ bond is observed in XPS analysis. Furthermore, in XPS analysis, the intensity of a spectrum peak attributed to a state where a boron element exists alone is so low that the spectrum peak is not observed or is buried in background noise detected around the lower measurement limit.

The insulating layer 110 functioning as a gate insulating layer includes a region in contact with the channel formation region of the semiconductor layer 108, i.e., a region overlapping with the conductive layer 112. The insulating layer 110 further includes a region that is in contact with the low-resistance region 108N of the semiconductor layer 108 and does not overlap with the conductive layer 112.

The insulating layer 110 in contact with the semiconductor layer 108 preferably includes an oxide insulating film. The insulating layer 110 further preferably includes a region containing oxygen in excess of that in the stoichiometric composition. In other words, the insulating layer 110 preferably includes an insulating film capable of releasing oxygen. It is also possible to supply oxygen into the insulating layer 110 by forming the insulating layer 110 in an oxygen-containing atmosphere, performing heat treatment, plasma treatment, or the like on the deposited insulating layer 110 in an oxygen-containing atmosphere, or depositing an oxide film over the insulating layer 110 in an oxygen-containing atmosphere, for example.

The insulating layer 110 can be formed using a method that can be used to form the insulating layer 118. In particular, the insulating layer 110 is preferably formed by a PECVD method.

In some cases, the above impurity element is contained in a region of the insulating layer 110 that overlaps with the low-resistance region 108N. In this case, as in the low-resistance region 108N, the impurity element in the insulating layer 110 also preferably exists in a state of being bonded to oxygen. Since such an element that is easily oxidized can exist stably in an oxidized state by being bonded to oxygen in the insulating layer 110, the element can be inhibited from being released even when a high temperature is applied in a later step. Furthermore, particularly in the case where oxygen (also referred to as excess oxygen) that might be released by heating is included in the insulating layer 110, excess oxygen and the impurity element are bonded to each other and stabilized, so that oxygen can be inhibited from being supplied from the insulating layer 110 to the low-resistance region 108N. Furthermore, since oxygen is less likely to be diffused into part of the insulating layer 110 containing the oxidized impurity element, supply of oxygen to the low-resistance region 108N from above the insulating layer 110 therethrough is inhibited and an increase in the resistance of the low-resistance region 108N can also be prevented.

The conductive layer 112 is preferably formed using a conductive film containing a metal or an alloy, in which case electric resistance can be reduced. Note that a conductive film containing an oxide may be used as the conductive layer 112.

As in the deposition of the conductive film to be the conductive layer 120a and the conductive layer 120b, ultraviolet light is sometimes generated inside a deposition apparatus in the deposition of a conductive film to be the conductive layer 112. When the ultraviolet light passes through the insulating layer 110 and reaches the semiconductor layer 108, oxygen vacancies $V_O$ and $V_OH$ in the semiconductor layer 108 are increased in some cases. In particular, the oxygen vacancies $V_O$ and $V_OH$ in the channel formation region adversely affect the electrical characteristics and the reliability of the transistor in some cases. Thus, the amount of ultraviolet light reaching the semiconductor layer 108 is preferably small also in the deposition of the conductive film to be the conductive layer 112.

Figure 8A:
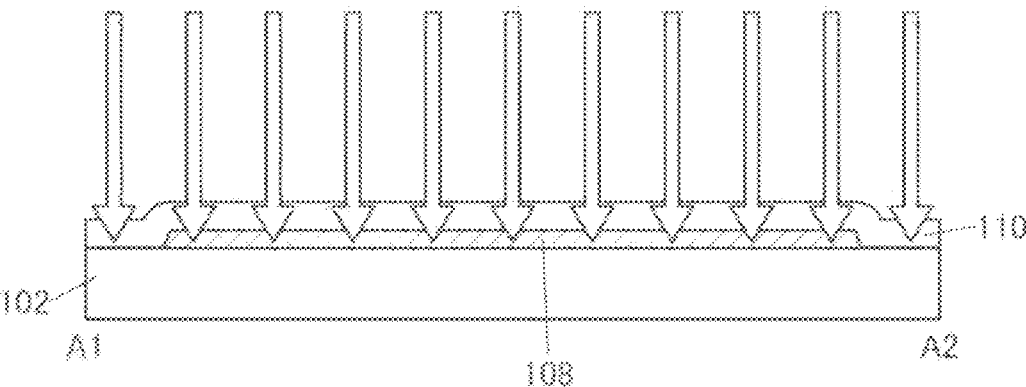
FIG. 8A to FIG. 8C are diagrams illustrating structure examples of a transistor.

FIG. 8A is a cross-sectional view of the transistor 100 before the deposition of the conductive film to be the conductive layer 112. In FIG. 8A, ultraviolet light generated inside the deposition apparatus when depositing the conductive film to be the conductive layer 112 is represented by solid white arrows, and a state where ultraviolet light passes through the insulating layer 110 and reaches the semiconductor layer 108 is schematically illustrated.

The amount of ultraviolet light reaching the semiconductor layer 108 is determined by the product of the intensity (also referred to as illuminance) of ultraviolet light and the time for which the ultraviolet light reaches the semiconductor layer 108. That is, when the intensity of ultraviolet light is high, the amount of ultraviolet light reaching the semiconductor layer 108 is increased, and when the time for which ultraviolet light reaches the semiconductor layer 108 is long, the amount of ultraviolet light is increased. In the case where ultraviolet light is generated inside the deposition apparatus for depositing the conductive film to be the conductive layer 112, a material having a low transmittance of ultraviolet light is preferably used for the conductive layer 112. When the conductive film with a certain thickness to be the conductive layer 112 is deposited over the semiconductor layer 108 by using a material having a low transmittance, ultraviolet light is blocked by the conductive film, so that the amount of ultraviolet light reaching the semiconductor layer 108 can be reduced.

Figure 8B:
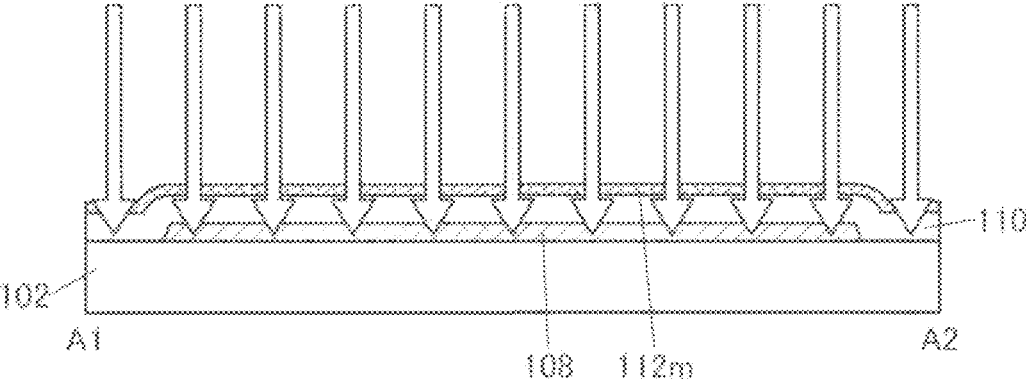
Figure 8C:
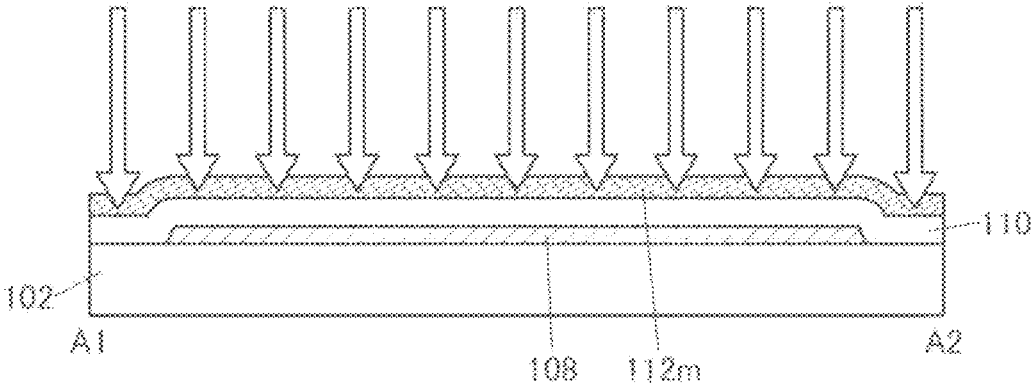

FIG. 8B is a diagram schematically illustrating an initial state of the deposition in which the thickness of a conductive film 112m to be the conductive layer 112 has not reached the thickness enough to block ultraviolet light. In the period during which the thickness of the conductive film 112m has not reached the thickness enough to block ultraviolet light, ultraviolet light passes through the conductive film 112m and reaches the semiconductor layer 108. FIG. 8C is a diagram schematically illustrating a state after the thickness of the conductive film 112m reaches the thickness enough to block ultraviolet light. After the thickness of the conductive film 112m reaches the thickness enough to block ultraviolet light, ultraviolet light is blocked by the conductive film 112m and does not reach the semiconductor layer 108.

Next, the deposition conditions of the conductive film are described. When the conductive film is deposited with high power, the intensity of ultraviolet light to be generated is increased in some cases. However, the deposition rate is increased with higher deposition power, which can shorten the time until the conductive film with the thickness enough to block ultraviolet light is formed. Thus, the time for which ultraviolet light reaches the semiconductor layer 108 is shortened, whereby the amount of ultraviolet light reaching the semiconductor layer 108 can be reduced.

Note that the deposition rate is decreased when the conductive film is deposited with low power, which sometimes increases the time until the conductive film with the thickness enough to block ultraviolet light is formed. However, the intensity of ultraviolet light to be generated is decreased when with lower deposition power, whereby the amount of ultraviolet light reaching the semiconductor layer 108 is decreased in some cases. Accordingly, the deposition power is set such that the amount of ultraviolet light reaching the semiconductor layer 108 is small in consideration of the intensity of ultraviolet light to be generated and the deposition rate. Although the deposition power is described here as an example, conditions other than power (e.g., pressure) are also preferably set in a similar manner in consideration of the intensity of ultraviolet rays to be generated and the deposition rate.

The case where the conductive layer 112 has a stacked-layer structure is described. Here, the conductive layer 112 has a stacked-layer structure of two layers, and description is made using, as an example, a structure in which the conductive film to be the conductive layer 112 has a stacked-layer structure of a first conductive film and a second conductive film over the first conductive film.

As described above, the first conductive film is preferably deposited using conditions where the amount of ultraviolet light reaching the semiconductor layer 108 is small. The first conductive film preferably employs a material and a thickness that allow blocking ultraviolet light. When the first conductive film blocks ultraviolet light at the time of depositing the second conductive film, the amount of ultraviolet light reaching the semiconductor layer 108 can be reduced. The first conductive film can be formed using one or more of a metal element selected from chromium, copper, aluminum, gold, silver, zinc, molybdenum, tantalum, titanium, tungsten, manganese, nickel, iron, and cobalt; an alloy containing any of these metal elements as its component; and an alloy containing a combination of any of these metal elements.

Since the transmittance of ultraviolet light of the first conductive film is preferably as low as possible, it is not necessary to set the lower limit of the transmittance. Note that in the case where the lower limit is set, the transmittance of ultraviolet light of the first conductive film is preferably higher than or equal to 0.01%, for example.

The transmittance of the first conductive film in the wavelength range of greater than or equal to 200 nm and less than or equal to 400 nm is preferably higher than or equal to 0.01% and lower than or equal to 80%, further preferably higher than or equal to 0.01% and lower than or equal to 75%, still further preferably higher than or equal to 0.01% and lower than or equal to 70%.

Furthermore, the transmittance of the first conductive film in the wavelength range of greater than or equal to 200 nm and less than or equal to 350 nm is preferably higher than or equal to 0.01% and lower than or equal to 70%, further preferably higher than or equal to 0.01% and lower than or equal to 60%, further preferably higher than or equal to 0.01% and lower than or equal to 50%, further preferably higher than or equal to 0.01% and lower than or equal to 40%, still further preferably higher than or equal to 0.01% and lower than or equal to 30%, yet further preferably higher than or equal to 0.01% and lower than or equal to 20%, yet still further preferably higher than or equal to 0.01% and lower than or equal to 10%.

The thickness of the first conductive film is preferably set such that the transmittance of ultraviolet light is in the above range. Furthermore, the thickness of the first conductive film is preferably set in consideration of the resistance required for the conductive layer 112 functioning as a gate electrode. Increasing the thickness of the first conductive film increases the thickness of the conductive layer 112, whereby a defect, such as step disconnection or a void, sometimes occurs in the insulating layer 118 formed over the conductive layer 112. The thickness of the first conductive film is preferably greater than or equal to 20 nm and less than or equal to 200 nm, further preferably greater than or equal to 30 nm and less than or equal to 150 nm, further preferably greater than or equal to 40 nm and less than or equal to 120 nm, still further preferably greater than or equal to 50 nm and less than or equal to 100 nm, yet still further preferably greater than or equal to 70 nm and less than or equal to 100 nm. When the thickness of the first conductive film is in the above range, the amount of ultraviolet light reaching the semiconductor layer 108 can be reduced, and the step coverage with the insulating layer 118 is improved, so that a defect such as step disconnection or a void can be inhibited from occurring in the insulating layer 118.

A structure example of a transistor, which is partly different from Structure example 1, is described. Note that description of the same portions as those in Structure example 1 is omitted below in some cases. Furthermore, in drawings that are referred to later, the same hatching pattern is applied to portions having functions similar to those in Structure example 1, and the portions are not denoted by reference numerals in some cases.

Structure Example 2

Figures 9A, 9B:
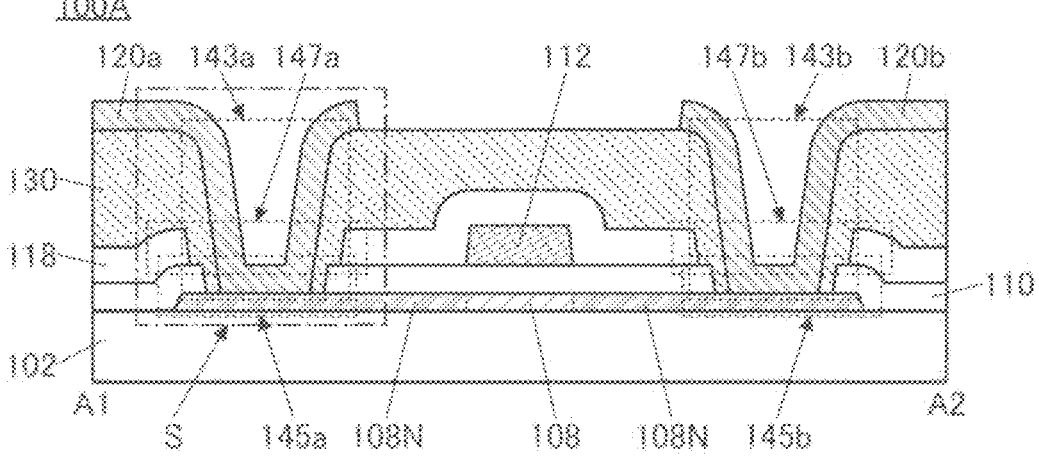
FIG. 9A and FIG. 9B are diagrams illustrating a structure example of a transistor.
Figure 10:
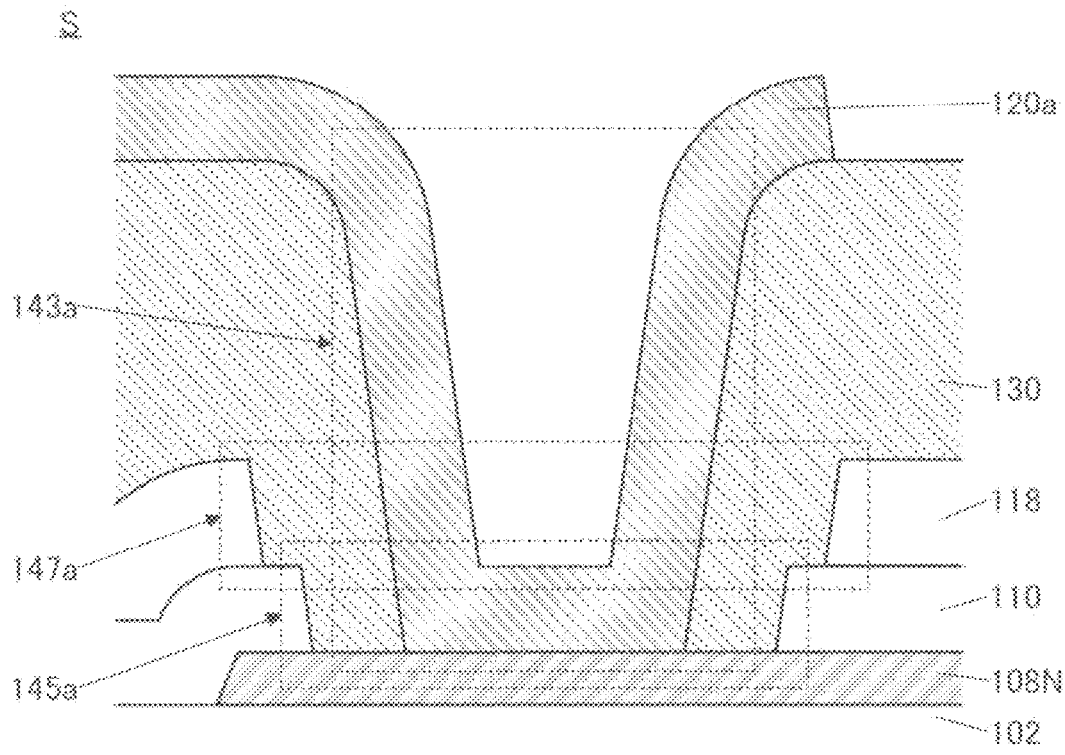
FIG. 10 is a diagram illustrating a structure example of a transistor.

FIG. 9A is a top view of a transistor 100A, and FIG. 9B is a cross-sectional view of the transistor 100A in the channel length direction. Note that FIG. 1C can be referred to for a cross-sectional view of the transistor 100A in the channel width direction. FIG. 10 is an enlarged view of a region S surrounded by a dashed-dotted line in FIG. 9B.

The transistor 100A is different from the transistor 100 illustrated in FIG. TA and the like mainly in that the top surface shape of the insulating layer 110 is not the same as the top surface shape of the insulating layer 118.

The insulating layer 110 includes an opening 145a and an opening 145b in regions overlapping with the low-resistance regions 108N. The insulating layer 118 includes an opening 147a and an opening 147b in regions overlapping with the low-resistance regions 108N. The opening 145a is positioned inside the opening 147a, and the opening 145b is positioned inside the opening 147b.

The insulating layer 130 is provided to cover the top surface and the side surface of the insulating layer 118 and the top surface and the side surface of the insulating layer 110. The insulating layer 130 includes the opening 143a and the opening 143b, and the opening 143a is positioned inside the opening 145a and the opening 143b is positioned inside the opening 145b.

Figure 11A:
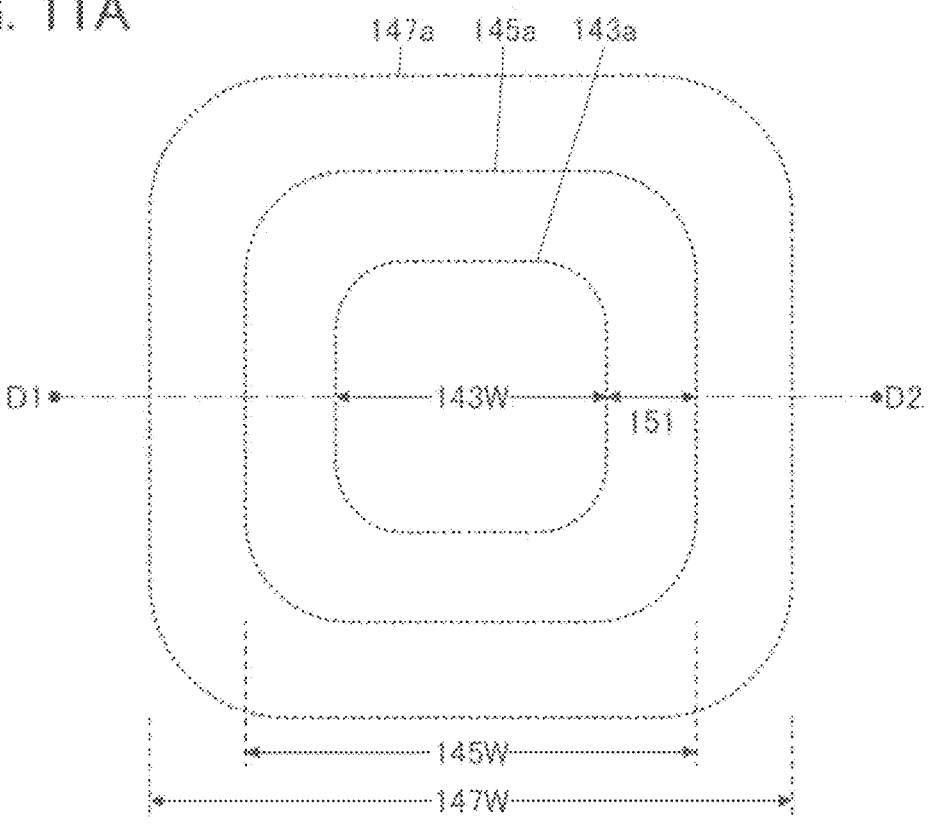
FIG. 11A and FIG. 11B are diagrams illustrating a structure example of a transistor.
Figure 11B:
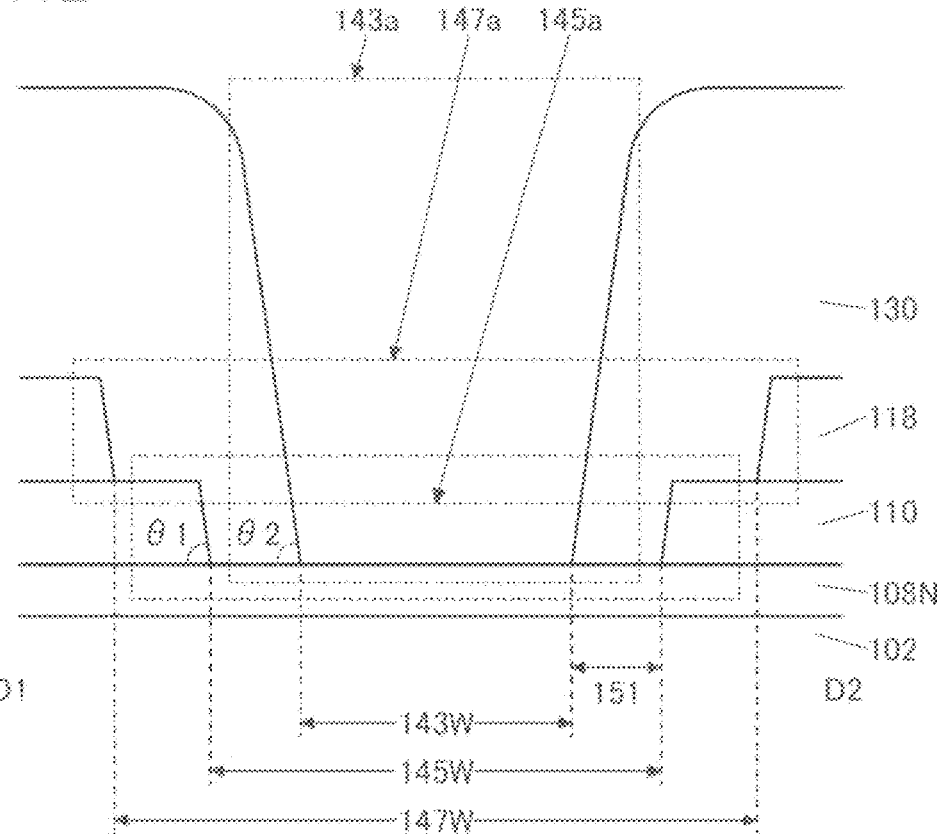

FIG. 11A and FIG. 11B are enlarged views of the opening 143a, the opening 145a, the opening 147a, and the vicinity thereof. FIG. 11A is a top view, and FIG. 11B corresponds to a cross-sectional view of a cut plane along the dashed-dotted line D1-D2 in FIG. 11A. Note that hatching is omitted in FIG. 11B to avoid complexity of the drawing.

On a given straight line crossing the opening 143a, the opening 145a, and the opening 147a, the value of a width 145W of a bottom portion of the opening 145a is preferably smaller than the value of a width 147W of a bottom portion of the opening 147a. With such a structure, the step coverage with the layer formed over the insulating layer 118 and the insulating layer 110 (e.g., the insulating layer 130) can be improved and a defect such as step disconnection or a void can be inhibited from occurring in the layer. The value of the width 143W of the bottom portion of the opening 143a is preferably smaller than the value of the width 145W of the bottom portion of the opening 145a.

The above description can be referred to for the angle θ1, the angle θ2, and the width 151; therefore, the detailed description thereof is omitted.

Structure Example 3

Figure 12A:
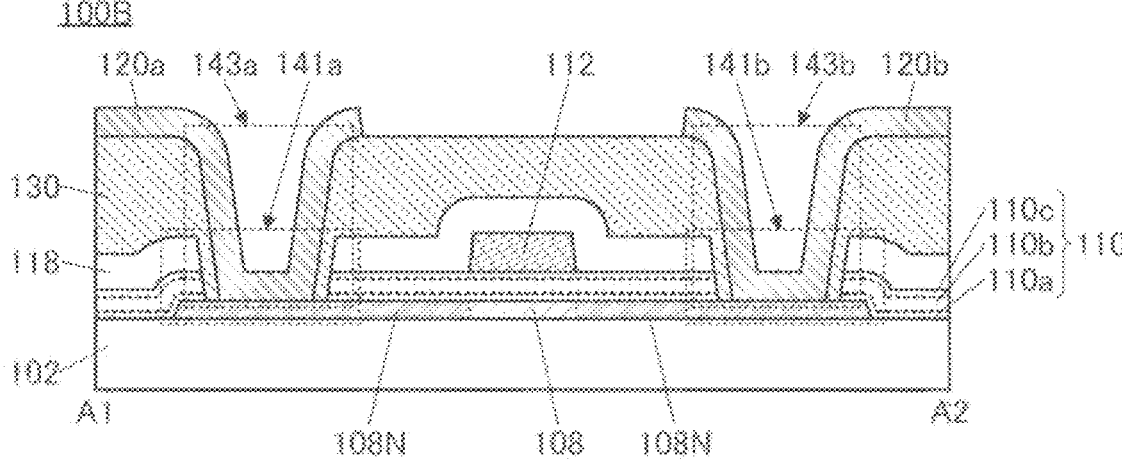
FIG. 12A and FIG. 12B are diagrams illustrating a structure example of a transistor.
Figure 12B:
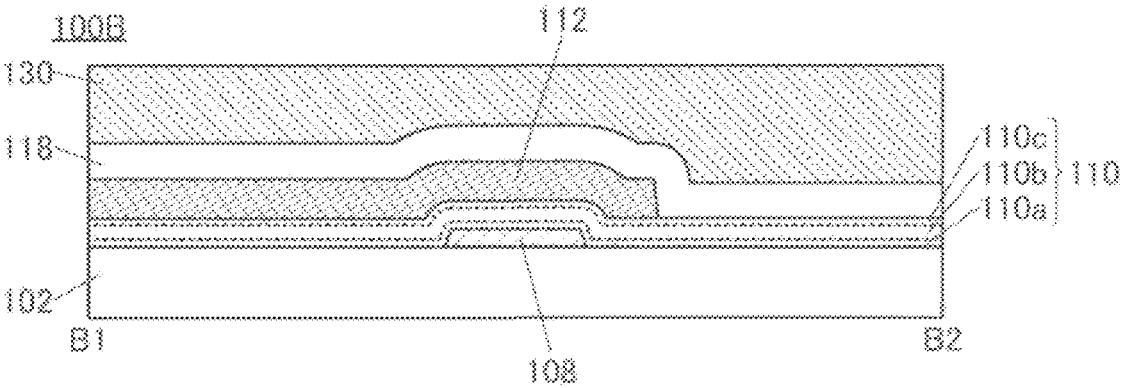

FIG. 12A is a cross-sectional view of a transistor 100B in the channel length direction, and FIG. 12B is a cross-sectional view of the transistor 100B in the channel width direction. Note that FIG. TA can be referred to for a top view of the transistor 100B.

The transistor 100B is different from the transistor 100 illustrated in FIG. 1 mainly in the structure of the insulating layer 110.

The insulating layer 110 has a stacked-layer structure in which an insulating film 110a, an insulating film 110b, and an insulating film 110c are stacked in this order from the substrate 102 side. The insulating film 110a includes a region in contact with the channel formation region of the semiconductor layer 108. The insulating film 110c includes a region in contact with the conductive layer 112. The insulating film 110b is positioned between the insulating film 110a and the insulating film 110c.

It is preferable that the insulating film 110a, the insulating film 110b, and the insulating film 110c be each an insulating film containing an oxide. In that case, the insulating film 110a, the insulating film 110b, and the insulating film 110c are preferably deposited successively with the same deposition apparatus.

As the insulating film 110a, the insulating film 110b, and the insulating film 110c, an insulating layer including one or more kinds of a silicon oxide film, a silicon oxynitride film, a silicon nitride oxide film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film can be used, for example.

The insulating layer 110 in contact with the semiconductor layer 108 preferably has a stacked-layer structure of oxide insulating films. The insulating layer 110 further preferably includes a region containing oxygen in excess of that in the stoichiometric composition. In other words, the insulating layer 110 includes an insulating film capable of releasing oxygen. It is also possible to supply oxygen into the insulating layer 110 by forming the insulating layer 110 in an oxygen-containing atmosphere, performing heat treatment in an oxygen-containing atmosphere after the deposition of the insulating layer 110, performing plasma treatment or the like in an oxygen-containing atmosphere after the deposition of the insulating layer 110, or depositing an oxide film over the insulating layer 110 in an oxygen-containing atmosphere, for example. Note that an oxidizing gas may be used instead of oxygen or in addition to oxygen in each of the above treatments for supplying oxygen. Examples of the oxidizing gas include dinitrogen monoxide and ozone. Note that a plurality of kinds of oxidizing gas may be used.

For example, the insulating film 110a, the insulating film 110b, and the insulating film 110c can be formed by a sputtering method, a CVD method, a vacuum evaporation method, a PLD method, an ALD method, or the like.

In particular, the insulating film 110a, the insulating film 110b, and the insulating film 110c are preferably formed by a plasma CVD method.

The insulating film 110a is deposited over the semiconductor layer 108, and thus is preferably a film deposited under conditions where the semiconductor layer 108 is damaged as little as possible. For example, the insulating layer 110a can be deposited under conditions where the deposition rate is sufficiently low.

For example, when a silicon oxynitride film is formed as the insulating film 110a by a plasma CVD method, damage to the semiconductor layer 108 can be extremely small by formation under a low-power condition.

For example, a source gas that contains a silicon-containing deposition gas such as silane or disilane and an oxidizing gas such as oxygen, ozone, dinitrogen monoxide, or nitrogen dioxide can be used as a deposition gas for deposition of a silicon oxynitride film. A dilution gas such as argon, helium, or nitrogen may be contained in addition to the source gas.

When the proportion of the flow rate of the deposition gas in the total flow rate of the deposition gas (hereinafter, also simply referred to as a flow rate ratio) is low, for example, the deposition rate can be made low, which allows deposition of a dense film with few defects.

The insulating film 110b is preferably a film deposited under conditions where the deposition rate is higher than that of the insulating film 110a. Thus, the productivity can be improved.

For example, the insulating film 110b can be deposited under conditions where the deposition rate is increased by setting the flow rate ratio of the deposition gas to be higher than that of the insulating film 110a.

The insulating film 110c is preferably an extremely dense film whose surface has fewer defects and is less likely to adsorb an impurity contained in the air such as water. For example, like the insulating film 110a, the insulating film 110c can be deposited under conditions where the deposition rate is sufficiently low.

Since the insulating film 110c is deposited over the insulating film 110b, the deposition of the insulating film 110c affects the semiconductor layer 108 less than the deposition of the insulating film 110a. Thus, the insulating film 110c can be deposited under conditions where the power is higher than that for the insulating film 110a. The reduced flow rate ratio of the deposition gas and the relatively high-power film formation enable formation of a dense film in which defects on its surface are reduced.

That is, as the insulating layer 110, a stacked-layer film deposited under conditions where the deposition rate of the insulating film 110b is the highest, that of the insulating film 110a is the second highest, and that of the insulating film 110c is the lowest can be used. In the insulating layer 110, the etching rate of the insulating film 110b is the highest, that of the insulating film 110a is the second highest, and that of the insulating film 110c is the lowest when wet etching or dry etching is performed under the same condition.

The insulating film 110b is preferably formed to be thicker than the insulating film 110a and the insulating film 110c. The time taken for the deposition process of the insulating layer 110 can be shortened by forming the insulating film 110b, which is deposited at the highest deposition rate, to be thick.

Here, the boundary between the insulating film 110a and the insulating film 110b and the boundary between the insulating film 110b and the insulating film 110c are sometimes unclear and thus are clearly shown by dashed lines in FIG. 12A and the like. Note that since the insulating film 110a and the insulating film 110b have different film densities, the boundary therebetween can be observed as a difference in contrast in a transmission electron microscopy image or the like of a cross section of the insulating layer 110 in some cases. Similarly, the boundary between the insulating film 110b and the insulating film 110c can be observed as a difference in contrast in some cases.

In the transistor 100B of one embodiment of the present invention, a metal oxide film which has a low gallium content or does not contain gallium is preferably used as the semiconductor layer 108. In addition, a film formed by a deposition method in which damage to the semiconductor layer 108 is reduced is preferably used as the insulating film 110a in contact with the top surface of the semiconductor layer 108. Therefore, the density of defect states at the interface between the semiconductor layer 108 and the insulating layer 110 is reduced and the transistor 100B can thus have high reliability.

Structure Example 4

Figure 13A:
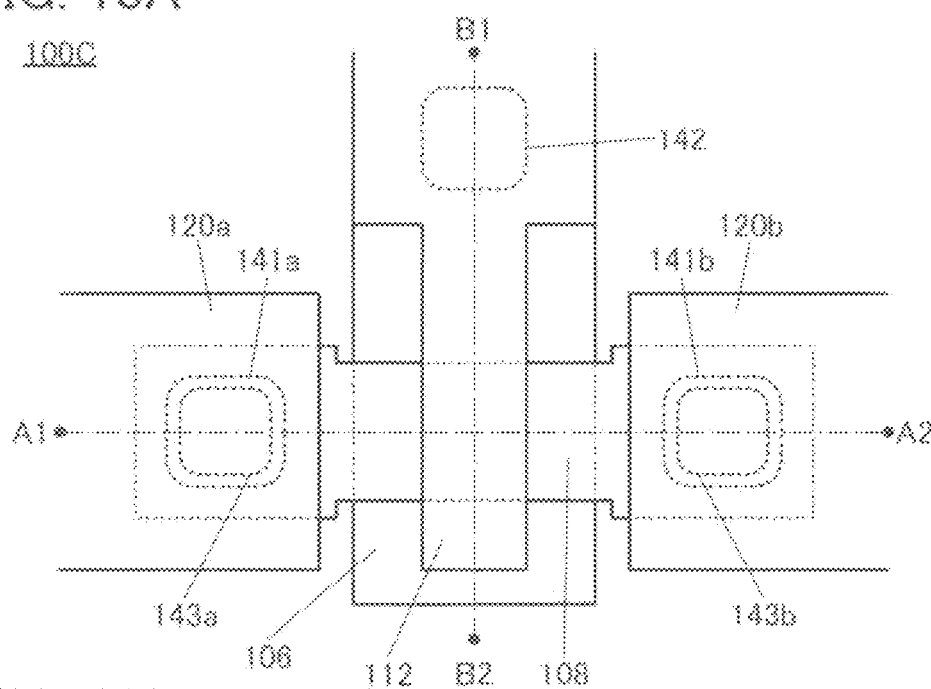
FIG. 13A to FIG. 13C are diagrams illustrating a structure example of a transistor.
Figure 13B:
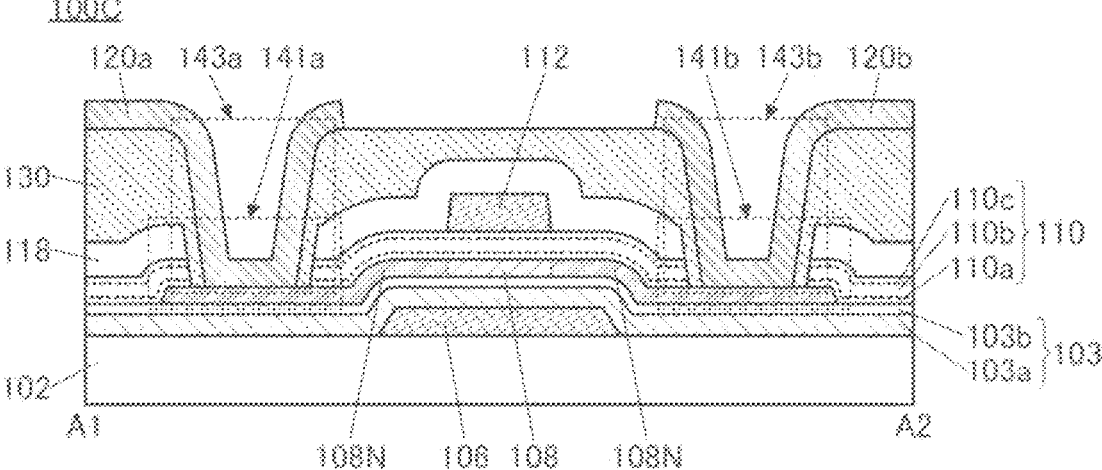
Figure 13C:
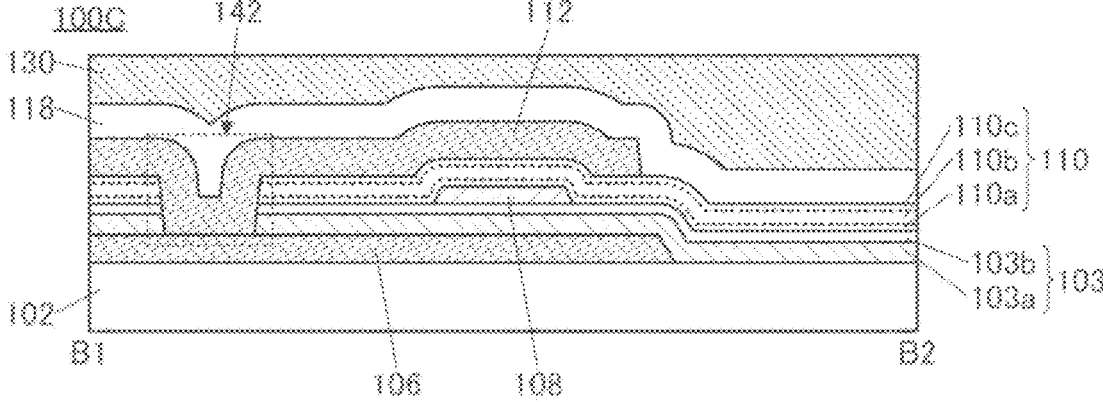

FIG. 13A is a top view of a transistor 100C, FIG. 13B is a cross-sectional view of the transistor 100C in the channel length direction, and FIG. 13C is a cross-sectional view of the transistor 100C in the channel length direction.

The transistor 100C is different from the transistor 100 illustrated in FIG. 1 and the like mainly in including a conductive layer 106 and an insulating layer 103 between the substrate 102 and the semiconductor layer 108. The conductive layer 106 includes a region overlapping with the conductive layer 112 with the semiconductor layer 108 therebetween.

In the transistor 100C, the conductive layer 112 has a function of a second gate electrode (also referred to as a top gate electrode), and the conductive layer 106 has a function of a first gate electrode (also referred to as a bottom gate electrode). In addition, part of the insulating layer 110 functions as a second gate insulating layer, and part of the insulating layer 103 functions as a first gate insulating layer.

A portion of the semiconductor layer 108 that overlaps with at least one of the conductive layer 112 and the conductive layer 106 functions as a channel formation region. Note that for easy explanation, a portion of the semiconductor layer 108 that overlaps with the conductive layer 112 is sometimes referred to as a channel formation region; however, a channel can also be actually formed in a portion not overlapping with the conductive layer 112 and overlapping with the conductive layer 106 (a portion including the low-resistance region 108N).

As illustrated in FIG. 13C, the conductive layer 106 may be electrically connected to the conductive layer 112 through an opening 142 provided in the insulating layer 110 and the insulating layer 103. In that case, the same potential can be applied to the conductive layer 106 and the conductive layer 112. When the same potential is applied to the conductive layer 112 and the conductive layer 106, the amount of current that can flow in the transistor 100C in an on state can be increased.

For the conductive layer 106, a material similar to that for the conductive layer 112, the conductive layer 120a, or the conductive layer 120b can be used. In particular, a material containing copper is preferably used for the conductive layer 106, in which case wiring resistance can be reduced.

As illustrated in FIG. 13A and FIG. 13C, the conductive layer 112 and the conductive layer 106 preferably extend beyond an end portion of the semiconductor layer 108 in the channel width direction. In that case, as illustrated in FIG. 13C, a structure is employed in which the semiconductor layer 108 in the channel width direction is entirely covered with the conductive layer 112 and the conductive layer 106 with the insulating layer 110 and the insulating layer 103 therebetween.

With such a structure, the semiconductor layer 108 can be electrically surrounded by electric fields generated by a pair of gate electrodes. At this time, it is particularly preferable that the same potential be applied to the conductive layer 106 and the conductive layer 112. In that case, electric fields for inducing a channel can be effectively applied to the semiconductor layer 108, whereby the on-state current of the transistor 100C can be increased. Thus, the transistor 100C can also be miniaturized.

Note that a structure in which the conductive layer 112 and the conductive layer 106 are not connected to each other may be employed. In that case, a constant potential may be applied to one of the pair of gate electrodes, and a signal for driving the transistor 100C may be applied to the other. In this case, the potential applied to one of the gate electrodes enables control of the threshold voltage at the time of driving the transistor 100C with the other gate electrode.

The conductive layer 106 may be electrically connected to the conductive layer 120a or the conductive layer 120b. In that case, the conductive layer 120a or the conductive layer 120b and the conductive layer 106 may be electrically connected to each other through an opening provided in the insulating layer 118, the insulating layer 110, and the insulating layer 103.

The insulating layer 103 can be formed using the method that can be used to form the insulating layer 118. In particular, the insulating layer 103 is preferably formed by a PECVD method.

The insulating layer 103 functioning as the second gate insulating layer preferably satisfies at least one of the following characteristics, further preferably satisfies all of the following characteristics: high breakdown voltage, low stress, unlikeliness of releasing hydrogen, unlikeliness of releasing water, a small number of defects, and prevention of diffusion of metal elements contained in the conductive layer 106.

FIG. 13B and FIG. 13C illustrate an example in which the insulating layer 103 has a stacked-layer structure of an insulating film 103a and an insulating film 103b over the insulating film 103a. An insulating film that is less likely to diffuse a metal element included in the conductive layer 106 is preferably used as the insulating film 103a in contact with the conductive layer 106. For example, for the insulating film 103a, a silicon nitride film, a silicon nitride oxide film, an aluminum oxide film, or a hafnium oxide film is preferably used. The insulating film 103b in contact with the semiconductor layer 108 is preferably formed using an insulating film containing oxygen. It is preferable to use, for example, a silicon oxide film or a silicon oxynitride film as the insulating film 103b.

Although the insulating layer 103 has a two-layer structure of the insulating film 103a and the insulating film 103b in FIG. 13B and FIG. 13C, one embodiment of the present invention is not limited thereto. The insulating layer 103 may have a single-layer structure or a stacked-layer structure of three or more layers. Each of the insulating film 103a and the insulating film 103b may have a stacked-layer structure of two or more layers.

In the case where the insulating layer 103 has a stacked-layer structure, each of the insulating films included the insulating layer 103 is preferably deposited successively without exposure to the air. For example, each of the insulating films included in the insulating layer 103 is preferably deposited successively without exposure to the air with a plasma CVD apparatus.

Structure Example 5

Figure 14A:
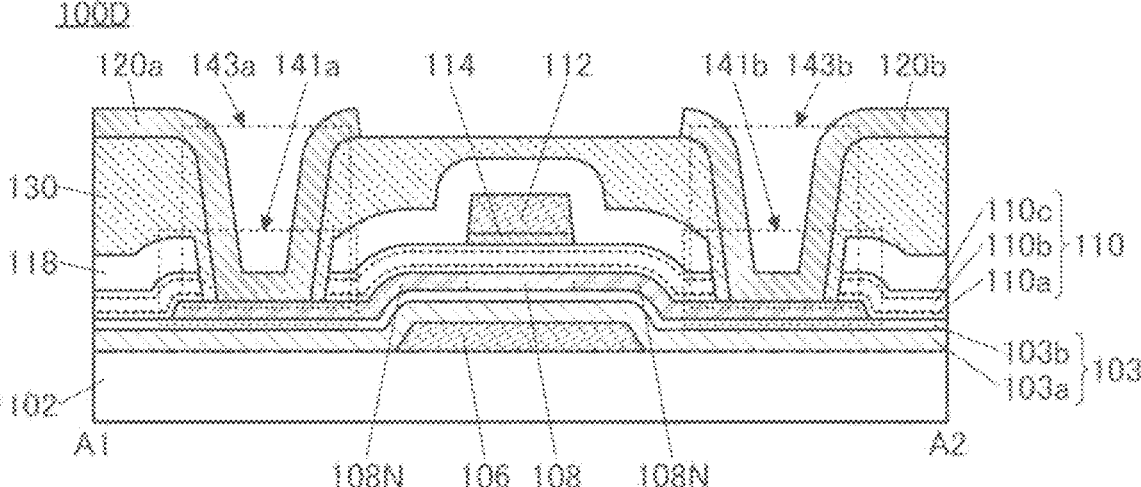
FIG. 14A and FIG. 14B are diagrams illustrating a structure example of a transistor.
Figure 14B:
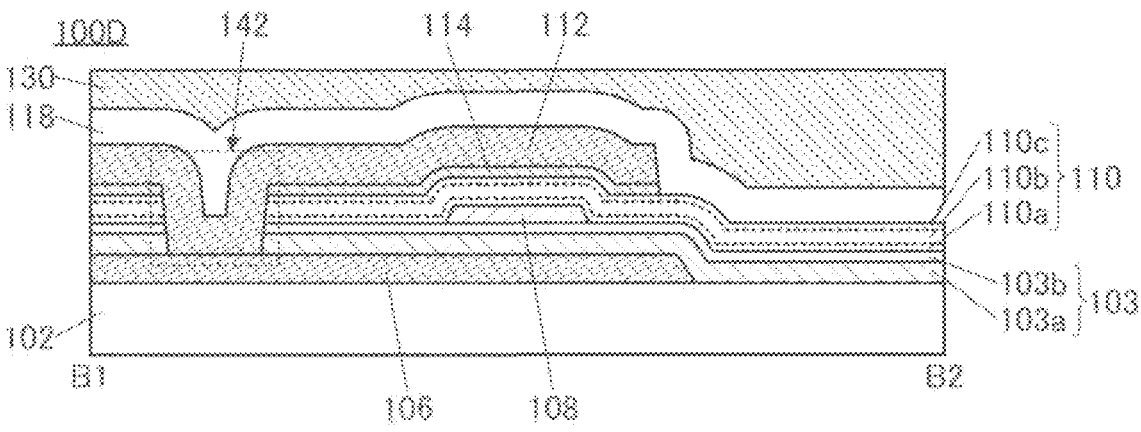

FIG. 14A is a cross-sectional view of a transistor 100D in the channel length direction, and FIG. 14B is a cross-sectional view of the transistor 100D in the channel length direction. Note that FIG. 13A can be referred to for a top view of the transistor 100D.

The transistor 100D is different from the transistor 100C illustrated in FIG. 13 and the like mainly in including the metal oxide layer 114 between the insulating layer 110 and the conductive layer 112.

The conductive layer 112 and the metal oxide layer 114 are processed to have substantially the same top surface shapes. The metal oxide layer 114 can be formed with the use of a resist mask for processing the conductive layer 112, for example.

The metal oxide layer 114 has a function of supplying oxygen into the insulating layer 110. In the case where a conductive film containing a metal or an alloy that is easily oxidized is used for the conductive layer 112, the metal oxide layer 114 can also function as a barrier layer that prevents the conductive layer 112 from being oxidized by oxygen in the insulating layer 110. Note that the metal oxide layer 114 may be removed before formation of the conductive layer 112 so that the conductive layer 112 and the insulating layer 110 are in contact with each other. The metal oxide layer 114 is not necessarily provided when not needed.

The metal oxide layer 114 positioned between the insulating layer 110 and the conductive layer 112 functions as a barrier film that prevents diffusion of oxygen contained in the insulating layer 110 to the conductive layer 112 side. The metal oxide layer 114 also functions as a barrier film that prevents diffusion of impurities containing hydrogen elements contained in the conductive layer 112 to the insulating layer 110 side. Examples of impurities containing hydrogen elements include hydrogen and water. The metal oxide layer 114 is preferably formed using, for example, a material that is less likely to transmit oxygen and hydrogen than at least the insulating layer 110.

Even in the case where a metal material that is likely to absorb oxygen is used for the conductive layer 112, the metal oxide layer 114 can prevent diffusion of oxygen from the insulating layer 110 into the conductive layer 112. Furthermore, even in the case where the conductive layer 112 contains hydrogen, diffusion of hydrogen from the conductive layer 112 into the semiconductor layer 108 through the insulating layer 110 can be prevented. Consequently, the carrier concentration in the channel formation region of the semiconductor layer 108 can be extremely low. Note that examples of the metal material that is likely to absorb oxygen include aluminum and copper.

For the metal oxide layer 114, an insulating material or a conductive material can be used. When the metal oxide layer 114 has an insulating property, the metal oxide layer 114 functions as part of the gate insulating layer. Meanwhile, when the metal oxide layer 114 has conductivity, the metal oxide layer 114 functions as part of the gate electrode.

The metal oxide layer 114 is preferably formed using an insulating material with a higher permittivity than silicon oxide. It is particularly preferable to use an aluminum oxide film, a hafnium oxide film, a hafnium aluminate film, or the like because driving voltage can be lowered.

For the metal oxide layer 114, a conductive oxide such as indium oxide, indium tin oxide (ITO), or indium tin oxide containing silicon (ITSO) can also be used, for example. A conductive oxide containing indium is particularly preferable because of its high conductivity.

For the metal oxide layer 114, an oxide material containing one or more elements that are the same as those of the semiconductor layer 108 is preferably used. It is particularly preferable to use an oxide semiconductor material that can be used for the semiconductor layer 108. In that case, a metal oxide film formed using the same sputtering target as that for the semiconductor layer 108 is preferably used as the metal oxide layer 114 because an apparatus can be shared.

The metal oxide layer 114 is preferably formed using a sputtering apparatus. For example, in the case where an oxide film is formed using a sputtering apparatus, forming the oxide film in an atmosphere containing an oxygen gas can suitably add oxygen to one or both of the insulating layer 110 and the semiconductor layer 108.

Note that after the metal oxide film that can be used for the metal oxide layer 114 is deposited and oxygen is supplied to the insulating layer 110, the metal oxide film may be removed. The metal oxide layer 114 or the metal oxide film that can be used for the metal oxide layer 114 is not necessarily provided.

Structure Example 6

Figures 15A, 15B:
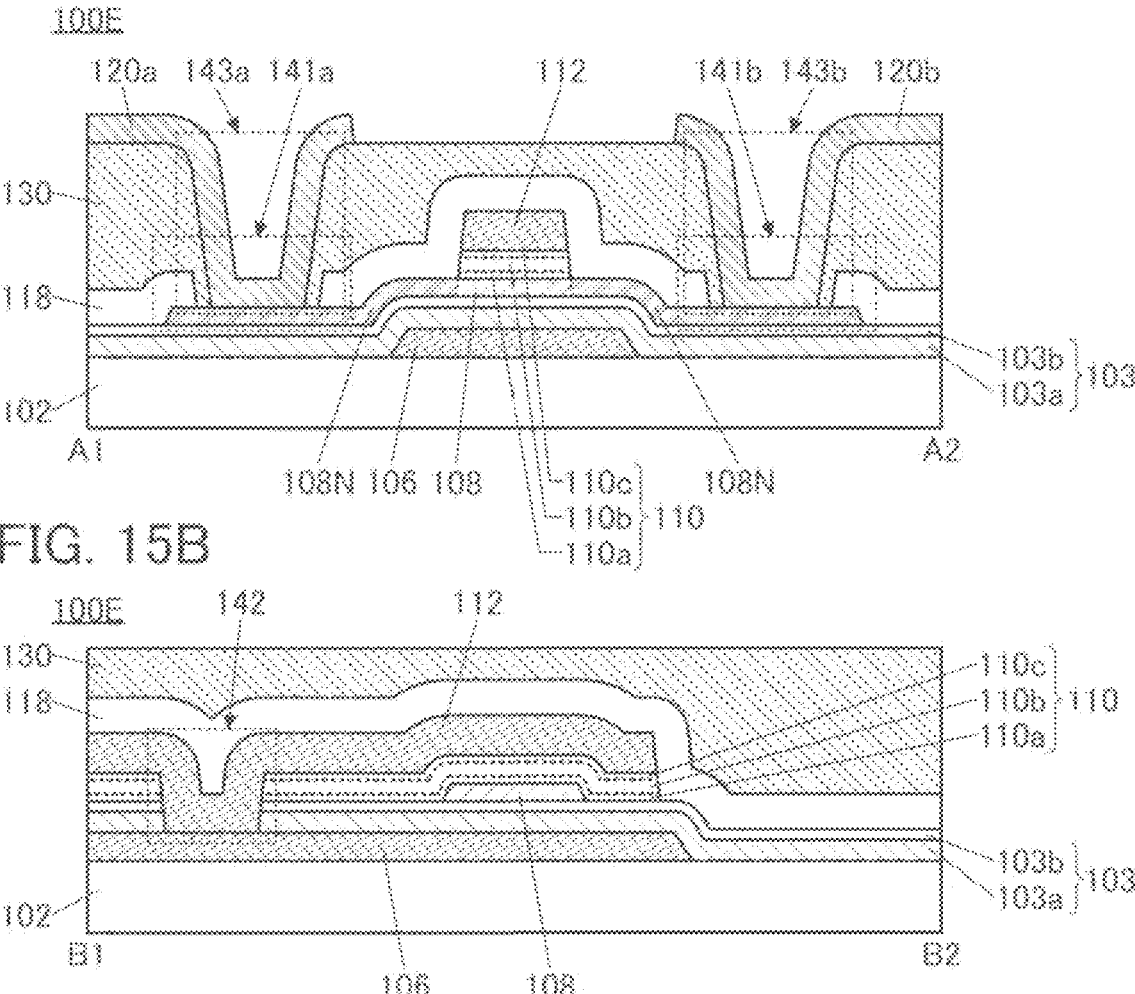
FIG. 15A and FIG. 15B are diagrams illustrating a structure example of a transistor.

FIG. 15A is a cross-sectional view of a transistor 100E in the channel length direction, and FIG. 15B is a cross-sectional view of the transistor 100E in the channel length direction. Note that FIG. 13A can be referred to for a top view of the transistor 100E.

The transistor 100E is different from the transistor 100C illustrated in FIG. 13 and the like mainly in the structure of the insulating layer 110.

The insulating layer 110 is processed to have substantially the same top surface shape as the conductive layer 112. The insulating layer 110 can be formed with the use of a resist mask for processing the conductive layer 112, for example.

The insulating layer 118 is in contact with the top surface and the side surface of the semiconductor layer 108, the side surface of the insulating layer 110, and the top surface and the side surface of the conductive layer 112. The insulating layer 118 includes the opening 141a and the opening 141b in regions overlapping with the semiconductor layer 108.

End portions of the insulating layer 118 are preferably tapered. The above description of the angle $\theta1$ can be referred to for the angle of an end portion of the insulating layer 118; thus, the detailed description thereof is omitted.

The above description can be referred to for the insulating layer 130, the conductive layer 120a, and the conductive layer 120b; thus, the detailed description thereof is omitted.

Structure Example 7

Figure 16A:
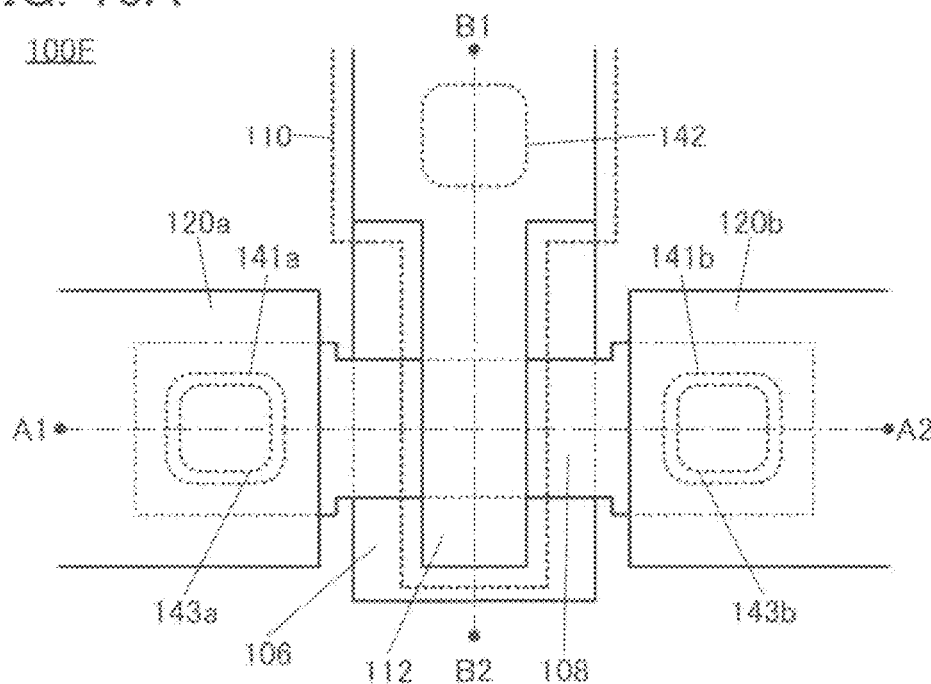
FIG. 16A to FIG. 16C are diagrams illustrating a structure example of a transistor.
Figure 16B:
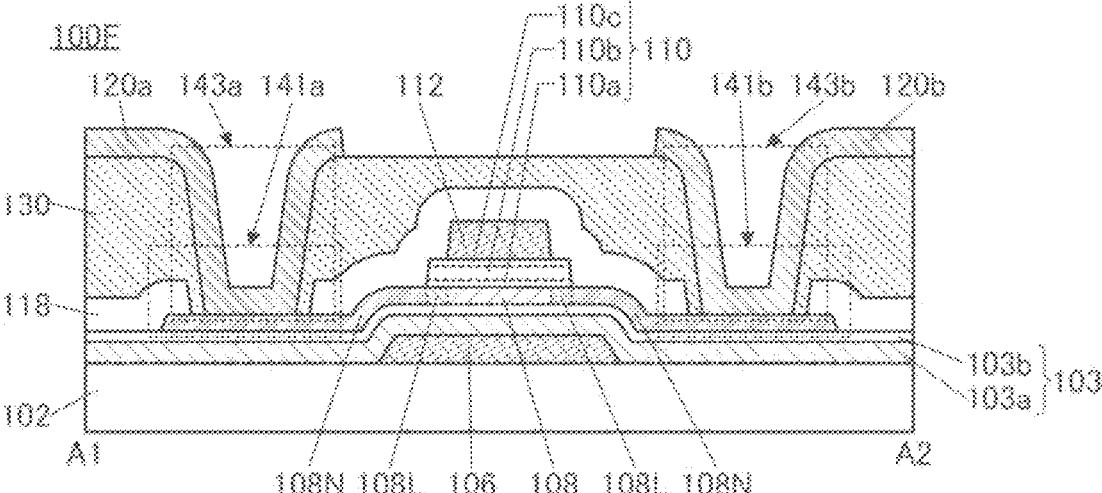
Figure 16C:
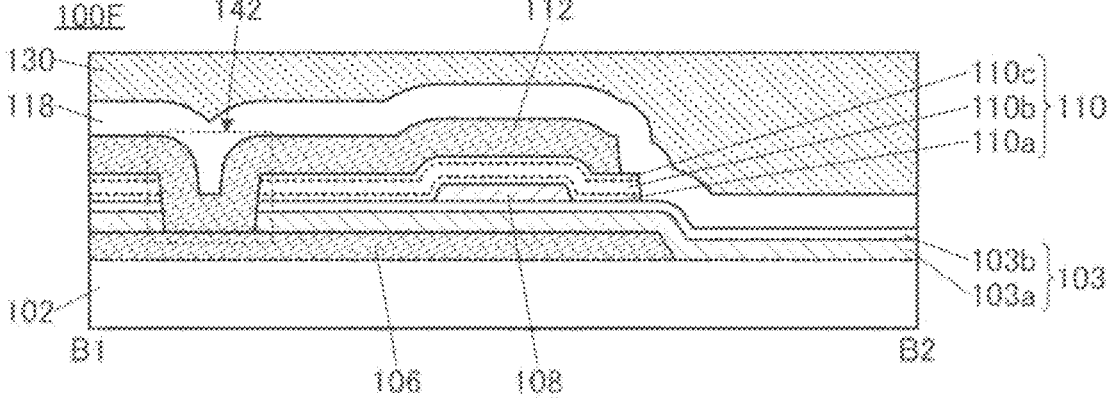

FIG. 16A is a top view of a transistor 100F, FIG. 16B is a cross-sectional view of the transistor 100F in the channel length direction, and FIG. 16C is a cross-sectional view of the transistor 100F in the channel length direction.

The transistor 100F is different from the transistor 100E illustrated in FIG. 15 or the like mainly in the structure of the insulating layer 110.

End portions of the conductive layer 112 are positioned inward from the end portions of the insulating layer 110. In other words, the insulating layer 110 includes a portion extending beyond the end portion of the conductive layer 112 over at least the semiconductor layer 108.

The semiconductor layer 108 includes a pair of regions 108L between which the channel formation region is sandwiched and the pair of low-resistance regions 108N on outer sides of the regions 108L. The regions 108L are each a region of the semiconductor layer 108 that overlaps with the insulating layer 110 and does not overlap with the conductive layer 112.

The region 108L has a function of a buffer region for relieving a drain electric field. The region 108L is a region not overlapping with the conductive layer 112 and thus is a region where a channel is hardly formed by application of gate voltage to the conductive layer 112. The region 108L preferably has a higher carrier concentration than the channel formation region. Thus, the region 108L can function as an LDD (Lightly Doped Drain) region.

The region 108L can be referred to as a region whose resistance is substantially equal to or lower than that of the channel formation region, a region whose carrier concentration is substantially equal to or higher than that of the channel formation region, a region whose oxygen vacancy density is substantially equal to or higher than that of the channel formation region, or a region whose impurity concentration is substantially equal to or higher than that of the channel formation region.

The region 108L can be referred to as a region whose resistance is substantially equal to or higher than that of the low-resistance region 108N, a region whose carrier concentration is substantially equal to or lower than that of the low-resistance region 108N, a region whose oxygen vacancy density is substantially equal to or lower than that of the low-resistance region 108N, or a region whose impurity concentration is substantially equal to or lower than that of the low-resistance region 108N.

In this manner, the region 108L functioning as the LDD region is provided between the channel formation region and the low-resistance region 108N functioning as a source region or a drain region, whereby a highly reliable transistor having both a high drain breakdown voltage and a high on-state current can be provided.

The low-resistance region 108N functions as the source region or the drain region and has the lowest resistance in the other regions of the semiconductor layer 108. Alternatively, the low-resistance region 108N can be referred to as a region having the highest carrier concentration, a region having the highest oxygen vacancy density, or a region having the highest impurity concentration in the regions of the semiconductor layer 108.

The electric resistance of the low-resistance region 108N is preferably as low as possible; for example, the sheet resistance of the low-resistance region 108N is preferably higher than or equal to 1 $\Omega$/square and lower than $1\Omega \times 10^3$ $\Omega$/square, further preferably higher than or equal to 1 $\Omega$/square and lower than or equal to $8\Omega \times 10^2$ $\Omega$/square.

The electric resistance of the channel formation region in a state where the channel is not formed is preferably as high as possible. For example, the sheet resistance of the channel formation region is preferably higher than or equal to $1\times10^9$ $\Omega$/square, further preferably higher than or equal to $5\times10^9$ $\Omega$/square, still further preferably higher than or equal to $1\times10^{10}$ $\Omega$/square.

Since the electric resistance of the channel formation region in a state where the channel is not formed is preferably as high as possible, it is not necessary to set its upper limit. If the upper limit is set, the sheet resistance of the channel formation region is preferably higher than or equal to $1\times10^9$ $\Omega$/square and lower than or equal to $1\times10^{12}$ $\Omega$/square, further preferably higher than or equal to $5\times10^9$ $\Omega$/square and lower than or equal to $1\times10^{12}$ $\Omega$/square, still further preferably higher than or equal to $1\times10^{10}$ $\Omega$/square and lower than or equal to $1\times10^{12}$ $\Omega$/square, for example.

The sheet resistance of the region 108L can be, for example, higher than or equal to $1\times10^3$ $\Omega$/square and lower than or equal to $1\times10^9$ $\Omega$/square, preferably higher than or equal to $1\times10^3$ $\Omega$/square and lower than or equal to $1\times10^8$ $\Omega$/square, further preferably higher than or equal to $1\times10^3$ $\Omega$/square and lower than or equal to $1\times10^7$ $\Omega$/square. When the resistance is within the above range, a transistor that has favorable electrical characteristics and high reliability can be provided. Note that the sheet resistance can be calculated from a resistance value. Providing the region 108L between the low-resistance region 108N and the channel formation region can increase the source-drain breakdown voltage of the transistor 100F.

The electric resistance of the channel formation region in a state where the channel is not formed can be more than or equal to $1\times10^6$ times and less than or equal to $1\times10^{12}$ times that of the low-resistance region 108N, preferably more than or equal to $1\times10^6$ times and less than or equal to $1\times10^{11}$ times that of the low-resistance region 108N, further preferably more than or equal to $1\times10^6$ times and less than or equal to $1\times10^{10}$ times that of the low-resistance region 108N.

The electric resistance of the channel formation region in a state where the channel is not formed can be more than or equal to $1\times10^0$ times and less than or equal to $1\times10^9$ times that of the region 108L, preferably more than or equal to $1\times10^1$ times and less than or equal to $1\times10^8$ times that of the region 108L, further preferably more than or equal to $1\times10^2$ times and less than or equal to $1\times10^7$ times that of the region 108L.

The electric resistance of the region 108L can be more than or equal to $1\times10^0$ times and less than or equal to $1\times10^9$ times that of the low-resistance region 108N, preferably more than or equal to $1\times10^1$ times and less than or equal to $1\times10^8$ times that of the low-resistance region 108N, further preferably more than or equal to $1\times10^1$ times and less than or equal to $1\times10^7$ times that of the low-resistance region 108N.

The carrier concentration in the semiconductor layer 108 preferably has a distribution such that the concentration is the lowest in the channel formation region and increases in the order of the region 108L and the low-resistance region 108N. Providing the region 108L between the channel formation region and the low-resistance region 108N can keep the carrier concentration of the channel formation region extremely low even when impurities such as hydrogen diffuse from the low-resistance region 108N during the manufacturing process, for example.

The carrier concentration in the channel formation region functioning as the channel formation region is preferably as low as possible and is preferably lower than or equal to $1\times10^{18}$ cm$^{-3}$, further preferably lower than or equal to $1\times10^{17}$ cm$^{-3}$, still further preferably lower than or equal to $1\times10^{16}$ cm$^{-3}$, yet further preferably lower than or equal to $1\times10^{13}$ cm$^{-3}$, yet still further preferably lower than or equal to $1\times10^{12}$ cm$^{-3}$. Note that the lower limit of the carrier concentration of the channel formation region is not particularly limited and can be, for example, $1\times10^{-9}$ cm$^{-3}$.

Meanwhile, the carrier concentration of the low-resistance region 108N can be higher than or equal to $5\times10^{18}$ cm$^{-3}$, preferably higher than or equal to $1\times10^{19}$ cm$^{-3}$, further preferably higher than or equal to $5\times10^{19}$ cm$^{-3}$, for example. The upper limit of the carrier concentration of the low-resistance region 108N is not particularly limited and can be, for example, $5\times10^{21}$ cm$^{-3}$ or $1\times10^{22}$ cm$^{-3}$.

The carrier concentration of the region 108L can be a value between that of the channel formation region and that of the low-resistance region 108N. For example, the carrier concentration of the region 108L is higher than or equal to $1\times10^{14}$ cm$^{-3}$ and lower than $1\times10^{20}$ cm$^{-3}$.

Note that the carrier concentration is not necessarily uniform in the region 108L; in some cases, the carrier concentration has a falling gradient from the low-resistance region 108N side toward the channel formation region. For example, one or both of the hydrogen concentration and the oxygen vacancy concentration in the region 108L may have a falling gradient from the low-resistance region 108N side to the channel formation region side.

Part of the end portion of the insulating layer 110 is positioned over the semiconductor layer 108. The insulating layer 110 includes a region overlapping with the conductive layer 112 and functioning as the gate insulating layer and a region not overlapping with the conductive layer 112 (i.e., a region overlapping with the region 108L).

Structure Example 8

Figures 17A, 17B:
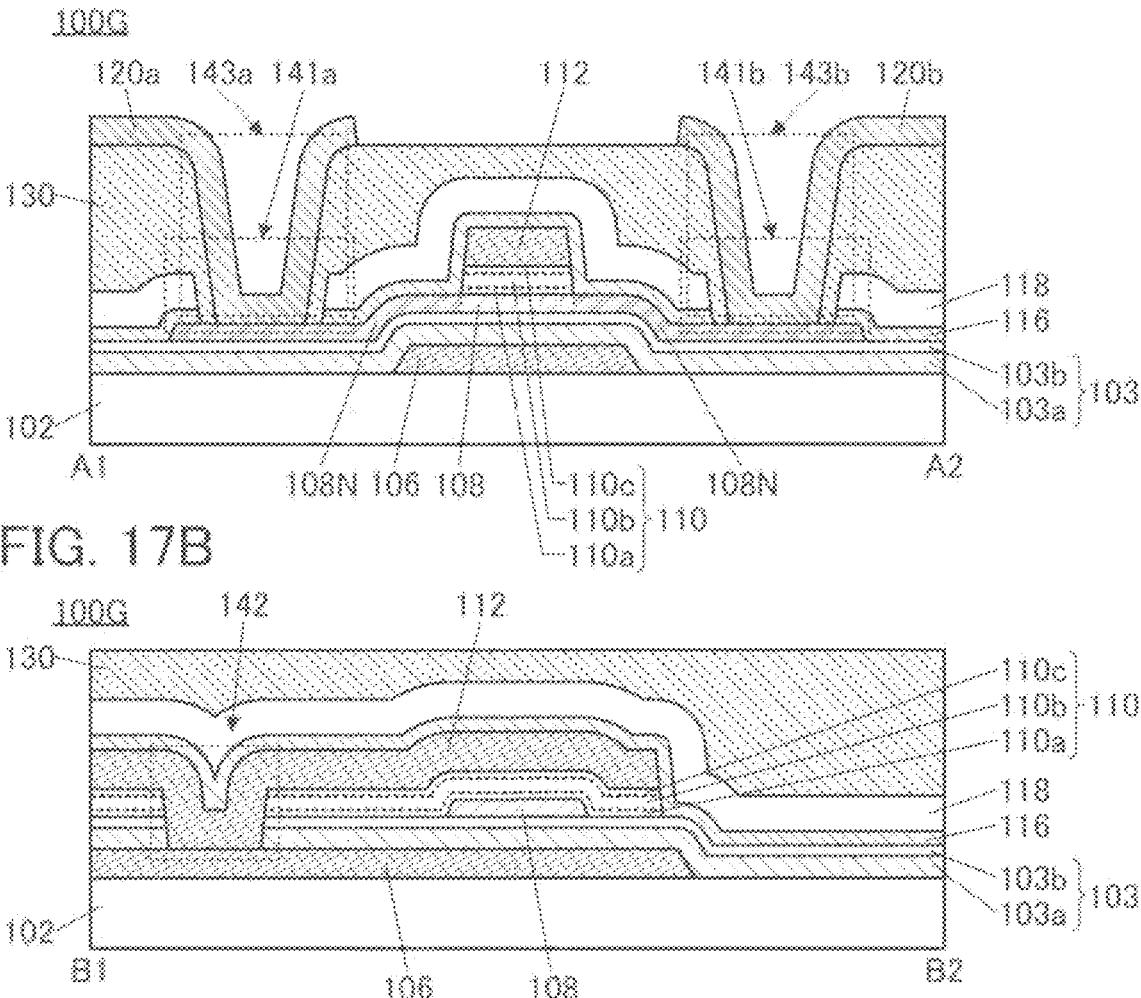
FIG. 17A and FIG. 17B are diagrams illustrating a structure example of a transistor.

FIG. 17A is a cross-sectional view of a transistor 100G in the channel length direction, and FIG. 17B is a cross-sectional view of the transistor 100G in the channel length direction. Note that FIG. 13A can be referred to for a top view of the transistor 100G.

The transistor 100G is different from the transistor 100E illustrated in FIG. 15 or the like mainly in including an insulating layer 116.

The insulating layer 116 is provided in contact with the top surface and the side surface of the semiconductor layer 108 which are not covered with the conductive layer 112 and the insulating layer 110. The insulating layer 116 is provided to cover atop surface of the insulating layer 103, the side surface of the insulating layer 110, and the top surface and the side surface of the conductive layer 112.

The insulating layer 116 has a function of reducing the resistance of the low-resistance region 108N. The insulating layer 116 can be formed using an insulating film which can supply impurities to the low-resistance regions 108N by being heated at the time of or after the deposition of the insulating layer 116. Alternatively, the insulating layer 116 can be formed using an insulating film that can cause generation of oxygen vacancies in the low-resistance region 108N by being heated at the time of or after the deposition of the insulating layer 116.

For example, as the insulating layer 116, an insulating film functioning as a supply source that supplies impurities to the low-resistance region 108N can be used. In that case, the insulating layer 116 is preferably a film from which hydrogen is released by heating. When the insulating layer 116 is formed in contact with the semiconductor layer 108, impurities such as hydrogen can be supplied to the low-resistance region 108N, so that the resistance of the low-resistance region 108N can be lowered.

The insulating layer 116 is preferably a film deposited using a gas containing an impurity element such as a hydrogen element as a deposition gas used for the deposition. In addition, as the deposition temperature of the insulating layer 116 is lower, a larger amount of impurity elements can be effectively supplied to the semiconductor layer 108. The deposition temperature of the insulating layer 116 is preferably higher than or equal to 200° C. and lower than or equal to 500° C., further preferably higher than or equal to 220° C. and lower than or equal to 450° C., still further preferably higher than or equal to 230° C. and lower than or equal to 400° C., for example.

When the insulating layer 116 is deposited under a reduced pressure while heating is performed, release of oxygen from the region to be the low-resistance region 108N in the semiconductor layer 108 can be promoted. When an impurity such as hydrogen is supplied to the semiconductor layer 108 where many oxygen vacancies are formed, the carrier concentration of the low-resistance region 108N is increased, and the resistance of the low-resistance region 108N can be lowered more effectively.

As the insulating layer 116, for example, an insulating film containing a nitride such as silicon nitride, silicon nitride oxide, silicon oxynitride, aluminum nitride, or aluminum nitride oxide can be suitably used. In particular, because of having a blocking property against both of hydrogen and oxygen, silicon nitride can prevent both a diffusion of hydrogen from the outside into the semiconductor layer and a release of oxygen from the semiconductor layer to the outside, and thus a highly reliable transistor can be achieved.

The insulating layer 116 may be an insulating film having a function of absorbing oxygen in the semiconductor layer 108 and generating oxygen vacancies. It is particularly preferable to use a metal nitride such as aluminum nitride, for example, for the insulating layer 116.

When a metal nitride is used for the insulating layer 116, it is preferable to use a nitride of aluminum, titanium, tantalum, tungsten, chromium, or ruthenium. In particular, aluminum or titanium is preferably contained. For example, an aluminum nitride film formed by a reactive sputtering method using aluminum as a sputtering target and a nitrogen-including gas as a deposition gas can be a film having both an extremely high insulating property and an extremely high blocking property against both of hydrogen and oxygen when the flow rate of the nitrogen gas with respect to the total flow rate of the deposition gas is appropriately controlled. Thus, when such an insulating film containing a metal nitride is provided in contact with the semiconductor layer, the resistance of the semiconductor layer can be lowered, and release of oxygen from the semiconductor layer and diffusion of hydrogen into the semiconductor layer can be favorably prevented.

In the case where aluminum nitride is used as the metal nitride, the thickness of the insulating layer including aluminum nitride is preferably 5 nm or more. A film with such a small thickness can have both a high blocking property against hydrogen and oxygen and a function of lowering the resistance of the semiconductor layer. Note that there is no upper limit of the thickness of the insulating layer; however, the thickness is preferably less than or equal to 500 nm, further preferably less than or equal to 200 nm, still further preferably less than or equal to 50 nm in consideration of productivity.

In the case of using an aluminum nitride film as the insulating layer 116, it is preferable to use a film that satisfies the composition formula $AlN_x$ (x is a real number greater than 0 and less than or equal to 2, and preferably, x is a real number greater than 0.5 and less than or equal to 1.5). In that case, a film having an excellent insulating property and high thermal conductivity can be obtained, and thus dissipation of heat generated in driving the transistor 100B can be increased.

Alternatively, an aluminum titanium nitride film, a titanium nitride film, or the like can be used as the insulating layer 116.

Such the insulating layer 116 is provided in contact with the low-resistance region 108N, whereby the insulating layer 116 absorbs oxygen in the low-resistance region 108N and oxygen vacancies can be formed in the low-resistance region 108N. Furthermore, when heat treatment is performed after the insulating layer 116 is formed, a larger amount of oxygen vacancies can be formed in the low-resistance region 108N, and a reduction in the resistance can be promoted. In the case where a film containing a metal oxide is used as the insulating layer 116, as the result of absorption of oxygen in the semiconductor layer 108 by the insulating layer 116, a layer containing an oxide of a metal element included in the insulating layer 116 (e.g., aluminum) may be formed between the insulating layer 116 and the low-resistance region 108N.

Here, in the case where a metal oxide film containing indium is used as the semiconductor layer 108, a region where indium oxide is precipitated or a region having a high indium concentration is sometimes formed in the low-resistance region 108N in the vicinity of the interface with the insulating layer 116. Accordingly, the low-resistance region 108N having extremely low resistance can be formed. Whether such a region exists can be observed by X-ray photoelectron spectroscopy (XPS), for example, in some cases.

Although an example in which the insulating layer 116 is used as a film for reducing the resistance of part of the semiconductor layer 108 is described here, the resistance of part of the semiconductor layer 108 may be reduced by provision of the insulating layer 118 in contact with part of the semiconductor layer 108. In other words, a structure without the insulating layer 116 can also be employed. In that case, an insulating film containing an oxide, such as a silicon oxide film or a silicon oxynitride film, can be used as the insulating layer 118 in contact with part of the semiconductor layer 108.

Structure Example 9

Figure 18A:
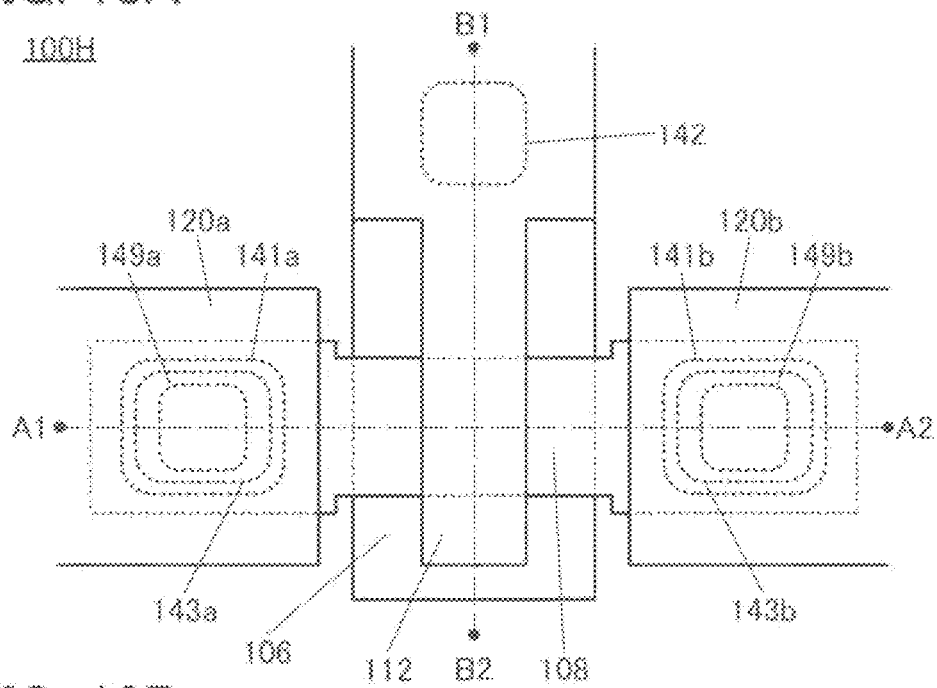
FIG. 18A to FIG. 18C are diagrams illustrating a structure example of a transistor.
Figure 18B:
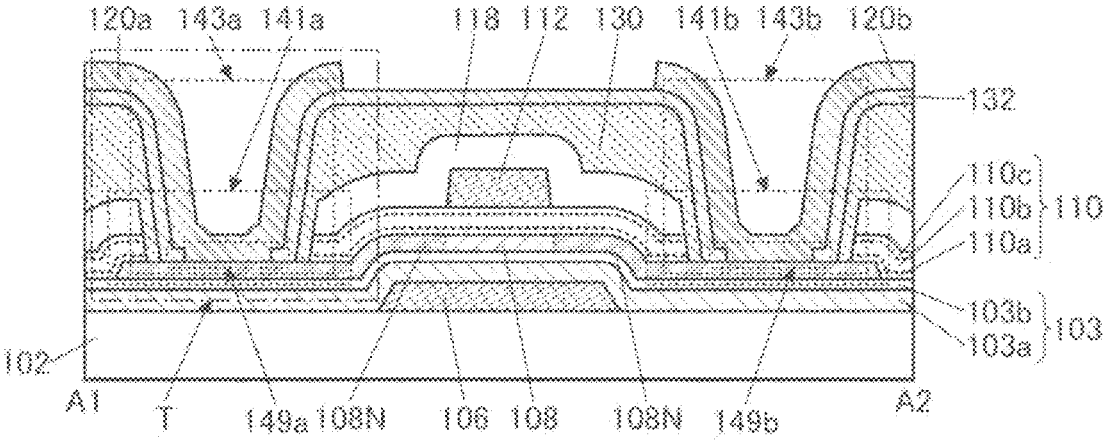
Figure 18C:
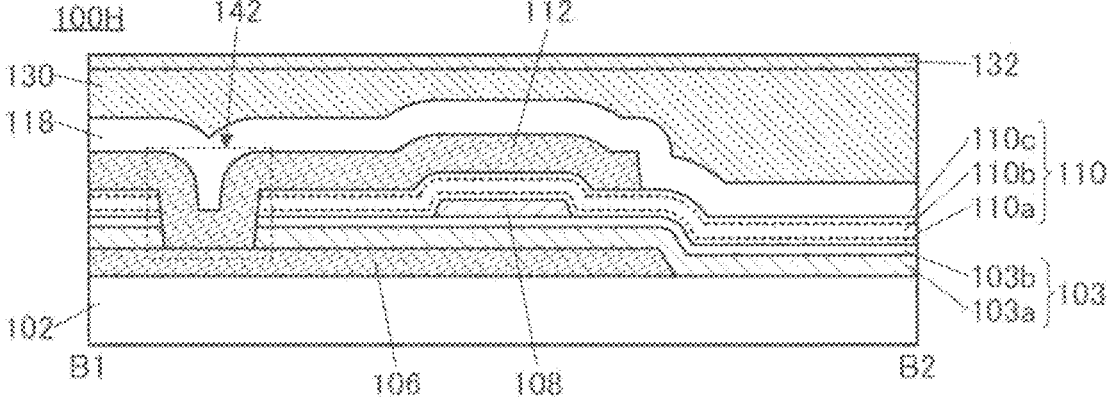
Figure 19:
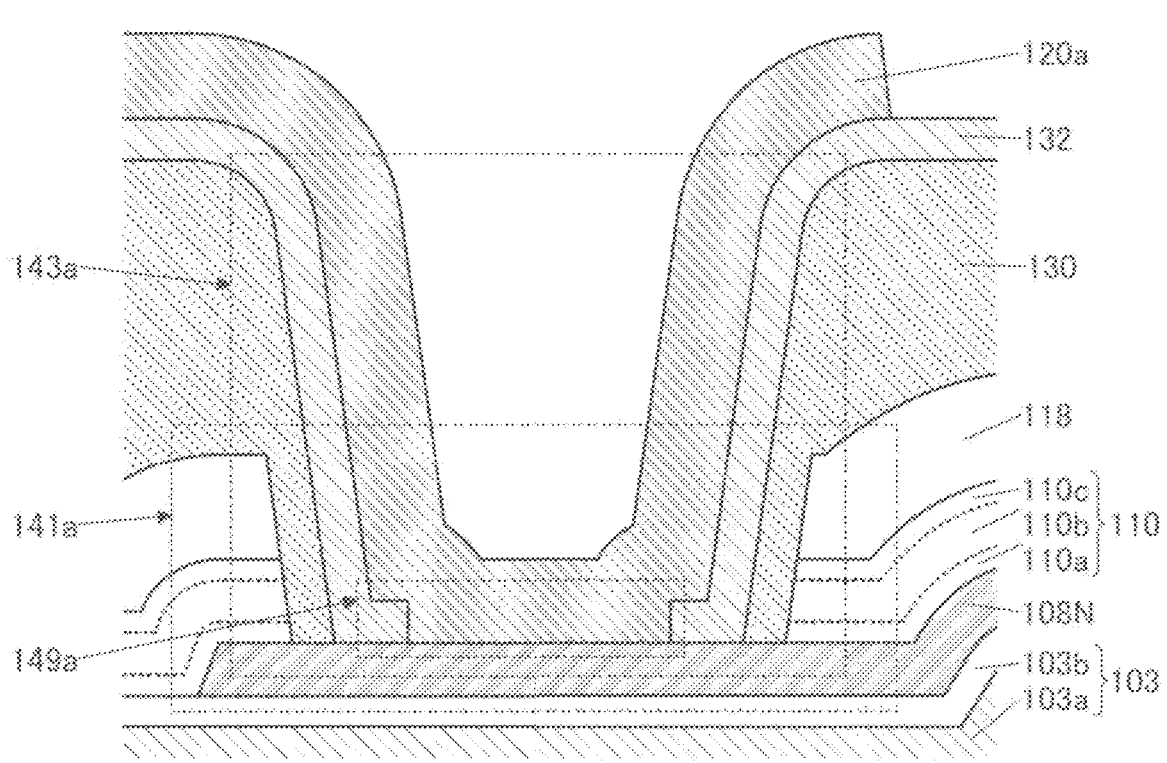
FIG. 19 is a diagram illustrating a structure example of a transistor.

FIG. 18A is a top view of a transistor 100H, FIG. 18B is a cross-sectional view of the transistor 100H in the channel length direction, and FIG. 18C is a cross-sectional view of the transistor 100H in the channel length direction. FIG. 19 is an enlarged view of a region T surrounded by a dashed-dotted line in FIG. 18B.

The transistor 100H is different from the transistor 100C illustrated in FIG. 13 mainly in including an insulating layer 132.

The insulating layer 132 is provided to cover a top surface and a side surface of the insulating layer 130. The insulating layer 132 includes an opening 149a inside the opening 143a and an opening 149b inside the opening 143b. Furthermore, the insulating layer 132 may include a region in contact with the top surface of the semiconductor layer 108.

The conductive layer 120a and the conductive layer 120b are electrically connected to the low-resistance regions 108N through the opening 149a and the opening 149b, respectively, which are provided in the insulating layer 132.

For the insulating layer 132, a material that can be used for the insulating layer 118 can be used. The insulating layer 132 is provided between the insulating layer 130 and each of the conductive layer 120a and the conductive layer 120b, and the conductive layer 120a and the conductive layer 120b are in contact with the insulating layer 132, whereby adhesion of the conductive layer 120a and the conductive layer 120b can be increased. The insulating layer 132 can be applied to other structure examples.

Figure 20A:
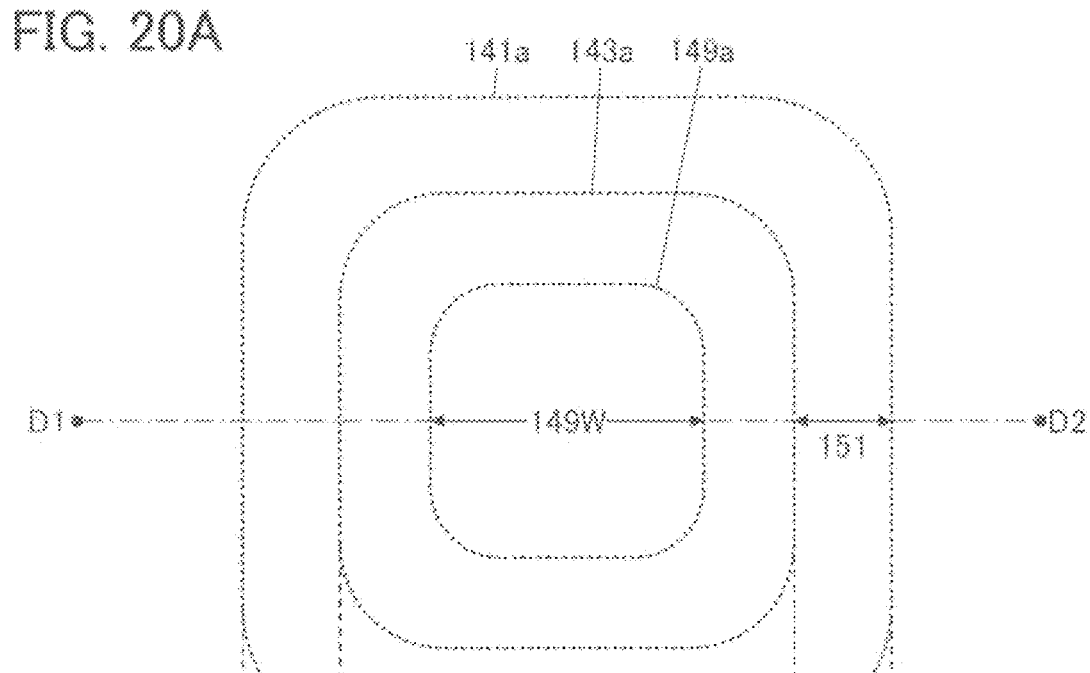
FIG. 20A and FIG. 20B are diagrams illustrating a structure example of a transistor.
Figure 20B:
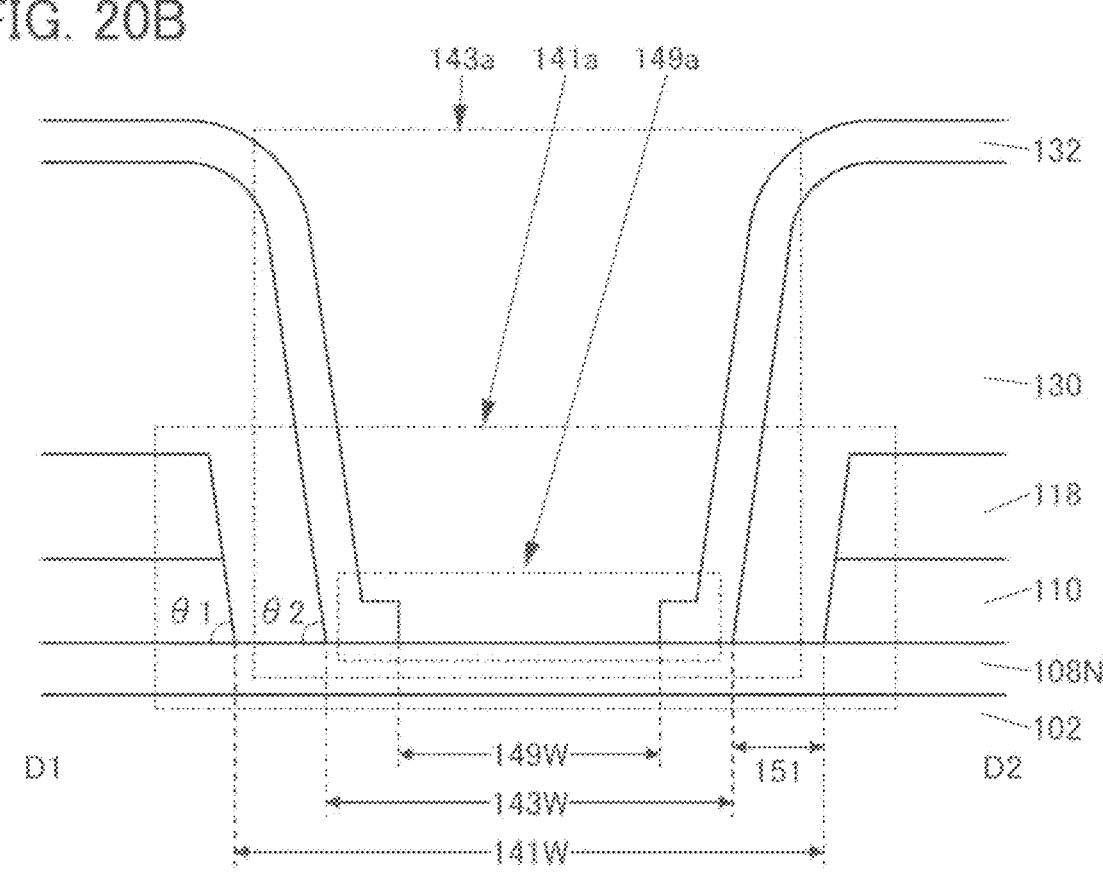

FIG. 20A and FIG. 20B are enlarged views of the opening 149a, the opening 143a, the opening 141a, and the vicinity thereof. FIG. 20A is a top view, and FIG. 20B corresponds to a cross-sectional view of a cut plane along the dashed-dotted line D1-D2 in FIG. 20A. Note that hatching is omitted in FIG. 20B to avoid complexity of the drawing.

On a given straight line crossing the opening 149a, the opening 143a, and the opening 141a, the value of the width 143W of the bottom portion of the opening 143a is preferably smaller than the value of the width 141W of the bottom portion of the opening 141a. The value of a width 149W of a bottom portion of the opening 149a is preferably smaller than the value of the width 143W of the bottom portion of the opening 143a.

The above description can be referred to for the angle θ1, the angle θ2, and the width 151; therefore, the detailed description thereof is omitted.

Manufacturing Method Example 1

A manufacturing method example of the transistor of one embodiment of the present invention will be described below. Here, description will be made using the transistor 100C illustrated in FIG. 13 as an example.

Note that thin films that form the semiconductor device (insulating films, semiconductor films, conductive films, and the like) can be formed by a sputtering method, a CVD method, a vacuum evaporation method, a PLD method, an ALD method, or the like. Examples of the CVD method include a PECVD method and a thermal CVD method. As an example of the thermal CVD method, an MOCVD method can be given.

The thin films that form the semiconductor device (insulating films, semiconductor films, conductive films, and the like) can be formed by a method such as spin coating, dipping, spray coating, ink-jetting, dispensing, screen printing, offset printing, a doctor knife, slit coating, roll coating, curtain coating, or knife coating.

When the thin films that form the semiconductor device are processed, a photolithography method or the like can be used for the processing. Besides, a nanoimprinting method, a sandblasting method, a lift-off method, or the like may be used for the processing of the thin films. Island-shaped thin films may be directly formed by a deposition method using a blocking mask such as a metal mask.

There are two typical examples of a photolithography method. In one of the methods, a resist mask is formed over a thin film that is to be processed, the thin film is processed by etching or the like, and then the resist mask is removed. In the other method, after a photosensitive thin film is deposited, exposure and development are performed, so that the thin film is processed into a desired shape.

For light used for exposure in a photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Furthermore, exposure may be performed by liquid immersion light exposure technique. Furthermore, as the light used for the exposure, extreme ultra-violet (EUV) light or X-rays may be used. Furthermore, instead of the light used for the exposure, an electron beam can also be used. It is preferable to use extreme ultra-violet light, X-rays, or an electron beam because extremely minute processing can be performed. Note that in the case of performing exposure by scanning of a beam such as an electron beam, a photomask is not needed.

For etching of the thin film, a dry etching method, a wet etching method, a sandblasting method, or the like can be used.

Cross sections of the transistor 100C in the channel length direction and the channel width direction at each stage in the manufacturing process are illustrated side by side in FIG. 21A to FIG. 24C.

[Formation of Conductive Layer 106]

Figure 21A:
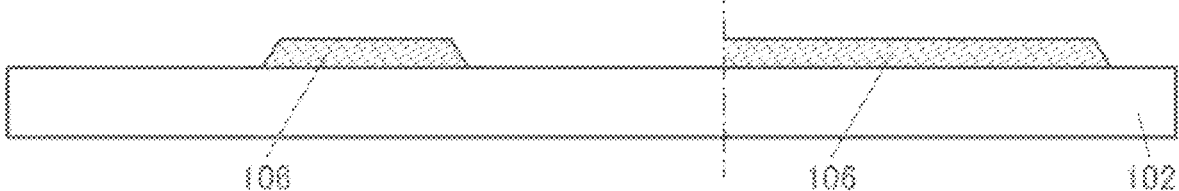
FIG. 21A to FIG. 21D are diagrams illustrating a method for manufacturing a transistor.

A conductive film is deposited over the substrate 102 and processed by etching, whereby the conductive layer 106 functioning as a gate electrode is formed (FIG. 21A).

At this time, as illustrated in FIG. 21A, the conductive layer 106 is preferably processed so as to have an end portion with a tapered shape. This can improve step coverage with the insulating layer 103 to be formed next.

When a conductive film containing copper is used as the conductive film to be the conductive layer 106, wiring resistance can be reduced. For example, a conductive film containing copper is preferably used in the case of a large display device or a display device with a high resolution. Even in the case where a conductive film containing copper is used as the conductive layer 106, diffusion of copper to the semiconductor layer 108 side can be suppressed by the insulating layer 103, whereby a highly reliable transistor can be obtained.

[Formation of Insulating Layer 103]

Figure 21B:
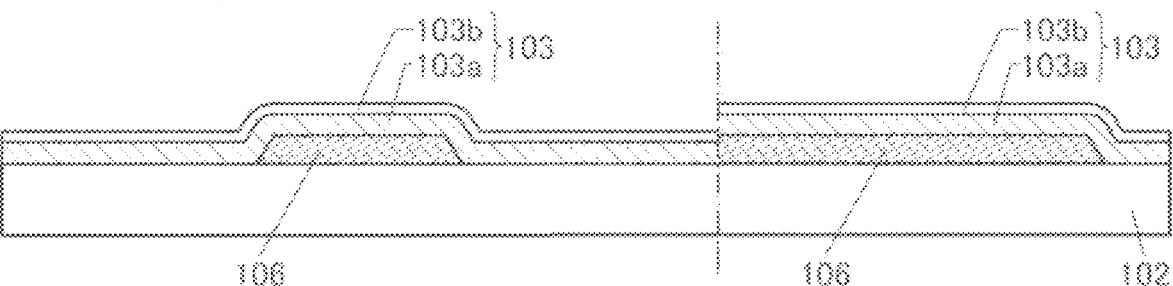

Next, the insulating layer 103 is formed to cover the substrate 102 and the conductive layer 106 (FIG. 21B). The insulating layer 103 can be formed by a PECVD method, an ALD method, a sputtering method, or the like.

Here, the insulating layer 103 is formed by stacking the insulating film 103a and the insulating film 103b. Specifically, each of the insulating films included in the insulating layer 103 is preferably formed by a PECVD method.

As the insulating film 103a, an insulating film containing nitrogen, such as a silicon nitride film, a silicon nitride oxide film, an aluminum nitride film, or a hafnium nitride film, can be used, for example. In particular, a dense silicon nitride film deposited with a PECVD apparatus is preferably used as the insulating film 103a. With the use of such an insulating film containing nitrogen, diffusion of impurities from the formation surface side can be suitably inhibited even when the thickness of the insulating film is small.

When an insulating film containing nitrogen is used as the insulating film 103a, a reduction in the amount of oxygen contained in the insulating film 103b and oxidation of the conductive layer 106 or the like due to diffusion of oxygen in the insulating film 103b to the conductive layer 106 or the like can be inhibited, for example.

The insulating film 103b in contact with the semiconductor layer 108 is preferably formed using an insulating film containing an oxide. It is particularly preferable that an oxide film be used as the insulating film 103b. As the insulating film 103b, it is preferable to use a dense insulating film in which impurities such as water are less likely to be adsorbed on the surface. In addition, as the insulating film 103b, it is preferable to use an insulating film which includes as few defects as possible and in which impurities containing hydrogen elements are reduced.

As the insulating film 103b, for example, an insulating film including one or more kinds of a silicon oxide film, a silicon oxynitride film, a silicon nitride oxide film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film can be used. It is particularly preferable to use a silicon oxide film or a silicon oxynitride film as the insulating film 103b.

The insulating film 103b preferably includes a region containing oxygen in excess of that in the stoichiometric composition. In other words, the insulating film 103b is preferably an insulating film capable of releasing oxygen by heating. It is also possible to supply oxygen into the insulating film 103b by forming the insulating film 103b in an oxygen-containing atmosphere, performing heat treatment on the deposited insulating film 103b in an oxygen-containing atmosphere, performing plasma treatment or the like on the deposited insulating film 103b in an oxygen-containing atmosphere, or depositing an oxide film over the insulating film 103b in an oxygen-containing atmosphere, for example. Note that an oxidizing gas may be used instead of oxygen or in addition to oxygen in each of the above treatments for supplying oxygen. Alternatively, heat treatment may be performed after an insulating film capable of releasing oxygen by heating is deposited over the insulating film 103b, so that oxygen may be supplied from the insulating film into the insulating film 103b. Alternatively, oxygen may be supplied to the insulating film 103b by a plasma ion doping method or an ion implantation method.

Here, the insulating film 103b is preferably formed to be thicker than the insulating film 103a. This increases the amount of oxygen that can be released from the insulating film 103b by heating and reduces the amount of hydrogen released from the insulating film 103a. Accordingly, a large amount of oxygen can be supplied to the semiconductor layer 108 formed later while supply of hydrogen thereto is inhibited, so that the transistor can have high reliability. The thickness of the insulating film 103b is preferably greater than or equal to twice and less than or equal to 50 times, further preferably greater than or equal to three times and less than or equal to 30 times, still further preferably greater than or equal to five times and less than or equal to 20 times, yet still further preferably greater than or equal to seven times and less than or equal to 15 times, typically approximately 10 times the thickness of the insulating film 103a.

Oxygen can be supplied into the insulating film 103b during formation of a metal oxide film to be the semiconductor layer 108 by a sputtering method in an oxygen-containing atmosphere. The formation of the metal oxide film to be the semiconductor layer may be followed by heat treatment. The heat treatment enables oxygen in the insulating film 103b to be supplied to the metal oxide film more effectively and can reduce oxygen vacancies in the metal oxide film.

In the case where the insulating layer 103 is formed with a PECVD apparatus, static electricity accumulated on the substrate 102 may be eliminated by performing plasma treatment in a treatment chamber with power lower than that in the formation of the insulating layer 103 after the formation of the insulating layer 103. The plasma treatment can be referred to as a static eliminating process. For the static eliminating process, an atmosphere containing one or more of nitrogen, dinitrogen monoxide, nitrogen dioxide, hydrogen, ammonia, and a rare gas can be used. For example, an argon gas atmosphere can be suitably used for the static eliminating process. A mixed gas containing the plurality of gases may be used for the static eliminating process.

A surface of the insulating layer 103 may be removed after the formation of the insulating layer 103. The static eliminating process sometimes causes defects on the surface of the insulating layer 103. If defects exist in the insulating layer 103 functioning as the first gate insulating layer of the transistor 100C, the defects become carrier trap sites and the reliability of the transistor 100C might be degraded. Thus, the surface of the insulating layer 103 including defects is removed, so that the reliability of the transistor 100C can be increased. For example, cleaning using a cleaning solution containing a hydrofluoric acid can be used to remove the surface of the insulating layer 103.

Heat treatment may be performed after the formation of the insulating layer 103. Heat treatment can reduce the number of defects included in the insulating layer 103. Impurities containing hydrogen elements contained in the insulating layer 103 can be reduced. Examples of the impurities containing hydrogen elements include hydrogen and water.

The heat treatment temperature is preferably higher than or equal to 150° C. and lower than the strain point of the substrate, further preferably higher than or equal to 250° C. and lower than or equal to 450° C., still further preferably higher than or equal to 300° C. and lower than or equal to 450° C. The heat treatment can be performed in an atmosphere containing one or more of a rare gas, nitrogen, and oxygen. As a nitrogen-containing atmosphere or an oxygen-containing atmosphere, clean dry air (CDA) may be used. Note that the content of hydrogen, water, or the like in the atmosphere is preferably as low as possible. As the atmosphere, a high-purity gas with a dew point of −60° C. or lower, preferably −100° C. or lower is preferably used. With the use of an atmosphere where the content of hydrogen, water, or the like is as low as possible, entry of hydrogen, water, or the like into the insulating layer 103 can be inhibited. An oven, a rapid thermal annealing (RTA) apparatus, or the like can be used for the heat treatment. The use of the RTA apparatus can shorten the heat treatment time.

The heat treatment may be performed after the surface of the insulating layer 103 is removed.

Next, treatment for supplying oxygen to the insulating layer 103 may be performed. As the oxygen supply treatment, an oxygen radical, an oxygen atom, an oxygen atomic ion, an oxygen molecular ion, or the like is supplied to the insulating layer 103 by an ion doping method, an ion implantation method, plasma treatment, or the like. Alternatively, a film that inhibits oxygen release may be formed over the insulating layer 103, and then oxygen may be added to the insulating layer 103 through the film. It is preferable to remove the film after addition of oxygen. As the above film that inhibits oxygen release, a conductive film or a semiconductor film containing one or more of indium, zinc, gallium, tin, aluminum, chromium, tantalum, titanium, molybdenum, nickel, iron, cobalt, and tungsten can be used.

[Formation of Semiconductor Layer 108]

Figure 21C:
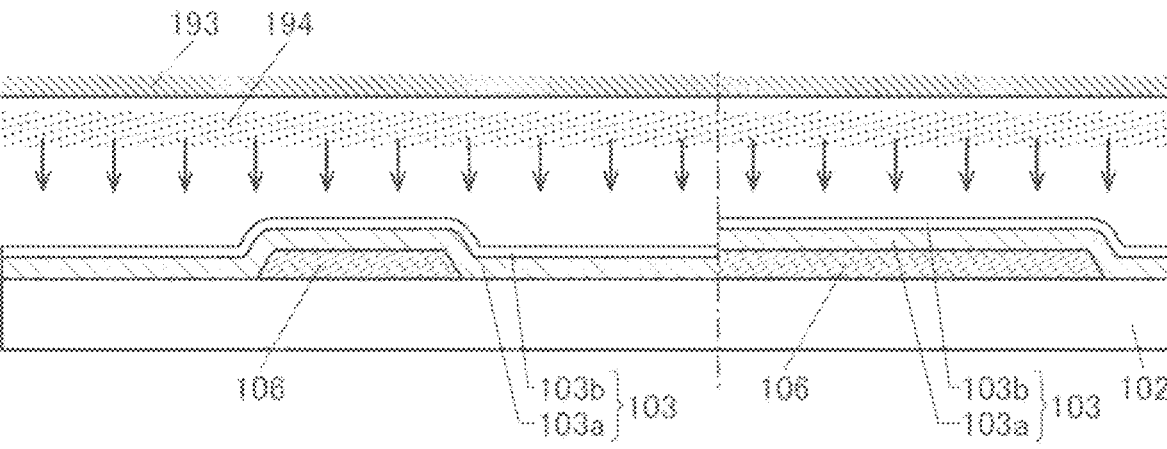
Figure 21D:
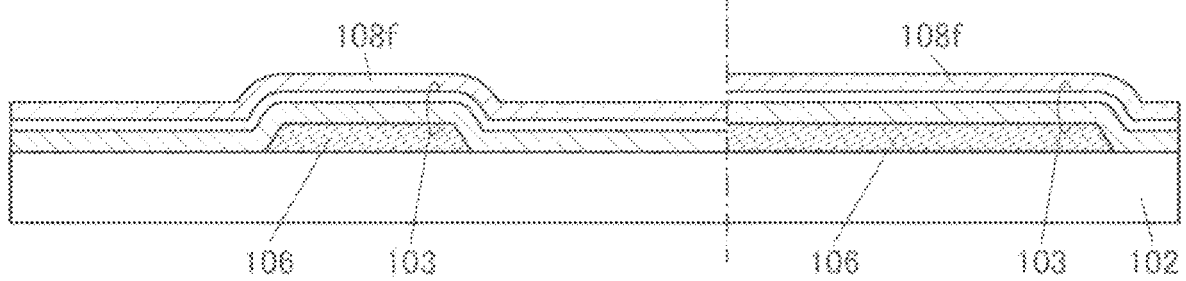

Next, a metal oxide film 108*f* is deposited over the insulating layer 103 (FIG. 21D).

The metal oxide film 108*f* is preferably formed by a sputtering method using a metal oxide target.

The metal oxide film 108*f* is preferably a dense film with as few defects as possible. The metal oxide film 108*f* is preferably a highly purified film in which impurities containing hydrogen elements are reduced as much as possible. It is particularly preferable to use a metal oxide film having crystallinity as the metal oxide film 108*f*.

In forming the metal oxide film 108*f*, an oxygen gas is preferably used. FIG. 21C is a schematic cross-sectional view of the inside of a sputtering apparatus at the time of forming the metal oxide film 108*f* over the insulating layer 103. In FIG. 21C, a target 193 placed inside the sputtering apparatus and plasma 194 formed under the target 193 are schematically illustrated. In the case of using an oxygen gas at the time of forming the metal oxide film 108*f*, oxygen can be suitably supplied into the insulating layer 103. For example, in the case of using an oxide for the insulating film 103*a*, oxygen can be suitably supplied into the insulating film 103*a*. Note that oxygen supplied to the insulating layer 103 is represented by arrows in FIG. 21C.

By the supply of oxygen to the insulating layer 103, oxygen is supplied to the semiconductor layer 108 in a later step, so that oxygen vacancies $V_O$ and $V_O$H in the semiconductor layer 108 can be reduced.

In depositing the metal oxide film, an inert gas (e.g., a helium gas, an argon gas, or a xenon gas) may be mixed in addition to the oxygen gas. Note that when the proportion of an oxygen gas in the whole deposition gas (hereinafter also referred to as an oxygen flow rate ratio) at the time of depositing the metal oxide film is higher, the crystallinity of the metal oxide film can be higher and a transistor with higher reliability can be obtained. By contrast, when the oxygen flow rate ratio is lower, the crystallinity of the metal oxide film is lower and a transistor with a high on-state current can be obtained.

In depositing the metal oxide film, as the substrate temperature becomes higher, a denser metal oxide film having higher crystallinity can be formed. On the other hand, as the substrate temperature becomes lower, a metal oxide film having lower crystallinity and higher electric conductivity can be formed.

The metal oxide film is formed under the deposition conditions where a substrate temperature is higher than or equal to room temperature and lower than or equal to 250° C., preferably higher than or equal to room temperature and lower than or equal to 200° C., further preferably higher than or equal to room temperature and lower than or equal to 140° C. For example, when the substrate temperature is higher than or equal to room temperature and lower than 140° C., high productivity is achieved, which is preferable. Furthermore, when the metal oxide film is deposited with the substrate temperature set at room temperature or without heating the substrate, the crystallinity can be made low.

It is preferable to perform at least one of treatment for desorbing water, hydrogen, an organic substance, and the like adsorbed onto the surface of the insulating layer 103 and treatment for supplying oxygen into the insulating layer 103 before the deposition of the metal oxide film 108*f*. For example, heat treatment can be performed at a temperature higher than or equal to 70° C. and lower than or equal to 200° C. in a reduced-pressure atmosphere. Alternatively, plasma treatment may be performed in an oxygen-containing atmosphere. Alternatively, oxygen may be supplied to the insulating layer 103 by plasma treatment in an atmosphere containing an oxidizing gas such as dinitrogen monoxide ($N_2O$). Performing plasma treatment containing a dinitrogen monoxide gas can supply oxygen to the insulating layer 103 while suitably removing an organic substance on the surface of the insulating layer 103. It is preferable that the metal oxide film 108*f* be deposited successively after such treatment, without exposure of the surface of the insulating layer 103 to the air.

Note that in the case where the semiconductor layer 108 has a stacked-layer structure in which a plurality of semiconductor layers are stacked, an upper metal oxide film is preferably deposited successively after deposition of a lower metal oxide film without exposure of the surface of the lower metal oxide layer to the air.

Next, the metal oxide film 108*f* is partly etched to form the island-shaped semiconductor layer 108 (FIG. 22A).

For processing of the metal oxide film 108*f*, either one or both of a wet etching method and a dry etching method are used. At this time, part of the insulating layer 103 that does not overlap with the semiconductor layer 108 is etched and thinned in some cases. For example, in some cases, the insulating film 103*b* of the insulating layer 103 is removed by etching and a surface of the insulating film 103*a* is exposed.

Here, it is preferable that heat treatment be performed after the metal oxide film 108*f* is deposited or the metal oxide film 108*f* is processed into the semiconductor layer 108. By the heat treatment, hydrogen or water contained in the metal oxide film 108*f* or the semiconductor layer 108 or adsorbed on the surface of the metal oxide film 108*f* or the semiconductor layer 108 can be removed. Furthermore, the film quality of the metal oxide film 108*f* or the semiconductor layer 108 is improved (e.g., the number of defects is reduced or crystallinity is increased) by the heat treatment in some cases.

Furthermore, oxygen can be supplied from the insulating layer 103 to the metal oxide film 108*f* or the semiconductor layer 108 by heat treatment. At this time, it is further preferable that the heat treatment be performed before the semiconductor film 108*f* is processed into the semiconductor layer 108.

The temperature of the heat treatment can be typically higher than or equal to 150° C. and lower than the strain point of the substrate, higher than or equal to 200° C. and lower than or equal to 500° C., higher than or equal to 250° C. and lower than or equal to 450° C., or higher than or equal to 300° C. and lower than or equal to 450° C.

The heat treatment can be performed in an atmosphere containing a rare gas or nitrogen. Alternatively, heating may be performed in the atmosphere, and then heating may be performed in an oxygen-containing atmosphere. Alternatively, heating may be performed in a dry air atmosphere. It is preferable that the atmosphere of the above heat treatment contain hydrogen, water, or the like as little as possible. An electric furnace, an RTA apparatus, or the like can be used for the heat treatment. The use of the RTA apparatus can shorten the heat treatment time.

Note that the heat treatment is not necessarily performed. The heat treatment is not performed in this step, and instead heat treatment performed in a later step may also serve as the heat treatment in this step. In some cases, treatment at a high temperature (e.g., deposition step) or the like in a later step can serve as the heat treatment in this step.

[Formation of Insulating Layer 110]

Next, the insulating layer 110 is formed to cover the insulating layer 103 and the semiconductor layer 108 (FIG. 22B).

Here, the insulating layer 110 is formed by stacking the insulating film 110a, the insulating film 110b, and the insulating film 110c.

In particular, each of the insulating films included in the insulating layer 110 is preferably formed by a PECVD method. For the method for forming each of the insulating layers included in the insulating layer 110, the description in Structure example 3 can be referred to.

It is preferable to perform plasma treatment on a surface of the semiconductor layer 108 before deposition of the gate insulating layer 110. By the plasma treatment, an impurity adsorbed onto the surface of the semiconductor layer 108, such as water, can be reduced. Therefore, impurities at the interface between the semiconductor layer 108 and the insulating layer 110 can be reduced, achieving a highly reliable transistor. The plasma treatment is particularly suitable in the case where the surface of the semiconductor layer 108 is exposed to the air after the formation of the semiconductor layer 108 and before the deposition of the gate insulating layer 110. For example, plasma treatment can be performed in an atmosphere containing oxygen, ozone, nitrogen, dinitrogen monoxide, argon, or the like. The plasma treatment and the deposition of the insulating layer 110 are preferably performed successively without exposure to the air.

After the insulating layer 110 is deposited, heat treatment is preferably performed. By the heat treatment, hydrogen or water contained in the insulating layer 110 or adsorbed on its surface can be removed. At the same time, the number of defects in the insulating layer 110 can be reduced.

For the conditions of the heat treatment, the above description can be referred to.

Note that the heat treatment is not necessarily performed. The heat treatment is not performed in this step, and instead heat treatment performed in a later step may also serve as the heat treatment in this step. In some cases, treatment at a high temperature (e.g., deposition step) or the like in a later step can serve as the heat treatment in this step.

[Formation of Opening 142]

Next, the insulating layer 110 and the insulating layer 103 are partly etched to form the opening 142 that reaches the conductive layer 106 (FIG. 22C). Accordingly, the conductive layer 112 to be formed later can be electrically connected to the conductive layer 106 through the opening 142.

[Formation of Conductive Layer 112]

Next, a conductive film 112f to be the conductive layer 112 is deposited over the insulating layer 110 (FIG. 22D).

A low-resistance metal or alloy material is preferably used for the conductive film 112f. It is preferable that the conductive film 112f be formed using a material from which hydrogen is less likely to be released and in which hydrogen is less likely to be diffused. Furthermore, a material that is less likely to be oxidized is preferably used for the conductive film 112f.

For example, the conductive film 112f is preferably deposited by a sputtering method using a sputtering target containing a metal or an alloy.

For example, the conductive film 112f is preferably a stacked-layer film including a low-resistance conductive film and a conductive film which is less likely to be oxidized and in which hydrogen is less likely to be diffused.

Figure 23A:
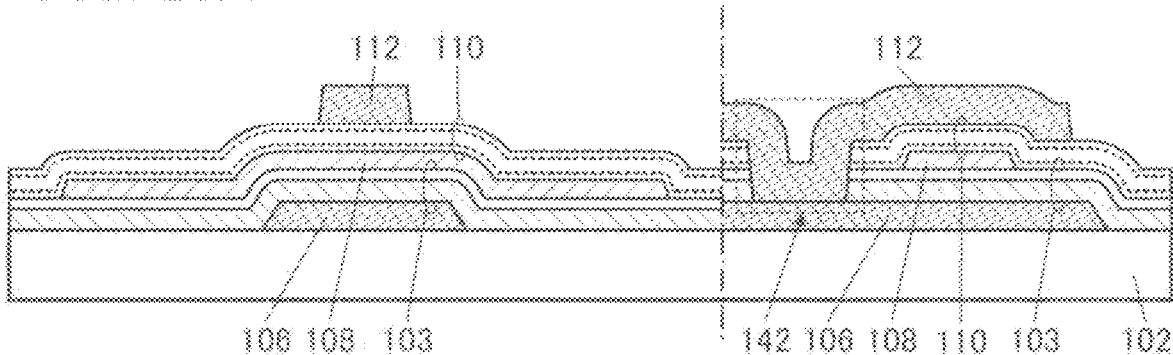
FIG. 23A to FIG. 23C are diagrams illustrating a method for manufacturing a transistor.

Next, the conductive film 112f is partly etched to form the conductive layer 112 (FIG. 23A). For processing of the conductive film 112f, either one or both of a wet etching method and a dry etching method are used.

As described above, the insulating layer 110 is not etched and covers the top surface and the side surface of the semiconductor layer 108 and the insulating layer 103, which prevents the semiconductor layer 108 and the insulating layer 103 from being partly etched and thinned in etching the conductive film 112f or the like.

[Treatment for Supplying Impurity Element]

Figure 23B:
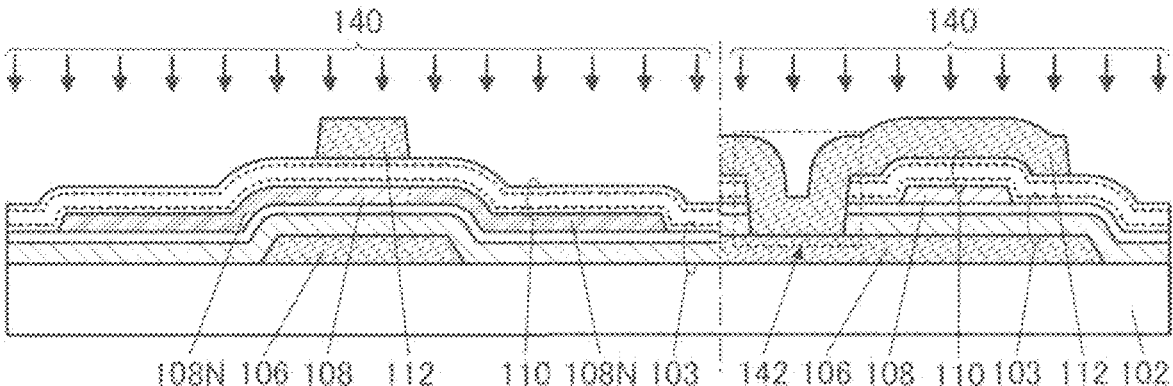

Next, treatment for supplying (adding or injecting) an impurity element 140 to the semiconductor layer 108 through the insulating layer 110 is performed with the use of the conductive layer 112 as a mask (FIG. 23B). Thus, the low-resistance regions 108N can be formed in regions of the semiconductor layer 108 that are not covered with the conductive layer 112. At this time, the conditions of the treatment for supplying the impurity element 140 are preferably determined in consideration of the material and thickness of the conductive layer 112 serving as the mask and the like so that the impurity element 140 is supplied as little as possible to the region of the semiconductor layer 108 overlapping with the conductive layer 112. In this manner, a channel formation region with a sufficiently reduced impurity concentration can be formed in the region of the semiconductor layer 108 overlapping with the conductive layer 112.

A plasma ion doping method or an ion implantation method can be suitably used for the supply of the impurity element 140. In these methods, the concentration profile in the depth direction can be controlled with high accuracy by the acceleration voltage and the dosage of ions, or the like. The use of a plasma ion doping method can increase productivity. In addition, the use of an ion implantation method with mass separation can increase the purity of an impurity element to be supplied.

In the treatment for supplying the impurity element 140, treatment conditions are preferably controlled such that the concentration is the highest at an interface between the semiconductor layer 108 and the insulating layer 110, a portion in the semiconductor layer 108 near the interface, or a portion in the insulating layer 110 near the interface. Accordingly, the impurity element 140 at an optimal concentration can be supplied to both the semiconductor layer 108 and the insulating layer 110 in one treatment.

Examples of the impurity element 140 include hydrogen, boron, carbon, nitrogen, fluorine, phosphorus, sulfur, arsenic, aluminum, magnesium, silicon, and a rare gas. Note that typical examples of a rare gas include helium, neon, argon, krypton, and xenon. It is particularly preferable to use boron, phosphorus, aluminum, magnesium, or silicon.

As a source gas of the impurity element 140, a gas containing any of the above impurity elements can be used. In the case where boron is supplied, typically, one or more of a $B_2H_6$ gas and a $BF_3$ gas can be used. In the case where phosphorus is supplied, typically, a $PH_3$ gas can be used. A mixed gas in which any of these source gases is diluted with a rare gas may be used.

Besides, any of $CH_4$, $N_2$, $NH_3$, $AlH_3$, $AlCl_3$, $SiH_4$, $Si_2H_6$, $F_2$, HF, $H_2$, $(C_5H_5)_2Mg$, a rare gas, and the like can be used as the source gas. An ion source is not limited to a gas, and a solid or a liquid that is vaporized by heating may be used.

Addition of the impurity element 140 can be controlled by setting the conditions such as the acceleration voltage and the dosage in consideration of the compositions, densities, thicknesses, and the like of the insulating layer 110 and the semiconductor layer 108.

For example, in the case where boron is added by an ion implantation method or a plasma ion doping method, the acceleration voltage can be, for example, higher than or equal to 5 kV and lower than or equal to 100 kV, preferably higher than or equal to 7 kV and lower than or equal to 70 kV, further preferably higher than or equal to 10 kV and lower than or equal to 50 kV. The dosage can be, for example, greater than or equal to $1\times10^{13}$ ions/cm$^2$ and less than or equal to $1\times10^{17}$ ions/cm$^2$, preferably greater than or equal to $1\times10^{14}$ ions/cm$^2$ and less than or equal to $5\times10^{16}$ ions/cm$^2$, further preferably greater than or equal to $1\times10^{15}$ ions/cm$^2$ and less than or equal to $3\times10^{16}$ ions/cm$^2$.

In the case where phosphorus ions are added by an ion implantation method or a plasma ion doping method, the acceleration voltage can be, for example, higher than or equal to 10 kV and lower than or equal to 100 kV, preferably higher than or equal to 30 kV and lower than or equal to 90 kV, further preferably higher than or equal to 40 kV and lower than or equal to 80 kV. The dosage can be, for example, greater than or equal to $1\times10^{13}$ ions/cm$^2$ and less than or equal to $1\times10^{17}$ ions/cm$^2$, preferably greater than or equal to $1\times10^{14}$ ions/cm$^2$ and less than or equal to $5\times10^{16}$ ions/cm$^2$, further preferably greater than or equal to $1\times10^{15}$ ions/cm$^2$ and less than or equal to $3\times10^{16}$ ions/cm$^2$.

Note that a method for supplying the impurity element 140 is not limited thereto; plasma treatment, treatment using thermal diffusion by heating, or the like may be used, for example. In a plasma treatment method, plasma is generated in a gas atmosphere containing an impurity element to be added and plasma treatment is performed, so that the impurity element can be added. A dry etching apparatus, an ashing apparatus, a plasma CVD apparatus, a high-density plasma CVD apparatus, or the like can be used as an apparatus for generating the plasma.

For example, when plasma treatment is performed with a plasma CVD apparatus in an atmosphere containing a hydrogen gas, hydrogen can be supplied as the impurity element 140 to the semiconductor layer 108 in a region that does not overlap with the conductive layer 112. With the use of a plasma CVD apparatus for the treatment for supplying the impurity element 140 and the formation of the insulating layer 118, the treatment for supplying the impurity element 140 and the formation of the insulating layer 118 can be successively performed in the apparatus, so that the productivity can be increased.

In one embodiment of the present invention, the impurity element 140 can be supplied to the semiconductor layer 108 through the insulating layer 110. Thus, even in the case where the semiconductor layer 108 has crystallinity, damage to the semiconductor layer 108 is reduced at the time of supplying the impurity element 140, and degradation of crystallinity can be inhibited. Therefore, this is suitable for the case where a reduction in crystallinity increases electrical resistance.

[Formation of Insulating Layer 118]

Figure 23C:
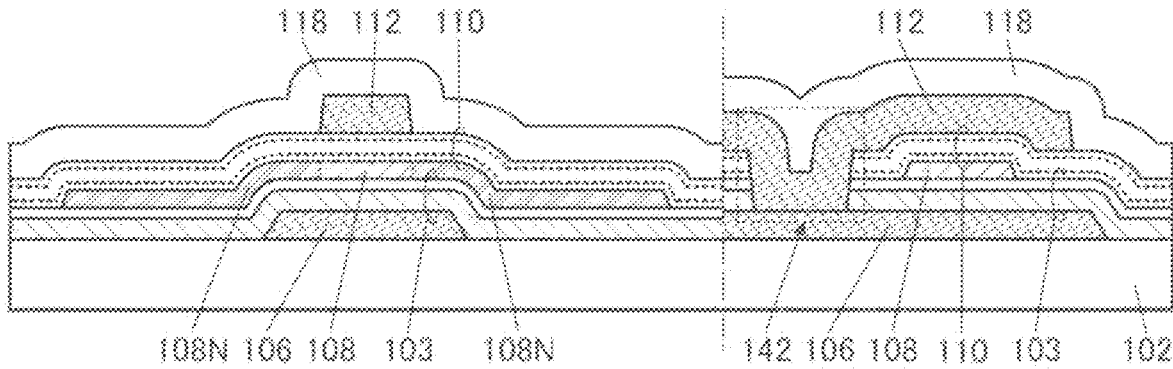

Next, the insulating layer 118 is formed to cover the insulating layer 110 and the conductive layer 112 (FIG. 23C).

In the case where the deposition temperature of the insulating layer 118 is too high, impurities contained in the low-resistance region 108N and the like might be diffused into a surrounding portion including the channel formation region of the semiconductor layer 108 or the electric resistance of the low-resistance region 108N might be increased. Thus, the deposition temperature of the insulating layer 118 is determined in consideration of these.

The deposition temperature of the insulating layer 118 is preferably higher than or equal to 150° C. and lower than or equal to 400° C., further preferably higher than or equal to 180° C. and lower than or equal to 360° C., still further preferably higher than or equal to 200° C. and lower than or equal to 250° C., for example. Deposition of the insulating layer 118 at low temperatures enables the transistor to have favorable electrical characteristics even when it has a short channel length.

Heat treatment may be performed after the formation of the insulating layer 118. The heat treatment can allow the low-resistance region 108N to have low resistance more stably, in some cases. For example, by the heat treatment, the impurity element 140 diffuses moderately and homogenized locally, so that the low-resistance region 108N having an ideal concentration gradient of the impurity element can be formed. Note that when the temperature of the heat treatment is too high (e.g., higher than or equal to 500° C.), the impurity element 140 is also diffused into the channel formation region, so that the electrical characteristics or reliability of the transistor might be degraded.

For the conditions of the heat treatment, the above description can be referred to.

Note that the heat treatment is not necessarily performed. The heat treatment is not necessarily performed in this step, and heat treatment performed in a later step may also serve as the heat treatment in this step. In the case where treatment at a high temperature is performed (e.g., deposition step) in a later step, such treatment can serve as the heat treatment in this step in some cases.

[Formation of Opening 141a and Opening 141b]

Figure 24A:
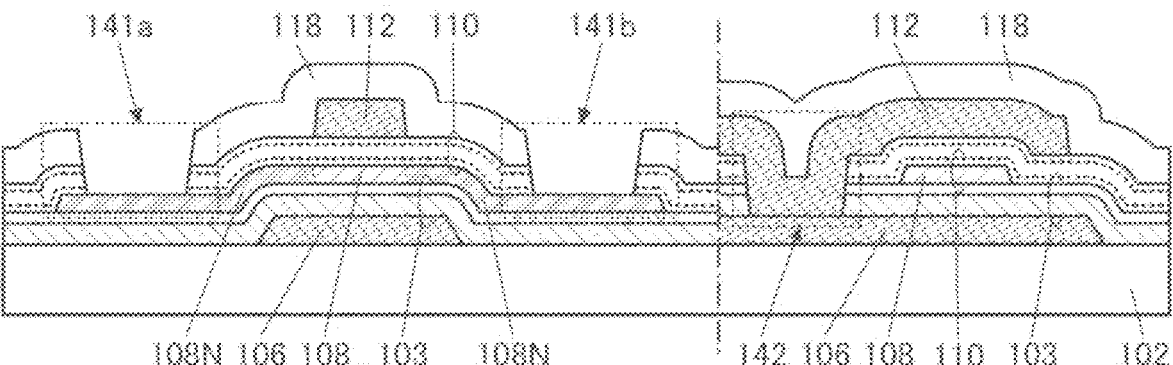
FIG. 24A to FIG. 24C are diagrams illustrating a method for manufacturing a transistor.

Next, the insulating layer 118 and the insulating layer 110 are partly etched to form the opening 141a and the opening 141b that reach the low-resistance regions 108N (FIG. 24A).

[Formation of Insulating Layer 130]

Figure 24B:
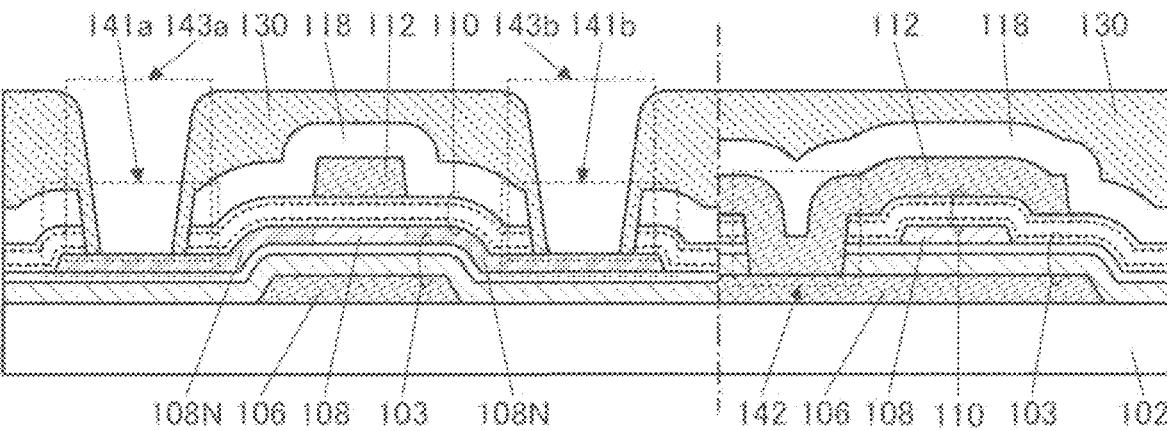

Next, the insulating layer 130 is formed over the insulating layer 118 to cover the opening 141a and the opening 141b (FIG. 24B).

The insulating layer 130 includes the opening 143a and the opening 143b, and the insulating layer 130 is formed so that the opening 143a is positioned inside the opening 141a and the opening 143b is positioned inside the opening 141b.

For example, when a photosensitive organic material is used for the insulating layer 130, the insulating layer 130 can be formed in the following manner: a composition containing an organic material is applied by a spin coating method, and then the composition is subjected to selective light exposure and development. As another formation method, one or more of a sputtering method, an evaporation method, a droplet discharging method (an inkjet method), a screen printing method, and an offset printing method may be used.

Here, after the insulating layer 130 is formed, heat treatment is preferably performed. In the case where an organic material is used for the insulating layer 130, the heat treatment can cure the organic material.

The temperature of the heat treatment is preferably lower than the heat resistant temperature of the organic material. For example, the temperature of the heat treatment is preferably higher than or equal to 150° C. and lower than or equal to 350° C., further preferably higher than or equal to 180° C. and lower than or equal to 300° C., still further preferably higher than or equal to 200° C. and lower than or equal to 270° C., yet further preferably higher than or equal to 200° C. and lower than or equal to 250° C., yet still further preferably higher than or equal to 220° C. and lower than or equal to 250° C.

The heat treatment can be performed in an atmosphere containing a rare gas or nitrogen. Alternatively, heating may be performed in a dry air atmosphere. It is preferable that the atmosphere of the above heat treatment contain hydrogen, water, or the like as little as possible. An electric furnace, an RTA apparatus, or the like can be used for the heat treatment.

[Formation of Conductive Layer 120a and Conductive Layer 120b]

Figure 24C:
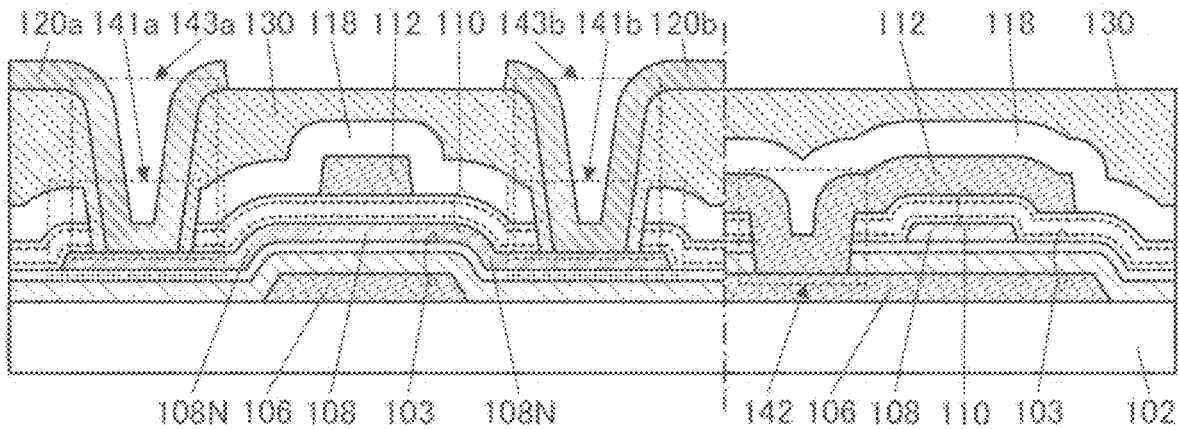

Next, a conductive film is deposited over the insulating layer 130 to cover the opening 143a and the opening 143b, and the conductive film is processed into a desired shape, so that the conductive layer 120a and the conductive layer 120b are formed (FIG. 24C).

Through the above steps, the transistor 100A can be manufactured. In the case where the transistor 100C is used in a pixel of a display device, for example, this process may be followed by a step of forming one or more of a protective insulating layer, a planarization layer, a pixel electrode, and a wiring.

The above is the description of Manufacturing method example 1.

Note that in the case of manufacturing the transistor 100 described in Structure example 1, the step of forming the conductive layer 106, the step of forming the insulating layer 103, and the step of forming the opening 142 in Manufacturing method example 1 are omitted. The transistor 100 and the transistor 100C can be formed over one substrate through the same process.

Manufacturing Method Example 2

A method for manufacturing the transistor 100D illustrated in FIG. 14A and FIG. 14B will be described. Note that description of the same portions as the above is omitted and different portions will be described.

Note that description of the same portions as those in Manufacturing method example 1 is omitted and different portions will be described in detail.

First, as in Manufacturing method example 1, the steps up to the formation of the insulating layer 110 are performed (FIG. 22B). The above description can be referred to for the steps up to the formation of the insulating layer 110; thus, the detailed description thereof is omitted.

[Formation of Metal Oxide Film 114f]

Figure 25A:
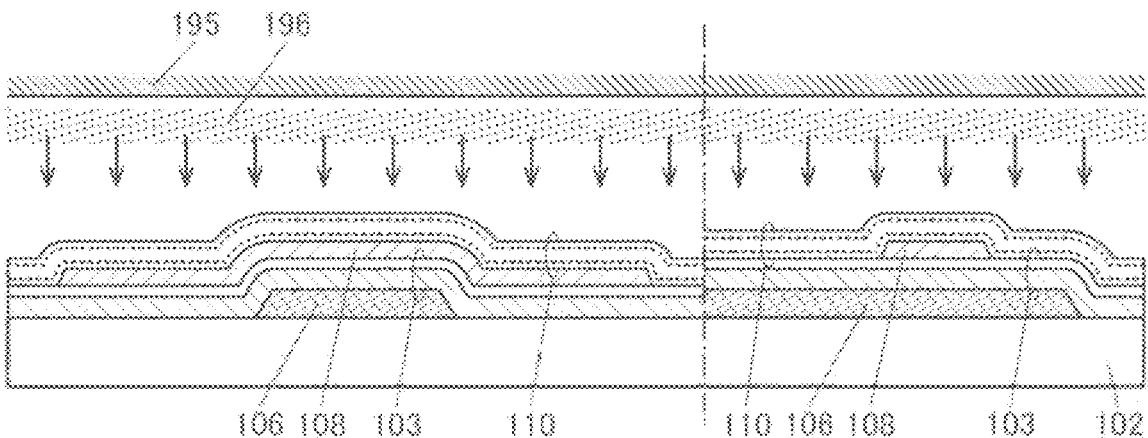
FIG. 25A to FIG. 25D are diagrams illustrating a method for manufacturing a transistor.
Figure 25B:
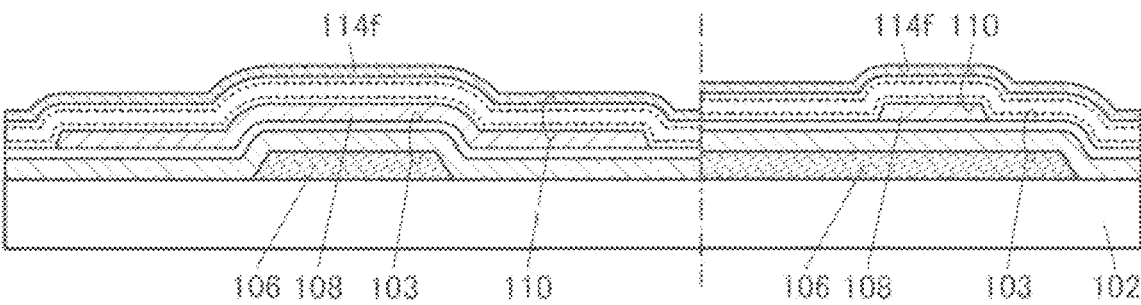

Next, a metal oxide film 114f is formed over the insulating layer 110 (FIG. 25B).

The metal oxide film 114f is preferably deposited in an oxygen-containing atmosphere, for example. It is particularly preferable to form the metal oxide film 114f by a sputtering method in an oxygen-containing atmosphere. FIG. 25A is a schematic cross-sectional view of the inside of a sputtering apparatus at the time of forming the metal oxide film 114f over the insulating layer 110. In FIG. 25A, a target 195 placed inside the sputtering apparatus and plasma 196 formed under the target 195 are schematically illustrated. In the case of using an oxygen gas at the time of forming the metal oxide film 114f, oxygen can be suitably supplied into the insulating layer 110. Note that oxygen supplied to the insulating layer 110 is represented by arrows in FIG. 25A.

By the supply of oxygen to the insulating layer 110, oxygen is supplied to the semiconductor layer 108 in a later step, so that oxygen vacancies $V_O$ and $V_O H$ in the semiconductor layer 108 can be reduced.

The above description can be referred to for the case where the metal oxide film 114f is formed by a sputtering method using an oxide target containing a metal oxide as in the case of the semiconductor layer 108.

For example, as deposition conditions of the metal oxide film 114f, a metal oxide film may be formed by a reactive sputtering method with a metal target using oxygen as a deposition gas. When aluminum is used for the metal target, for example, an aluminum oxide film can be deposited.

At the time of depositing the metal oxide film 114f, the amount of oxygen supplied into the insulating layer 110 can be increased with a higher proportion of the oxygen flow rate to the total flow rate of the deposition gas introduced into a deposition chamber of a deposition apparatus (a higher oxygen flow rate ratio) or with higher oxygen partial pressure in the deposition chamber. The oxygen flow rate ratio or the oxygen partial pressure is, for example, higher than or equal to 50% and lower than or equal to 100%, preferably higher than or equal to 65% and lower than or equal to 100%, further preferably higher than or equal to 80% and lower than or equal to 100%, still further preferably higher than or equal to 90% and lower than or equal to 100%. It is particularly preferable that the oxygen flow rate ratio be 100% and the oxygen partial pressure in the deposition chamber be as close to 100% as possible.

When the metal oxide film 114f is formed by a sputtering method in an oxygen-containing atmosphere in the above manner, oxygen can be supplied to the insulating layer 110 and release of oxygen from the insulating layer 110 can be prevented during the deposition of the metal oxide film 114f. As a result, a large amount of oxygen can be enclosed in the insulating layer 110.

After the deposition of the metal oxide film 114f, heat treatment is preferably performed. By the heat treatment, oxygen contained in the insulating layer 110 can be supplied to the semiconductor layer 108. When the heat treatment is performed while the metal oxide film 114f covers the insulating layer 110, oxygen can be prevented from being released from the insulating layer 110 to the outside, and a large amount of oxygen can be supplied to the semiconductor layer 108. Thus, the amount of oxygen vacancies in the semiconductor layer 108 can be reduced, leading to a highly reliable transistor.

For the conditions of the heat treatment, the above description can be referred to.

Note that the heat treatment is not necessarily performed. The heat treatment is not performed in this step, and instead heat treatment performed in a later step may also serve as the heat treatment in this step. In some cases, treatment at a high temperature (e.g., deposition step) or the like in a later step can serve as the heat treatment in this step.

After the deposition of the metal oxide film 114f or the heat treatment, the metal oxide film 114f may be removed.

[Formation of Opening 142]

Figure 25C:
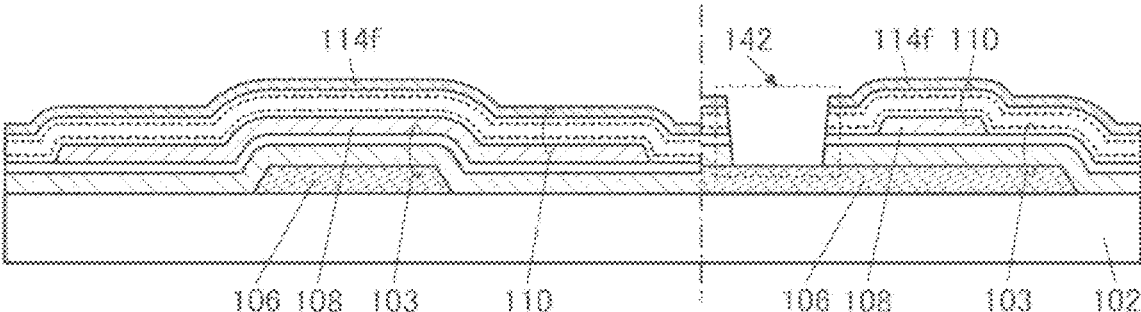

Next, the metal oxide film 114f, the insulating layer 110, and the insulating layer 103 are partly etched to form the opening 142 that reaches the conductive layer 106 (FIG. 25C).

[Formation of Conductive Layer 112]

Figure 25D:
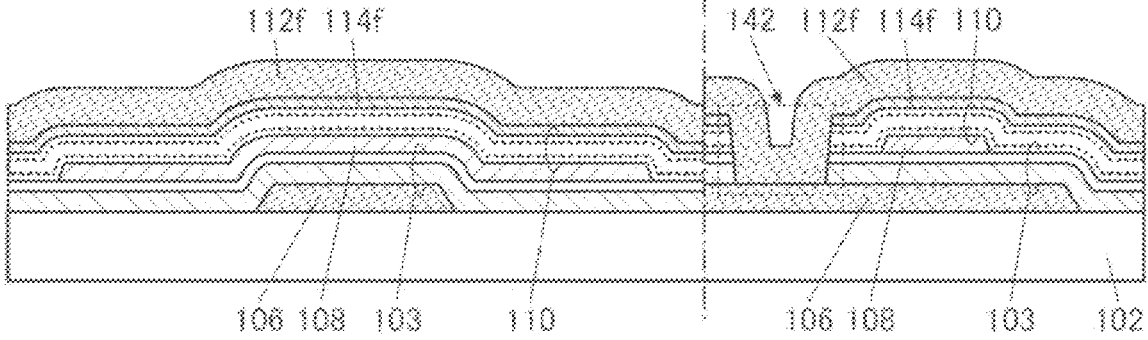

Next, the conductive film 112f to be the conductive layer 112 is deposited over the metal oxide film 114f (FIG. 25D). The above description can be referred to for the conductive film 112f; thus, the detailed description thereof is omitted.

Figures 26A, 26B, 26C:
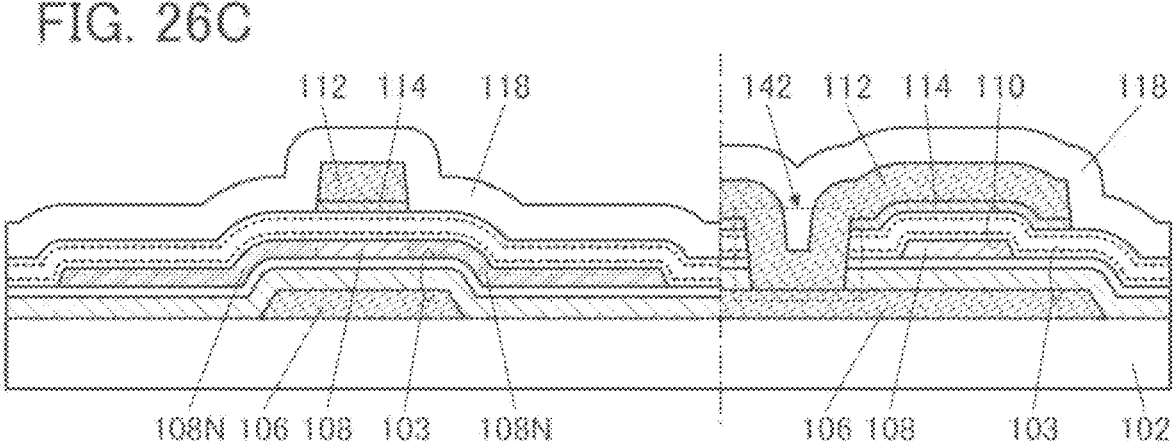
FIG. 26A to FIG. 26C are diagrams illustrating a method for manufacturing a transistor.

Next, the conductive film 112f and the metal oxide film 114f are partly etched to form the conductive layer 112 and the metal oxide layer 114 (FIG. 26A). The conductive film 112f and the metal oxide film 114f are preferably processed using the same resist mask. Alternatively, the metal oxide film 114f may be etched using the conductive layer 112 after etching as a hard mask.

In particular, a wet etching method is preferably employed for etching the conductive film 112f and the metal oxide film 114f.

In such a manner, the conductive layer 112 and the metal oxide layer 114 that have substantially the same top surface shapes can be formed.

[Treatment for Supplying Impurity Element]

Next, treatment for supplying (also referred to as "adding" or "injecting") the impurity element 140 to the semiconductor layer 108 through the insulating layer 110 is performed with the use of the conductive layer 112 as a mask (FIG. 26B). Thus, the low-resistance region 108N can be formed in a region of the semiconductor layer 108 that is not covered with the conductive layer 112. The above description can be referred to for the treatment for supplying the impurity element; thus, the detailed description thereof is omitted.

[Formation of insulating layer 118]

Next, the insulating layer 118 is formed to cover the insulating layer 110, the metal oxide layer 114, and the conductive layer 112 (FIG. 26C). The above description can be referred to for the formation of the insulating layer 118; thus, the detailed description thereof is omitted.

Heat treatment may be performed after the formation of the insulating layer 118. The above description can be referred to for the heat treatment; thus, the detailed description thereof is omitted.

[Formation of Opening 141a and Opening 141b]

Figure 27A:
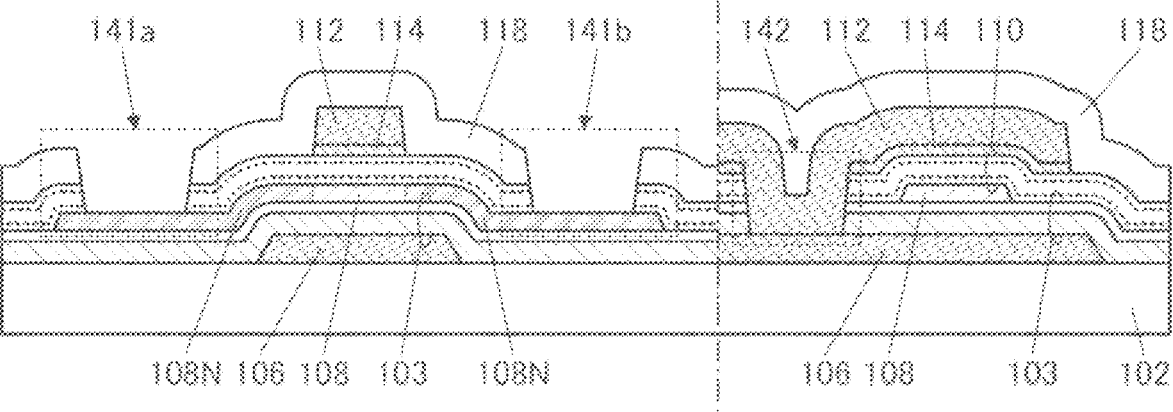
FIG. 27A to FIG. 27C are diagrams illustrating a method for manufacturing a transistor.

Next, the insulating layer 118 and the insulating layer 110 are partly etched to form the opening 141a and the opening 141b that reach the low-resistance regions 108N (FIG. 27A).

[Formation of Insulating Layer 130]

Figure 27B:
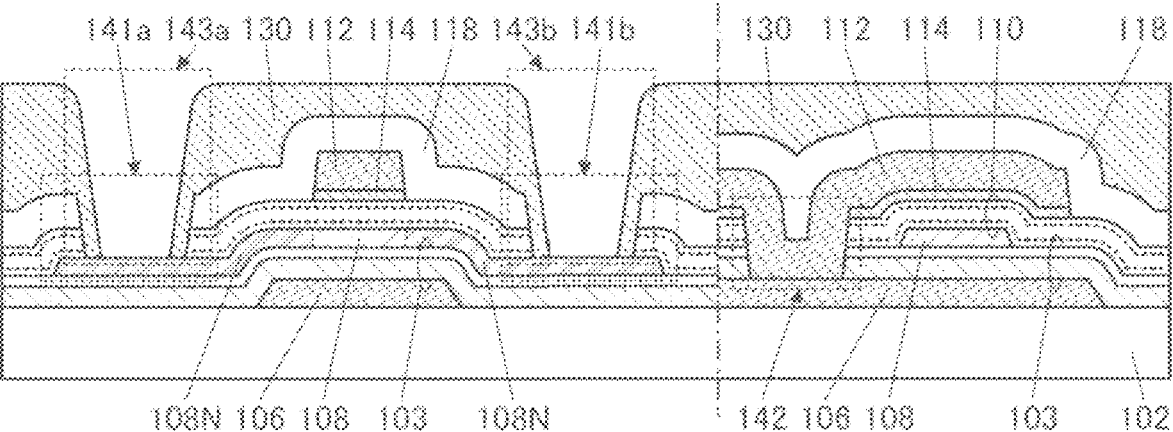

Next, the insulating layer 130 is formed over the insulating layer 118 to cover the opening 141a and the opening 141b (FIG. 27B). The above description can be referred to for the formation of the insulating layer 130; thus, the detailed description thereof is omitted.

[Formation of Conductive Layer 120a and Conductive Layer 120b]

Figure 27C:
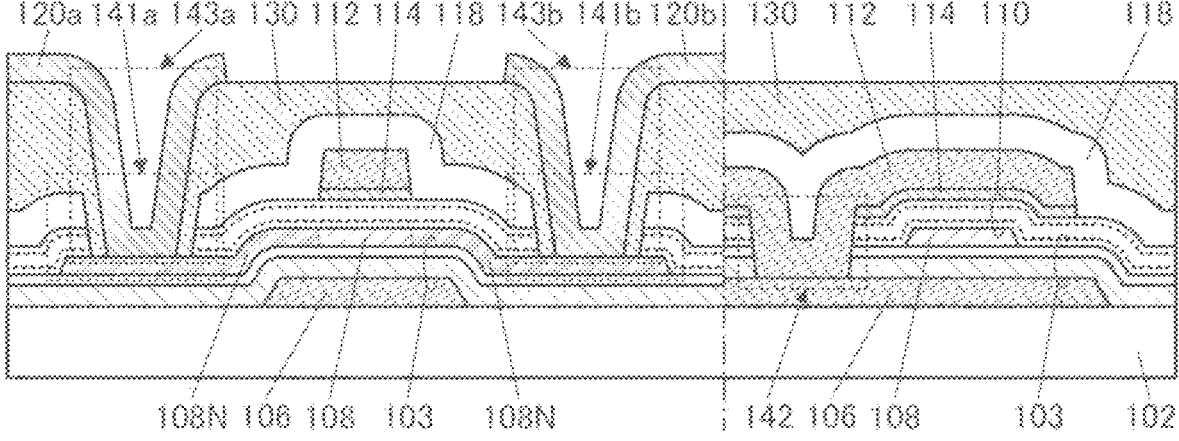

Next, a conductive film is deposited over the insulating layer 130 to cover the opening 143a and the opening 143b, and the conductive film is processed into a desired shape, so that the conductive layer 120a and the conductive layer 120b are formed (FIG. 27C).

Through the above steps, the transistor 100D can be manufactured.

Manufacturing Method Example 3

A manufacturing method of the transistor 100G illustrated in FIG. 17A and FIG. 17B will be described. Note that description of the same portions as the above is omitted and different portions will be described.

First, as in Manufacturing method example 1, the steps up to the formation of the conductive film 112f are performed (FIG. 22D). The above description can be referred to for the steps up to the formation of the conductive film 112f; thus, the detailed description thereof is omitted.

Figure 28A:
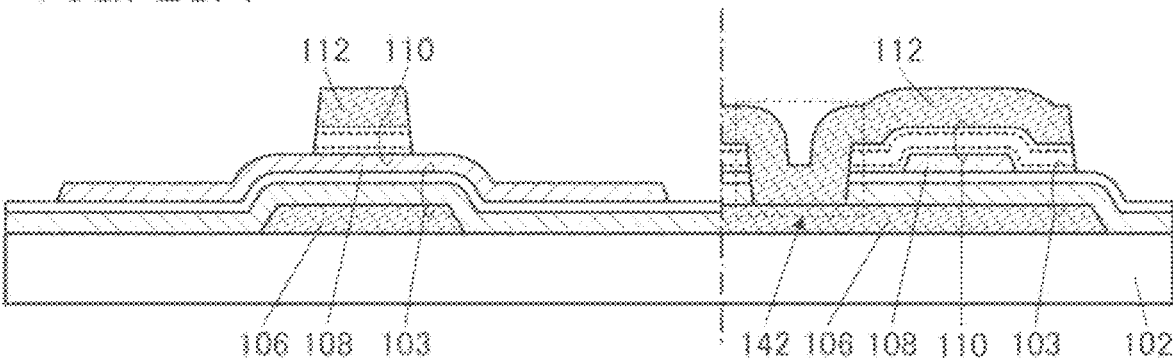
FIG. 28A to FIG. 28C are diagrams illustrating a method for manufacturing a transistor.

Next, the conductive film 112f is partly etched to form the conductive layer 112, and the insulating layer 110 is partly etched so that part of the semiconductor layer 108 is exposed (FIG. 28A). In such a manner, the conductive layer 112 and the insulating layer 110 that have substantially the same top surface shapes can be formed.

The insulating layer 110 is preferably etched using a resist mask for etching the conductive film 112f. The insulating layer 110 may be etched in the same step as the conductive film 112f, or may be etched by a different etching method after the conductive film 112f is etched.

For example, the conductive film 112f is etched by a wet etching method, and then the insulating layer 110 can be etched by a dry etching method. In particular, when the conductive film 112f is processed by a dry etching method, a generated reaction product containing a metal might lead to the contamination of the semiconductor layer 108 or the insulating layer 110. Thus, before the insulating layer 110 is etched, the conductive film 112f is preferably processed by a wet etching method.

Depending on the etching conditions, end portions of the conductive layer 112 and the insulating layer 110 are not aligned with each other in some cases. For example, the end portion of the conductive layer 112 is positioned inward or outward the end portion of the insulating layer 110 in some cases.

In etching the insulating layer 110, part of the exposed semiconductor layer 108 is etched and thus thinned in some cases. In that case, the semiconductor layer 108 has a shape in which the low-resistance region 108N is thinner than the channel formation region.

In etching the insulating layer 110, part of the insulating layer 103 that is not covered with the semiconductor layer 108 is etched and thus thinned in some cases. For example, the insulating film 103b in a region that is not covered with the semiconductor layer 108 might be removed.

[Formation of Insulating Layer 116 and Insulating Layer 118]

Figure 28B:
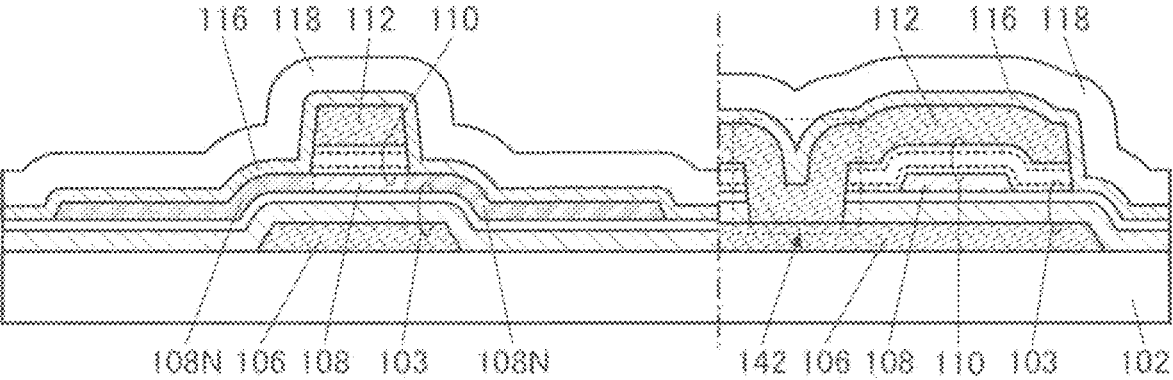

Next, the insulating layer 116 is formed in contact with the exposed portion of the semiconductor layer 108, and the insulating layer 118 is subsequently formed (FIG. 28B). By the formation of the insulating layer 116, the resistance of the exposed portion of the semiconductor layer 108 is reduced, so that the low-resistance region 108N is formed.

As the insulating layer 116, an insulating film that releases an impurity element having a function of reducing the resistance of the semiconductor layer 108 can be used. In particular, an inorganic insulating film that can release hydrogen, such as a silicon nitride film, a silicon nitride oxide film, or a silicon oxynitride film, is preferably used. Here, a plasma CVD method using a deposition gas containing hydrogen is preferably used because hydrogen can be supplied to the semiconductor layer 108 at the time of depositing of the insulating layer 116.

In the case where silicon nitride is used for the insulating layer 116, the insulating layer 116 is preferably formed by a PECVD method using a mixed gas of a gas containing silicon, such as silane, and a gas containing nitrogen as a deposition gas. In this case, it is preferable that the deposited silicon nitride contain hydrogen. Thus, hydrogen in the insulating layer 116 is diffused into the semiconductor layer 108, whereby the resistance of part of the semiconductor layer 108 can be easily reduced. Note that examples of the gas containing nitrogen include ammonia and dinitrogen monoxide.

Alternatively, an insulating film having a function of generating oxygen vacancies in the semiconductor layer 108 can be used as the insulating layer 116. It is particularly preferable to use an insulating film containing a metal nitride. For example, it is preferable to form the insulating layer 116 by a reactive sputtering method using a sputtering target containing a metal and, as a deposition gas, a mixed gas of a nitrogen gas and a rare gas or the like that is a dilution gas. Thus, the film quality of the insulating layer 116 can be easily controlled by controlling the flow rate ratio of the deposition gas.

In the case where an aluminum nitride film formed by reactive sputtering using an aluminum target is used as the insulating layer 116, the flow rate of a nitrogen gas to the total flow rate of the deposition gas is preferably higher than or equal to 30% and lower than or equal to 100%, further preferably higher than or equal to 40% and lower than or equal to 100%, still further preferably higher than or equal to 50% and lower than or equal to 100%.

Here, the insulating layer 116 and the insulating layer 118 are preferably deposited successively without exposure to the air.

In the case where the insulating layer 118 is provided in contact with the semiconductor layer 108, the above step of forming the insulating layer 116 is omitted.

Heat treatment may be performed after the deposition of the insulating layer 116 or the deposition of the insulating layer 118. The heat treatment can promote the reduction in the resistance of the low-resistance region 108N.

For the conditions of the heat treatment, the above description can be referred to.

Note that the heat treatment is not necessarily performed. The heat treatment is not performed in this step, and instead heat treatment performed in a later step may also serve as the heat treatment in this step. In some cases, treatment at a high temperature (e.g., deposition step) or the like in a later step can serve as the heat treatment in this step.

[Formation of Opening 141a and Opening 141b]

Figure 28C:
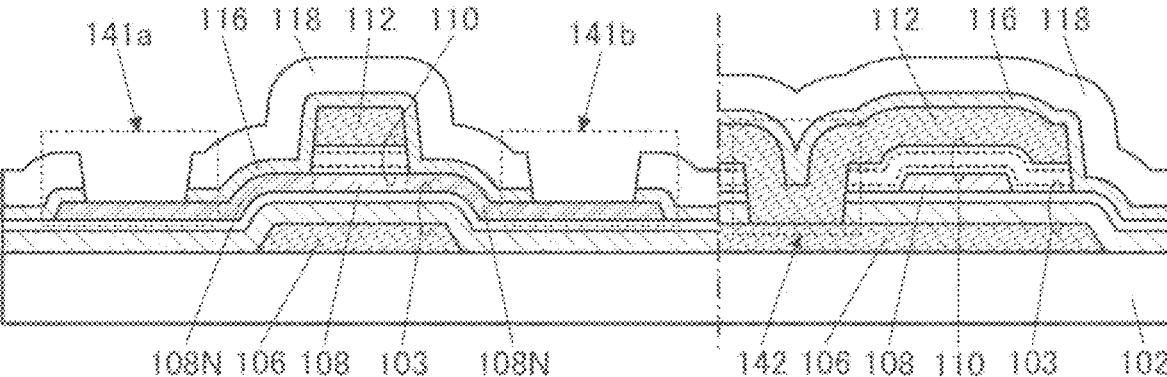

Next, in the insulating layer 118 and the insulating layer 116, the opening 141a and the opening 141b that reach the low-resistance regions 108N are formed (FIG. 28C).

[Formation of Insulating Layer 130]

Figure 29A:
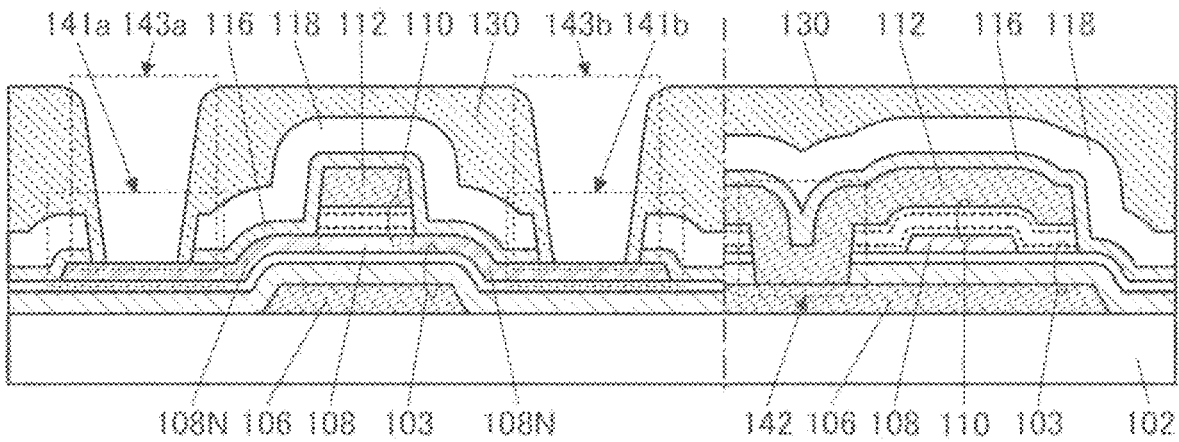
FIG. 29A and FIG. 29B are diagrams illustrating a method for manufacturing a transistor.

Next, the insulating layer 130 is formed over the insulating layer 118 to cover the opening 141a and the opening 141b (FIG. 29A). The above description can be referred to for the formation of the insulating layer 130; thus, the detailed description thereof is omitted.

[Formation of Conductive Layer 120a and Conductive Layer 120b]

Figure 29B:
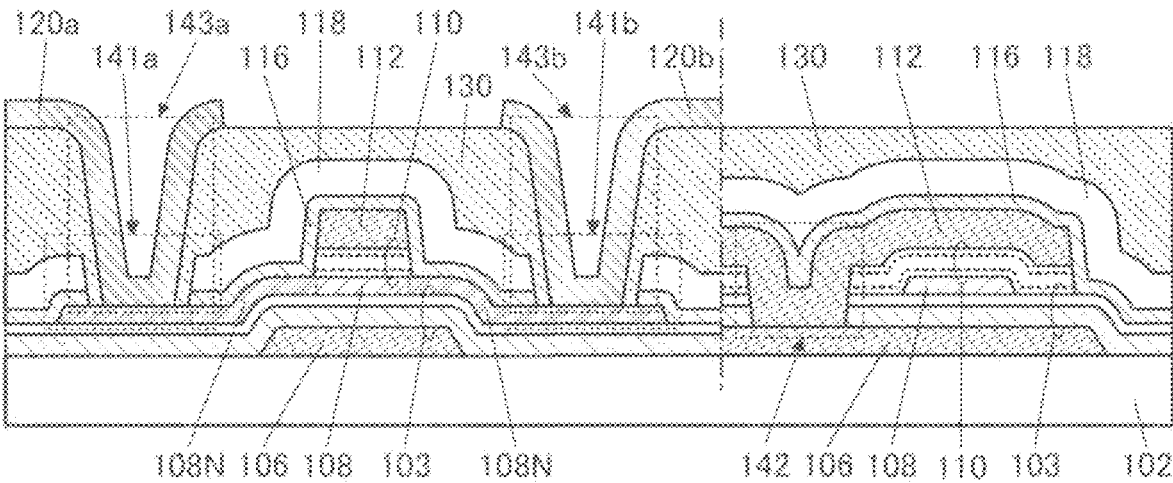

Next, a conductive film is deposited over the insulating layer 130 to cover the opening 143a and the opening 143b, and the conductive film is processed into a desired shape, so that the conductive layer 120a and the conductive layer 120b are formed (FIG. 29B).

Through the above steps, the transistor 100G can be manufactured.

Note that when the formation of the insulating layer 116 is omitted, the transistor 100E illustrated in FIG. 15A and FIG. 15B can be manufactured.

Manufacturing Method Example 4

A manufacturing method of the transistor 100F illustrated in FIG. 16 will be described. Note that description of the same portions as the above is omitted and different portions will be described.

First, as in Manufacturing method example 3, the steps up to the formation of the conductive film 112f are performed (FIG. 22D). The above description can be referred to for the formation of the conductive film 112f; thus, the detailed description thereof is omitted.

[Formation of Insulating Layer 110 and Conductive Layer 112]

Figure 30A:
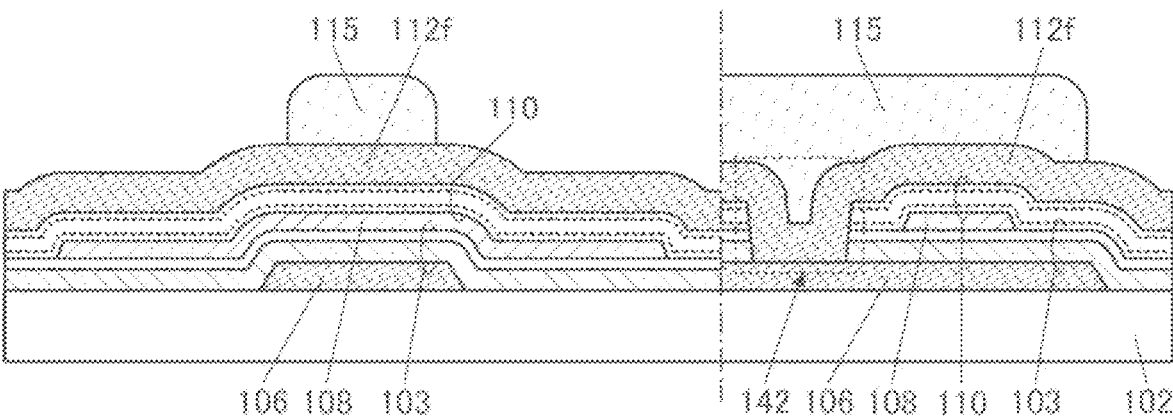
FIG. 30A to FIG. 30C are diagrams illustrating a method for manufacturing a transistor.
Figure 30B:
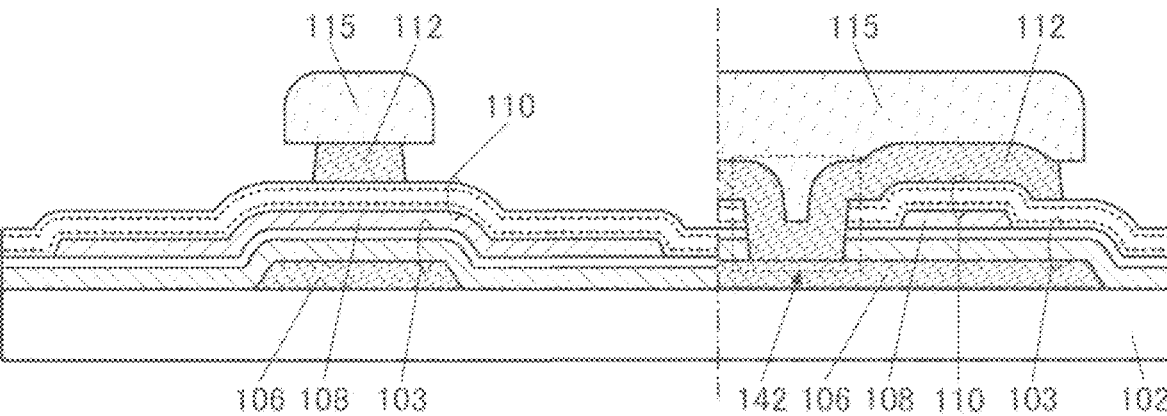

Next, a resist mask 115 is formed over the conductive film 112f (FIG. 30A). After that, the conductive film 112f in a region not covered with the resist mask 115 is removed, so that the conductive layer 112 is formed (FIG. 30B).

At the time of forming the conductive layer 112, the processing is performed so that the end portions of the conductive layer 112 are positioned inward from the outline of the resist mask 115. A wet etching method can be suitably used to form the conductive layer 112. In a wet etching method, for example, an etchant containing hydrogen peroxide can be used. For example, an etchant containing one or more of phosphoric acid, acetic acid, nitric acid, hydrochloric acid, and sulfuric acid can be used. In particular, in the case where a material containing copper is used for the conductive layer 112, an etchant containing phosphoric acid, acetic acid, and nitric acid can be suitably used. The width of the region 108L can be controlled by adjustment of the etching time.

The conductive layer 112 may be formed in the following manner: the conductive film 112f is etched by an anisotropic etching method, and then a side surface of the conductive film 112f is etched by an isotropic etching method to make the end surface recede (also referred to as side etching). Consequently, the conductive layer 112 positioned inward from the insulating layer 110 in a plan view can be formed.

Figure 30C:
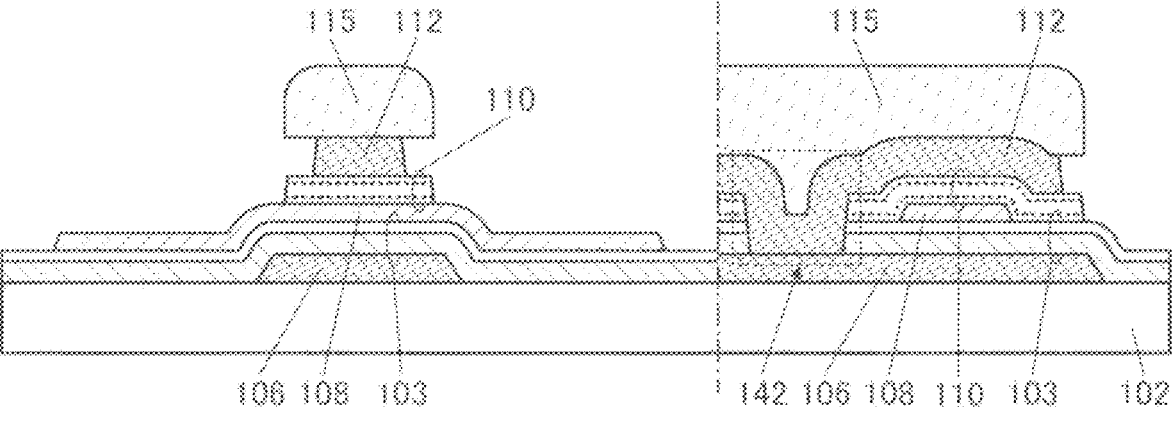

Next, the insulating layer 110 in a region not covered with the resist mask 115 is removed to form the insulating layer 110 (FIG. 30C). For the formation of the insulating layer 110, either one or both of a wet etching method and a dry etching method can be used. Although the insulating layer 110 may be formed after the resist mask 115 is removed, a reduction in the thickness of the conductive layer 112 can be inhibited when the resist mask 115 is left.

After the formation of the insulating layer 110, the resist mask 115 is removed.

[Plasma Treatment]

Next, plasma treatment may be performed. By the plasma treatment, oxygen vacancies $V_O$ can be formed in the semiconductor layer 108 in a region not overlapping with the conductive layer 112.

For the plasma treatment, an atmosphere containing one or more of nitrogen, hydrogen, and a rare gas can be used. For example, an argon gas atmosphere can be suitably used for the plasma treatment. A mixed gas containing the plurality of gases may be used for the plasma treatment. For example, a mixed gas atmosphere containing an argon gas and a nitrogen gas can be suitably used for the plasma treatment.

The oxygen vacancies $V_O$ formed in the semiconductor layer 108 become $V_O H$ by hydrogen in the semiconductor layer 108, and the carrier concentration of the semiconductor layer 108 in the region not overlapping with the conductive layer 112 is increased. That is, by performing the plasma treatment, the resistance of regions to be the region 108L and low-resistance region 108N can be lowered (see FIG. 16B).

Since the plasma treatment is performed on the region 108L through the insulating layer 110, the amount of the oxygen vacancies $V_O$ to be formed is substantially equal to or smaller than that in the low-resistance region 108N. Thus, the region 108L becomes a region whose carrier concentration is substantially equal to or lower than that of the low-resistance region 108N.

In the case where the insulating layer 118 is formed with a PECVD apparatus, the plasma treatment can be performed with the same apparatus. Furthermore, the plasma treatment and the formation of the insulating layer 118 can be successively performed in a treatment chamber where the insulating layer 118 is formed.

Next, the insulating layer 118 is formed. The above description in Manufacturing method example 3 can be referred to for the steps after the formation of the insulating layer 118; thus, the detailed description thereof is omitted.

Through the above steps, the transistor 100F can be manufactured.

Manufacturing Method Example 5

A manufacturing method of the transistor 100H illustrated in FIG. 18A to FIG. 18C will be described. Note that description of the same portions as the above is omitted and different portions will be described.

First, as in Manufacturing method example 1, the steps up to the formation of the insulating layer 130 are performed (FIG. 24B). The above description can be referred to for the steps up to the formation of the insulating layer 130; thus, the detailed description thereof is omitted.

[Formation of Insulating Layer 132]

Figure 31A:
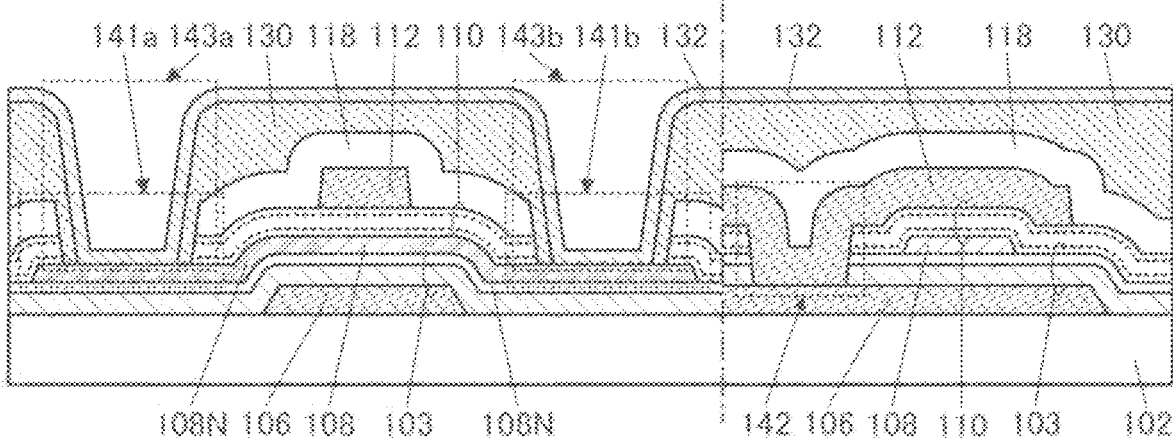
FIG. 31A to FIG. 31C are diagrams illustrating a method for manufacturing a transistor.

Next, the insulating layer 132 is formed over the insulating layer 118 to cover the opening 143a and the opening 143b (FIG. 31A).

The deposition temperature of the insulating layer 132 is preferably lower than the heat resistant temperature of the organic material. For example, the temperature of the heat treatment is preferably higher than or equal to 150° C. and lower than or equal to 350° C., further preferably higher than or equal to 180° C. and lower than or equal to 300° C., still further preferably higher than or equal to 200° C. and lower than or equal to 270° C., yet further preferably higher than or equal to 200° C. and lower than or equal to 250° C., yet still further preferably higher than or equal to 220° C. and lower than or equal to 250° C.

[Formation of Opening 149a and Opening 149b]

Figure 31B:
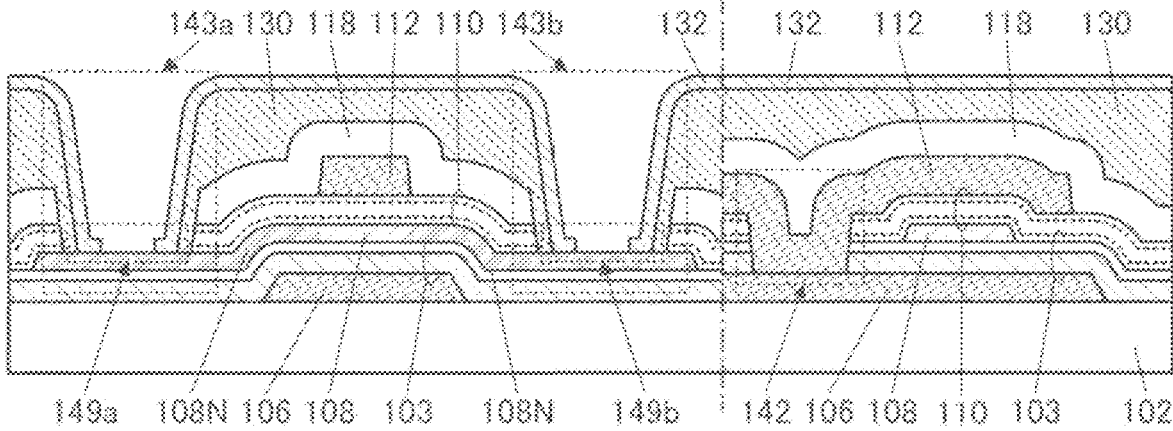

Next, in the insulating layer 132, the opening 149a and the opening 149b that reach the low-resistance regions 108N are formed (FIG. 31B).

[Formation of Conductive Layer 120a and Conductive Layer 120b]

Figure 31C:
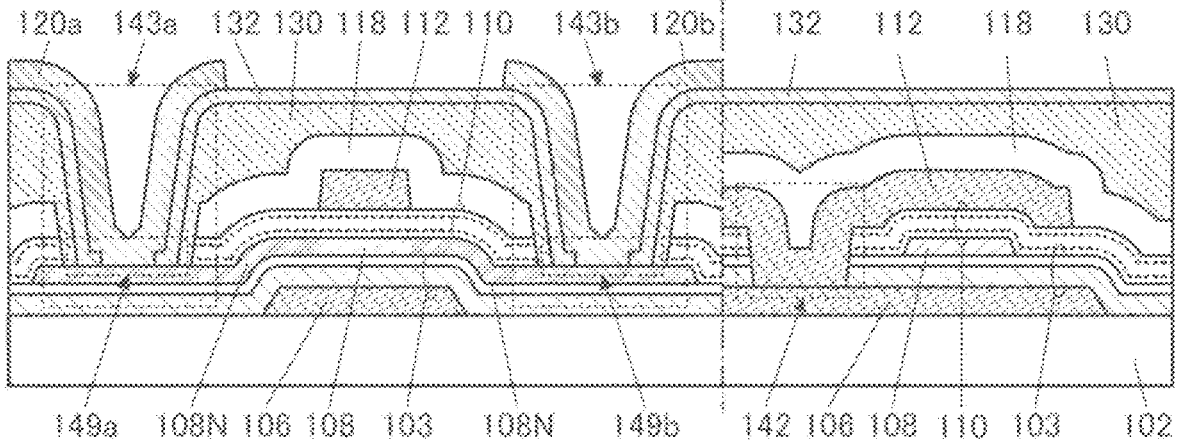

Next, a conductive film is deposited over the insulating layer 132 to cover the opening 149a and the opening 149b, and the conductive film is processed into a desired shape, so that the conductive layer 120a and the conductive layer 120b are formed (FIG. 31C).

Through the above steps, the transistor 100H can be manufactured.

<Components of Semiconductor Device>

Components included in the semiconductor device of this embodiment will be described below in detail.

[Substrate]

Although there is no particular limitation on a material and the like of the substrate 102, it is necessary that the substrate have heat resistance high enough to withstand at least heat treatment performed later. For example, a single crystal semiconductor substrate or a polycrystalline semiconductor substrate containing silicon or silicon carbide as a material, a compound semiconductor substrate of silicon germanium or the like, an SOI substrate, a glass substrate, a ceramic substrate, a quartz substrate, a sapphire substrate, or the like may be used as the substrate 102. Alternatively, any of these substrates over which a semiconductor element is provided may be used as the substrate 102.

A flexible substrate may be used as the substrate 102, and the semiconductor device may be formed directly on the flexible substrate. A separation layer may be provided between the substrate 102 and the semiconductor device. The separation layer can be used when part or the whole of a semiconductor device completed thereover is separated from the substrate 102 and transferred onto another substrate. In that case, the semiconductor device can be transferred to even a substrate having low heat resistance or a flexible substrate.

[Conductive Film]

The conductive layer 112 and the conductive layer 106 functioning as gate electrodes, the conductive layer 120a functioning as one of a source electrode and a drain electrode, and the conductive layer 120b functioning as the other electrode can each be formed using one or more of a metal element selected from chromium, copper, aluminum, gold, silver, zinc, molybdenum, tantalum, titanium, tungsten, manganese, nickel, iron, and cobalt; an alloy containing any of these metal elements as its component; and an alloy including a combination of any of these metal elements.

An oxide conductor or a metal oxide such as an In—Sn oxide, an In—W oxide, an In—W—Zn oxide, an In—Ti oxide, an In—Ti—Sn oxide, an In—Zn oxide, an In—Sn—Si oxide, or an In—Ga—Zn oxide can also be used for the conductive layer 112, the conductive layer 106, the conductive layer 120a, and the conductive layer 120b.

Here, an oxide conductor (OC) is described. For example, when oxygen vacancies are formed in a metal oxide having semiconductor characteristics and hydrogen is added to the oxygen vacancies, a donor level is formed in the vicinity of the conduction band. As a result, the conductivity of the metal oxide is increased, so that the metal oxide becomes a conductor. The metal oxide having become a conductor can be referred to as an oxide conductor.

In addition, the conductive layer 112 or the like may have a stacked-layer structure of a conductive film containing the oxide conductor (the metal oxide) and a conductive film containing a metal or an alloy. The use of the conductive film containing a metal or an alloy can reduce the wiring resistance. At this time, a conductive film containing an oxide conductor is preferably used as a conductive film on the side in contact with an insulating layer functioning as a gate insulating layer.

Furthermore, among the above metal elements, it is particularly suitable that any one or more metal elements selected from titanium, tungsten, tantalum, and molybdenum be included in the conductive layer 112, the conductive layer 106, the conductive layer 120a, and the conductive layer 120b. In particular, a tantalum nitride film is suitably used. The tantalum nitride film has conductivity and a high barrier property against copper, oxygen, or hydrogen and releases little hydrogen from itself; thus, the tantalum nitride film can be suitably used as a conductive film in contact with the semiconductor layer 108 or a conductive film near the semiconductor layer 108.

[Semiconductor Layer]

In the case where the semiconductor layer 108 is an In-M-Zn oxide, examples of the atomic ratio of metal elements of a sputtering target for depositing the In-M-Zn oxide include In:M:Zn=1:1:1, In:M:Zn=1:1:1.2, In:M:Zn=2:1:3, In:M:Zn=3:1:2, In:M:Zn=4:2:3, In:M:Zn=4:2:4.1, In:M:Zn=5:1:3, In:M:Zn=5:1:6, In:M:Zn=5:1:7, In:M:Zn=5:1:8, In:M:Zn=6:1:6, In:M:Zn=5:2:5, In:M:Zn=10:1:3, In:M:Zn=10:1:6, and In:M:Zn=10:1:8. In the case where two or more kinds of elements are contained as the element M, the proportion of M in the atomic ratio corresponds to the sum of the number of atoms of the two or more metal elements.

A target containing a polycrystalline oxide is preferably used as the sputtering target, in which case the semiconductor layer 108 having crystallinity is easily formed. Note that the atomic ratio in the semiconductor layer 108 to be deposited varies in the range of ±40% from any of the above atomic ratios of the metal elements contained in the sputtering target. For example, in the case where the composition of a sputtering target used for the semiconductor layer 108 is In:Ga:Zn=4:2:4.1 [atomic ratio], the composition of the semiconductor layer 108 to be deposited is sometimes in the neighborhood of In:Ga:Zn=4:2:3 [atomic ratio].

The energy gap of the semiconductor layer 108 is greater than or equal to 2 eV, preferably greater than or equal to 2.5 eV. With the use of such a metal oxide having a wider energy gap than silicon, the off-state current of the transistor can be reduced.

The semiconductor layer 108 preferably has a non-single-crystal structure. Examples of the non-single-crystal structure include a CAAC structure to be described later, a polycrystalline structure, a microcrystalline structure, and an amorphous structure. Among the non-single-crystal structures, the amorphous structure has the highest density of defect states, whereas the CAAC structure has the lowest density of defect states.

A CAAC (c-axis aligned crystal) will be described below. A CAAC refers to an example of a crystal structure.

The CAAC structure is a crystal structure of a thin film or the like that has a plurality of nanocrystals (crystal regions having a maximum diameter of less than 10 nm), characterized in that the nanocrystals have c-axis alignment in a particular direction and are not aligned but continuously connected in the a-axis and b-axis directions without forming a grain boundary. In particular, a thin film having the CAAC structure is characterized in that the c-axes of nanocrystals are likely to be aligned in a film thickness direction, a normal direction of a surface where the thin film is formed, or a normal direction of a surface of the thin film.

A CAAC-OS (Oxide Semiconductor) is an oxide semiconductor with high crystallinity. By contrast, in the CAAC-OS, it can be said that a reduction in electron mobility due to the crystal grain boundary is less likely to occur because a clear crystal grain boundary cannot be observed. Moreover, since the crystallinity of an oxide semiconductor might be decreased by entry of impurities, formation of defects, or the like, the CAAC-OS can be regarded as an oxide semiconductor that has small amounts of impurities and defects (oxygen vacancies or the like). Thus, an oxide semiconductor including a CAAC-OS is physically stable. Therefore, the oxide semiconductor including the CAAC-OS is resistant to heat and has high reliability.

Here, in crystallography, in a unit cell formed with three axes (crystal axes) of the a-axis, the b-axis, and the c-axis, a specific axis is generally taken as the c-axis. In particular, in the case of a crystal having a layered structure, two axes parallel to the plane direction of a layer are regarded as the a-axis and the b-axis and an axis intersecting with the layer is regarded as the c-axis in general. Typical examples of such a crystal having a layered structure include graphite, which is classified as a hexagonal system. In a unit cell of graphite, the a-axis and the b-axis are parallel to a cleavage plane and the c-axis is orthogonal to the cleavage plane. For example, an InGaZnO$_4$ crystal having a YbFe$_2$O$_4$ type crystal structure, which is a layered structure, can be classified as a hexagonal system, and in a unit cell thereof, the a-axis and the b-axis are parallel to the plane direction of a layer and the c-axis is orthogonal to the layer (i.e., the a-axis and the b-axis).

In an image observed with a TEM, crystal parts cannot be found clearly in an oxide semiconductor film having a microcrystalline structure (a microcrystalline oxide semiconductor film) in some cases. In most cases, the size of a crystal part included in the microcrystalline oxide semiconductor film is greater than or equal to 1 nm and less than or equal to 100 nm, or greater than or equal to 1 nm and less than or equal to 10 nm. In particular, an oxide semiconductor film including a nanocrystal (nc) that is a microcrystal with a size greater than or equal to 1 nm and less than or equal to 10 nm, or greater than or equal to 1 nm and less than or equal to 3 nm is referred to as an nc-OS (nanocrystalline Oxide Semiconductor) film. In an image observed with a TEM, for example, a crystal grain boundary cannot be found clearly in the nc-OS film in some cases.

In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic arrangement. Furthermore, there is no regularity of crystal orientation between different crystal parts in the nc-OS film. Thus, the orientation in the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak that shows a crystal plane does not appear. Furthermore, a diffraction pattern like a halo pattern is observed when the nc-OS film is subjected to electron diffraction (also referred to as selected-area electron diffraction) using an electron beam with a probe diameter (e.g., 50 nm or larger) that is larger than the size of a crystal part. Meanwhile, in some cases, a ring-like region with high luminance is observed in a circular pattern by electron diffraction (also referred to as nanobeam electron diffraction pattern) of the nc-OS film, which uses an electron beam with a probe diameter close to or smaller than the diameter of a crystal part (e.g., greater than or equal to 1 nm and less than or equal to 30 nm), and a plurality of spots are observed in the ring-like region.

The nc-OS film has a lower density of defect states than an amorphous oxide semiconductor film. Note that there is no regularity of crystal orientation between different crystal parts in the nc-OS film. Thus, the nc-OS film has a higher density of defect states than the CAAC-OS film. Thus, the nc-OS film has a higher carrier concentration and higher electron mobility than the CAAC-OS film in some cases. Therefore, a transistor using the nc-OS film may have high field-effect mobility.

The nc-OS film can be formed at a smaller oxygen flow rate ratio in deposition than the CAAC-OS film. The nc-OS film can also be formed at a lower substrate temperature in deposition than the CAAC-OS film. For example, the nc-OS film can be deposited at a relatively low substrate temperature (e.g., a temperature of 130° C. or lower) or without heating of the substrate and thus is suitable for the case of using a large glass substrate, a resin substrate, or the like, and productivity can be increased.

An example of a crystal structure of a metal oxide is described. A metal oxide that is formed by a sputtering method using an In—Ga—Zn oxide target (In:Ga:Zn=4:2: 4.1 [atomic ratio]) at a substrate temperature higher than or equal to 100° C. and lower than or equal to 130° C. is likely to have either the nc (nano crystal) structure or the CAAC structure, or a structure in which both structures are mixed. By contrast, a metal oxide formed at a substrate temperature set at room temperature is likely to have the nc structure. Note that room temperature here also includes a temperature in the case where a substrate is not heated.

<Composition of Metal Oxide>

The composition of a CAC (Cloud-Aligned Composite)-OS that can be used in a transistor disclosed in one embodiment of the present invention will be described below.

Note that a CAAC (c-axis aligned crystal) refers to an example of a crystal structure, and a CAC (Cloud-Aligned Composite) refers to an example of a function or a material composition.

A CAC-OS or a CAC-metal oxide has a conducting function in a part of the material and an insulating function in another part of the material, and has a function of a semiconductor as the whole material. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

The CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS or the CAC-metal oxide, the conductive regions and the insulating regions each have a size greater than or equal to 0.5 nm and less than or equal to 10 nm, preferably greater than or equal to 0.5 nm and less than or equal to 3 nm, and are dispersed in the material, in some cases.

The CAC-OS or the CAC-metal oxide includes components having different band gaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used in a channel formation region of a transistor, the transistor in an on state can achieve high current driving capability, that is, high on-state current and high field-effect mobility.

In other words, the CAC-OS or the CAC-metal oxide can also be referred to as a matrix composite or a metal matrix composite.

The above is the description of the metal oxide structure.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 2

In this embodiment, an example of a display device that includes the transistor described in the above embodiment will be described.

Structure Example

FIG. 32A is atop view of a display device 700. The display device 700 includes a first substrate 701 and a second substrate 705 that are attached to each other with a sealant 712. In a region sealed with the first substrate 701, the second substrate 705, and the sealant 712, a pixel portion 702, a source driver circuit portion 704, and a gate driver circuit portion 706 are provided over the first substrate 701. In the pixel portion 702, a plurality of display elements are provided.

An FPC terminal portion 708 to which an FPC 716 (FPC: Flexible printed circuit) is connected is provided in a portion of the first substrate 701 that does not overlap with the second substrate 705. The pixel portion 702, the source driver circuit portion 704, and the gate driver circuit portion 706 are each supplied with a variety of signals and the like from the FPC 716 through the FPC terminal portion 708 and a signal line 710.

A plurality of gate driver circuit portions 706 may be provided. The gate driver circuit portion 706 and the source driver circuit portion 704 may be formed separately on semiconductor substrates or the like to obtain packaged IC chips. The IC chip can be mounted over the first substrate 701 or on the FPC 716.

The transistor that is the semiconductor device of one embodiment of the present invention can be used as transistors included in the pixel portion 702, the source driver circuit portion 704, and the gate driver circuit portion 706.

Examples of the display element provided in the pixel portion 702 include a liquid crystal element and a light-emitting element. As the liquid crystal element, a transmissive liquid crystal element, a reflective liquid crystal element, a transflective liquid crystal element, or the like can be used. As the light-emitting element, a self-luminous light-emitting element such as an LED (Light Emitting Diode), an OLED (Organic LED), a QLED (Quantum-dot LED), or a semiconductor laser can be used. It is also possible to use a MEMS (Micro Electro Mechanical Systems) shutter element, an optical interference type MEMS element, or a display element using a microcapsule method, an electrophoretic method, an electrowetting method, an Electronic Liquid Powder (registered trademark) method, or the like, for instance.

A display device 700A illustrated in FIG. 32B is an example of a display device which includes a flexible resin layer 743 instead of the first substrate 701 and can be used as a flexible display.

In the display device 700A, the pixel portion 702 has not a rectangular shape but a shape with rounded corners. The display device 700A includes a notch portion in which part of the pixel portion 702 and part of the resin layer 743 are cut as illustrated in a region P1 in FIG. 32B. A pair of gate driver circuit portions 706 is provided on the opposite sides with the pixel portion 702 therebetween. The gate driver circuit portions 706 are provided along a curved outline at the corners of the pixel portion 702.

The resin layer 743 has a shape with a sticking-out portion where the FPC terminal portion 708 is provided. Furthermore, part of the resin layer 743 that includes the FPC terminal portion 708 can be bent backward in a region P2 in FIG. 32B. When part of the resin layer 743 is bent backward, the display device 700A can be mounted on an electronic device while the FPC 716 overlaps with the back side of the pixel portion 702; thus, the electronic device can be downsized.

The FPC 716 connected to the display device 700A is mounted with an IC 717. The IC 717 has a function of a source driver circuit, for example. In this case, the source driver circuit portion 704 in the display device 700A can include at least one of a protection circuit, a buffer circuit, a demultiplexer circuit, and the like.

A display device 700B illustrated in FIG. 32C is a display device that can be suitably used for an electronic device with a large screen. For example, the display device 700B can be suitably used for a television device, a monitor device, a personal computer (including a laptop type and a desktop type), a tablet terminal, digital signage, or the like.

The display device 700B includes a plurality of source driver ICs 721 and a pair of gate driver circuit portions 722.

The plurality of source driver ICs 721 are attached to respective FPCs 723. In each of the plurality of FPCs 723, one of terminals is connected to the first substrate 701, and the other terminal is connected to a printed circuit board 724. By bending the FPCs 723, the printed circuit board 724 can be placed on the back side of the pixel portion 702 so that the display device 700B can be mounted on an electronic device; thus, the electronic device can be downsized.

By contrast, the gate driver circuit portions 722 are provided over the first substrate 701. Thus, an electronic device with a narrow bezel can be provided.

With such a structure, a large-size and high-resolution display device can be provided. For example, a display device with a diagonal screen size of 30 inches or more, 40 inches or more, 50 inches or more, or 60 inches or more can be obtained. Furthermore, a display device with extremely high resolution such as 4K2K or 8K4K can be provided.
<Cross-Sectional Structure Example>

Figure 33:
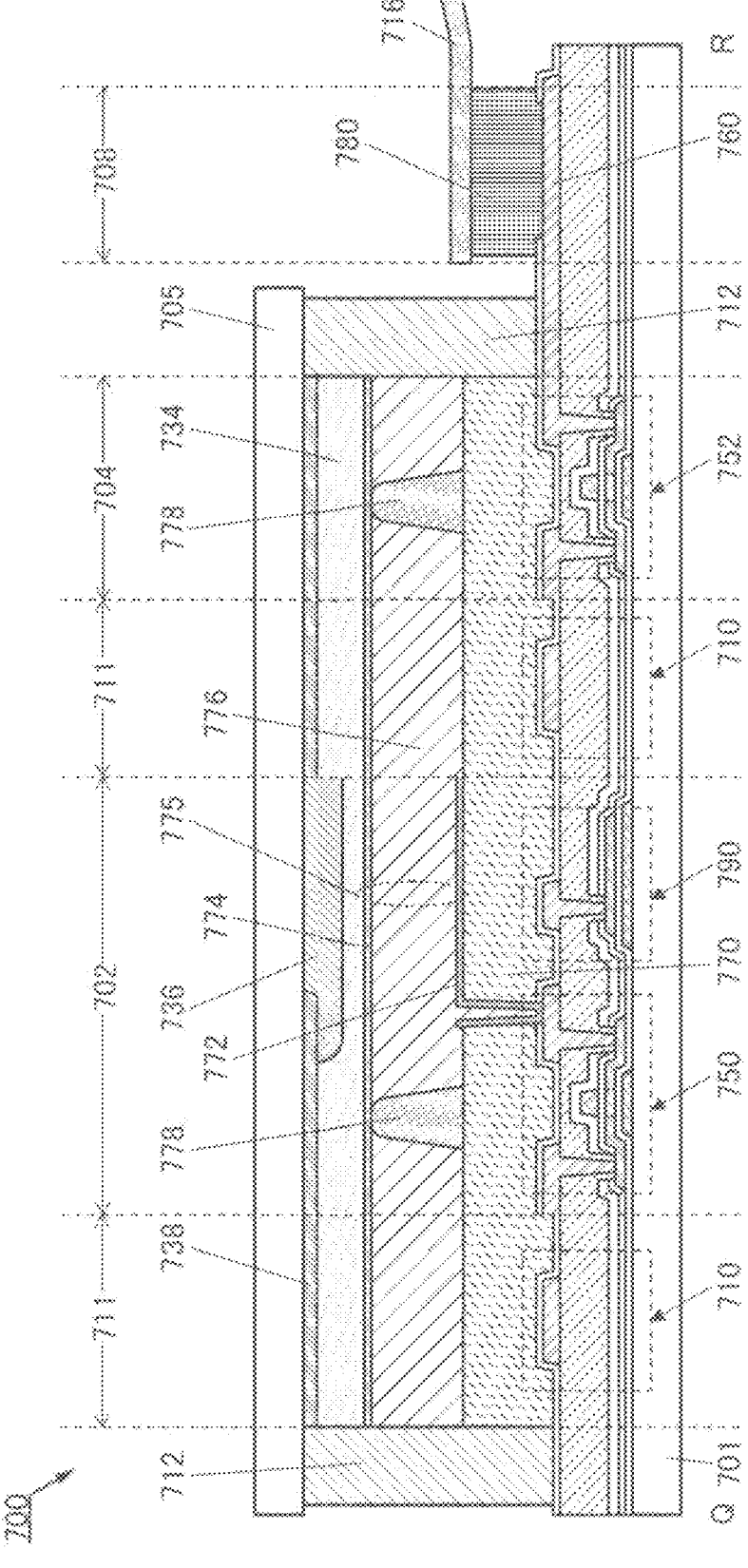
FIG. 33 is a cross-sectional view of a display device.
Figure 34:
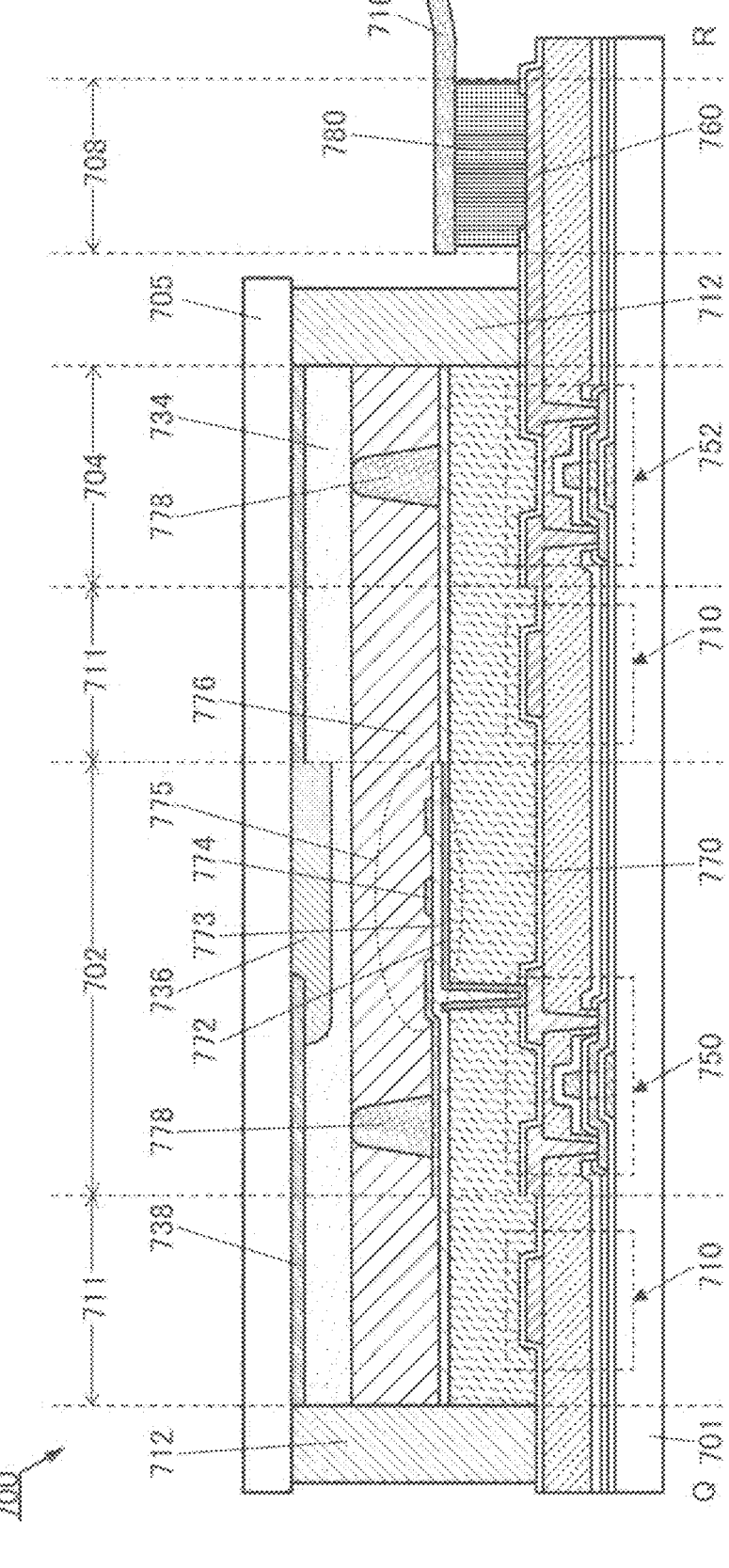
FIG. 34 is a cross-sectional view of a display device.
Figure 35:
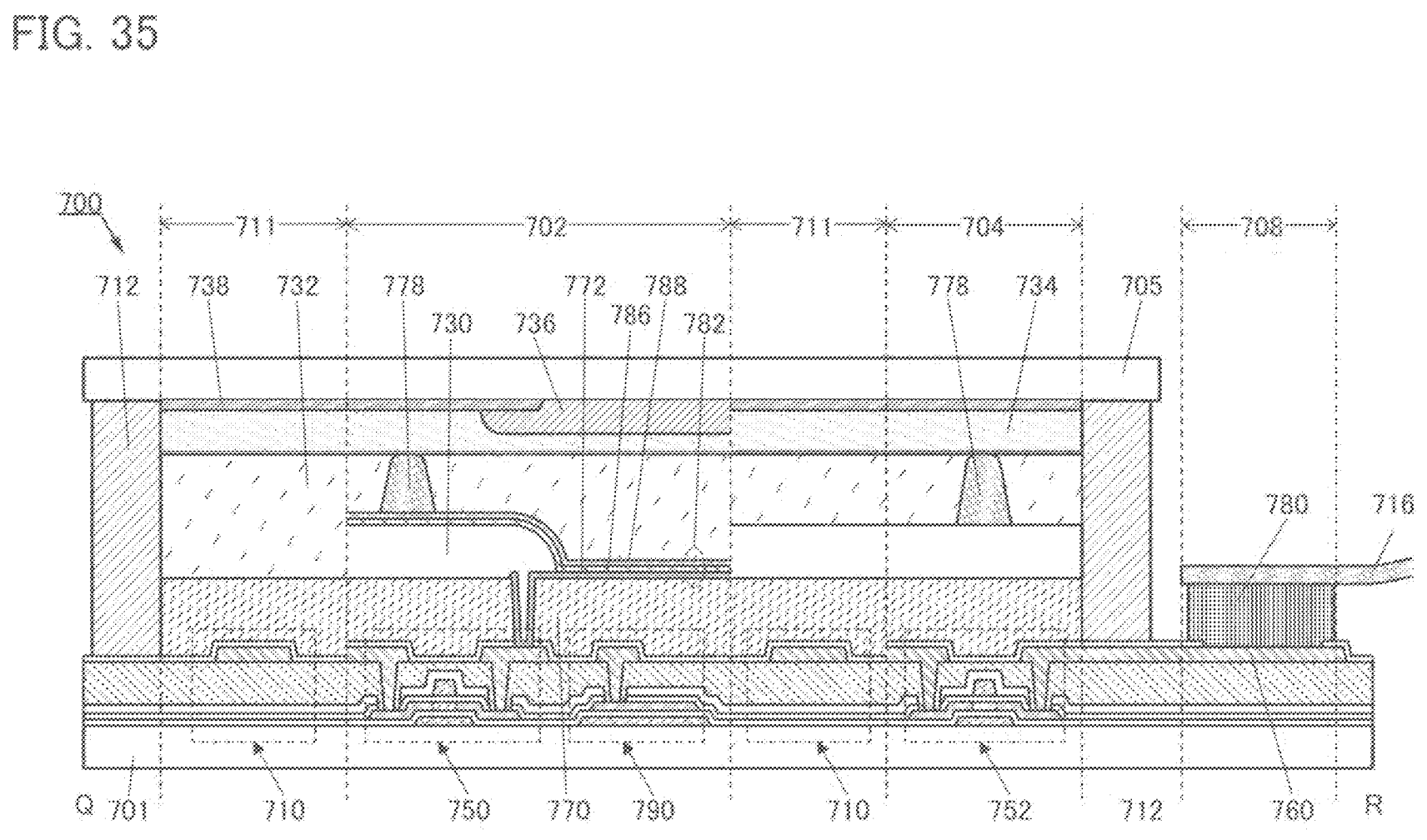
Figure 36:
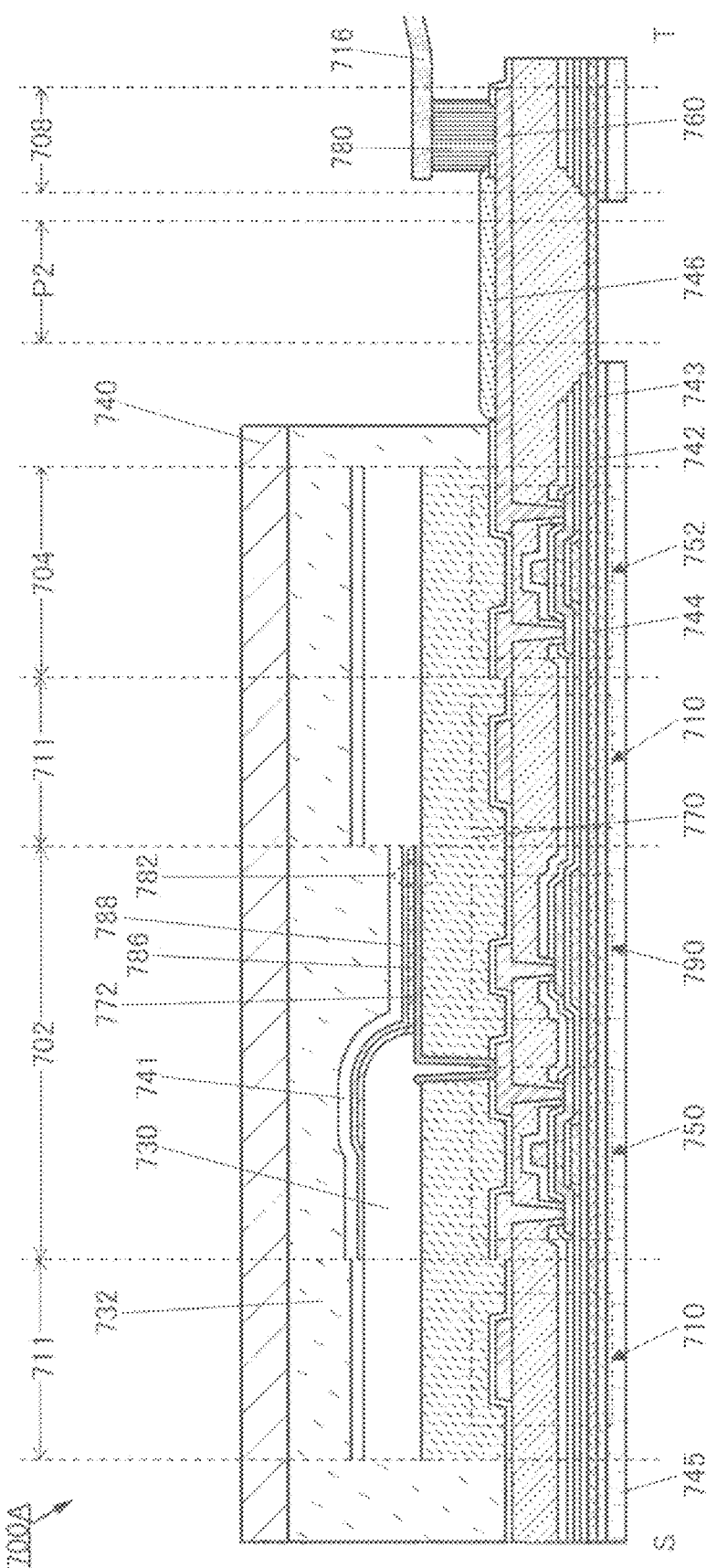
FIG. 36 is a cross-sectional view of a display device.

Structures using a liquid crystal element as a display element and structures using an EL element will be described below with reference to FIG. 33 to FIG. 36. Note that FIG. 33 to FIG. 35 are cross-sectional views taken along the dashed-dotted line Q-R in the display device 700 in FIG. 32A. FIG. 36 is a cross-sectional view taken along the dashed-dotted line S-T in the display device 700A in FIG. 32B. FIG. 33 and FIG. 34 are each a structure using a liquid crystal element as a display element, and FIG. 35 and FIG. 36 are each a structure using an EL element.
[Description of Common Portion in Display Device]

Display devices illustrated in FIG. 33 to FIG. 36 each include a lead wiring portion 711, the pixel portion 702, the source driver circuit portion 704, and the FPC terminal portion 708. The lead wiring portion 711 includes the signal line 710. The pixel portion 702 includes a transistor 750 and a capacitor 790. The source driver circuit portion 704 includes a transistor 752. FIG. 34 illustrates a case where the capacitor 790 is not provided.

As the transistor 750 and the transistor 752, any of the transistors described in Embodiment 1 can be used.

The transistor used in this embodiment includes a highly purified oxide semiconductor film in which formation of oxygen vacancies is suppressed. The transistor can have low off-state current. Accordingly, an electrical signal such as an image signal can be held for a longer period, and the interval between writes of an image signal or the like can be set longer. Thus, frequency of refresh operation can be reduced, which leads to lower power consumption.

The transistor used in this embodiment can have relatively high field-effect mobility and thus is capable of high-speed operation. For example, with the use of such a transistor capable of high-speed operation for a display device, a switching transistor in a pixel portion and a driver transistor used in a driver circuit portion can be formed over one substrate. That is, a structure in which a driver circuit formed using a silicon wafer or the like is not used is possible, in which case the number of components of the display device can be reduced. Moreover, the use of the transistor capable of high-speed operation also in the pixel portion can provide a high-quality image.

The capacitor 790 illustrated in FIG. 33, FIG. 35, and FIG. 36 includes a lower electrode formed by processing the same film as a first gate electrode included in the transistor 750 and an upper electrode formed by processing the same metal oxide as the semiconductor layer. The upper electrode has reduced resistance like a source region and a drain region of the transistor 750. Part of an insulating film functioning as a first gate insulating layer of the transistor 750 is provided between the lower electrode and the upper electrode. That is, the capacitor 790 has a stacked-layer structure in which the insulating films functioning as dielectric films are positioned between a pair of electrodes. A wiring obtained by processing the same film as a source electrode and a drain electrode of the transistor is connected to the upper electrode.

A planarization insulating film 770 is provided over the transistor 750, the transistor 752, and the capacitor 790.

The transistor 750 in the pixel portion 702 and the transistor 752 in the source driver circuit portion 704 may have different structures. For example, a top-gate transistor may be used as one of the transistors 750 and 752, and a bottom-gate transistor may be used as the other. Note that like in the source driver circuit portion 704, a transistor having the same structure as or a different structure from the transistor 750 may be used in the gate driver circuit portion 706.

The signal line 710 is formed using the same conductive film as the source electrodes, the drain electrodes, and the like of the transistor 750 and the transistor 752. In this case, a low-resistance material such as a material containing a copper element is preferably used because signal delay or the like due to the wiring resistance can be reduced and display on a large screen is possible.

The FPC terminal portion 708 includes a wiring 760 part of which functions as a connection electrode, an anisotropic conductive film 780, and the FPC 716. The wiring 760 is electrically connected to a terminal included in the FPC 716 through the anisotropic conductive film 780. Here, the wiring 760 is formed using the same conductive film as the source electrodes, the drain electrodes, and the like of the transistor 750 and the transistor 752.

As the first substrate 701 and the second substrate 705, a glass substrate or a flexible substrate such as a plastic substrate can be used, for example. In the case where a flexible substrate is used as the first substrate 701, an insulating layer having a barrier property against impurities containing hydrogen elements is preferably provided between the first substrate 701 and the transistor 750, for example.

A light-blocking film 738, a coloring film 736, and an insulating film 734 in contact with these films are provided on the second substrate 705 side.

[Structure Example of Display Device Using Liquid Crystal Element]

The display device 700 illustrated in FIG. 33 includes a liquid crystal element 775. The liquid crystal element 775 includes a conductive layer 772, a conductive layer 774, and a liquid crystal layer 776 therebetween. The conductive layer 774 is provided on the second substrate 705 side and has a function of a common electrode. The conductive layer 772 is electrically connected to the source electrode or the drain electrode of the transistor 750. The conductive layer 772 is formed over the planarization insulating film 770 and functions as a pixel electrode.

A material that transmits visible light or a material that reflects visible light can be used for the conductive layer 772. As a light-transmitting material, for example, an oxide material containing indium, zinc, tin, or the like is preferably used. As a reflective material, for example, a material containing aluminum, silver, or the like is preferably used.

When a reflective material is used for the conductive layer 772, the display device 700 is a reflective liquid crystal display device. When a light-transmitting material is used for the conductive layer 772, a transmissive liquid crystal display device is obtained. For a reflective liquid crystal display device, a polarizing plate is provided on the viewer side. By contrast, for a transmissive liquid crystal display device, a pair of polarizing plates is provided so that the liquid crystal element is placed therebetween.

A structure body 778 is provided between the first substrate 701 and the second substrate 705. The structure body 778 is a columnar spacer and is provided to control the distance (cell gap) between the first substrate 701 and the second substrate 705. Note that a spherical spacer may be used as the structure body 778.

The display device 700 illustrated in FIG. 34 is an example of employing the liquid crystal element 775 of a horizontal electric field mode (e.g., an FFS mode). The conductive layer 774 functioning as a common electrode is provided over the conductive layer 772 with an insulating layer 773 therebetween. The alignment state of the liquid crystal layer 776 can be controlled by the electric field generated between the conductive layer 772 and the conductive layer 774.

In FIG. 34, a storage capacitor can be formed with a stacked-layer structure of the conductive layer 774, the insulating layer 773, and the conductive layer 772. Thus, another capacitor need not be provided, and thus the aperture ratio can be increased.

Although not illustrated in FIG. 33 and FIG. 34, a structure in which an alignment film in contact with the liquid crystal layer 776 is provided may be employed. Furthermore, an optical member (an optical substrate) such as a polarizing member, a retardation member, or an anti-reflection member, and a light source such as a backlight or a sidelight can be provided as appropriate.

For the liquid crystal layer 776, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case where a horizontal electric field mode is employed, a liquid crystal exhibiting a blue phase for which an alignment film is not used may be used.

The following can be used as a mode of the liquid crystal element: a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optically Compensated Birefringence) mode, an ECB (Electrically Controlled Birefringence) mode, a guest-host mode, or the like.

A scattering liquid crystal employing a polymer dispersed liquid crystal, a polymer network liquid crystal, or the like can be used for the liquid crystal layer 776. At this time, monochrome image display may be performed without the coloring film 736, or color display may be performed using the coloring film 736.

As a method for driving the liquid crystal element, a time-division display method (also referred to as a field-sequential driving method) in which color display is performed on the basis of a successive additive color mixing method may be employed. In that case, a structure in which the coloring film 736 is not provided may be employed. In the case where the time-division display method is employed, advantages such as the aperture ratio of each pixel or the resolution being increased can be obtained because subpixels that emit light of, for example, R (red), G (green), and B (blue), need not be provided.

[Display Device Using Light-Emitting Element]

The display device 700 illustrated in FIG. 35 includes a light-emitting element 782. The light-emitting element 782 includes the conductive layer 772, an EL layer 786, and a conductive film 788. The EL layer 786 contains a light-emitting material such as an organic compound or an inorganic compound.

As the light-emitting material, a fluorescent material, a phosphorescent material, a thermally activated delayed fluorescence (TADF) material, an inorganic compound (e.g., a quantum dot material), or the like can be used.

In the display device 700 illustrated in FIG. 35, an insulating film 730 covering part of the conductive layer 772 is provided over the planarization insulating film 770. Here, the light-emitting element 782 is a top-emission light-emitting element, which includes the conductive film 788 with a light-transmitting property. Note that the light-emitting element 782 may have a bottom-emission structure in which light is emitted to the conductive layer 772 side, or a dual-emission structure in which light is emitted to both the conductive layer 772 side and the conductive film 788 side.

The coloring film 736 is provided to overlap with the light-emitting element 782. The light-blocking film 738 is provided to overlap with the insulating film 730 and be in the lead wiring portion 711, and the source driver circuit portion 704. The coloring film 736 and the light-blocking film 738 are covered with the insulating film 734. A space between the light-emitting element 782 and the insulating film 734 is filled with a sealing film 732. Note that a structure in which the coloring film 736 is not provided may be employed when the EL layer 786 is formed into an island shape for each pixel or into a stripe shape for each pixel column, i.e., the EL layer 786 is formed by a side by side method.

FIG. 36 illustrates a structure of a display device suitably applicable to a flexible display. FIG. 36 is a cross-sectional view taken along the dashed-dotted line S-T in the display device 700A in FIG. 32B.

The display device 700A illustrated in FIG. 36 has a structure in which a support substrate 745, a bonding layer 742, the resin layer 743, and an insulating layer 744 are stacked instead of the first substrate 701 in FIG. 35. The transistor 750, the capacitor 790, and the like are provided over the insulating layer 744 over the resin layer 743.

The support substrate 745 includes an organic resin, glass, or the like and is thin enough to have flexibility. The resin layer 743 is a layer including an organic resin such as a polyimide resin or an acrylic resin. The insulating layer 744 includes an inorganic insulating film of silicon oxide, silicon oxynitride, silicon nitride, or the like. The resin layer 743 and the support substrate 745 are bonded to each other with the adhesive layer 742. The resin layer 743 is preferably thinner than the support substrate 745.

The display device 700A illustrated in FIG. 36 includes a protective layer 740 instead of the second substrate 705 in FIG. 35. The protective layer 740 is bonded to the sealing film 732. A glass substrate, a resin film, or the like can be used as the protective layer 740. Alternatively, as the protective layer 740, an optical member such as a polarizing plate or a scattering plate, an input device such as a touch sensor panel, or a structure in which two or more of the above are stacked may be employed.

The EL layer 786 included in the light-emitting element 782 is provided over the insulating film 730 and the conductive layer 772 in an island shape. The EL layer 786 is formed separately such that the subpixels have the respective emission colors, whereby color display can be achieved without the coloring film 736. A protective layer 741 is provided to cover the light-emitting element 782. The protective layer 741 has a function of preventing diffusion of impurities such as water into the light-emitting element 782. The protective layer 741 is preferably formed using an inorganic insulating film. The protective layer 741 further preferably has a stacked-layer structure including one or more inorganic insulating films and one or more organic insulating films.

FIG. 36 illustrates the region P2 that can be bent. The region P2 includes a portion where the support substrate 745, the bonding layer 742, and the inorganic insulating film such as the insulating layer 744 are not provided. In the region P2, a resin layer 746 is provided to cover the wiring 760. When a structure is employed in which an inorganic insulating film is not provided if possible in the region P2 that can be bent and only a conductive layer containing a metal or an alloy and a layer containing an organic material are stacked, generation of cracks caused at bending can be prevented. When the support substrate 745 is not provided in the region P2, part of the display device 700A can be bent with an extremely small radius of curvature.

An input device may be provided in the display device 700 or the display device 700A illustrated in FIG. 33 to FIG. 36. Examples of the input device include a touch sensor.

A variety of types such as a capacitive type, a resistive type, a surface acoustic wave type, an infrared type, an optical type, and a pressure-sensitive type can be used as the sensor type, for example. Alternatively, two or more of these types may be combined and used.

Examples of the touch panel structure include a so-called in-cell touch panel in which an input device is provided between a pair of substrates, a so-called on-cell touch panel in which an input device is formed over the display device 700, and a so-called out-cell touch panel in which an input device is attached to the display device 700.

Variation Examples

Variation examples partly different from the above display device are described below.

Figure 37A:
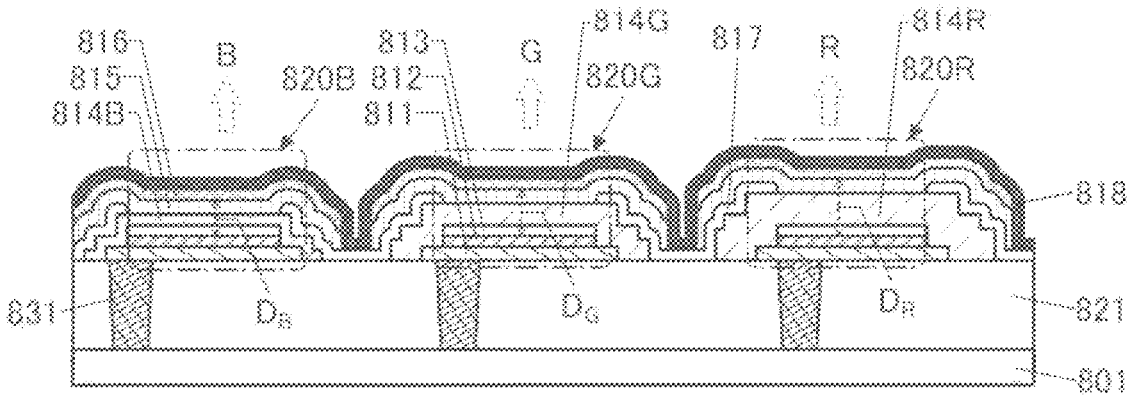
FIG. 37A and FIG. 37B are diagrams illustrating structure examples of display devices.

FIG. 37A is a schematic cross-sectional view of a display device 800. The display device 800 includes a light-emitting element 820R, a light-emitting element 820G, and a light-emitting element 820B over a substrate 801. The light-emitting element 820R is a light-emitting element that emits red light, the light-emitting element 820G is a light-emitting element that emits green light, and the light-emitting element 820B is a light-emitting element that emits blue light. Note that the light-emitting element 820R, the light-emitting element 820G, and the light-emitting element 820B are collectively referred to as a light-emitting element 820 in some cases.

A circuit board including a transistor, a wiring, or the like can be used as the substrate 801. For example, the semiconductor device described in Embodiment 1 can be suitably used. Note that in the case where a passive matrix method or a segment method can be employed, an insulating substrate such as a glass substrate can be used as the substrate 801. The substrate 801 is a substrate provided with a circuit for driving the light-emitting elements (also referred to as a pixel circuit) or a semiconductor circuit functioning as a driver circuit for driving the pixel circuit.

The light-emitting element 820R includes a conductive layer 811, a reflective layer 812, an insulating layer 813, a conductive layer 814R, an EL layer 815, and a conductive layer 816. The light-emitting element 820G includes the conductive layer 811, the reflective layer 812, the insulating layer 813, a conductive layer 814G, the EL layer 815, and the conductive layer 816. The light-emitting element 820B includes the conductive layer 811, the reflective layer 812, the insulating layer 813, a conductive layer 814B, the EL layer 815, and the conductive layer 816. Note that the conductive layer 814R, the conductive layer 814G, and the conductive layer 814B are collectively referred to as a conductive layer 814 in some cases.

The conductive layer 811 functions as a lower electrode, and the conductive layer 816 functions as an upper electrode. The reflective layer 812 provided over the conductive layer 811 has a function of reflecting visible light. The insulating layer 813 and the conductive layer 814 each have a function of transmitting visible light, and the conductive layer 816 has a transmissive property and a reflective property with respect to visible light. The EL layer 815 includes a light-emitting compound.

The conductive layer 814 provided in each of the light-emitting elements 820 has a thickness that differs among the light-emitting elements. Among the three conductive layers 814, the thickness of the conductive layer 814B is the smallest, and the thickness of the conductive layer 814R is the largest. Here, as illustrated in FIG. 37A, when the distances between top surfaces of the reflective layers 812 and bottom surfaces of the conductive layers 816 (i.e., an interface between the conductive layer 816 and the EL layer 815) in the light-emitting elements are referred to as a distance $D_R$, a distance $D_G$, and a distance $D_B$, the distance $D_R$ is the largest and the distance $D_B$ is the smallest. The difference between the distance $D_R$, the distance $D_G$, and the distance $D_B$ corresponds to the difference in optical distance (optical path length) between the light-emitting elements.

The light-emitting element 820R has the longest optical path length among the three light-emitting elements, and thus emits light R that is the intensified light with the longest wavelength. In contrast, the light-emitting element 820B has the shortest optical path length, and thus emits light B that is the intensified light with the shortest wavelength. The light-emitting element 820G emits light G that is the intensified light with the intermediate wavelength. For example, the light R is the intensified red light, the light G is the intensified green light, and the light B is the intensified blue light.

With such a structure, the EL layer included in the light-emitting element 820 need not be formed separately for different colors of the light-emitting elements; thus, color display with high color reproducibility can be performed using elements with the same structure. In addition, the light-emitting elements 820 can be arranged extremely densely. For example, a display device having resolution exceeding 5000 ppi can be achieved.

The substrate 801 and the conductive layer 811 of the light-emitting element 820 are electrically connected to each other through a plug 831. The plug 831 is formed to be embedded in an opening provided in the insulating layer 821. The conductive layer 811 is provided in contact with a top surface of the plug 831.

In the display device 800, the EL layer 815 and the conductive layer 816 are each separated between adjacent light-emitting elements of different colors. Accordingly, leakage current flowing through the EL layer 815 between the adjacent light-emitting elements of different colors can be prevented. Thus, light emission caused by the leakage current can be inhibited, so that display with high contrast can be obtained. Furthermore, even in the case where the resolution is increased, the range of choices for materials can be widened since the EL layer 815 can be formed using a material with high conductivity, which facilitates an improvement in efficiency, a reduction in power consumption, and an improvement in reliability.

The EL layer 815 and the conductive layer 816 may be patterned into an island shape by deposition with the use of a shadow mask such as a metal mask; however, it is particularly preferable to employ a processing method using no metal mask. Accordingly, an extremely minute pattern can be formed; thus, resolution and the aperture ratio can be improved as compared to the formation method using a metal mask. A typical example of such a processing method is a photolithography method. Alternatively, a formation method such as a nanoimprinting method, a sandblasting method, or the like can be used.

In this specification and the like, a device formed using a metal mask or an FMM (a fine metal mask, a high resolution metal mask) may be referred to as a device having an MM (metal mask) structure. In this specification and the like, a device formed without using a metal mask or an FMM is sometimes referred to as a device having a MML (metal maskless) structure.

In a method for manufacturing the display device 800, the EL layer 815 and the conductive layer 816 are deposited first without using a metal mask, and then a resist mask is formed over the conductive layer 816. After that, parts of the EL layer 815 and the conductive layer 816 that are not covered with the resist mask are removed by etching, and then the resist mask is removed. Then, the insulating layer 118 is formed. Thus, the display device 800 can be manufactured.

In the display device 800, an insulating layer 818 is provided to cover the light-emitting element 820B, the light-emitting element 820G, and the light-emitting element 820R. Part of the insulating layer 818 is in contact with a top surface of an insulating layer 817 between adjacent light-emitting elements. The insulating layer 818 functions as a protective layer that prevents diffusion of impurities such as water into the light-emitting elements. As the insulating layer 818, it is preferable to use an inorganic insulating film with low moisture permeability, such as a silicon oxide film, a silicon nitride film, or an aluminum oxide film.

Figure 37B:
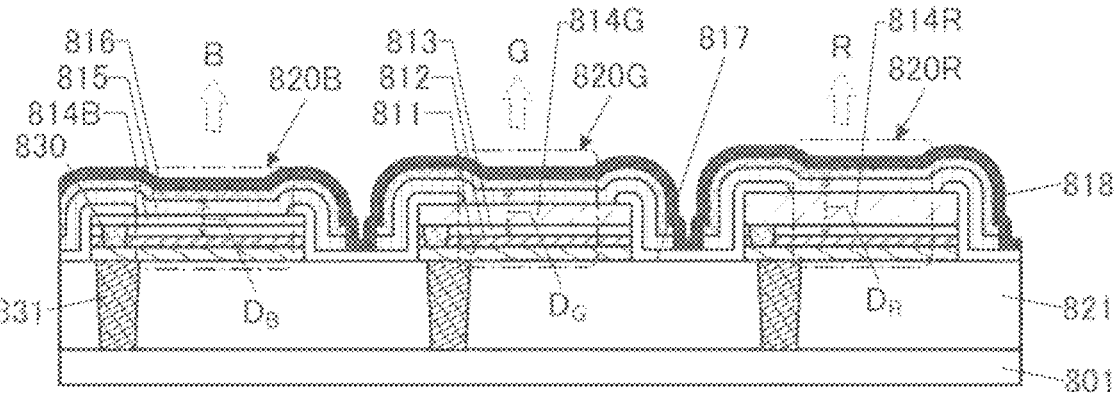

A display device 800A illustrated in FIG. 37B is different from the display device 800 mainly in including a plug 830, and in the structures of the conductive layer 814R, the conductive layer 814G, and the conductive layer 814B.

In the display device 800A, the reflective layer 812, the insulating layer 813, and the conductive layer 814 are stacked in this order over the conductive layers 811 which are formed apart from each other. The conductive layer 814 has a thickness that differs among the light-emitting elements. Since the conductive layer 814 is electrically connected to the conductive layer 811 through the plug 830, it is not necessary to provide the conductive layer 814 larger than the conductive layer 811. With such a structure, the conductive layer 811 functioning as a pixel electrode can be larger, and since there is no need to provide a contact between the conductive layer 814 and the conductive layer 811, the aperture ratio of the pixel can be increased.

Note that although FIG. 37B illustrates a structure in which the plug 830 is embedded in the insulating layer 813 and the reflective layer 812, one embodiment of the present invention is not limited thereto. The plug 830 may be embedded in the insulating layer 813 and in contact with the reflective layer 812. In that case, the reflective layer 812 and the plug 830 may be in contact with each other without providing the conductive layer 811; however, in the case where the thickness of the reflective layer 812 is small, for example, the conductive layer 811 is preferably provided because when an opening for forming the plug 830 is formed in the insulating layer 813, the opening might penetrate the reflective layer 812.

In the display device 800 and the display device 800A, the EL layer 815 and the conductive layer 816 are preferably processed to be not separated but continuous between pixels of the same color. For example, the EL layer 815 and the conductive layer 816 can be processed into a stripe shape. Thus, the conductive layer 816 of all the light-emitting elements can be supplied with a predetermined potential without being in a floating state.

Note that although FIG. 37A and FIG. 37B illustrate an example where the EL layer 815 has a structure that exhibits different colors for pixels of R, G, and B (also referred to as an SBS (Side By Side) structure), one embodiment of the present invention is not limited thereto. For example, each of the pixels of R, G, and B may include an EL layer which emits white light and include a coloring layer (what is called a color filter) on the side to which light is emitted from the EL layer which emits white light. Note that the EL layer which emits white light may have a structure in which a plurality of light-emitting units are connected in series with an intermediate layer (charge-generation layer) therebetween (also referred to as to a tandem structure). The tandem structure enables a light-emitting element capable of high luminance light emission. In this specification and the like, a light-emitting element including the EL layer which emits white light is sometimes referred to as a white-light-emitting element.

When the above white-light-emitting element (having a single structure or a tandem structure) and a light-emitting element having an SBS structure are compared to each other, the light-emitting element having an SBS structure can have lower power consumption than the white-light-emitting element. To reduce power consumption, the light-emitting element having an SBS structure is suitably used. Meanwhile, the white-light-emitting element is suitable in terms of lower manufacturing cost or higher manufacturing yield because the manufacturing process of the white-light-emitting element is simpler than that of the light-emitting element having an SBS structure.

The above is the description of the variation examples.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 3

In this embodiment, a display device that includes the semiconductor device of one embodiment of the present invention will be described with reference to FIG. 38A to 38C.

Figure 38A:
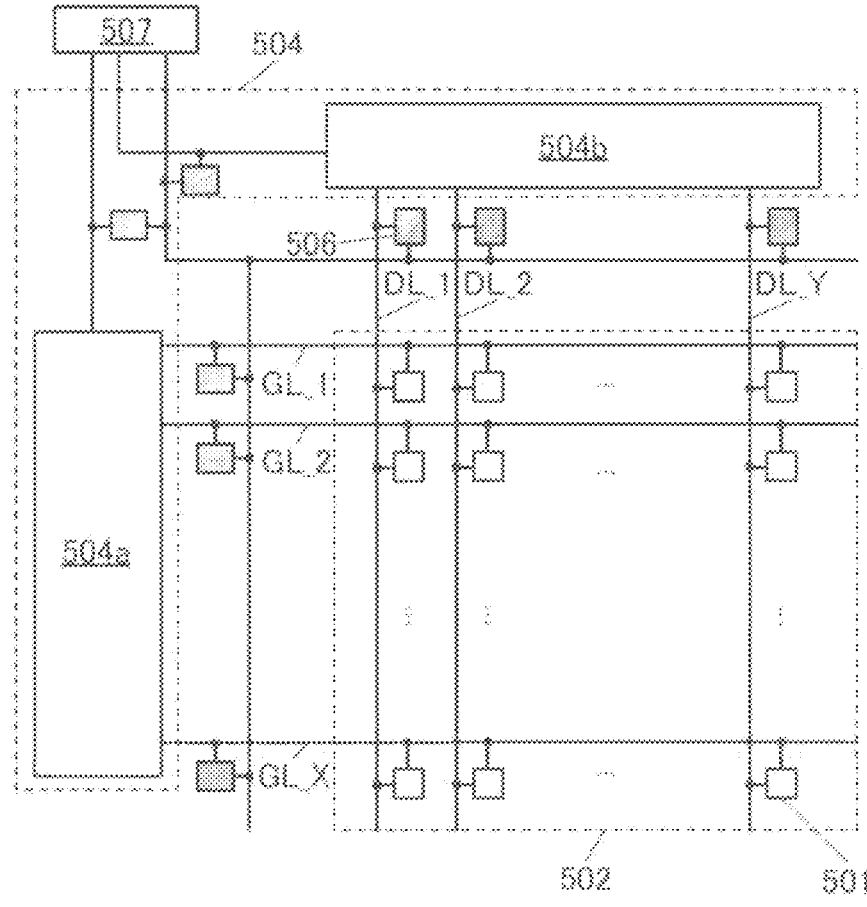
FIG. 38A is a block diagram of a display device.
Figure 38A:
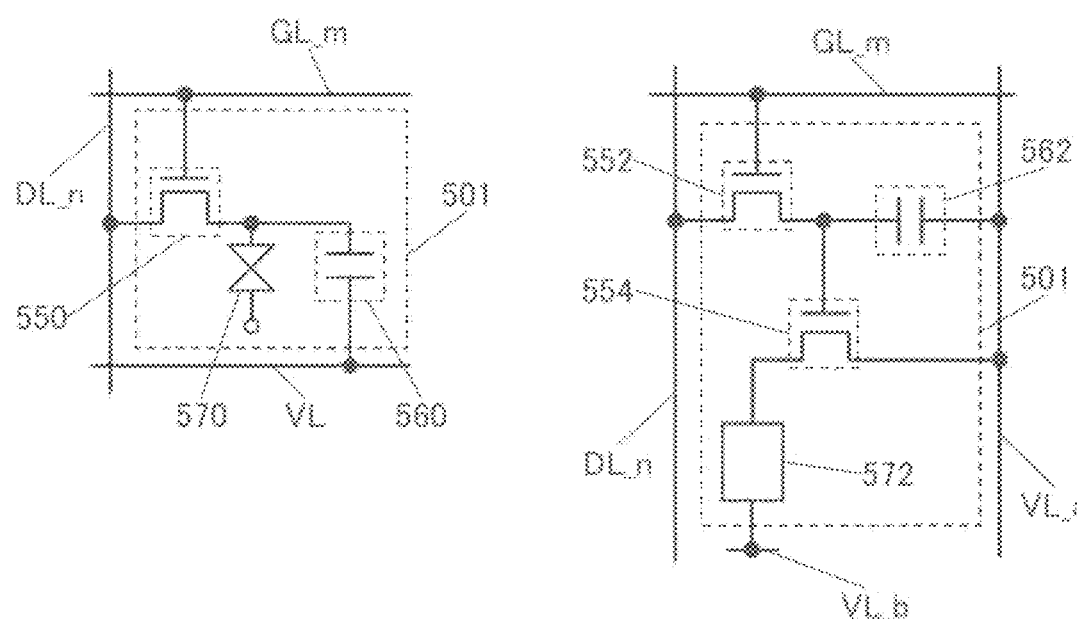

A display device illustrated in FIG. 38A includes a pixel portion 502, a driver circuit portion 504, protection circuits 506, and a terminal portion 507. Note that a structure in which the protection circuits 506 are not provided may be employed.

The transistor of one embodiment of the present invention can be used as transistors included in the pixel portion 502 and transistors included in the driver circuit portion 504. The transistor of one embodiment of the present invention may also be used in the protection circuits 506.

The pixel portion 502 includes a plurality of pixel circuits 501 arranged in X rows and Y columns (X and Y each independently represent a natural number of 2 or more). Each of the pixel circuits 501 includes a circuit for driving a display element.

The driver circuit portion 504 includes driver circuits such as a gate driver 504a that outputs a scanning signal to a gate line GL_1 to a gate line GL_X and a source driver 504b that supplies a data signal to a data line DL_1 to a data line DL_Y. The gate driver 504a includes at least a shift register. The source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is applied to a wiring to which the protection circuit 506 is connected, establishes continuity between the wiring and another wiring. The protection circuit 506 illustrated in FIG. 38A is connected to a variety of wirings such as the gate lines GL that are wirings between the gate driver 504a and the pixel circuits 501 and the data lines DL that are wirings between the source driver 504b and the pixel circuits 501, for example. Note that the protection circuits 506 are hatched in FIG. 38A to distinguish the protection circuits 506 from the pixel circuits 501.

The gate driver 504a and the source driver 504b may be provided over a substrate over which the pixel portion 502 is provided, or a substrate where a gate driver circuit or a source driver circuit is separately formed (e.g., a driver circuit board formed using a single crystal semiconductor or a polycrystalline semiconductor) may be mounted on the substrate over which the pixel portion 502 is provided by COG or TAB (Tape Automated Bonding).

The plurality of pixel circuits 501 illustrated in FIG. 38A can have a structure illustrated in FIG. 38B or FIG. 38C, for example.

The pixel circuit 501 illustrated in FIG. 38B includes a liquid crystal element 570, a transistor 550, and a capacitor 560. The data line DL_n, the gate line GL_m, a potential supply line VL, and the like are connected to the pixel circuit 501.

The potential of one of a pair of electrodes of the liquid crystal element 570 is set appropriately in accordance with the specifications of the pixel circuit 501. The alignment state of the liquid crystal element 570 is set depending on written data. Note that a common potential may be supplied to one of the pair of electrodes of the liquid crystal element 570 included in each of the plurality of pixel circuits 501. Alternatively, a different potential may be applied to one of the pair of electrodes of the liquid crystal element 570 of the pixel circuit 501 in each row.

The pixel circuit 501 illustrated in FIG. 38C includes a transistor 552, a transistor 554, a capacitor 562, and a light-emitting element 572. The data line DL_n, the gate line GL_m, a potential supply line VL_a, a potential supply line VL_b, and the like are connected to the pixel circuit 501.

Note that a high power supply potential VDD is applied to one of the potential supply line VL_a and the potential supply line VL_b, and a low power supply potential VSS is applied to the other. Current flowing through the light-emitting element 572 is controlled in accordance with a potential applied to a gate of the transistor 554, whereby the luminance of light emitted from the light-emitting element 572 is controlled.

At least part of the structure examples, the drawings corresponding thereto, and the like exemplified in this embodiment can be implemented in combination with the other structure examples, the other drawings, and the like as appropriate.

At least part of this embodiment can be implemented in combination with the other embodiments described in this specification as appropriate.

Embodiment 4

A pixel circuit including a memory for correcting gray levels displayed by pixels and a display device including the pixel circuit will be described below. The transistor described in Embodiment 1 can be used as a transistor used in the pixel circuit described below.

<Circuit Configuration>

FIG. 39A is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other is connected to one electrode of the capacitor C1. In the transistor M2, a gate is connected to the wiring G2, one of a source and a drain is connected to the wiring S2, and the other is connected to the other electrode of the capacitor C1 and the circuit 401.

The circuit 401 is a circuit including at least one display element. Any of a variety of elements can be used as the display element, and typically, a light-emitting element such as an organic EL element or an LED element, a liquid crystal element, a MEMS (Micro Electro Mechanical Systems) element, or the like can be used.

A node connecting the transistor M1 and the capacitor C1 is denoted as a node N1, and a node connecting the transistor M2 and the circuit 401 is denoted as a node N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 1, can be used as one or both of the transistor M1 and the transistor M2. Accordingly, owing to an extremely low off-state current, the potential of the node N1 or the node N2 can be retained for a long time. Note that in the case where the period in which the potential of each node is retained is short (specifically, the case where the frame frequency is higher than or equal to 30 Hz, for example), a transistor using a semiconductor such as silicon may be used.

<Driving Method Example>

Next, an example of a method for operating the pixel circuit 400 is described with reference to FIG. 39B. FIG. 39B is a timing chart of the operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 39B, one frame period is divided into a period T1 and a period T2. The period T1 is a period in which a potential is written to the node N2, and the period T2 is a period in which a potential is written to the node N1.

[Period T1]

In the period T1, a potential for turning on the transistor is applied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is applied from the wiring S1 to the node N1 through the transistor M1. The first data potential $V_w$ is applied from the wiring S2 to the node N2 through the transistor M2. Accordingly, a potential difference $V_w$-$V_{ref}$ is retained in the capacitor C1.

[Period T2]

Next, in the period T2, a potential for turning on the transistor M1 is applied to the wiring G1, and a potential for turning off the transistor M2 is applied to the wiring G2. A second data potential $V_{data}$ is supplied to the wiring S1. The wiring S2 may be supplied with a predetermined constant potential or brought into a floating state.

The second data potential $V_{data}$ is applied from the wiring S1 to the node N1 through the transistor M1. At this time, capacitive coupling due to the capacitor C1 changes the potential of the node N2 in accordance with the second data potential $V_{data}$ by a potential dV. That is, a potential that is the sum of the first data potential $V_w$ and the potential dV is input to the circuit 401. Note that although the potential dV is shown as a positive value in FIG. 39B, the potential dV may be a negative value. That is, the second data potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied by a source driver connected to the wiring S1 and the wiring S2. For example, in the case where a light-emitting element is used, high-dynamic range (HDR) display or the like can be performed. In the case where a liquid crystal element is used, overdriving or the like can be achieved.

Application Example

[Example Using Liquid Crystal Element]

A pixel circuit 400LC illustrated in FIG. 39C includes a circuit 401LC. The circuit 401LC includes a liquid crystal element LC and a capacitor C2.

In the liquid crystal element LC, one electrode is connected to the node N2 and one electrode of the capacitor C2, and the other electrode is connected to a wiring supplied with a potential $V_{com2}$. The other electrode of the capacitor C2 is connected to a wiring supplied with a potential $V_{com1}$.

The capacitor C2 functions as a storage capacitor. Note that the capacitor C2 can be omitted when not needed.

In the pixel circuit 400LC, a high voltage can be supplied to the liquid crystal element LC; thus, high-speed display can be performed by overdriving or a liquid crystal material with a high driving voltage can be employed, for example. Moreover, by supply of a correction signal to the wiring S1 or the wiring S2, a gray level can be corrected in accordance with the operating temperature, the deterioration state of the liquid crystal element LC, or the like.

[Example Using Light-Emitting Element]

A pixel circuit 400EL illustrated in FIG. 39D includes a circuit 401EL. The circuit 401EL includes a light-emitting element EL, a transistor M3, and the capacitor C2.

In the transistor M3, a gate is connected to the node N2 and one electrode of the capacitor C2, one of a source and a drain is connected to a wiring supplied with a potential $V_H$, and the other is connected to one electrode of the light-emitting element EL. The other electrode of the capacitor C2 is connected to a wiring supplied with a potential $V_{com}$. The other electrode of the light-emitting element EL is connected to a wiring supplied with a potential VL.

The transistor M3 has a function of controlling current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential $V_H$ and the potential $V_L$ can be appropriately changed.

In the pixel circuit 400EL, a large amount of current can flow through the light-emitting element EL when a high potential is applied to the gate of the transistor M3, which enables HDR display, for example. A variation in the electrical characteristics of the transistor M3 and the light-emitting element EL can be corrected by supply of a correction signal to the wiring S1 or the wiring S2.

Note that the configuration is not limited to the circuits illustrated in FIG. 39C and FIG. 39D, and a configuration to which a transistor, a capacitor, or the like is further added may be employed.

At least part of this embodiment can be implemented in combination with the other embodiments described in this specification as appropriate.

Embodiment 5

In this embodiment, a display module that can be fabricated using one embodiment of the present invention is described.

Figures 40A, 40B:
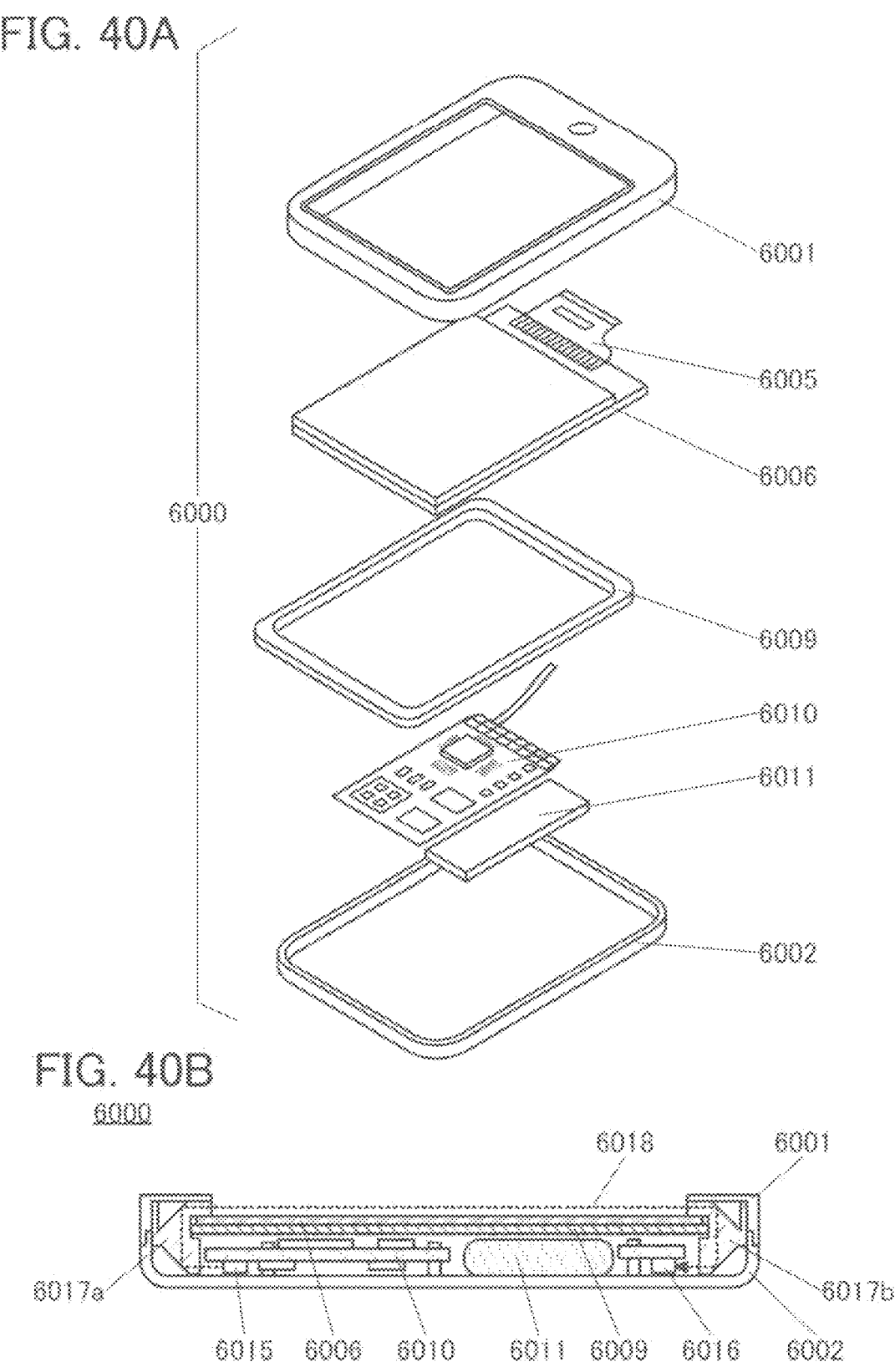
FIG. 40A and FIG. 40B are diagrams illustrating a structure example of a display module.

In a display module 6000 illustrated in FIG. 40A, a display device 6006 to which an FPC 6005 is connected, a frame 6009, a printed circuit board 6010, and a battery 6011 are provided between an upper cover 6001 and a lower cover 6002.

A display device fabricated using one embodiment of the present invention can be used as the display device 6006, for example. With the display device 6006, a display module with extremely low-power consumption can be achieved.

The shape or size of the upper cover 6001 and the lower cover 6002 can be changed as appropriate in accordance with the size of the display device 6006.

The display device 6006 may have a function of a touch panel.

The frame 6009 may have a function of protecting the display device 6006, a function of blocking electromagnetic waves generated by the operation of the printed circuit board 6010, a function of a heat dissipation plate, or the like.

The printed circuit board 6010 includes a power supply circuit, a signal processing circuit for outputting a video signal and a clock signal, a battery control circuit, and the like. FIG. 40B is a schematic cross-sectional view of the display module 6000 having an optical touch sensor.

The display module 6000 includes a light-emitting portion 6015 and a light-receiving portion 6016 that are provided on the printed circuit board 6010. Furthermore, a pair of light guide portions (a light guide portion 6017a and a light guide portion 6017b) are provided in regions surrounded by the upper cover 6001 and the lower cover 6002.

The display device 6006 overlaps with the printed circuit board 6010 and the battery 6011 with the frame 6009 therebetween. The display device 6006 and the frame 6009 are fixed to the light guide portion 6017a and the light guide portion 6017b.

Light 6018 emitted from the light-emitting portion 6015 travels over the display device 6006 through the light guide portion 6017a and reaches the light-receiving portion 6016 through the light guide portion 6017b. For example, blocking of the light 6018 by a sensing target such as a finger or a stylus enables detection of touch operation.

A plurality of light-emitting portions 6015 are provided along two adjacent sides of the display device 6006, for example. A plurality of light-receiving portions 6016 are provided at the positions on the opposite side of the light-emitting portions 6015. Accordingly, information about the position of touch operation can be obtained.

As the light-emitting portion 6015, a light source such as an LED element can be used, for example, and it is particularly preferable to use a light source emitting infrared rays. As the light-receiving portion 6016, a photoelectric element that receives light emitted from the light-emitting portion 6015 and converts it into an electrical signal can be used. A photodiode that can receive infrared rays can be suitably used.

With the use of the light guide portion 6017a and the light guide portion 6017b which transmit the light 6018, the light-emitting portion 6015 and the light-receiving portion 6016 can be placed under the display device 6006, and a malfunction of the touch sensor due to external light reaching the light-receiving portion 6016 can be inhibited. Particularly when a resin that absorbs visible light and transmits infrared rays is used, a malfunction of the touch sensor can be suppressed more effectively.

At least part of this embodiment can be implemented in combination with the other embodiments described in this specification as appropriate.

Embodiment 6

In this embodiment, examples of an electronic device for which the display device of one embodiment of the present invention can be used will be described.

Figures 41A, 41B:
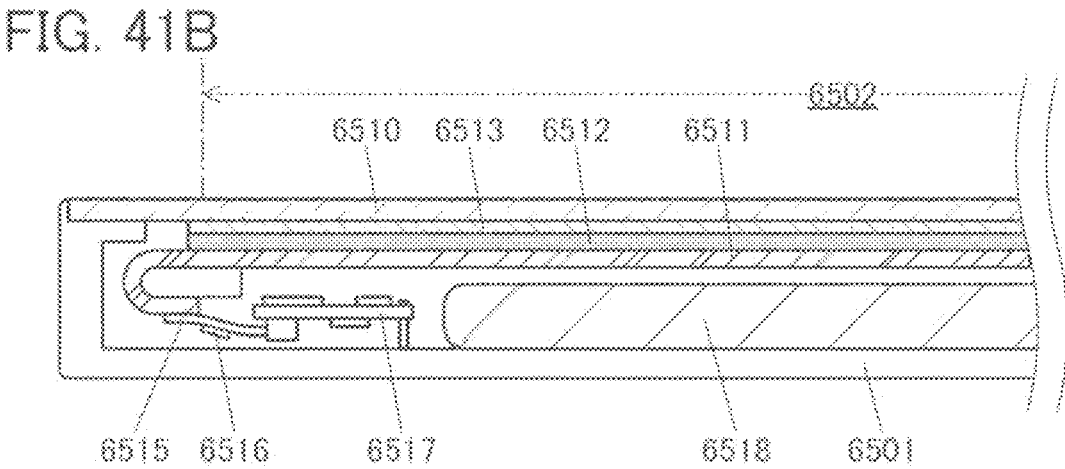
FIG. 41A and FIG. 41B are diagrams illustrating a structure example of an electronic device.

An electronic device 6500 illustrated in FIG. 41A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display device of one embodiment of the present invention can be used in the display portion 6502.

FIG. 41B is a schematic cross-sectional view including an end portion of the housing 6501 on the microphone 6506 side.

A protective member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protective member 6510.

The display panel 6511, the optical member 6512, and the touch sensor panel 6513 are fixed to the protective member 6510 with a bonding layer not illustrated.

Part of the display panel 6511 is bent in a region outside the display portion 6502. An FPC 6515 is connected to the bent part. An IC 6516 is mounted on the FPC 6515. The FPC 6515 is connected to a terminal provided for the printed circuit board 6517.

A flexible display panel of one embodiment of the present invention can be used as the display panel 6511. Thus, an extremely lightweight electronic device can be achieved.

Furthermore, since the display panel 6511 is extremely thin, the battery 6518 with a high capacity can be provided without an increase in the thickness of the electronic device. Moreover, part of the display panel 6511 is bent to provide a connection portion with the FPC 6515 on the back side of the pixel portion, whereby an electronic device with a narrow bezel can be obtained.

At least part of this embodiment can be implemented in combination with the other embodiments described in this specification as appropriate.

Embodiment 7

In this embodiment, electronic devices each including a display device fabricated using one embodiment of the present invention will be described.

Electronic devices exemplified below each include the display device of one embodiment of the present invention in a display portion. Thus, the electronic devices achieve high resolution. In addition, the electronic devices can each achieve both high resolution and a large screen.

A display portion in an electronic device of one embodiment of the present invention can display a video with a resolution of, for example, full high definition, 4K2K, 8K4K, 16K8K, or higher.

Examples of the electronic devices include a digital camera, a digital video camera, a digital photo frame, a cellular phone, a portable game machine, a portable information terminal, and an audio reproducing device, in addition to electronic devices with comparatively large screens, such as a television device, a notebook personal computer, a monitor device, digital signage, a pachinko machine, and a game machine.

An electronic device using one embodiment of the present invention can be incorporated along a flat surface or a curved surface of an inside wall or an outside wall of a house or a building, an interior or an exterior of a car, or the like.

FIG. 42A is a diagram illustrating appearance of a camera 8000 to which a finder 8100 is attached.

The camera 8000 includes a housing 8001, a display portion 8002, operation buttons 8003, a shutter button 8004, and the like. In addition, a detachable lens 8006 is attached to the camera 8000.

Note that the lens 8006 and the housing may be integrated with each other in the camera 8000.

The camera 8000 can take images by the press of the shutter button 8004 or touch on the display portion 8002 serving as a touch panel.

The housing 8001 includes a mount including an electrode, so that the finder 8100, a stroboscope, or the like can be connected to the housing.

The finder 8100 includes a housing 8101, a display portion 8102, a button 8103, and the like.

The housing 8101 is attached to the camera 8000 with the mount engaging with a mount of the camera 8000. In the finder 8100, a video or the like received from the camera 8000 can be displayed on the display portion 8102.

The button 8103 has a function of a power button or the like.

The display device of one embodiment of the present invention can be used for the display portion 8002 of the camera 8000 and the display portion 8102 of the finder 8100. Note that a finder may be incorporated in the camera 8000.

FIG. 42B is a diagram illustrating appearance of a head-mounted display 8200.

The head-mounted display 8200 includes a mounting portion 8201, a lens 8202, a main body 8203, a display portion 8204, a cable 8205, and the like. In addition, a battery 8206 is incorporated in the mounting portion 8201.

The cable 8205 supplies power from the battery 8206 to the main body 8203. The main body 8203 includes a wireless receiver or the like and can display received video information on the display portion 8204. In addition, the main body 8203 is provided with a camera, and data on the movement of the user's eyeball or eyelid can be used as an input means.

The mounting portion 8201 may be provided with a plurality of electrodes capable of sensing current flowing in response to the movement of the user's eyeball in a position in contact with the user to have a function of recognizing the user's sight line. Furthermore, the mounting portion 8201 may have a function of monitoring the user's pulse with the use of current flowing through the electrodes. Moreover, the mounting portion 8201 may include a variety of sensors such as a temperature sensor, a pressure sensor, and an acceleration sensor to have one or more of a function of displaying the user's biological information on the display portion 8204 and a function of changing a video displayed on the display portion 8204 in accordance with the movement of the user's head.

The display device of one embodiment of the present invention can be used for the display portion 8204.

FIG. 42C, FIG. 42D, and FIG. 42E are diagrams illustrating appearance of a head-mounted display 8300. The head-mounted display 8300 includes a housing 8301, a display portion 8302, band-shaped fixing units 8304, and a pair of lenses 8305.

A user can see display on the display portion 8302 through the lenses 8305. Note that the display portion 8302 is preferably curved and placed because the user can feel a high realistic sensation. In addition, when another image displayed in a different region of the display portion 8302 is viewed through the lenses 8305, 3D display using parallax or the like can also be performed. Note that the structure is not limited to that in which one display portion 8302 is provided, and two display portions 8302 may be provided so that one display portion is provided for one eye of the user.

Note that the display device of one embodiment of the present invention can be used in the display portion 8302. The display device including the semiconductor device of one embodiment of the present invention has an extremely high resolution; thus, even when a video is magnified by the lenses 8305 as in FIG. 42E, the user does not perceive pixels, and a more realistic video can be displayed.

Electronic devices illustrated in FIG. 43A to FIG. 43G include a housing 9000, a display portion 9001, a speaker 9003, an operation key 9005 (including a power switch or an operation switch), a connection terminal 9006, a sensor 9007 (a sensor having a function of measuring force, displacement, a position, speed, acceleration, angular velocity, rotational frequency, distance, light, liquid, magnetism, temperature, a chemical substance, sound, time, hardness, an electric field, current, voltage, power, radiation, flow rate, humidity, a gradient, oscillation, an odor, or infrared rays), a microphone 9008, and the like.

The electronic devices illustrated in FIG. 43A to FIG. 43G have a variety of functions. For example, the electronic devices can have a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of reading out and processing a program or data stored in a recording medium, and the like. Note that the functions of the electronic devices are not limited thereto, and the electronic devices can have a variety of functions. The electronic devices may include a plurality of display portions. In addition, the electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 43A to FIG. 43G are described below.

FIG. 43A is a perspective view illustrating a television device 9100. The display portion 9001 having a large screen size of, for example, 50 inches or more, or 100 inches or more can be incorporated in the television device 9100.

FIG. 43B is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, or the like. The portable information terminal 9101 can display one or more of text and image information on its plurality of surfaces. FIG. 43B illustrates an example in which three icons 9050 are displayed. Furthermore, information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in a position where the information 9051 is displayed.

FIG. 43C is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is illustrated. For example, the user can check the information 9053 displayed in a position that can be observed from above the portable information terminal 9102, with the portable information terminal 9102 put in a breast pocket of his/her clothes. The user can seethe display without taking out the portable information terminal 9102 from the pocket and decide whether to answer a call, for example.

FIG. 43D is a perspective view illustrating a watch-type portable information terminal 9200. In addition, a display surface of the display portion 9001 is curved and provided, and display can be performed along the curved display surface. Furthermore, intercommunication between the portable information terminal 9200 and, for example, a headset capable of wireless communication enables hands-free calling. Moreover, with the connection terminal 9006, the portable information terminal 9200 can also perform mutual data transmission with another information terminal or charging. Note that charging operation may be performed by wireless power feeding.

FIG. 43E, FIG. 43F, and FIG. 43G are perspective views illustrating a foldable portable information terminal 9201. In addition, FIG. 43E is a perspective view of an unfolded state of the portable information terminal 9201, FIG. 43G is a perspective view of a folded state thereof, and FIG. 43F is a perspective view of a state in the middle of change from one of FIG. 43E and FIG. 43G to the other. The portable information terminal 9201 is highly portable in the folded state and is highly browsable in the unfolded state because of a seamless large display region. The display portion 9001 of the portable information terminal 9201 is supported by three housings 9000 joined with hinges 9055. For example, the display portion 9001 can be bent with a radius of curvature greater than or equal to 1 mm and less than or equal to 150 mm.

FIG. 44A illustrates an example of a television device. In a television device 7100, a display portion 7500 is incorporated in a housing 7101. Here, a structure in which the housing 7101 is supported by a stand 7103 is illustrated.

Operation of the television device 7100 illustrated in FIG. 44A can be performed with an operation switch provided in the housing 7101 or a separate remote controller 7111. Alternatively, a touch panel may be used for the display portion 7500, and the television device 7100 may be operated by touch on the touch panel. The remote controller 7111 may include a display portion in addition to operation buttons.

Note that the television device 7100 may include a television receiver or a communication device for network connection.

FIG. 44B illustrates a notebook personal computer 7200. The notebook personal computer 7200 includes a housing 7211, a keyboard 7212, a pointing device 7213, an external connection port 7214, and the like. The display portion 7500 is incorporated in the housing 7211.

FIG. 44C and FIG. 44D illustrate examples of digital signage.

Digital signage 7300 illustrated in FIG. 44C includes a housing 7301, the display portion 7500, a speaker 7303, and the like. Furthermore, the digital signage can include an LED lamp, operation keys (including a power switch or an operation switch), a connection terminal, a variety of sensors, a microphone, and the like.

FIG. 44D is digital signage 7400 attached to a cylindrical pillar 7401. The digital signage 7400 includes the display portion 7500 provided along a curved surface of the pillar 7401.

The larger display portion 7500 can increase the amount of information that can be provided at a time and attracts more attention, so that the effectiveness of the advertisement can be increased, for example.

A touch panel is preferably used for the display portion 7500 so that the user can operate the digital signage. Thus, the digital signage can be used not only for advertising but also for providing information that the user needs, such as route information, traffic information, or guidance information on a commercial facility.

As illustrated in FIG. 44C and FIG. 44D, it is preferable that the digital signage 7300 or the digital signage 7400 can work with an information terminal 7311 such as a user's smartphone through wireless communication. For example, information of an advertisement displayed on the display portion 7500 can be displayed on a screen of the information terminal 7311. For example, the display on the display portion 7500 can be switched by operation of the information terminal 7311.

It is possible to make the digital signage 7300 or the digital signage 7400 execute a game with the use of the information terminal 7311 as an operation means (controller). Thus, an unspecified number of users can join in and enjoy the game concurrently.

The display device of one embodiment of the present invention can be used for the display portion 7500 in FIG. 44A to FIG. 44D.

The electronic devices of this embodiment each include a display portion; however, one embodiment of the present invention can also be used in an electronic device without a display portion.

At least part of this embodiment can be implemented in combination with the other embodiments described in this specification as appropriate.

Example 1

Figure 45A:
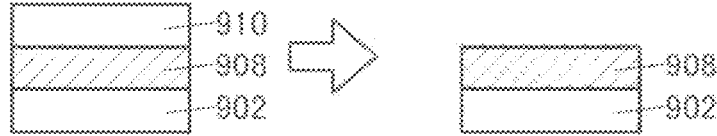
FIG. 45A to FIG. 45C are schematic diagrams illustrating structures of samples according to Example.
Figure 45B:
Figure 45C:
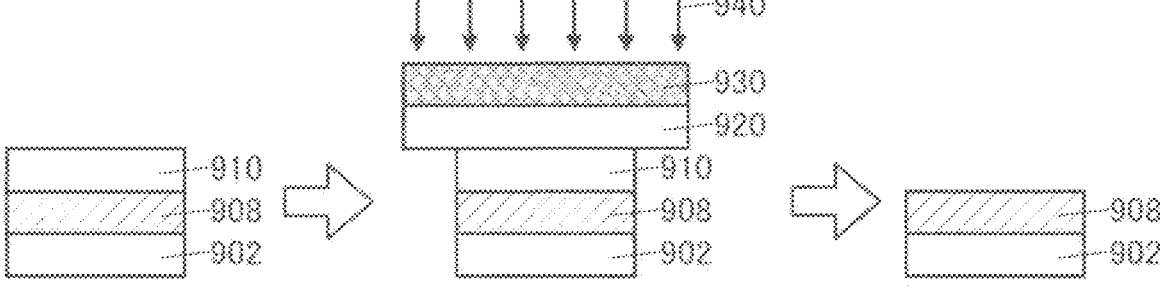

In this example, an influence of ultraviolet light on a metal oxide film was evaluated. In this example, three kinds of samples (Sample 1A, Sample 1B, and Sample 1C) each including a metal oxide film were fabricated. FIG. 45A is a cross-sectional schematic view of Sample 1A, FIG. 45B is a cross-sectional schematic view of Sample 1B, and FIG. 45C is a cross-sectional schematic view of Sample 1C. <Sample Fabrication>

First, a 30-nm-thick first metal oxide film 908 was deposited over a substrate 902. The first metal oxide film 908 was deposited by a sputtering method using an In—Ga—Zn oxide target (In:Ga:Zn=4:2:4.1 [atomic ratio]). The deposition pressure was 0.6 Pa, the power supply was 2.5 kW, and the substrate temperature was room temperature. A mixed gas of an oxygen gas and an argon gas was used as a deposition gas, and the oxygen flow rate ratio was 10%. A glass substrate was used as the substrate 902.

Next, after heat treatment was performed at 370° C. in a nitrogen gas atmosphere for one hour, another heat treatment was performed at 370° C. in a mixed atmosphere of a nitrogen gas and an oxygen gas for one hour. The mixed atmosphere had a volume ratio of the nitrogen gas to the oxygen gas of 4:1. An oven apparatus was used for the heat treatment.

Next, a 140-nm-thick silicon oxynitride film 910 was deposited over the first metal oxide film 908.

Next, heat treatment was performed at 370° C. in a nitrogen gas atmosphere for one hour. An oven apparatus was used for the heat treatment.

Next, a 20-nm-thick second metal oxide film was deposited over the silicon oxynitride film 910. The second metal oxide film was deposited by a sputtering method using an In—Ga—Zn oxide target (In:Ga:Zn=4:2:4.1 [atomic ratio]). The deposition pressure was 0.8 Pa, the power supply was 3.5 kW, and the substrate temperature was room temperature. An oxygen gas was used as a deposition gas (oxygen flow rate ratio: 100%).

Next, heat treatment was performed at 370° C. in a mixed atmosphere of a nitrogen gas and an oxygen gas for one hour. The mixed atmosphere had a volume ratio of the nitrogen gas to the oxygen gas of 4:1. An oven apparatus was used for the heat treatment.

Next, the second metal oxide film was removed.

Next, heat treatment was performed at 370° C. in a nitrogen gas atmosphere for one hour. An oven apparatus was used for the heat treatment.

Next, plasma treatment was performed on Sample 1B and Sample 1C with a dry etching apparatus. The plasma treatment was performed under the following conditions: a carbon tetrachloride gas was used, the ICP power supply was 6000 W, the bias power was 500 W, and the pressure was 0.67 Pa. During the plasma treatment, a mask was provided over each of Sample 1B and Sample 1C so that Sample 1B and Sample 1C were not exposed to the plasma. In Sample 1B, a quartz substrate 920 was used for the mask. In Sample 1C, a mask in which a light-blocking film 930 was provided over the quartz substrate 920 was used so as also not to be exposed to ultraviolet light. A 200-nm-thick aluminum film was used as the light-blocking film 930.

FIG. 45B is a schematic cross-sectional view of Sample 1B in the plasma treatment, and FIG. 45C is a schematic cross-sectional view of Sample 1C in the plasma treatment. FIG. 45B and FIG. 45C each schematically illustrate ultraviolet light 940 generated by the plasma.

Note that Sample 1A was not subjected to the plasma treatment.

Then, the silicon oxynitride film 910 was removed, so that the first metal oxide film 908 was exposed.

<Sheet Resistance Measurement>

Next, the sheet resistance of each sample fabricated as above was measured, so that the resistance of the first metal oxide film 908 was evaluated.

Figure 46:
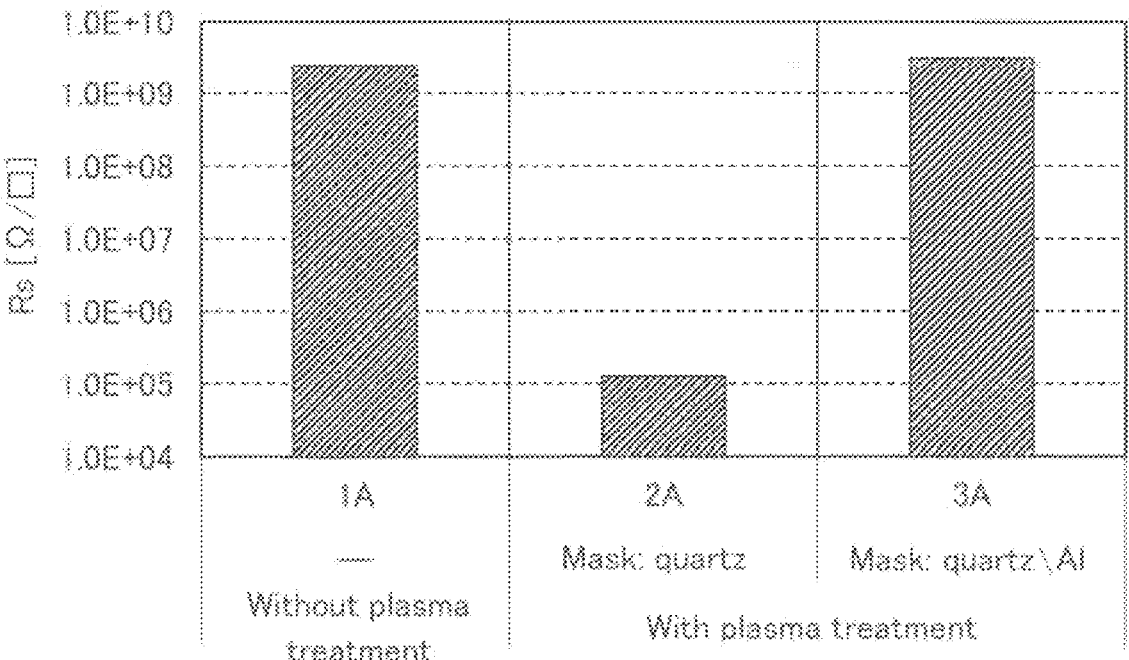
FIG. 46 is a diagram showing the resistance of samples according to Example.

FIG. 46 shows the sheet resistance values of the first metal oxide film 908 in each sample. In FIG. 46, the horizontal axis represents the sample names, whether or not the plasma treatment was performed, and the conditions of the mask used during the plasma treatment, and the vertical axis represents the sheet resistance (Rs) of the first metal oxide film 908.

As shown in FIG. 46, the resistance of Sample 1B that was exposed to ultraviolet light in the plasma treatment was lower than that of Sample TA that was not exposed to ultraviolet light since the plasma treatment was not performed. Meanwhile, the resistance of Sample 1C that was not exposed to ultraviolet light by plasma treatment was equal to the resistance of Sample TA.

The above results demonstrate that ultraviolet light generated in plasma treatment reduces the resistance of the metal oxide film. In addition, it is found that when the metal oxide film is not exposed to ultraviolet light during plasma treatment, the resistance of the metal oxide film can be inhibited from decreasing.

Example 2

In this example, the transmittances of organic materials that can be used in one embodiment of the present invention were evaluated. In this example, eight kinds of samples (Sample 2A to Sample 2H) including different organic materials were fabricated.

<Sample Fabrication>

In Sample 2A, a 1.5-μm-thick organic material A was formed over a glass substrate. As the organic material A, an acrylic resin (JEM-549 produced by JSR Corporation) was used.

In Sample 2B, a 1.5-μm-thick organic material B was formed over a glass substrate. As the organic material B, a polyimide resin (DL-1603 produced by Toray Industries, Inc.) was used.

In Sample 2C, a 1.5-μm-thick organic material C was formed over a glass substrate. As the organic material C, a novolac resin (RG-300 produced by Merck) was used. The organic material C is a material that can be used as a resist in a photolithography step, for example.

In Sample 2D, a 1.2-μm-thick organic material D was formed over a glass substrate. As the organic material D, a novolac resin (TELR-P003PM produced by TOKYO OHKA KOGYO CO., LTD.) was used. Note that the organic material D is brown.

In Sample 2E, a 0.6-μm-thick organic material E was formed over a glass substrate. As the organic material E, an acrylic resin (BK-4611 produced by TOKYO OHKA KOGYO CO., LTD.) was used. Note that the organic material E is black, and is a material that can also be used for a light-blocking layer, for example.

In Sample 2F, a 1.5-μm-thick organic material F was formed over a glass substrate. As the organic material F, an acrylic resin (CR-7001W produced by FUJIFILM Electronic Materials Co., Ltd.) was used. Note that the organic material F is red, and is a material that can also be used for a red coloring layer, for example.

In Sample 2G, a 1.5-μm-thick organic material G was formed over a glass substrate. As the organic material G, an acrylic resin (CG-7001W produced by FUJIFILM Electronic Materials Co., Ltd.) was used. Note that the organic material G is green, and is a material that can also be used for a green coloring layer, for example.

In Sample 2H, a 1.5-μm-thick organic material H was formed over a glass substrate. As the organic material H, an acrylic resin (CB-7001W produced by FUJIFILM Electronic Materials Co., Ltd.) was used. Note that the organic material H is blue, and is a material that can also be used for a blue coloring layer, for example.

Then, Sample 2A to Sample 2H were subjected to heat treatment at 250° C. An oven apparatus was used for the heat treatment. Sample 2A to Sample 2C and Sample 2F to Sample 2H were subjected to the heat treatment in a nitrogen gas atmosphere and the treatment time was one hour. Sample 2D was subjected to the heat treatment in an air atmosphere and the treatment time was one hour. Sample 2E was subjected to the heat treatment in a nitrogen gas atmosphere and the treatment time was 30 minutes. An oven apparatus was used for the heat treatment of each sample.

Sample 2I and Sample 2J were prepared as comparative samples. A glass substrate was used as Sample 2I. A quartz substrate was used as Sample 2J.

<Measurement of Transmittance>

Next, the transmittance of each of the samples fabricated above was measured.

Figure 47:
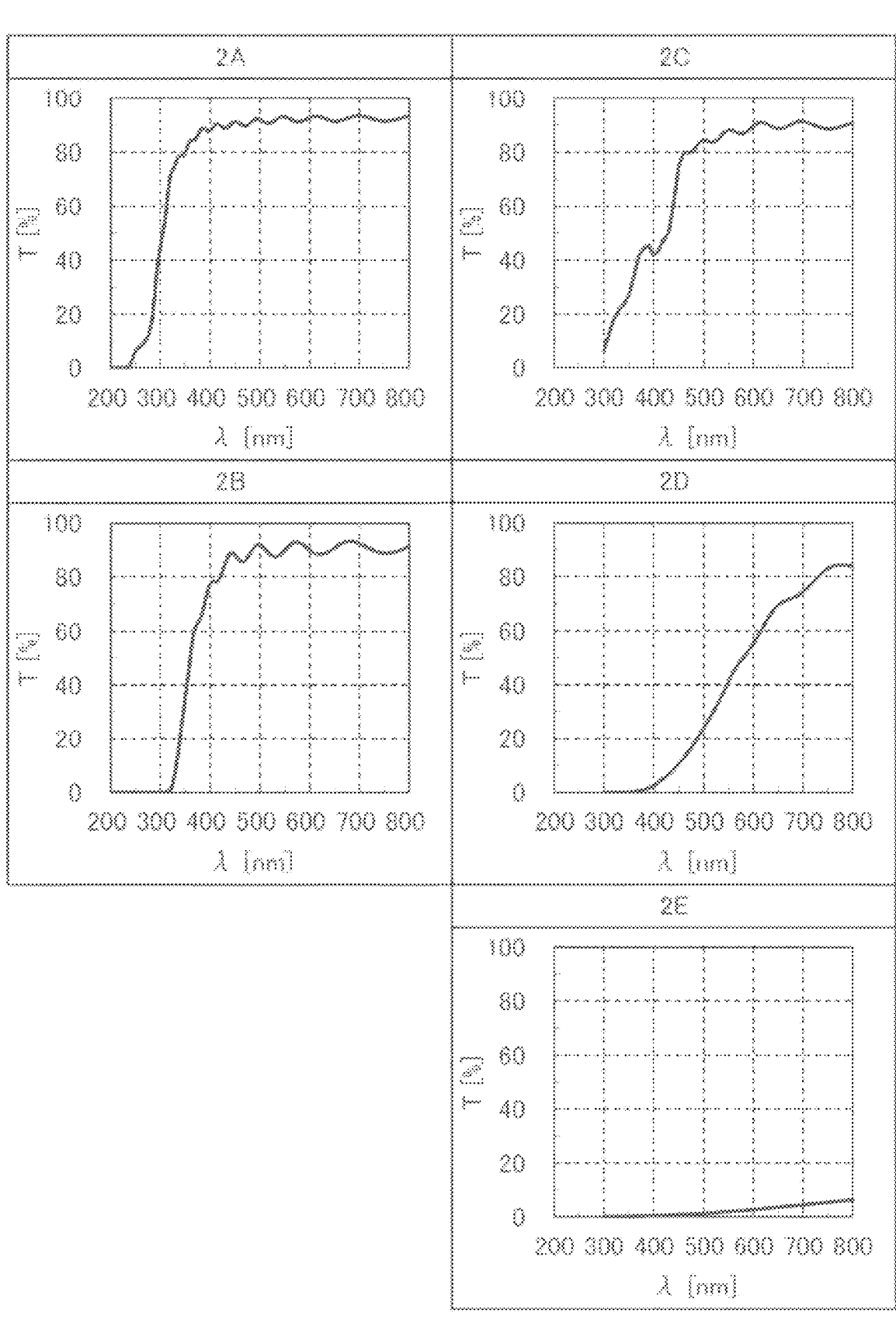
FIG. 47 is a diagram showing the transmittances of samples according to Example.
Figure 48:
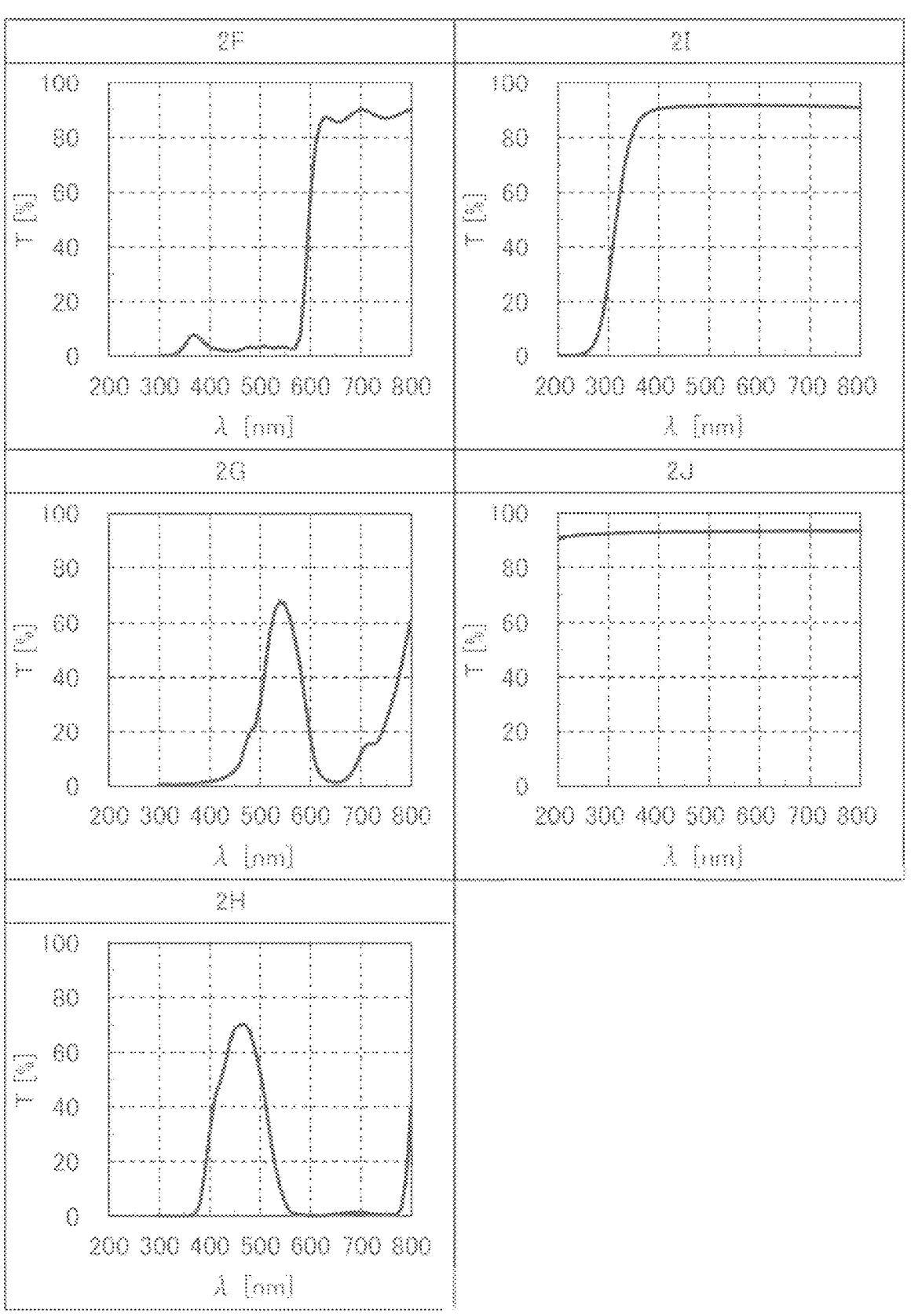
FIG. 48 is a diagram showing the transmittances of samples according to Example.

FIG. 47 and FIG. 48 show measurement results of the transmittances of the samples. In each of FIG. 47 and FIG. 48, the horizontal axis represents a wavelength λ and the vertical axis represents a transmittance T.

As shown in FIG. 47 and FIG. 48, it was found that Sample 2A to Sample 2H each had a low transmittance in an ultraviolet light wavelength region.

Example 3

In this example, transistors were fabricated, and the electrical characteristics were evaluated.

In this example, Sample 3A that is the transistor of one embodiment of the present invention and Sample 3B and Sample 3C that are comparative transistors were fabricated. For the structure of Sample 3A, the description of the transistor 100 in Embodiment 1 and FIG. 1A to FIG. 1C can be referred to.

Figure 49A:
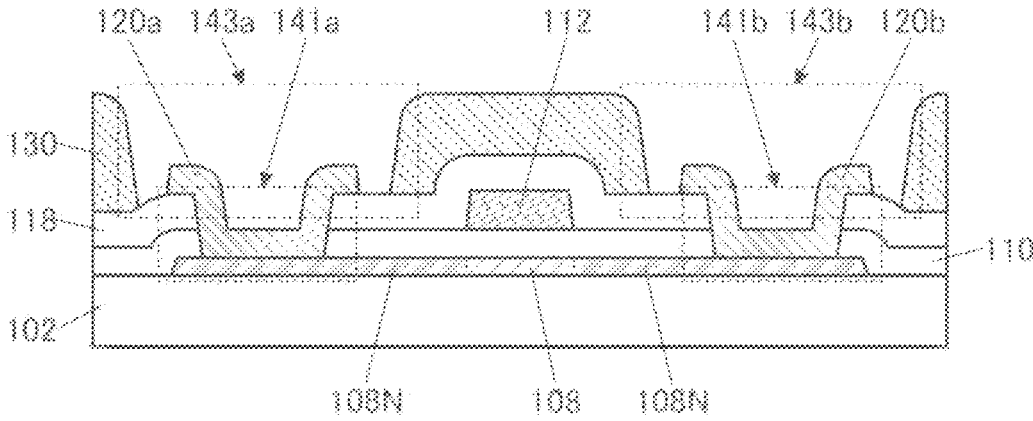
FIG. 49A to FIG. 49C are diagrams illustrating structures of samples according to Example.

FIG. 49A is a schematic cross-sectional view of Sample 3B that is a comparative example in the channel direction. Sample 3B is different from Sample 3A in that the peripheries of the opening 143a and the opening 143b included in the insulating layer 130 are positioned on the outer side than the peripheries of the opening 141a and the opening 141b included in the insulating layer 110 and the insulating layer 118, and the conductive layer 120a and the conductive layer 120b are in contact with the side surface of the insulating layer 110 and the side surface of the insulating layer 118.

Figure 49B:
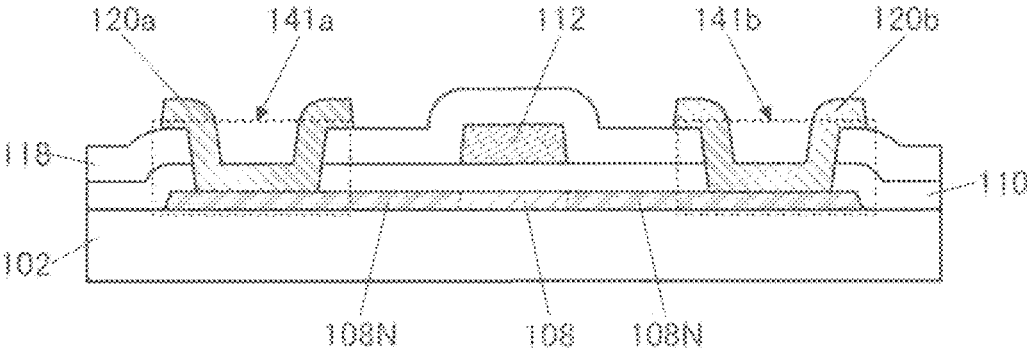

FIG. 49B is a schematic cross-sectional view of Sample 3C that is a comparative example in the channel direction. Sample 3C is different from Sample 3A in that the insulating layer 130 is not included, and the conductive layer 120a and the conductive layer 120b are in contact with the side surface of the insulating layer 110 and the side surface of the insulating layer 118.

<Sample Fabrication>

First, an approximately 30-nm-thick metal oxide film was deposited over the substrate 102. The metal oxide film was deposited by a sputtering method using a sputtering target with an atomic ratio of metal elements of In:Ga:Zn=1:1:1. A glass substrate was used as the substrate 102.

Next, heat treatment was performed at 340° C. in a dry air atmosphere for two hours. An oven apparatus was used for the heat treatment.

Next, a metal oxide film was deposited and processed to obtain the semiconductor layer 108.

Next, as the insulating layer 110 functioning as a gate insulating layer, an approximately 140-nm-thick silicon oxynitride film was deposited by a plasma CVD method.

Next, heat treatment was performed at 340° C. in a dry air atmosphere for one hour. An oven apparatus was used for the heat treatment.

Next, an approximately 50-nm-thick titanium film, an approximately 200-nm-thick aluminum film, and an approximately 50-nm-thick titanium film were each deposited by a sputtering method. Then, each of the conductive films was processed to obtain the conductive layer 112 functioning as a gate electrode.

Next, after plasma treatment was performed in a hydrogen atmosphere, an approximately 300-nm-thick silicon nitride oxide film was formed as the insulating layer 118. The plasma treatment and the formation of the silicon nitride oxide film were successively performed with a plasma CVD apparatus. By the plasma treatment, the low-resistance region 108N was formed in a region of the semiconductor layer 108 not overlapping with the conductive layer 112.

Next, the insulating layer 110 and the insulating layer 118 were partly removed by etching to form the opening 141a and the opening 141b.

Next, the insulating layer 130 was formed in each of Sample 3A and Sample 3B. As the insulating layer 130, an approximately 1.5-μm-thick polyimide resin was used. In this case, in Sample 3A that is the transistor of one embodiment of the present invention, the insulating layer 130 was formed so that the opening 143a included in the insulating layer 130 was positioned inside the opening 141a, and the opening 143b included in the insulating layer 130 was positioned inside the opening 141b, as illustrated in FIG. 1B. Thus, the side surface of the insulating layer 110 and the side surface of the insulating layer 118 were covered with the insulating layer 130 over the low-resistance region 108N.

In Sample 3B that is a comparative example, the insulating layer 130 was formed so that the periphery of the opening 143a included in the insulating layer 130 was positioned outside the periphery of the opening 141a, and the periphery of the opening 143b included in the insulating layer 130 was positioned outside the periphery of the opening 141b, as illustrated in FIG. 49A. Thus, the side surface of the insulating layer 110 and the side surface of the insulating layer 118 were not covered with the insulating layer 130 over the low-resistance region 108N. The insulating layer 130 was not formed in Sample 3C as illustrated in FIG. 49B.

Next, heat treatment was performed at 250° C. in a nitrogen gas atmosphere for one hour. An oven apparatus was used for the heat treatment.

Then, an approximately 50-nm-thick titanium film, an approximately 300-nm-thick aluminum film, and an approximately 50-nm-thick titanium film were each deposited by a sputtering method. After that, the conductive films were processed to obtain the conductive layer 120a and the conductive layer 120b functioning as a source electrode and a drain electrode.

Through the above steps, Sample 3A to Sample 3C were obtained.

<Id-Vg Characteristics of Transistors>

Next, the Id-Vg characteristics of the fabricated transistors of Sample 3A to Sample 3C were measured.

For measuring the Id-Vg characteristics of the transistors, voltage applied to the gate electrode (hereinafter also referred to as gate voltage (VG)) was applied from −15 V to +15 V in increments of 0.25 V. Moreover, voltage applied to the source electrode (hereinafter also referred to as source voltage (VS)) was 0 V (comm), and voltage applied to the drain electrode (hereinafter also referred to as drain voltage (VD)) was 0.1 V and 10 V.

Here, a transistor having a designed channel length of 6 μm and a designed channel width of 100 μm was measured. The number of measured transistors was 20 for each sample.

Figure 50:
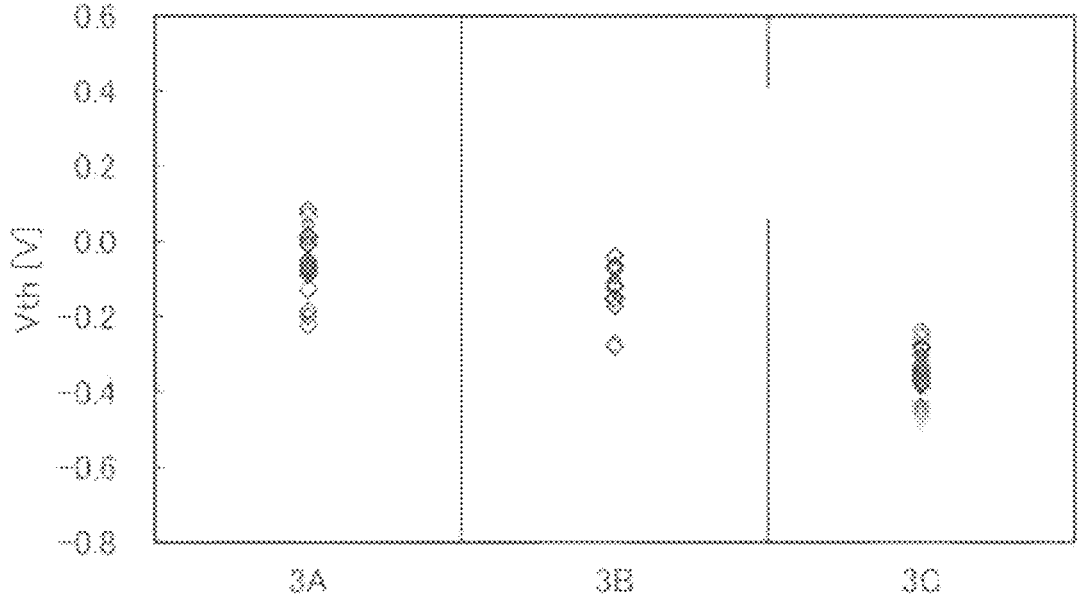
FIG. 50 is a diagram showing the threshold voltage of transistors according to Example.

FIG. 50 shows the threshold voltage Vth of the transistors of Sample 3A to Sample 3C. In FIG. 50, the horizontal axis represents the sample names, and the vertical axis represents the threshold voltage Vth.

As shown in FIG. 50, it was confirmed that the threshold voltage Vth of Sample 3B in which the insulating layer 130 is provided is on the positive side compared with that of Sample 3C in which the insulating layer 130 is not provided. In addition, it was confirmed that Sample 3A of the transistor of one embodiment of the present invention has the threshold voltage Vth that is further on the positive side as compared with Sample 3B and has favorable normally-off electrical characteristics.

Example 4

In this example, transistors were fabricated, and the electrical characteristics were evaluated.

In this example, Sample 4A and Sample 4B that are the transistors of one embodiment of the present invention and Sample 4C that is a comparative transistor were fabricated. For the structures of Sample 4A and Sample 4B, the description of the transistor 100C in Embodiment 1 and FIG. 13A to FIG. 13C can be referred to.

Figure 49C:
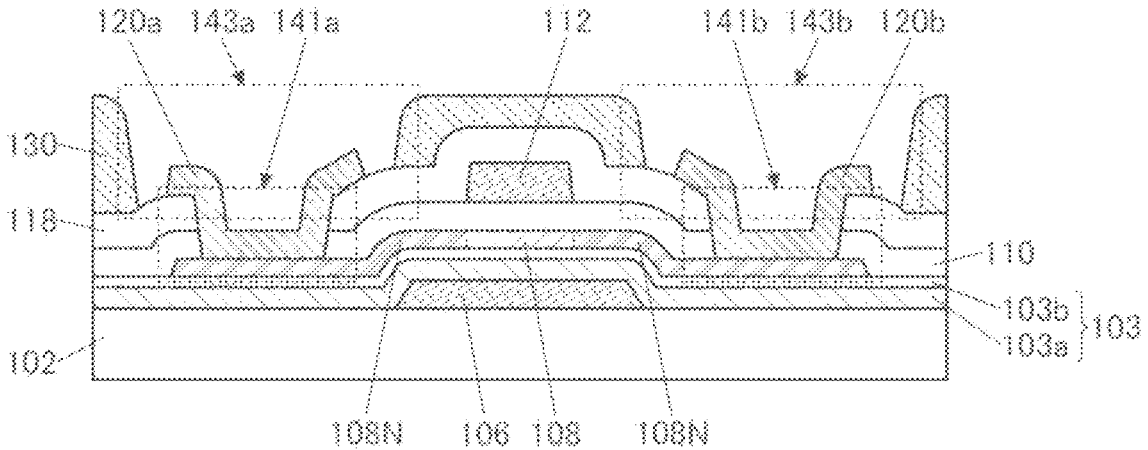

FIG. 49C is a schematic cross-sectional view of Sample 4C that is a comparative example in the channel direction. Sample 4C is different from Sample 4A and Sample 4B in that the peripheries of the opening 143a and the opening 143b included in the insulating layer 130 are positioned on the outer side than the peripheries of the opening 141a and the opening 141b included in the insulating layer 110 and the insulating layer 118, and the conductive layer 120a and the conductive layer 120b are in contact with the side surface of the insulating layer 110 and the side surface of the insulating layer 118.

<Sample Fabrication>

First, an approximately 100-nm-thick tungsten film was formed over a glass substrate by a sputtering method and processed to obtain the conductive layer 106 functioning as a first gate electrode.

Next, the insulating layer 103 functioning as a first gate insulating layer was formed. The insulating layer 103 had a stacked-layer structure of the insulating film 103a and the insulating film 103b. As the insulating film 103a, a stacked-layer structure of an approximately 30-nm-thick silicon nitride film and an approximately 280-nm-thick silicon nitride oxide film was used. An approximately 20-nm-thick silicon oxynitride film was used as the insulating film 103b.

Next, an approximately 30-nm-thick metal oxide film was deposited. The metal oxide film was deposited by a sputtering method using a sputtering target with an atomic ratio of metal elements of In:Ga:Zn=1:1:1.

Next, heat treatment was performed at 340° C. in a dry air atmosphere for two hours. An oven apparatus was used for the heat treatment.

Next, a metal oxide film was deposited and processed to obtain the semiconductor layer 108.

Next, as the insulating layer 110 functioning as a second gate insulating layer, an approximately 140-nm-thick silicon oxynitride film was deposited by a plasma CVD method.

Next, heat treatment was performed at 340° C. in a dry air atmosphere for one hour. An oven apparatus was used for the heat treatment.

Next, an approximately 50-nm-thick titanium film, an approximately 200-nm-thick aluminum film, and an approximately 50-nm-thick titanium film were each deposited by a sputtering method. Then, each of the conductive films was processed to obtain the conductive layer 112 functioning as a second gate electrode.

Next, after plasma treatment was performed in a hydrogen atmosphere, an approximately 300-nm-thick silicon nitride oxide film was formed as the insulating layer 118. The plasma treatment and the formation of the silicon nitride oxide film were successively performed with a plasma CVD apparatus. By the plasma treatment, the low-resistance region 108N was formed in a region of the semiconductor layer 108 not overlapping with the conductive layer 112.

Next, the insulating layer 110 and the insulating layer 118 were partly removed by etching to form the opening 141a and the opening 141b.

Next, the insulating layer 130 was formed. In each of Sample 4A and Sample 4C, a 2.0-μm-thick polyimide resin was used as the insulating layer 130. In Sample 4B, a 2.0-μm-thick acrylic resin was used as the insulating layer 130. In this case, in each of Sample 4A and Sample 4B that are the transistors of one embodiment of the present invention, the insulating layer 130 was formed so that the opening 143a included in the insulating layer 130 was positioned inside the opening 141a, and the opening 143b included in the insulating layer 130 was positioned inside the opening 141b, as illustrated in FIG. 13. Thus, the side surface of the insulating layer 110 and the side surface of the insulating layer 118 were covered with the insulating layer 130 over the low-resistance region 108N.

In Sample 4C that is a comparative example, the insulating layer 130 was formed so that the periphery of the opening 143a included in the insulating layer 130 was positioned outside the periphery of the opening 141a, and the periphery of the opening 143b included in the insulating layer 130 was positioned outside the periphery of the opening 141b, as illustrated in FIG. 49C. Thus, the side surface of the insulating layer 110 and the side surface of the insulating layer 118 were not covered with the insulating layer 130 over the low-resistance region 108N.

Next, heat treatment was performed at 250° C. in a nitrogen gas atmosphere for one hour. An oven apparatus was used for the heat treatment.

Then, an approximately 50-nm-thick titanium film, an approximately 300-nm-thick aluminum film, and an approximately 50-nm-thick titanium film were each deposited by a sputtering method. After that, the conductive films were processed to obtain the conductive layer 120a and the conductive layer 120b functioning as a source electrode and a drain electrode.

Through the above steps, Sample 4A to Sample 4C were obtained.

<Id-Vg Characteristics of Transistors>

Next, the Id-Vg characteristics of the fabricated transistors of Sample 4A to Sample 4C were measured.

For measuring the Id-Vg characteristics of the transistors, voltage applied to the gate electrode (hereinafter also referred to as gate voltage (VG)) was applied from −15 V to +15 V in increments of 0.25 V. Moreover, voltage applied to the source electrode (hereinafter also referred to as source voltage (VS)) was 0 V (comm), and voltage applied to the drain electrode (hereinafter also referred to as drain voltage (VD)) was 0.1 V and 10 V. The Id-Vg characteristics were measured by applying the same gate voltage to the first gate electrode and the second gate electrode.

Here, a transistor having a designed channel length of 3 μm and a designed channel width of 50 μm was measured. The number of measured transistors was 20 for each sample.

Figure 51:
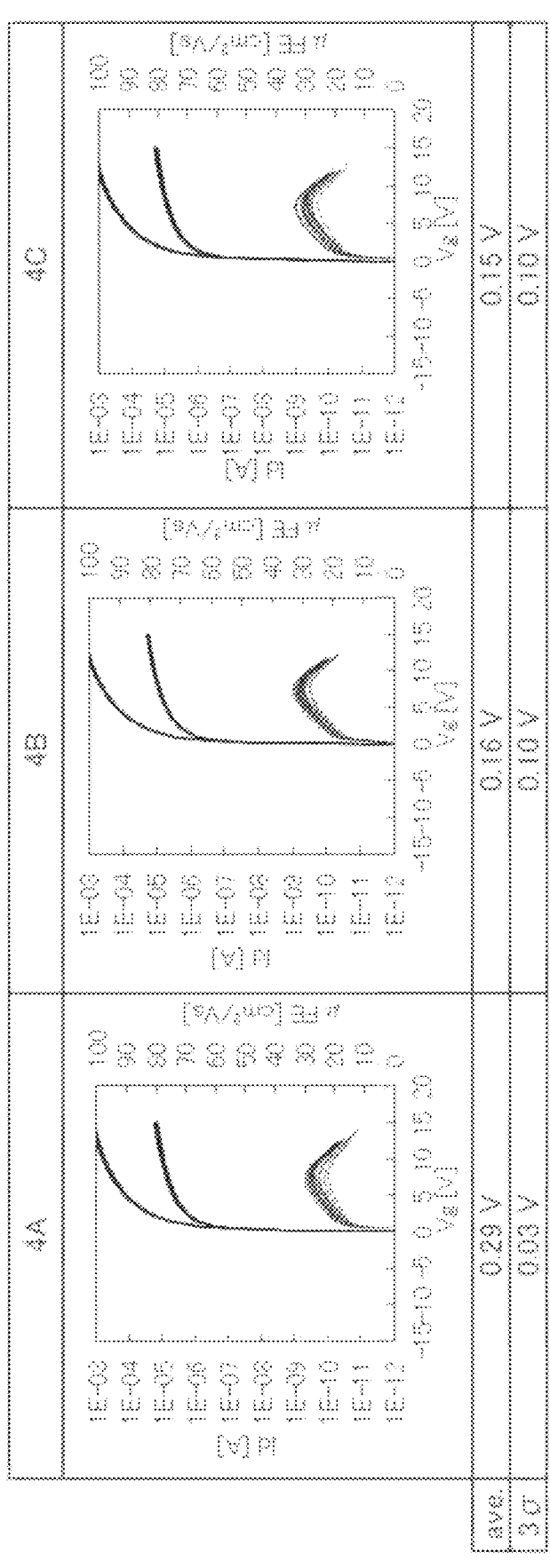
FIG. 51 is a diagram showing Id-Vg characteristics of transistors according to Example.

FIG. 51 shows the Id-Vg characteristics of Sample 4A to Sample 4C. FIG. 51 shows superimposed Id-Vg characteristics of the 20 transistors. FIG. 51 also shows an average value (ave.) of the threshold voltage Vth and a standard deviation (3u) of each of the samples.

As shown in FIG. 51, it was confirmed that the threshold voltage Vth of each of Sample 4A and Sample 4B of one embodiment of the present invention is on the positive side compared with that of Sample 4C that is a comparative example. In addition, it was confirmed that Sample 4A has the threshold voltage Vth that is further on the positive side as compared with Sample 4B and has favorable normally-off electrical characteristics.

<Cross-Sectional Observation>

Next, the samples were thinned by focused ion beam (FIB), and cross sections were observed with a scanning transmission electron microscope (by STEM: Scanning Transmission Electron Microscopy).

Figure 52A:
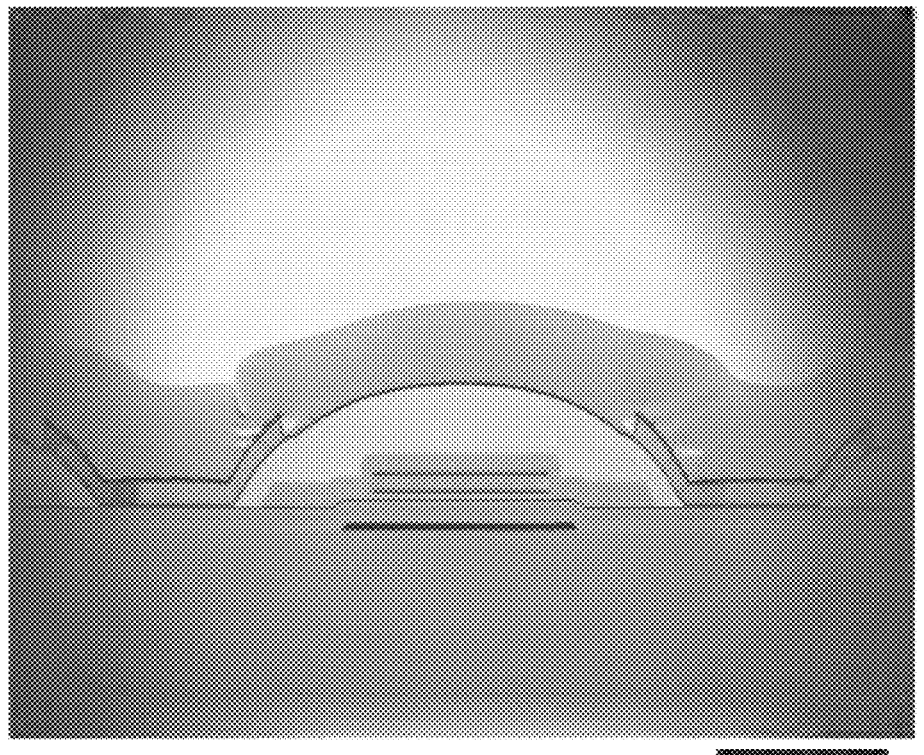
FIG. 52A and FIG. 52B are cross-sectional STEM images of a sample according to Example.
Figure 52B:
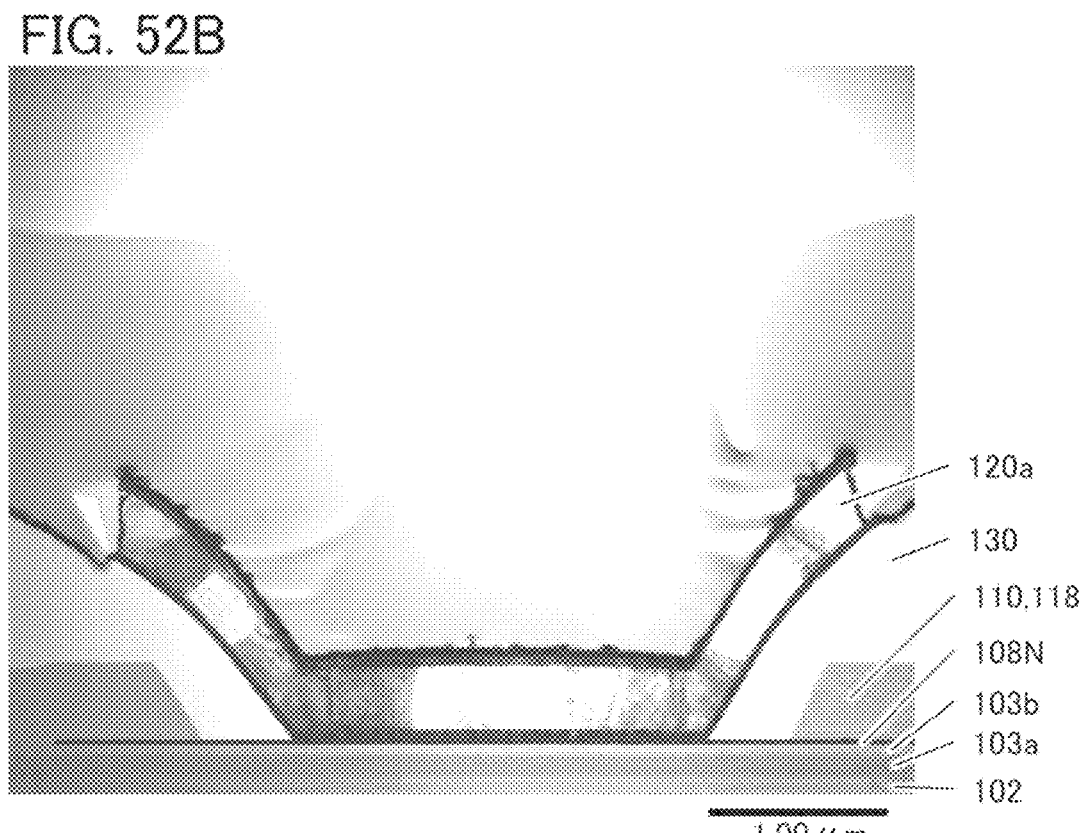
Figure 53A:
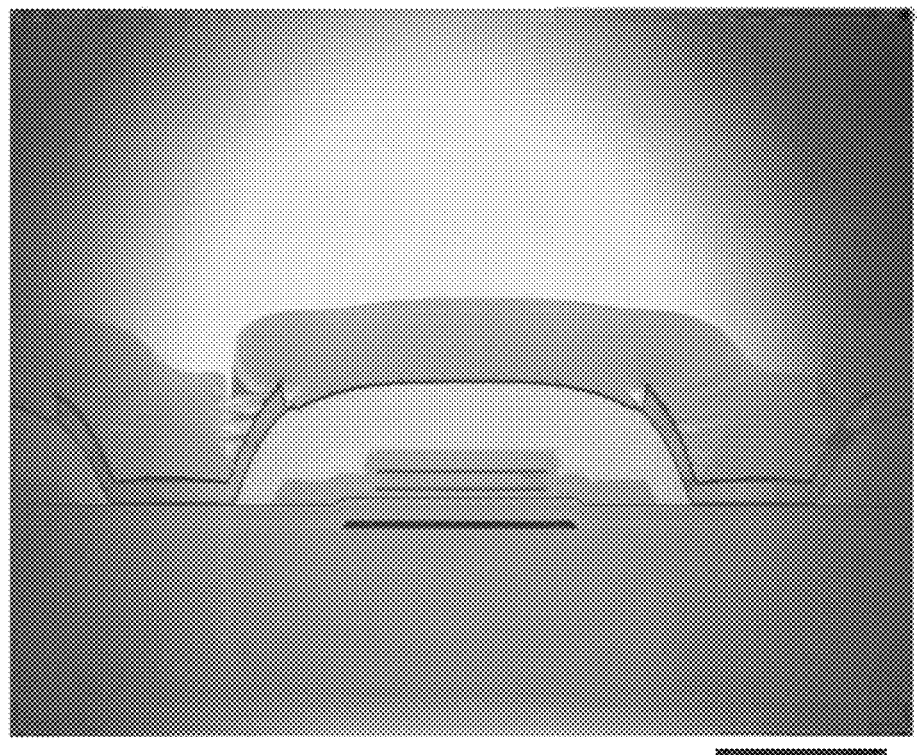
FIG. 53A and FIG. 53B are cross-sectional STEM images of a sample according to Example.
Figure 53A:
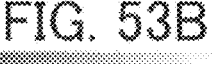
Figure 53B:
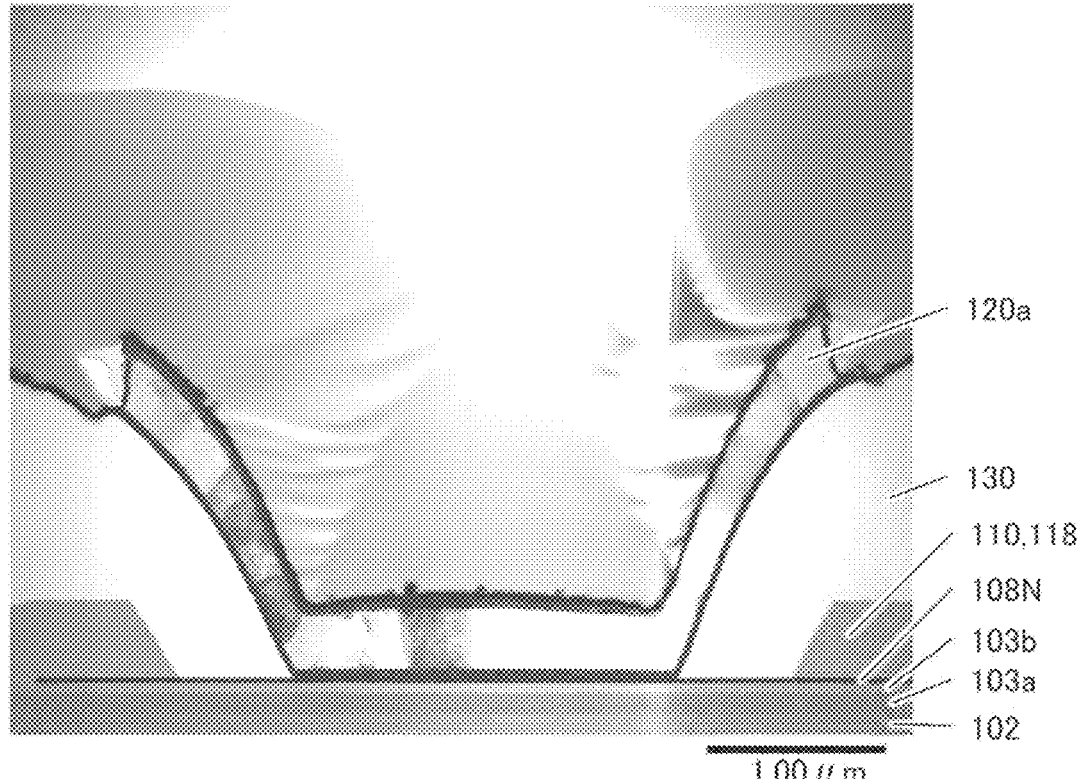
Figure 54A:
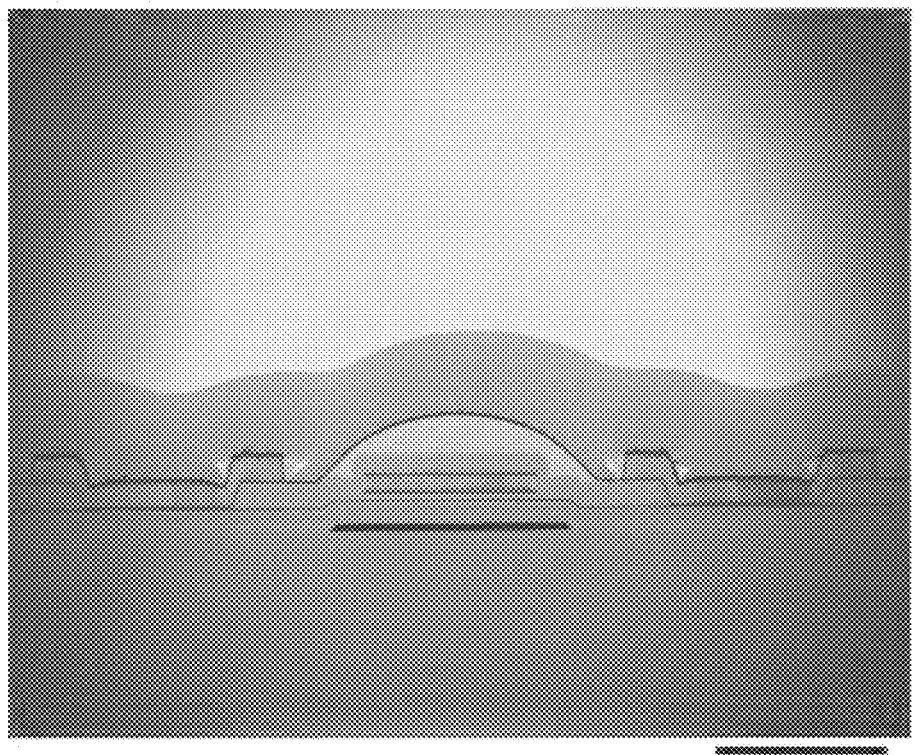
FIG. 54A and FIG. 54B are cross-sectional STEM images of a sample according to Example.
Figure 54B:
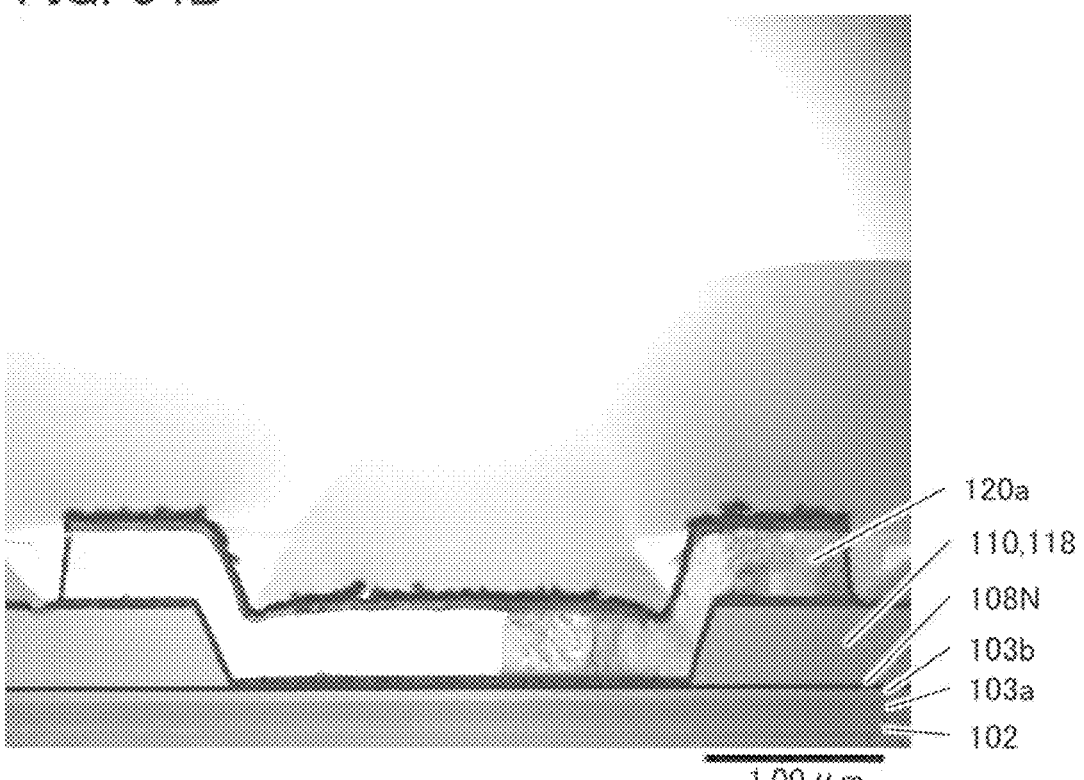

FIG. 52A and FIG. 52B are STEM images of the cross section of Sample 4A. FIG. 53A and FIG. 53B are STEM images of the cross section of Sample 4B. FIG. 54A and FIG. 54B are STEM images of the cross section of Sample 4C. FIG. 52A, FIG. 53A, and FIG. 54A are images of transmitted electrons (TE) at a magnification of 8000 times. FIG. 52B, FIG. 53B, and FIG. 54B are images of transmitted electrons (TE) which are enlarged views of the opening 143a and the vicinity thereof at a magnification of 25000 times.

As shown in FIG. 52A to FIG. 54B, the samples were confirmed to have favorable shapes. The width 151 of a region in contact with the semiconductor layer 108 (the low-resistance region 108N) of the insulating layer 130 in Sample 4A was approximately 490 nm (left side in FIG. 52B) and was approximately 460 nm (right side in FIG. 52B), and the width 151 in Sample 4B was approximately 630 nm (left side in FIG. 53B) and was approximately 650 nm (right side in FIG. 53B).

Example 5

In this example, the transmittance of a conductive film that can be used in one embodiment of the present invention was evaluated.

<Sample Fabrication>

A titanium film was deposited over a quartz substrate by a sputtering method. In this example, a titanium film was used as the conductive film, and six kinds of samples with different thicknesses of the titanium film (20 nm, 35 nm, 50 nm, 70 nm, 100 nm, and 200 nm) were fabricated.

<Measurement of Transmittance>

Next, the transmittance of each of the samples fabricated above was measured.

Figure 55A:
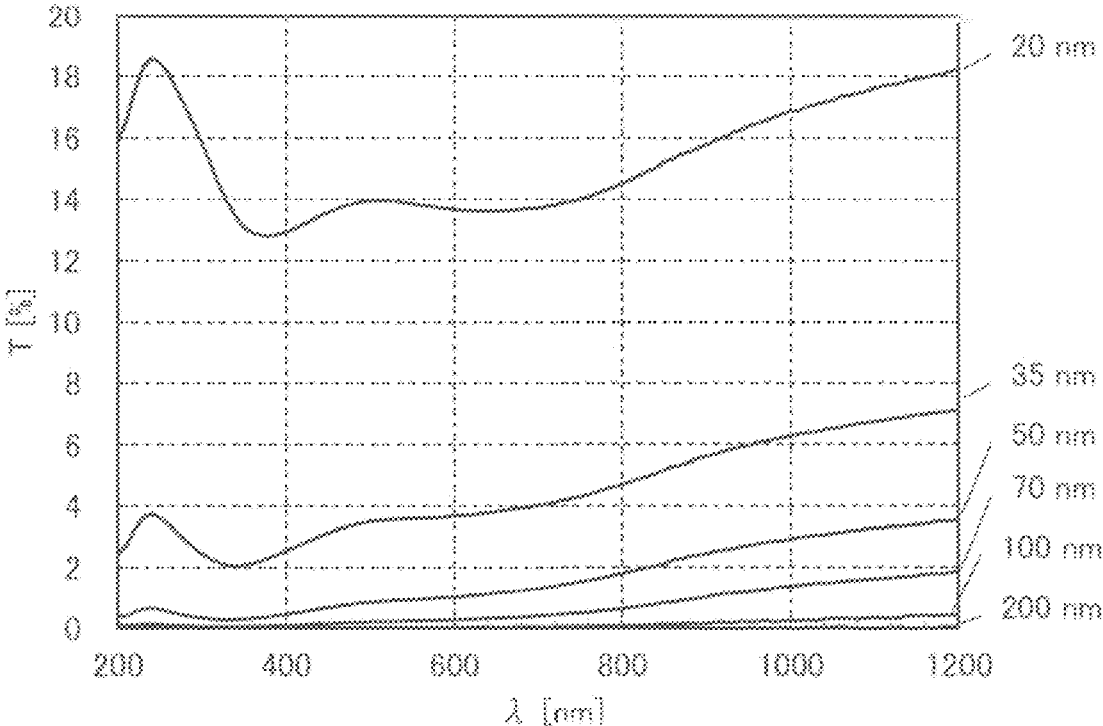
FIG. 55A and FIG. 55B are diagrams showing the transmittances of samples according to Example.
Figure 55B:
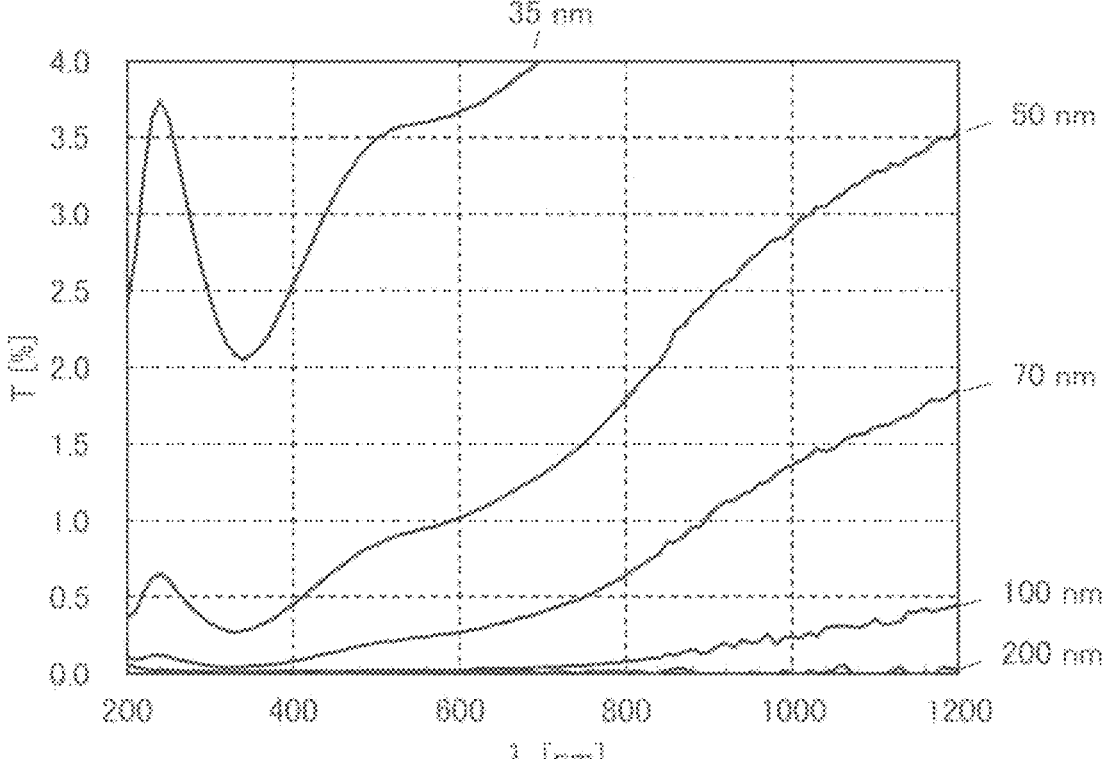

FIG. 55A shows measurement results of the transmittances of the samples. FIG. 55B is a graph in which the vertical axis in FIG. 55A is enlarged. In each of FIG. 55A and FIG. 55B, the horizontal axis represents a wavelength λ and the vertical axis represents a transmittance T.

As shown in FIG. 55A and FIG. 55B, it was found that as the thickness of the titanium film becomes larger, the transmittance of ultraviolet light is lower.

Example 6

In this example, an influence of ultraviolet light on a metal oxide film at the time of depositing a conductive film was evaluated. In this example, six kinds of samples with different thicknesses of the conductive film formed over the metal oxide film were fabricated. As a reference sample, one kind of sample in which a conductive film was not formed was fabricated.

<Sample Fabrication>

A 120-nm-thick silicon nitride film was deposited over a glass substrate.

Next, a 150-nm-thick first silicon oxynitride film was deposited.

Next, a 30-nm-thick metal oxide film was deposited. The metal oxide film was deposited by a sputtering method using an In—Ga—Zn oxide target (In:Ga:Zn=5:1:3 [atomic ratio]). The deposition pressure was 0.4 Pa, the power supply was 1.0 kW, and the substrate temperature was room temperature. A mixed gas of an oxygen gas and an argon gas was used as a deposition gas, and the oxygen flow rate ratio was 50%.

Next, after heat treatment was performed at 320° C. in a dry air (CDA) atmosphere for one hour, another heat treatment was performed at 340° C. for one hour. An oven apparatus was used for the heat treatment.

Next, a 140-nm-thick second silicon oxynitride film was deposited.

Next, heat treatment was performed at 340° C. in a dry air (CDA) atmosphere for one hour. An oven apparatus was used for the heat treatment.

Next, a conductive film was deposited over the second silicon oxynitride film by a sputtering method. The conductive film had a stacked-layer structure of a first titanium film, an aluminum film over the first titanium film, and a second titanium film over the aluminum film. Here, six kinds of samples with different thicknesses of the first titanium film (20 nm, 35 nm, 50 nm, 70 nm, 100 nm, and 200 nm) were fabricated. The thickness of the aluminum film was 200 nm, and the thickness of the second titanium film was 50 nm. A conductive film was not deposited in the one kind of sample.

Next, the conductive film was removed. For the removal of the conductive film, a wet etching method was used.

Next, the second silicon oxynitride film was removed, so that the metal oxide film was exposed. For the removal of the second silicon oxynitride film, a dry etching method was used.

<Sheet Resistance Measurement>

Next, the sheet resistance of each sample fabricated as above was measured, so that the resistance of the metal oxide film was evaluated.

Figure 56:
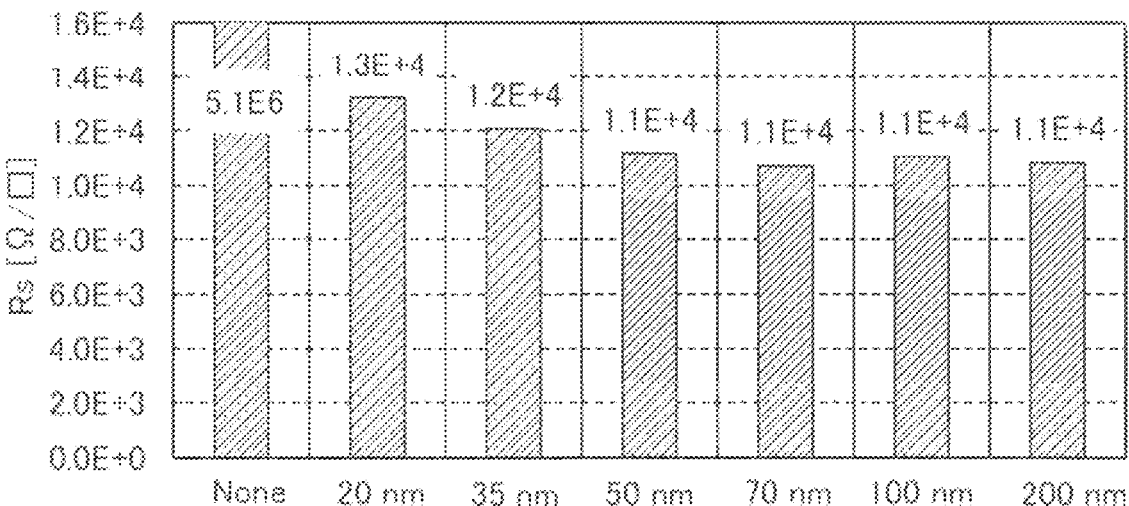
FIG. 56 is a diagram showing the resistance of samples according to Example.

FIG. 56 shows the sheet resistance values of the metal oxide film in each sample. In FIG. 56, the horizontal axis represents the thickness of the first titanium film, and the vertical axis represents the sheet resistance (Rs) of the metal oxide film. Note that the sample in which the conductive film was not deposited is referred to as "None" in the horizontal axis in FIG. 56.

As shown in FIG. 56, it was found that the resistance of the metal oxide film is lowered by the deposition of the conductive film. A larger thickness of the first titanium film resulted in lower resistance of the metal oxide film, and there was no difference in the resistance of the metal oxide film when the thickness of the first titanium film was larger than or equal to 70 nm. In the deposition of the conductive film, although the resistance of the metal oxide film was lower when ultraviolet light reached the metal oxide film in an early stage of the deposition, there was no difference in the resistance of the metal oxide film probably because ultraviolet light was blocked by the conductive film with a larger thickness.

Example 7

In this example, an influence of ultraviolet light on a metal oxide film at the time of depositing a conductive film was evaluated. In this example, nine kinds of samples with different deposition conditions of the conductive film formed over the metal oxide film were fabricated. As a reference sample, one kind of sample in which a conductive film was not formed was fabricated.

<Sample Fabrication>

A 120-nm-thick silicon nitride film was deposited over a glass substrate.

Next, a 150-nm-thick first silicon oxynitride film was deposited.

Next, a 30-nm-thick metal oxide film was deposited. The metal oxide film was deposited by a sputtering method using an In—Ga—Zn oxide target (In:Ga:Zn=5:1:3 [atomic ratio]). The deposition pressure was 0.4 Pa, the power supply was 1.0 kW, and the substrate temperature was room temperature. A mixed gas of an oxygen gas and an argon gas was used as a deposition gas, and the oxygen flow rate ratio was 50%.

Next, after heat treatment was performed at 320° C. in a dry air (CDA) atmosphere for one hour, another heat treatment was performed at 340° C. for one hour. An oven apparatus was used for the heat treatment.

Next, a 140-nm-thick second silicon oxynitride film was deposited.

Next, heat treatment was performed at 340° C. in a dry air (CDA) atmosphere for one hour. An oven apparatus was used for the heat treatment.

Next, a conductive film was deposited over the second silicon oxynitride film by a sputtering method. The conductive film had a stacked-layer structure of a first titanium film, an aluminum film over the first titanium film, and a second titanium film over the aluminum film. The thicknesses of the first titanium film, the aluminum film, and the second titanium film were 50 nm, 200 nm, and 50 nm, respectively. Here, nine kinds of samples with different deposition conditions of the first titanium film were fabricated. The deposition conditions of the first titanium film were as follows: three conditions of the pressure (0.3 Pa, 0.6 Pa, and 0.85 Pa) were used, and three conditions of the power (8 kW, 29 kW, and 58 kW) were used. A conductive film was not deposited in the one kind of sample.

Next, the conductive film was removed. For the removal of the conductive film, a wet etching method was used.

Next, the second silicon oxynitride film was removed, so that the metal oxide film was exposed. For the removal of the second silicon oxynitride film, a dry etching method was used.

<Sheet Resistance Measurement>

Next, the sheet resistance of each sample fabricated as above was measured, so that the resistance of the metal oxide film was evaluated.

Figure 57:
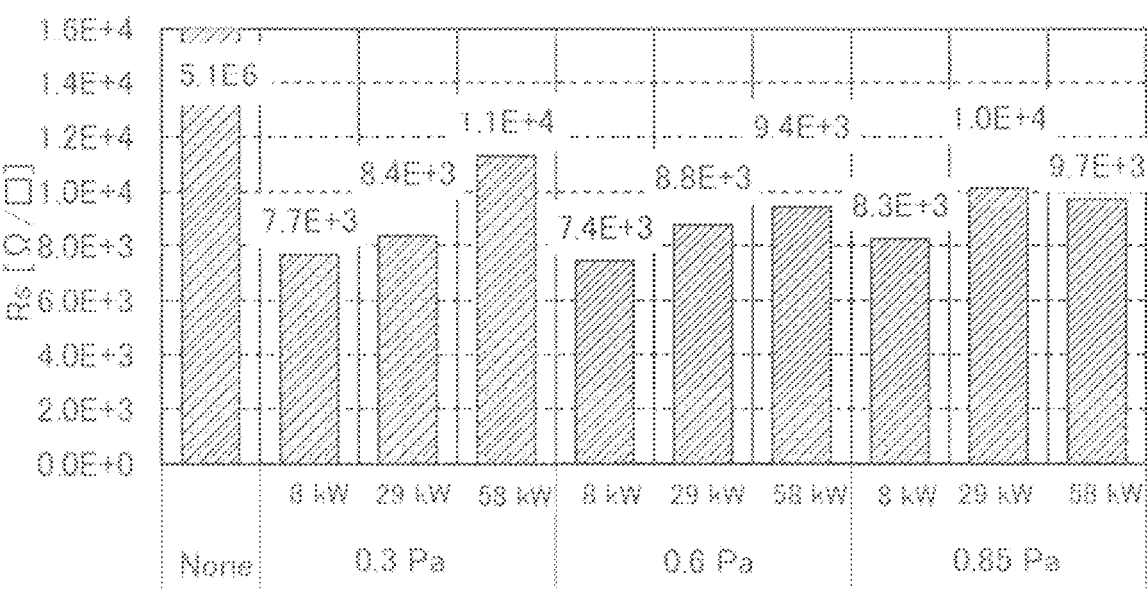
FIG. 57 is a diagram showing the resistance of samples according to Example.

FIG. 57 shows the sheet resistance values of the metal oxide film in each sample. In FIG. 57, the horizontal axis represents the deposition conditions of the first titanium film, and the vertical axis represents the sheet resistance (Rs) of the metal oxide film. Note that the sample in which the conductive film was not deposited is referred to as "None" in the horizontal axis in FIG. 57.

As shown in FIG. 57, it was found that the resistance of the metal oxide film is lowered by the deposition of the conductive film. Moreover, it was found that the resistance of the metal oxide film is increased when the first titanium film is deposited with higher power. This is probably because the time for which ultraviolet light reaches the metal oxide film was shortened by an increase in a deposition rate when the first titanium film was deposited with high power; as a result, the amount of ultraviolet rays reaching the metal oxide film was reduced, and a decrease in the resistance of the metal oxide film was inhibited. Note that there was no difference in the resistance of the metal oxide film depending on the pressure at the time of depositing the first titanium film.

Example 8

In this example, an influence of ultraviolet light on a metal oxide film at the time of depositing a conductive film was evaluated. In this example, nine kinds of samples with different deposition conditions of the conductive film formed over the metal oxide film were fabricated.

As a reference sample, one kind of sample in which a conductive film was not formed was fabricated.

<Sample Fabrication>

A 120-nm-thick silicon nitride film was deposited over a glass substrate.

Next, a 150-nm-thick first silicon oxynitride film was deposited.

Next, a 30-nm-thick metal oxide film was deposited. The metal oxide film was deposited by a sputtering method using an In—Ga—Zn oxide target (In:Ga:Zn=5:1:3 [atomic ratio]). The deposition pressure was 0.4 Pa, the power supply was 1.0 kW, and the substrate temperature was room temperature. A mixed gas of an oxygen gas and an argon gas was used as a deposition gas, and the oxygen flow rate ratio was 50%.

Next, after heat treatment was performed at 320° C. in a dry air (CDA) atmosphere for one hour, another heat treatment was performed at 340° C. for one hour. An oven apparatus was used for the heat treatment.

Next, a 140-nm-thick second silicon oxynitride film was deposited.

Next, heat treatment was performed at 340° C. in a dry air (CDA) atmosphere for one hour. An oven apparatus was used for the heat treatment.

Next, a conductive film was deposited over the second silicon oxynitride film by a sputtering method. The conductive film had a stacked-layer structure of a first titanium film, an aluminum film over the first titanium film, and a second titanium film over the aluminum film. The thicknesses of the first titanium film, the aluminum film, and the second titanium film were 50 nm, 200 nm, and 50 nm, respectively. Here, nine kinds of samples with different deposition conditions of the aluminum film were fabricated. The deposition conditions of the aluminum film were as follows: three conditions of the pressure (0.3 Pa, 0.6 Pa, and 0.85 Pa) were used, and three conditions of the power (10 kW, 36 kW, and 78 kW) were used. A conductive film was not deposited in the one kind of sample.

Next, the conductive film was removed. For the removal of the conductive film, a wet etching method was used.

Next, the second silicon oxynitride film was removed, so that the metal oxide film was removed. For the removal of the second silicon oxynitride film, a dry etching method was used.

<Sheet Resistance Measurement>

Next, the sheet resistance of each sample fabricated as above was measured, so that the resistance of the metal oxide film was evaluated.

Figure 58:
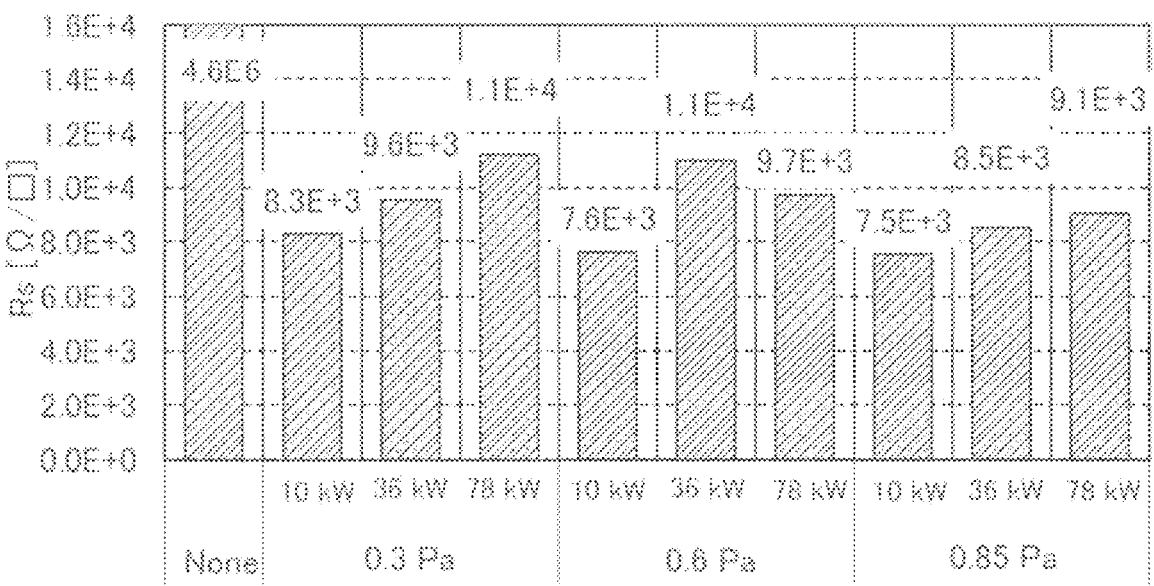
FIG. 58 is a diagram showing the resistance of samples according to Example.

FIG. 58 shows the sheet resistance values of the metal oxide film in each sample. In FIG. 58, the horizontal axis represents the deposition conditions of the aluminum film, and the vertical axis represents the sheet resistance (Rs) of the metal oxide film. Note that the sample in which the conductive film was not deposited is referred to as "None" in the horizontal axis in FIG. 58.

As shown in FIG. 58, it was found that the resistance of the metal oxide film is lowered by the deposition of the conductive film. Moreover, it was found that the resistance of the metal oxide film is increased when the aluminum film is deposited with higher power. This is probably because the time for which ultraviolet light reaches the metal oxide film was shortened by an increase in a deposition rate when the aluminum film was deposited with high power; as a result, the amount of ultraviolet rays reaching the metal oxide film was reduced, and a decrease in the resistance of the metal oxide film was inhibited. Note that there was no difference in the resistance of the metal oxide film depending on the pressure at the time of depositing the aluminum film.

REFERENCE NUMERALS

DL_1: data line, DL_n: data line, DL_Y: data line, DL: data line, GL_1: gate line, GL_m: gate line, GL_X: gate line, GL: gate line, LC: liquid crystal element, VL_a: potential supply line, VL_b: potential supply line, 100A: transistor, 100B: transistor, 100C: transistor, 100D: transistor, 100E: transistor, 100F: transistor, 100G: transistor, 100H: transistor, 100: transistor, 102: substrate, 103a: insulating film, 103b: insulating film, 103: insulating layer, 106: conductive layer, 108f: metal oxide film, 108L: region, 108N: low-resistance region, 108: semiconductor layer, 110a: insulating film, 110b: insulating film, 110c: insulating film, 110: insulating layer, 112f conductive film, 112: conductive layer, 112m: conductive film, 114f: metal oxide film, 114: metal oxide layer, 116: insulating layer, 118: insulating layer, 120a: conductive layer, 120b: conductive layer, 130: insulating layer, 132: insulating layer, 140: impurity element, 141a: opening, 141W: width, 142: opening, 143a: opening, 143b: opening, 143W: width, 145a: opening, 145b: opening, 145W: width, 147a: opening, 147b: opening, 147W: width, 149a: opening, 149b: opening, 149W: width, 151: width, 193: target, 194: plasma, 195: target, 196: plasma, 400EL: pixel circuit, 400LC: pixel circuit, 400: pixel circuit, 401EL: circuit, 401LC: circuit, 401: circuit, 501: pixel circuit, 502: pixel portion, 504a: gate driver, 504b: source driver, 504: driver circuit portion, 506: protection circuit, 507: terminal portion, 550: transistor, 552: transistor, 554: transistor, 560: capacitor, 562: capacitor, 570: liquid crystal element, 572: light-emitting element, 700A: display device, 700B: display device, 700: display device, 701: first substrate, 702: pixel portion, 704: source driver circuit portion, 705: second substrate, 706: gate driver circuit portion, 708: FPC terminal portion, 710: signal line, 711: lead wiring portion, 712: sealant, 716: FPC, 717: IC, 721: source driver IC, 722: gate driver circuit portion, 723: FPC, 724: printed circuit board, 730: insulating film, 732: sealing film, 734: insulating film, 736: coloring film, 738: light-blocking film, 740: protective layer, 741: protective layer, 742: adhesive layer, 743: resin layer, 744: insulating layer, 745: support substrate, 746: resin layer, 750: transistor, 752: transistor, 760: wiring, 770: planarization insulating film, 772: conductive layer, 773: insulating layer, 774: conductive layer, 775: liquid crystal element, 776: liquid crystal layer, 778: structure body, 780: anisotropic conductive film, 782: light-emitting element, 786: EL layer, 788: conductive film, 790: capacitor, 800A: display device, 800: display device, 801: substrate, 811: conductive layer, 812: reflective layer, 813: insulating layer, 814B: conductive layer, 814G: conductive layer, 814R: conductive layer, 814: conductive layer, 815: EL layer, 816: conductive layer, 817: insulating layer, 818: insulating layer, 820B: light-emitting element, 820G: light-emitting element, 820R: light-emitting element, 820: light-emitting element, 821: insulating layer, 830: plug, 831: plug, 902: substrate, 908: first metal oxide film, 910: silicon oxynitride film, 920: quartz substrate, 930: light-blocking film, 940: ultraviolet light, 6000: display module, 6001: upper cover, 6002: lower cover, 6005: FPC, 6006: display device, 6009: frame, 6010: printed circuit board, 6011: battery, 6015: light-emitting portion, 6016: light-receiving portion, 6017a: light guide portion, 6017b: light guide portion, 6018: light, 6500: electronic device, 6501: housing, 6502: display portion, 6503: power button, 6504: button, 6505: speaker, 6506: microphone, 6507: camera, 6508: light source, 6510: protective member, 6511: display panel, 6512: optical member, 6513: touch sensor panel, 6515: FPC, 6516: IC, 6517: printed circuit board, 6518: battery, 7100: television device, 7101: housing, 7103: stand, 7111: remote controller, 7200: notebook personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7500: display portion, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing unit, 8305: lens, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9100: television device, 9101: portable information terminal, 9102: portable information terminal, 9200: portable information terminal, 9201: portable information terminal

The invention claimed is:

1. A semiconductor device comprising:

a semiconductor layer;

a gate insulating layer;

a gate electrode;

a first insulating layer;

a second insulating layer; and a conductive layer, wherein the gate insulating layer is in contact with a top surface and a side surface of the semiconductor layer, wherein the gate electrode comprises a region overlapping with the semiconductor layer with the gate insulating layer therebetween, wherein the first insulating layer comprises an inorganic material, wherein the first insulating layer is in contact with a top surface of the gate insulating layer and a top surface and a side surface of the gate electrode, wherein the gate insulating layer and the first insulating layer comprise a first opening in a region overlapping with the semiconductor layer, wherein the second insulating layer comprises an organic material, wherein the second insulating layer comprises a second opening inside the first opening, wherein the second insulating layer is in contact with a top surface and a side surface of the first insulating layer and a side surface of the gate insulating layer, wherein the conductive layer is electrically connected to the semiconductor layer through the second opening, and wherein, in a region where the conductive layer is in direct contact with a top surface of the semiconductor layer, the second insulating layer does not overlap with the conductive layer.

2. The semiconductor device according to claim 1, wherein an angle formed by a side surface of the second insulating layer and the top surface of the semiconductor layer is greater than or equal to 45° and less than 90°.

3. The semiconductor device according to claim 1,
wherein the second insulating layer comprises a region in
direct contact with the top surface of the semiconductor
layer, and
wherein a width of the region is greater than or equal to
50 nm and less than or equal to 3000 nm.

4. The semiconductor device according to claim 1,
wherein a transmittance of the second insulating layer in a
wavelength range of greater than or equal to 200 nm and less
than or equal to 350 nm is higher than or equal to 0.01% and
lower than or equal to 70%.

5. The semiconductor device according to claim 1,
wherein a transmittance of the organic material in a wave-
length range of greater than or equal to 200 nm and less than
or equal to 350 nm is higher than or equal to 0.01% and
lower than or equal to 70%.

6. The semiconductor device according to claim 1,
wherein the organic material comprises one or more of an
acrylic resin, a polyimide resin, an epoxy resin, a polyamide
resin, a polyimide-amide resin, a siloxane resin, a benzocy-
clobutene-based resin, a phenol resin, a novolac resin, a
precursor of the acrylic resin, a precursor of the polyimide
resin, a precursor of the epoxy resin, a precursor of the
polyamide resin, a precursor of the polyimide-amide resin,
a precursor of the siloxane resin, a precursor of the benzo-
cyclobutene-based resin, a precursor of the phenol resin, and
a precursor of the novolac resin.

7. The semiconductor device according to claim 1, further
comprising a third insulating layer,
wherein the third insulating layer comprises an inorganic
material,
wherein the third insulating layer comprises a third open-
ing inside the second opening, and
wherein the third insulating layer is in contact with a top
surface and the side surface of the second insulating
layer.

8. A semiconductor device comprising:
a semiconductor layer;
a gate insulating layer;
a gate electrode;
a first insulating layer;
a second insulating layer; and
a conductive layer,
wherein the gate insulating layer is in contact with a top
surface of the semiconductor layer,
wherein the gate electrode comprises a region overlapping
with the semiconductor layer with the gate insulating
layer therebetween,
wherein the first insulating layer comprises an inorganic
material,
wherein the first insulating layer is in contact with the top
surface and a side surface of the semiconductor layer,
a side surface of the gate insulating layer, and a top
surface and a side surface of the gate electrode,
wherein the first insulating layer comprises a first opening
in a region overlapping with the semiconductor layer, wherein the second insulating layer comprises an organic
material,
wherein the second insulating layer comprises a second
opening inside the first opening,
wherein the second insulating layer is in contact with a top
surface and a side surface of the first insulating layer,
wherein the conductive layer is electrically connected to
the semiconductor layer through the second opening,
wherein the second insulating layer comprises a region in
direct contact with the top surface of the semiconductor
layer, and
wherein a width of the region of the second insulating
layer is greater than or equal to 50 nm and less than or
equal to 3000 nm.

9. The semiconductor device according to claim 8,
wherein an angle formed by a side surface of the second
insulating layer and the top surface of the semiconductor
layer is greater than or equal to 45° and less than 90°.

10. The semiconductor device according to claim 8,
wherein a transmittance of the second insulating layer in a
wavelength range of greater than or equal to 200 nm and less
than or equal to 350 nm is higher than or equal to 0.01% and
lower than or equal to 70%.

11. The semiconductor device according to claim 8,
wherein a transmittance of the organic material in a wave-
length range of greater than or equal to 200 nm and less than
or equal to 350 nm is higher than or equal to 0.01% and
lower than or equal to 70%.

12. The semiconductor device according to claim 8,
wherein the organic material comprises one or more of an
acrylic resin, a polyimide resin, an epoxy resin, a polyamide
resin, a polyimide-amide resin, a siloxane resin, a benzocy-
clobutene-based resin, a phenol resin, a novolac resin, a
precursor of the acrylic resin, a precursor of the polyimide
resin, a precursor of the epoxy resin, a precursor of the
polyamide resin, a precursor of the polyimide-amide resin,
a precursor of the siloxane resin, a precursor of the benzo-
cyclobutene-based resin, a precursor of the phenol resin, and
a precursor of the novolac resin.

13. The semiconductor device according to claim 8,
further comprising a third insulating layer,
wherein the third insulating layer comprises an inorganic
material,
wherein the third insulating layer comprises a third open-
ing inside the second opening, and
wherein the third insulating layer is in contact with a top
surface and the side surface of the second insulating
layer.

14. The semiconductor device according to claim 8,
wherein, in a region where the conductive layer is in direct
contact with the top surface of the semiconductor layer, the
second insulating layer does not overlap with the conductive
layer.

* * * * *